(12) United States Patent
Rogers et al.

(10) Patent No.: US 10,538,028 B2
(45) Date of Patent: Jan. 21, 2020

(54) DETERMINISTIC ASSEMBLY OF COMPLEX, THREE-DIMENSIONAL ARCHITECTURES BY COMPRESSIVE BUCKLING

(71) Applicants: THE BOARD OF TRUSTEES OF THE UNIVERSITY OF ILLINOIS, Urbana, IL (US); NORTHWESTERN UNIVERSITY, Evanston, IL (US)

(72) Inventors: John A. Rogers, Champaign, IL (US); Sheng Xu, Urbana, IL (US); Zheng Yan, Urbana, IL (US); Yihui Zhang, Evanston, IL (US); Yonggang Huang, Glencoe, IL (US)

(73) Assignees: The Board of Trustees of the University of Illinois, Urbana, IL (US); Northwestern University, Evanston, IL (US)

( * ) Notice: Subject to any disclaimer, the term of this patent is extended or adjusted under 35 U.S.C. 154(b) by 722 days.

(21) Appl. No.: 14/944,039

(22) Filed: Nov. 17, 2015

(65) Prior Publication Data
US 2016/0136877 A1    May 19, 2016

Related U.S. Application Data

(60) Provisional application No. 62/080,897, filed on Nov. 17, 2014.

(51) Int. Cl.
*B32B 3/24* (2006.01)
*B29C 61/06* (2006.01)
(Continued)

(52) U.S. Cl.
CPC ........ *B29C 61/0616* (2013.01); *B29C 61/006* (2013.01); *B32B 1/00* (2013.01);
(Continued)

(58) Field of Classification Search
CPC .................................................... B29C 61/006
(Continued)

(56) References Cited

U.S. PATENT DOCUMENTS 4,935,287 A * 6/1990 Johnson ............... B32B 5/04
428/198
5,376,430 A * 12/1994 Swenson ........... A61F 13/49015
428/152

(Continued)

FOREIGN PATENT DOCUMENTS

WO  PCT/US2015/044573    8/2015
WO  PCT/US2015/044588    8/2015
(Continued)

OTHER PUBLICATIONS

Ahn et al. (2009) "Omnidirectional Printing of Flexible, Stretchable, and Spanning Silver Microelectrodes," Science. 323(5921):1590-1593.

(Continued)

*Primary Examiner* — William P Watkins, III
(74) *Attorney, Agent, or Firm* — Leydig, Voit & Mayer, Ltd.

(57) ABSTRACT

Origami- and Kirigami-inspired assembly of predetermined three-dimensional forms is presented in comprehensive theoretical and experimental studies, with examples of a broad range of topologies and material compositions. The resulting engineering options in the construction of functional 3D structures have important implications for advanced microsystem technologies.

64 Claims, 86 Drawing Sheets

(51) Int. Cl.
*B32B 1/00* (2006.01)
*B32B 27/28* (2006.01)
*B32B 27/40* (2006.01)
*B29C 61/00* (2006.01)
*B29L 31/00* (2006.01)

(52) U.S. Cl.
CPC .......... *B32B 27/283* (2013.01); *B32B 27/285* (2013.01); *B32B 27/40* (2013.01); *B29L 2031/756* (2013.01)

(58) Field of Classification Search
USPC ........................................ 428/152, 198, 135
See application file for complete search history.

(56) References Cited

U.S. PATENT DOCUMENTS

| | | |
|---|---|---|
| 7,195,733 B2 | 3/2007 | Rogers et al. |
| 7,521,292 B2 | 4/2009 | Rogers et al. |
| 7,557,367 B2 | 7/2009 | Rogers et al. |
| 7,622,367 B1 | 11/2009 | Nuzzo et al. |
| 7,704,684 B2 | 4/2010 | Rogers et al. |
| 7,705,280 B2 | 4/2010 | Nuzzo et al. |
| 7,799,699 B2 | 9/2010 | Nuzzo et al. |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 7,982,296 B2 | 7/2011 | Nuzzo et al. |
| 8,039,847 B2 | 10/2011 | Nuzzo et al. |
| 8,198,621 B2 | 6/2012 | Rogers et al. |
| 8,217,381 B2 | 7/2012 | Rogers et al. |
| 8,367,035 B2 | 2/2013 | Rogers et al. |
| 8,394,706 B2 | 3/2013 | Nuzzo et al. |
| 8,440,546 B2 | 5/2013 | Nuzzo et al. |
| 8,470,701 B2 | 6/2013 | Rogers et al. |
| 8,552,299 B2 | 10/2013 | Rogers et al. |
| 8,562,095 B2 | 10/2013 | Alleyene et al. |
| 8,664,699 B2 | 3/2014 | Nuzzo et al. |
| 8,666,471 B2 | 3/2014 | Rogers et al. |
| 8,679,888 B2 | 3/2014 | Rogers et al. |
| 8,722,458 B2 | 5/2014 | Rogers et al. |
| 8,729,524 B2 | 5/2014 | Rogers et al. |
| 8,754,396 B2 | 6/2014 | Rogers et al. |
| 8,865,489 B2 | 10/2014 | Rogers et al. |
| 8,895,406 B2 | 11/2014 | Rogers et al. |
| 8,934,965 B2 | 1/2015 | Rogers et al. |
| 8,946,683 B2 | 2/2015 | Rogers et al. |
| 9,057,994 B2 | 6/2015 | Rogers et al. |
| 9,061,494 B2 | 6/2015 | Rogers et al. |
| 9,105,555 B2 | 8/2015 | Rogers et al. |
| 9,105,782 B2 | 8/2015 | Rogers et al. |
| 9,117,940 B2 | 8/2015 | Rogers et al. |
| 2007/0023987 A1* | 2/2007 | Kling ............... B31D 3/002 270/32 |
| 2008/0055581 A1 | 3/2008 | Rogers et al. |
| 2011/0316120 A1 | 12/2011 | Rogers et al. |
| 2012/0157804 A1 | 6/2012 | Rogers et al. |
| 2012/0165759 A1 | 6/2012 | Rogers et al. |
| 2012/0261551 A1 | 10/2012 | Rogers et al. |
| 2012/0320581 A1 | 12/2012 | Rogers et al. |
| 2013/0036928 A1 | 2/2013 | Rogers et al. |
| 2013/0041235 A1 | 2/2013 | Rogers et al. |
| 2013/0140649 A1 | 6/2013 | Rogers et al. |
| 2013/0333094 A1 | 12/2013 | Rogers et al. |
| 2014/0163390 A1 | 6/2014 | Rogers et al. |
| 2014/0191236 A1 | 7/2014 | Nuzzo et al. |
| 2014/0220422 A1 | 8/2014 | Rogers et al. |
| 2014/0305900 A1 | 10/2014 | Rogers et al. |
| 2014/0323968 A1 | 10/2014 | Rogers et al. |
| 2014/0361409 A1 | 12/2014 | Rogers et al. |
| 2014/0374872 A1 | 12/2014 | Rogers et al. |
| 2015/0001462 A1 | 1/2015 | Rogers et al. |
| 2015/0080695 A1 | 3/2015 | Rogers et al. |
| 2015/0132873 A1 | 5/2015 | Rogers et al. |
| 2015/0141767 A1 | 5/2015 | Rogers et al. |
| 2015/0181700 A1 | 6/2015 | Rogers et al. |
| 2015/0207012 A1 | 7/2015 | Rogers et al. |
| 2015/0237711 A1 | 8/2015 | Rogers et al. |
| 2015/0290938 A1 | 10/2015 | Rogers et al. |
| 2015/0373831 A1 | 12/2015 | Rogers et al. |
| 2015/0380355 A1 | 12/2015 | Rogers et al. |
| 2016/0005700 A1 | 1/2016 | Rogers et al. |
| 2016/0027737 A1 | 1/2016 | Rogers et al. |

FOREIGN PATENT DOCUMENTS

| | | |
|---|---|---|
| WO | PCT/US2015/044638 | 8/2015 |
| WO | PCT/US2015/053452 | 10/2015 |

OTHER PUBLICATIONS

Arora et al. (2006) "Membrane folding to achieve three-dimensional nanostructures: Nanopatterned silicon nitride folded with stressed chromium hinges," Appl. Phys. Lett. 88:053108.
Arpin et al. (2010) "Multidimensional Architectures for Functional Optical Devices," Adv. Mater. 22(10):1084-1101.
Babaee et al. (Jul. 22, 2013) "3D Soft Metamaterials with Negative Poisson's Ratio," Adv. Mater. 25:5044-5049.
Bassik et al. (2009) "Microassembly based on hands free origami with bidirectional curvature," Appl. Phys. Lett. 95:91901.
Behl et al. (2010) "Multifunctional Shape-Memory Polymers," Adv. Mater. 22:3388-3410.
Bishop et al. (Jul. 20, 2012) "Silicon Micro-Machines for Fun and Profit," J. Low Temp. Phys. 169(5-6):386-399.
Braun (Oct. 11, 2013) "Materials Chemistry in 3D Templates for Functional Photonics," Chem. Mater. 26(1):277-286.
Castle et al. (Aug. 27, 2014) "Making the Cut: Lattice Kirigami Rules," Phys. Rev. Lett. 113:245502.
Chen et al. (2011) "Directed self-assembly of a colloidal kagome lattice," Nature. 469:381-384.
Cheng et al. (Sep. 23, 2013) "Folding Paper-Based Lithium-Ion Batteries for Higher Areal Energy Densities," Nano Lett. 13:4969-4974.
Cho et al. (2011) "Nanoscale Origami for 3D Optics," Small 7(14):1943-1948.
Cho et al. (Dec. 9, 2014) "Engineering the shape and structure of materials by fractal cut," Proc. Natl. Acad. Sci. USA. 111(49):17390-17395.
Crane et al. (Oct. 5, 2012) "Fluidic assembly at the microscale: progress and prospects," Microfluid. Nanofluid. 14(3-4):383-419.
Damasceno et al. (2012) "Predictive Self-Assembly of Polyhedra into Complex Structures," Science. 337(6093):453-457.
Das et al. (Jan. 7, 2014) "Interfacial bonding characteristics between graphene and dielectric substrates," Nanotechnology. 25:045707.
Deng et al. (Jan. 22, 2013) "Naturally Rolled-Up C/Si/C Inlayer Nanomembranes as Stable Anodes for Lithium-Ion Batteries with Remarkable Cycling Performance," Angew. Chem.-Int. Ed. 52(8):2326-2330.
Duffy et al. (1998) "Rapid Prototyping of Microfluidic Systems in Poly(dimethylsiloxane)," Anal. Chem. 70:4974-4984.
Fan et al. (2009) "Three-dimensional nanopillar-array photovoltaics on low-cost and flexible substrates," Nat. Mater. 8(8):648-653.
Fan et al. (Oct. 7, 2013) "Fractal design concepts for stretchable electronics," Nature Communications. 5:3266.
Felton et al. (Aug. 8, 2014) "A method for building self-folding machines," Science. 345:644-646.
Felton et al. (Jun. 6, 2013) "Self-folding with shape memory composites," Soft Matter. 9:7688-7694.
Fischer et al. (Mar. 19, 2012) "Three-dimensional optical laser lithography beyond the diffraction limit," Laser Photonics Rev. 7(1):22-44.
Gao et al. (2005) "Conversion of zinc oxide nanobelts into superlattice-structured nanohelices," Science. 309(5741):1700-1704.
Gao et al. (Nov. 27, 2013) "Bioinspired Helical Microswimmers Based on Vascular Plants," Nano Lett. 14:305-310.
Gonzalez et al. (2011) "Carving at the nanoscale: sequential galvanic exchange and Kirkendall growth at room temperature," Science. 334:1377-1380.

(56) References Cited

OTHER PUBLICATIONS

Gottheim et al. (Feb. 28, 2015) "Fractal Nanoparticle Plasmonics: The Cayley Tree," ACS Nano. 9(3):3284-3292.

Grimm et al. (Dec. 17, 2012) "Rolled-up nanomembranes as compact 3D architectures for field effect transistors and fluidic sensing applications," Nano Lett 13(1):213-218.

Guo et al. (2009) "Two- and three-dimensional folding of thin film single-crystalline silicon for photovoltaic power applications," Proc. Natl. Acad. Sci. USA.106:20149-20154.

Hawkes et al. (2010) "Programmable matter by folding," Proc. Natl. Acad. Sci. USA. 107:12441-12445.

Huang et al. (2011) "Nanomechanical architecture of semiconductor nanomembranes," Nanoscale 3(1):96-120.

Huang et al. (Nov. 21, 2012) "On-Chip Inductors with Self-Rolled-Up $SiN_x$ Nanomembrane Tubes: A Novel Design Platform for Extreme Miniaturization," Nano Letters. 12:6283-6288.

Hwang et al. (2009) "Piezoresistive InGaAs/GaAs Nanosprings with Metal Connectors," Nano Lett. 9:554-561.

Jamal et al. (2011) "Differentially photo-crosslinked polymers enable self-assembling microfluidics," Nat. Commun. 2:527.

Jang et al. (2007) "3D micro- and nanostructures via interference lithography," Adv. Funct. Mater. 17(16):3027-3041.

Jang et al. (Sep. 1, 2013) "Fabrication and deformation of three-dimensional hollow ceramic nanostructures," Nature Mater. 12:893-898.

Kawata et al. (2001) "Finer features for functional microdevices," Nature 412:697-698.

Ke et al. (2009) "Multilayer DNA Origami Packed on a Square Lattice," J. Am. Chem. Soc. 131:15903-15908.

Khang et al. (2006) "A Stretchable Form of Single-Crystal Silicon for High-Performance Electronics on Rubber Substrates," Science. 311:208-212.

Kim et al. (2011) "Epidermal Electronics," Science. 333:838-843.

Kim et al. (2012) "Designing Responsive Buckled Surfaces by Halftone Gel Lithography," Science. 335:1201-1205.

Kim et al. (Mar. 2012) "Materials for stretchable electronics in bioinspired and biointegrated devices," MRS Bull. 37:226-235.

Klein et al. (2007) "Shaping of Elastic Sheets by Prescription of Non-Euclidean Metrics," Science. 315:1116-1120.

Kong et al. (2004) "Single-Crystal Nanorings Formed by Epitaxial Self-Coiling of Polar Nanobelts," Science. 303:1348-1351.

Krulevitch et al. (1996) "Thin film shape memory alloy microactuators," J. Microelectromech. Sys. 5:270-282.

LaFratta et al. (2007) "Multiphoton Fabrication," Angew. Chem.-Int. Ed. 46:6238-6258.

Lang (2003) Origami Design Secrets: Mathematical Methods for an Ancient Art. CRC Press. Natick, Massachusetts.

Lee et al. (Dec. 12, 2013) "25th Anniversary Article: Ordered Polymer Structures for the Engineering of Photons and Phonons," Adv. Mater. 26(4):532-568.

Leng et al. (2011) "Shape-memory polymers and their composites: Stimulus methods and applications," Prog. Mater Sci. 56:1077-1135.

Leong et al. (2009) "Tetherless thermobiochemically actuated microgrippers," Proc. Natl. Acad. Sci. USA. 106(3):703-708.

Leong et al. (2010) "Three-Dimensional Fabrication at Small Size Scales," Small. 6(7):792-806.

Lewis (2006) "Direct ink writing of 3D functional materials," Adv. Funct. Mater. 16(17):2193-2204.

Li et al. (2011) "Colloidal Assembly: The Road from Particles to Colloidal Molecules and Crystals," Angew. Chem.-Int. Ed. 50(2):360-388.

Lin et al. (2008) "PECVD low-permittivity organosilicate glass coatings: Adhesion, fracture and mechanical properties," Acta Materialia. 56:4932-4943.

Malachowski et al. (Jun. 10, 2014) "Self-Folding Single Cell Grippers," Nano Lett. 14:4164-4170.

Mao et al. (Jan. 13, 2013) "Entropy favours open colloidal lattices," Nat. Mater. 12:217-222.

Noorduin et al. (May 17, 2013) "Rationally Designed Complex, Hierarchical Microarchitectures," Science 340(6134):832-837.

Pan et al. (Jun 12, 2012) "Hierarchical nanostructured conducting polymer hydrogel with high electrochemical activity," Proc. Natl. Acad. Sci. USA. 109(24):9287-9292.

Pandey et al. (2011) "Algorithmic design of self-folding polyhedral," Proc. Natl. Acad. Sci. USA. 108:19885-19890.

Penmatsa et al. (Mar. 16, 2012) "Three-dimensional graphene nanosheet encrusted carbon micropillar arrays for electrochemical sensing," Nanoscale 4:3673-3678.

Pikul et al. (Apr. 16, 2013) "High-power lithium ion microbatteries from interdigitated three-dimensional bicontinuous nanoporous electrodes," Nat Commun 4:1732.

Piyawattanametha et al. (2005) "Surface- and bulk-micromachined two-dimensional scanner driven by angular vertical comb actuators," J. Microelectromech. Sys. 14(6):1329-1338.

Prinz et al. (2000) "Free-standing and overgrown InGaAs/GaAs nanotubes, nanohelices and their arrays," Physica E. 6:828-831.

Prinz et al. (2001) "A new technique for fabricating three-dimensional micro- and nanostructures of various shapes," Nanotechnology. 12(4):399-402.

Py et al. (2007) "Capillary origami: Spontaneous wrapping of a droplet with an elastic Sheet," Phys. Rev. Lett. 98:156103.

Randhawa et al. (2008) "Pick-and-Place Using Chemically Actuated Microgrippers," J. Am. Chem. Soc. 130:17238-17239.

Rogers et al. (2011) "Synthesis, assembly and applications of semiconductor nanomembranes," Nature. 477:45-53.

Sacca et al. (Dec. 7, 2011) "DNA Origami: The Art of Folding DNA," Angew. Chem.-Int. Ed. 51:58-66.

Schaedler et al. (2011) "Ultralight Metallic Microlattices," Science 334(6058):962-965.

Schmidt et al. (2001) "Nanotechnology—Thin solid films roll up into nanotubes," Nature. 410(6825):168.

Schumann et al. (Jun. 6, 2014) "Hybrid 2D-3D optical devices for integrated optics by direct laser writing," Light-Sci Appl 3:e175.

Shenoy et al. (Sep. 2012) "Self-folding thin-film materials: From nanopolyhedra to graphene origami," MRS Bull 37(9):847-854.

Shim et al. (Nov. 21, 2011) "Controlled origami folding of hydrogel bilayers with sustained reversibility for robust microcarriers," Angew. Chem.-Int. Ed. 51:1420-1423.

Shyu et al. (Jun. 22, 2015) "A kirigami approach to engineering elasticity in nanocomposites through patterned defects," Nat. Mater. 14(8):785-789.

Silverberg et al. (Aug. 8, 2014) "Applied origami. Using origami design principles to fold reprogrammable mechanical metamaterials," Science. 345:647-650.

Silverberg et al. (Mar. 9, 2015) "Origami structures with a critical transition to bistability arising from hidden degrees of freedom," Nat. Mater. 14:389-393.

Singamaneni et al. (2010) "Buckling instabilities in periodic composite polymeric materials," Soft Mater. 6:5681-5692.

Song et al. (Jan. 28, 2014) "Origami lithium-ion batteries," Nat. Commun. 5:3140.

Songmuang et al. (2007) "$SiO_x$/Si radial superlattices and microtube optical ring resonators," Appl. Phys. Lett. 90(9):091905.

Soukoulis et al. (2011) "Past achievements and future challenges in the development of three-dimensional photonic metamaterials," Nat. Photonics. 5(9):523-530.

Su et al. (Mar. 2012) "Postbuckling analysis and its application to stretchable electronics," Journal of the Mechanics and Physics of Solids. 60:487-508.

Sun et al. (2006) "Controlled buckling of semiconductor nanoribbons for stretchable electronics," Nat. Nanotechnol. 1(3):201-207.

Sun et al. (Jun. 17, 2013) "3D Printing of Interdigitated Li-Ion Microbattery Architectures," Adv. Mater. 25(33):4539-4543.

Sussman et al. (Jun. 16, 2015) "Algorithmic lattice kirigami: A route to pluripotent materials," Proc. Natl. Acad. Sci. USA. 112(24):7449-7453.

Syms et al. (1993) "Self-assembly of three-dimensional microstructures using rotation by surface tension forces," Electron. Lett. 29:662-664.

Tian et al. (Aug. 26, 2012) "Macroporous nanowire nanoelectronic scaffolds for synthetic tissues," Nat. Mater. 11(11):986-994.

(56) References Cited

OTHER PUBLICATIONS

Tsao et al. (2007) "Low temperature bonding of PMMA and COC microfluidic substrates using UV/ozone surface treatment," Lab on a Chip. 7:499-505.
Tumbleston et al. (2015) "Continuous liquid interface production of 3D objects," Science 347(6228):1349-1352.
Valentine et al. (2008) "Three-dimensional optical metamaterial with a negative refractive index," Nature. 455(7211):376-379.
Ware et al. (Feb. 27, 2015) "Voxelated liquid crystal elastomers," Science. 347:982-984.
Wood (Mar. 2014) "The Challenge of Manufacturing Between Macro and Micro," Am. Sci. 102(2):124-131.
Wu et al. (Jun. 4, 2013) "Stable Li-ion battery anodes by in-situ polymerization of conducting hydrogel to conformally coat silicon nanoparticles," Nat. Commun. 4:1943.
Xu et al. (Jan. 9, 2015) "Assembly of micro/nanomaterials into complex, three-dimensional architectures by compressive buckling," Science 347(6218):154-159.—with Supplementary Information.
Yang et al. (2010) "Harnessing Surface Wrinkle Patterns in Soft Matter," Adv. Funct. Mater. 20:2550-2564.
Yu et al. (2011) "Semiconductor Nanomembrane Tubes: Three-Dimensional Confinement for Controlled Neurite Outgrowth," ACS Nano. 5(4):2447-2457.
Yue et al. (2000) "Physical modeling of spiral inductors on silicon," IEEE Transactions on Electron Devices. 47:560-568.
Zang et al. (Jan. 20, 2013) "Multifunctionality and control of the crumpling and unfolding of large-area grapheme," Nature Mater. 12:321-325.
Zhang et al. (2006) "Fabrication and Characterization of Freestanding Si/Cr micro- and nanospirals," Microelectron. Eng. 83:1237-1240.
Zhang et al. (2011) "Optically- and Thermally-Responsive Programmable Materials Based on Carbon Nanotube-Hydrogel Polymer Composites," Nano Lett. 11(8):3239-3244.
Zhang et al. (2011) "Three-dimensional bicontinuous ultrafast-charge and -discharge bulk battery electrodes," Nat Nanotechnol. 6(5):277-281.
Zhang et al. (Jun. 27, 2013) "Buckling in serpentine microstructures and applications in elastomer-supported ultra-stretchable electronics with high areal coverage," Soft Matter. 9:8062-8070.
Zhang et al. (Sep. 22, 2015) "A mechanically driven form of Kirigami as a route to 3D mesostructures in micro/nanomembranes," Proc. Natl. Acad. Sci. USA. 112(38):11757-11764.—with Supporting Information.
Zheng et al. (2005) "Fabrication of Multicomponent Microsystems by Directed Three-Dimensional Self-Assembly," Adv. Funct. Mater. 15:732-738.
Zheng et al. (Jun. 20, 2014) "Ultra-light, Ultra-stiff Mechanical Metamaterials," Science. 344:1373-1377.
U.S. Appl. No. 11/001,689, filed Dec. 1, 2004, 2006/0286488, Dec. 21, 2006, U.S. Pat. No. 7,704,684, Apr. 27, 2010.
U.S. Appl. No. 11/115,954, filed Apr. 27, 2005. 2005/0238967, Oct. 27, 2005, U.S. Pat. No. 7,195,733, Mar. 27, 2007.
U.S. Appl. No. 11/145,574, filed Jun. 2, 2005, 2009/0294803, Dec. 3, 2009, U.S. Pat. No. 7,622,367, Nov. 24, 2009.
U.S. Appl. No. 11/145,542, filed Jun. 2, 2005, 2006/0038182, Feb. 23, 2006, U.S. Pat. No. 7,557,367, Jul. 7, 2009.
U.S. Appl. No. 11/421,654, filed Jun. 1, 2006, 2007/0032089, Feb. 8, 2007, U.S. Pat. No. 7,799,699, Sep. 21, 2010.
U.S. Appl. No. 11/423,287, filed Jun. 9, 2006, 2006/0286785, Dec. 21, 2006, U.S. Pat. No. 7,521,292, Apr. 21, 2009.
U.S. Appl. No. 11/423,192, filed Jun. 9, 2006, 2009/0199960, Aug. 13, 2009, U.S. Pat. No. 7,943,491, May 17, 2011.
U.S. Appl. No. 11/465,317, filed Aug. 17, 2006.
U.S. Appl. No. 11/675,659, filed Feb. 16, 2007, 2008/0055581, Mar. 6, 2008.
U.S. Appl. No. 11/782,799, filed Jul. 25, 2007, 2008/0212102, Sep. 4, 2008, U.S. Pat. No. 7,705,280, Apr. 27, 2010.
U.S. Appl. No. 11/851,182, filed Sep. 6, 2007, 2008/0157235, Jul. 3, 2008, U.S. Pat. No. 8,217,381, Jul. 10, 2012.
U.S. Appl. No. 11/858,788, filed Sep. 20, 2007, 2008/0108171, May 8, 2008, U.S. Pat. No. 7,932,123, Apr. 26, 2011.
U.S. Appl. No. 11/981,380, filed Oct. 31, 2007, 2010/0283069, Nov. 11, 2010, U.S. Pat. No. 7,972,875, Jul. 5, 2011.
U.S. Appl. No. 12/372,605, filed Feb. 17, 2009.
U.S. Appl. No. 12/398,811, filed Mar. 5, 2009, 2010/0002402, Jan. 7, 2010, U.S. Pat. No. 8,552,299, Oct. 8, 2013.
U.S. Appl. No. 12/405,475, filed Mar. 17, 2009, 2010/0059863, Mar. 11, 2010, U.S. Pat. No. 8,198,621, Jun. 12, 2012.
U.S. Appl. No. 12/418,071, filed Apr. 3, 2009, 2010/0052112, Mar. 4, 2010, U.S. Pat. No. 8,470,701, Jun. 25, 2013.
U.S. Appl. No. 12/564,566, filed Sep. 22, 2009, 2010/0072577, Mar. 25, 2010, U.S. Pat. No. 7,982,296, Jul. 19, 2011.
U.S. Appl. No. 12/669,287, filed Jan. 15, 2010, 2011/0187798, Aug. 4, 2011, U.S. Pat. No. 9,061,494, Jun. 23, 2015.
U.S. Appl. No. 12/778,588, filed May 12, 2010, 2010/0317132, Dec. 16, 2010, U.S. Pat. No. 8,865,489, Oct. 21, 2014.
U.S. Appl. No. 12/844,492, filed Jul. 27, 2010, 2010/0289124, Nov. 18, 2010, U.S. Pat. No. 8,039,847, Oct. 18, 2011.
U.S. Appl. No. 12/892,001, filed Sep. 28, 2010, 2011/0230747, Sep. 22, 2011, U.S. Pat. No. 8,666,471, Mar. 4, 2014.
U.S. Appl. No. 12/916,934, filed Nov. 1, 2010, 2012/0105528, May 3, 2012, U.S. Pat. No. 8,562,095, Oct. 22, 2013.
U.S. Appl. No. 12/947,120, filed Nov. 16, 2010, 2011/0170225, Jul. 14, 2011, U.S. Pat. No. 9,057,994, Jun. 16, 2015.
U.S. Appl. No. 12/996,924, filed Dec. 8, 2010, 2011/0147715, Jun. 23, 2011, U.S. Pat. No. 8,946,683, Feb. 3, 2015.
U.S. Appl. No. 12/968,637, filed Dec. 15, 2010, 2012/0157804, Jun. 21, 2012.
U.S. Appl. No. 13/046,191, filed Mar. 11, 2011, 2012/0165759, Jun. 28, 2012.
U.S. Appl. No. 13/071,027, filed Mar. 24, 2011, 2011/0171813, Jul. 14, 2011, U.S. Pat. No. 8,895,406, Nov. 25, 2014.
U.S. Appl. No. 13/095,502, filed Apr. 27, 2011.
U.S. Appl. No. 13/100,774, filed May 4, 2011, 2011/0266561, Nov. 3, 2011, U.S. Pat. No. 8,722,458, May 13, 2014.
U.S. Appl. No. 13/113,504, filed May 23, 2011, 2011/0220890, Sep. 15, 2011, U.S. Pat. No. 8,440,546, May 14, 2013.
U.S. Appl. No. 13/120,486, filed Aug. 4, 2011, 2011/0277813, Nov. 17, 2011, U.S. Pat. No. 8,679,888, Mar. 25, 2014.
U.S. Appl. No. 13/228,041, filed Sep. 8, 2011, 2011/0316120, Dec. 29, 2011.
U.S. Appl. No. 13/270,954, filed Oct. 11, 2011, 2012/0083099, Apr. 5, 2012, U.S. Pat. No. 8,394,706, Mar. 12, 2013.
U.S. Appl. No. 13/349,336, filed Jan. 12, 2012, 2012/0261551, Oct. 18, 2012.
U.S. Appl. No. 13/441,618, filed Apr. 6, 2012, 2013/0100618, Apr. 25, 2013, U.S. Pat. No. 8,754,396, Jun. 17, 2014.
U.S. Appl. No. 13/441,598, filed Apr. 6, 2012, 2012/0327608, Dec. 27, 2012, U.S. Pat. No. 8,729,524, May 20, 2014.
U.S. Appl. No. 13/472,165, filed May 15, 2012, 2012/0320581, Dec. 20, 2012.
U.S. Appl. No. 13/486,726, filed Jun. 1, 2012, 2013/0072775, Mar. 21, 2013, U.S. Pat. No. 8,934,965, Jan. 13, 2015.
U.S. Appl. No. 13/492,636, filed Jun. 8, 2012, 2013/0041235, Feb. 14, 2013.
U.S. Appl. No. 13/549,291, filed Jul. 13, 2012, 2013/0036928, Feb. 14, 2013.
U.S. Appl. No. 13/596,343, filed Aug. 28, 2012, 2012/0321785, Dec. 20, 2012, U.S. Pat. No. 8,367,035, Feb. 5, 2013.
U.S. Appl. No. 13/624,096, filed Sep. 21, 2012, 2013/0140649, Jun. 6, 2013.
U.S. Appl. No. 13/801,868, filed Mar. 13, 2013, 2013/0320503, Dec. 5, 2013, U.S. Pat. No. 8,664,699, Mar. 4, 2014.
U.S. Appl. No. 13/835,284, filed Mar. 15, 2013, 2014/0220422, Aug. 7, 2014.
U.S. Appl. No. 13/853,770, filed Mar. 29, 2013, 2013/0333094, Dec. 19, 2013.
U.S. Appl. No. 14/140,299, filed Dec. 24, 2013, 2014/0163390, Jun. 12, 2014.

(56) References Cited

OTHER PUBLICATIONS

U.S. Appl. No. 14/155,010, filed Jan. 14, 2014, 2014/0191236, Jul. 10, 2014.
U.S. Appl. No. 14/173,525, filed Feb. 5, 2014, 2014/0216524, Aug. 7, 2014, U.S. Pat. No. 9,105,782, Aug. 11, 2015.
U.S. Appl. No. 14/209,481, filed Mar. 13, 2014, 2014/0373898, Dec. 25, 2014, U.S. Pat. No. 9,117,940, Aug. 25, 2015.
U.S. Appl. No. 14/220,910, filed Mar. 20, 2014, 2014/0374872, Dec. 25, 2014.
U.S. Appl. No. 14/220,923, filed Mar. 20, 2014, 2015/0001462, Jan. 1, 2015, U.S. Pat. No. 9,105,555, Aug. 11, 2015.
U.S. Appl. No. 14/246,962, filed Apr. 7, 2014, 2014/0361409, Dec. 11, 2014.
U.S. Appl. No. 14/251,259, filed Apr. 11, 2014, 2014/0323968, Oct. 30, 2014.
U.S. Appl. No. 14/250,671, filed Apr. 11, 2014, 2014/0305900, Oct. 16, 2014.
U.S. Appl. No. 14/479,100, filed Sep. 5, 2014, 2015/0132873, May 14, 2015.
U.S. Appl. No. 14/504,736, filed Oct. 2, 2014, 2015/0141767, May 21, 2015.
U.S. Appl. No. 14/521,319, filed Oct. 22, 2014, 2015/0181700, Jun. 25, 2015.
U.S. Appl. No. 14/532,687, filed Nov. 4, 2014, 2015/0080695, Mar. 19, 2015.
U.S. Appl. No. 14/599,290, filed Jan. 16, 2015, 2015/0207012, Jul. 23, 2015.
U.S. Appl. No. 14/686,304, filed Apr. 14, 2015, 2015/0290938, Oct. 15, 2015.
U.S. Appl. No. 14/706,733, filed May 7, 2015, 2015/0237711, Aug. 20, 2015.
U.S. Appl. No. 14/789,645, filed Jul. 1, 2015, 2016/0027737, Jan. 28, 2016.
U.S. Appl. No. 14/800,363, filed Jul. 15, 2015.
U.S. Appl. No. 14/818,109, filed Aug. 4, 2015.
U.S. Appl. No. 14/766,333, filed Aug. 6, 2015, 2015/0380355, Dec. 31, 2015.
U.S. Appl. No. 14/766,926, filed Aug. 10, 2015.
U.S. Appl. No. 14/772,354, filed Sep. 2, 2015, 2016/0005700, Jan. 7, 2016.
U.S. Appl. No. 14/772,312, filed Sep. 2, 2015.
U.S. Appl. No. 14/944,039, filed Nov. 17, 2015.
U.S. Appl. No. 14/766,301, filed Dec. 24, 2015, 2015/0373831, Dec. 24, 2015.

* cited by examiner

B a  3D structure (experiment)

3D structure (FEA)

b  3D structure (experiment)

3D structure (FEA)

c  3D structure (experiment)

3D structure (FEA)

DETERMINISTIC ASSEMBLY OF COMPLEX, THREE-DIMENSIONAL ARCHITECTURES BY COMPRESSIVE BUCKLING

CROSS-REFERENCE TO RELATED APPLICATIONS

This application claims the benefit of priority from U.S. Provisional Patent Application No. 62/080,897, filed Nov. 17, 2014, which is hereby incorporated by reference in its entirety.

STATEMENT REGARDING FEDERALLY SPONSORED RESEARCH OR DEVELOPMENT

This invention was made with government support under DE-FG02-07ER46471 awarded by the U.S. Department of Energy, CMMI-1400169 awarded by the National Science Foundation and R01EB019337 awarded by the National Institutes of Health. The government has certain rights in the invention.

BACKGROUND

Controlled formation of 3D functional structures is a topic of broad and increasing interest, particularly in the last decade, due to important envisioned uses in nearly every type of micro/nanosystem technology, from biomedical devices to microelectromechanical components, metamaterials, sensors, electronics and others. Although volumetric optical exposures, colloidal self-assembly, residual stress induced bending and bio-templated growth can be used to realize certain classes of structures in certain types of materials, techniques that rely on rastering of fluid nozzles or focused beams of light, ions or electrons provide the greatest versatility in design. Applicability of these latter methods, however, only extends directly to materials that can be formulated as inks or patterned by exposure to light/energetic particles, and indirectly to those that can be deposited onto or into sacrificial 3D structures formed with these materials. Integration of more than one type of any material into a single structure can be challenging. Furthermore, the serial nature of these processes sets practical constraints on operating speeds and overall addressable areas. In addition, of the many methods for fabricating such structures, few are compatible with the highest performance classes of electronic materials, such as monocrystalline inorganic semiconductors, and only a subset of these can operate at high speeds, across length scales, from centimeters to nanometers.

Origami and Kirigami are now topics of rapidly growing interest in the scientific and engineering research communities, due to their potential or use in a broad range of applications, from self-folding microelectronics, deformable batteries, and reconfigurable metamaterials, to artificial DNA constructs. Important recent advances in the fundamental aspects of origami include the identification of mechanisms for bi-stability in deformed configurations, and the development of lattice Kirigami (a variant of origami that involves both cutting and folding) methods that solve the inverse problem of folding a flat plate into a complex targeted 3D configuration. In parallel, experimental methods are emerging for the assembly of origami structures at the micro/nanoscale. For example, a representative class of approaches relies on self-actuating materials, such as shape memory alloys, shape memory polymers, liquid crystal elastomers, and hydrogels, for programmable shape changes. These schemes are, however, not directly applicable to many technologically important types of materials, such as semiconductors or metals. Other routes rely on capillary forces (or surface tension forces), or residual stresses in thin films to drive the origami assembly, with the distinct practical advantage of compatibility with established planar device technologies. In most cases, however, such approaches are irreversible and offer limited control of parameters such as the folding angle, or folding rate.

From the foregoing, it will be appreciated that methods and design parameters for forming complex three-dimensional structures that exploit the existing base of competencies, in which spatially controlled compressive buckling induces rapid, reversible, large area geometric extension of 2D precursors into the third dimension, would be beneficial for various applications.

SUMMARY OF THE INVENTION

Origami- and Kirigami-inspired assembly of predetermined three-dimensional forms is presented with examples of a broad range of topologies, physical properties and material compositions. Methods and design parameters are disclosed for forming predetermined three-dimensional forms, in which spatially controlled compressive buckling induces rapid, optionally reversible, large area geometric extension of 2D precursors into the third dimension. Three-dimensional forms displaying multiple layers, nested configurations, chirality, spirals, suspended tabletops, folded plates and other geometries are achievable using a wide variety of thin film materials, including polymers, metals, semiconductors, insulators and combinations thereof. In some embodiments, engineered substrates contribute to the geometry of the predetermined three-dimensional forms. Such engineered substrates may include materials comprising relief features, cut-outs, varying physical dimensions (e.g., thickness) and/or varying physical properties (e.g., modulus), which may be implemented in a single material or a composite substrate comprising two or more materials. The predetermined three-dimensional forms may be used, for example, as structural, electrical, mechanical, electro-optical and/or optical elements in nano/microelectromechanical devices, photonic devices, optical devices, strain gauges, printed circuit boards and tissue engineering scaffolds.

In an aspect, a structure comprises a thin film structure having a complex shape held under strain by at least partial contact with a supporting material. In an embodiment, the complex shape is two-dimensional when the strain is tensile strain and the complex shape is three-dimensional when the strain is compressive strain. In an embodiment, the supporting material is selected from a deformable substrate a rigid substrate, an encapsulating layer, a space-filling material or combinations thereof, inclusive of stretchable materials, rigid materials, elastic materials and nonelastic materials. In an embodiment, contact occurs at bonding regions between the thin film structure and the supporting material, wherein said bonding regions are separated from each other by nonbonding regions. In an embodiment, the supporting material is an assembly substrate, such as a deformable substrate including a flexible substrate, a stretchable substrate, an elastic substrate or a rigid substrate.

In an embodiment, the term complex shape does not include a geometry characterized by two bonding points separated by a single buckled region, for example, wherein the buckled region is characterized by curvature that is oriented out of the plane of a supporting substrate or parallel to the plane of a supporting substrate, such as provided by an arc, bend or serpentine shape. In an embodiment, the term complex shape does not include a geometry characterized by four bonding points separated by a single buckled region, for example, wherein the buckled region is characterized by curvature that is oriented out of the plane of a supporting substrate, such as provided by a raised network/intersection geometry or, for some embodiments, a table geometry characterized by a raised region having a two, three or four buckled interconnects oriented out of the plane of a supporting substrate.

In an aspect, a structure comprises a deformable substrate, such as a stretchable, flexible or elastic substrate, having a surface and a thin film structure supported by the surface; wherein the thin film structure is bound to the surface at a plurality of bonding regions and not bound to the surface at a plurality of non-bonding regions; wherein an overall shape of the thin film structure is non-linear and no bonding region exists at corners of a square or termini of a four-way intersection formed by the thin film structure; wherein each of the non-bonding regions physically contacts the deformable substrate when the deformable substrate is in an expanded state and none of the non-bonding regions physically contacts the deformable substrate when the deformable substrate is in a contracted state.

In an aspect, a structure comprises a thin film structure characterized by a plurality of cut-outs configured to allow the thin film structure to form a predetermined three-dimensional shape upon application of a compressive force; wherein the predetermined three-dimensional shape is a rigid structure characterized by at least one region with a mode ratio greater than or equal to 0.1. For example, in some embodiments, deformation of the three-dimensional shape is limited to less than 5%, or less than 1%.

In an aspect, a structure comprises a deformable substrate having a surface; a thin film structure supported by the surface; wherein the thin film structure is bound to the surface at a plurality of bonding regions and not bound to the surface at a plurality of non-bonding regions; wherein relaxation of the deformable substrate provides a compressive force that generates a predetermined three-dimensional form of the thin film structure having a plurality of buckled regions; wherein the predetermined three-dimensional form is characterized by at least one region with a mode ratio greater than or equal to 0.1; and an encapsulation layer at least partially encapsulating the predetermined three-dimensional form, thereby providing an overall rigid geometry for said structure. For example, in some embodiments, deformation of the three-dimensional shape is limited to less than 5%, or less than 1%. In an embodiment, the encapsulation layer is rigid. In an embodiment, the deformable substrate is rigid.

In an aspect, a structure comprises a deformable substrate, such as a stretchable, flexible or elastic substrate, having a supporting surface and a thin film structure supported by the deformable substrate; wherein application of a compressive force generates a predetermined three-dimensional form of the thin film structure; wherein the predetermined three-dimensional form has at least two curved regions having different mean curvatures. In an embodiment, the at least two curved regions are characterized by curvature vectors having directions that differ by 10 degrees. In an embodiment, the at least two curved regions are characterized by different curvature vectors characterized by a different sharpness parameter. In an embodiment, the at least two curved regions are characterized by twists having different rates of rotation. In an embodiment, the predetermined three-dimensional form is characterized by at least two discontinuous points along the thin film structure. In an embodiment, the predetermined three-dimensional form is a space-filling shape. For example, the space-filing shape may be selected from the group consisting of helix, dome, cylinder, cube, prism, pyramid, cone, sphere, rectangular prism, tetrahedron and other shapes and any combination thereof. In an embodiment, the space-filing shape has a volume selected from $1000$ $nm^2$-$1$ $m^2$, and optionally for some embodiments $1000$ $nm^2$-$10$ $mm^2$, and optionally for some embodiments $1000$ $nm^2$-$1000$ $\mu m^2$.

In an aspect, a template for a three-dimensional structure comprises a deformable substrate having a surface and a two-dimensional thin film structure substantially parallel with and supported by the surface; wherein the two-dimensional thin film structure comprises a pattern of cut-outs configured to allow the two-dimensional thin film structure to convert into a predetermined three-dimensional complex shape upon application of a compressive force.

In an aspect, a structure comprises a thin film structure characterized by a plurality of cut-outs configured to allow the thin film structure to form a predetermined three-dimensional shape upon application of a compressive force.

In an aspect, a structure comprises a deformable substrate, such as a stretchable, flexible or elastic substrate, having a surface and a thin film structure supported by the surface; wherein the thin film structure is bound to the surface at a plurality of bonding regions and not bound to the surface at a plurality of non-bonding regions; wherein relaxation of the deformable substrate provides a compressive force that generates a predetermined three-dimensional form of the thin film structure; wherein the predetermined three-dimensional form is characterized by at least one region with a mode ratio greater than or equal to 0.2, optionally for some embodiments greater than or equal to 0.4, optionally for some embodiments greater than or equal to 0.6 and optionally for some embodiments greater than or equal to 0.8. In some embodiments, the predetermined three-dimensional form is characterized by at least one region having a mode ratio between 0.2 and 1.2, or between 0.2 and 1.1, or between 0.2 and 0.8, or between 0.2 and 0.5. In an embodiment, relaxation of a deformable substrate reduces a state or amount of strain in the substrate and induces a change in one or more physical dimensions of a thin film structure. For example, relaxation of a deformable substrate, such as a stretchable substrate, may significantly reduce strain of the substrate (e.g., by at least 10%). In some embodiments, "complete relaxation" of the deformable substrate occurs when the strain of the substrate is approximately zero (e.g., less than 2%, or less than 1%).

In an aspect, a structure comprises a deformable substrate, such as a stretchable, flexible or elastic substrate, having a surface and a thin film structure supported by the surface; wherein the thin film structure is bound to the surface at a plurality of bonding regions and not bound to the surface at a plurality of non-bonding regions; wherein relaxation of the deformable substrate provides a compressive force that generates a predetermined three-dimensional form of the thin film structure; wherein the predetermined three-dimensional form is a multilayered three-dimensional structure.

In an aspect, a structure comprises a deformable substrate, such as a stretchable, flexible or elastic substrate, having a surface and a thin film structure supported by the surface; wherein the thin film structure is bound to the surface at a plurality of bonding regions and not bound to the surface at a plurality of non-bonding regions; wherein relaxation of the deformable substrate provides a compressive force that generates a predetermined three-dimensional form of the thin film structure; wherein the predetermined three-dimensional form comprises an additional three-dimensional structure disposed inside the predetermined three-dimensional form.

In an aspect, a structure comprises a deformable substrate, such as a stretchable, flexible or elastic substrate, having a surface and a thin film structure supported by the surface; wherein the thin film structure is bound to the surface at a plurality of bonding regions and not bound to the surface at a plurality of non-bonding regions; wherein relaxation of the deformable substrate provides a compressive force that generates a predetermined three-dimensional form of the thin film structure; wherein the predetermined three-dimensional form displays chirality.

In an aspect, a structure comprises a deformable substrate, such as a stretchable, flexible or elastic substrate, having a surface; a thin film structure supported by the surface; wherein the thin film structure is bound to the surface at a plurality of bonding regions and not bound to the surface at a plurality of non-bonding regions; wherein relaxation of the deformable substrate provides a compressive force that generates a predetermined three-dimensional form of the thin film structure; and a functional device or functional device component integrated into or disposed upon a non-bonding region of the thin film structure.

In an aspect, a spatially varying structure comprises a deformable substrate, such as a stretchable, flexible or elastic substrate, having a surface and a thin film structure supported by the surface; wherein the thin film structure is bound to the surface at a plurality of bonding regions and not bound to the surface at a plurality of non-bonding regions; wherein relaxation of the deformable substrate provides a compressive force that generates a predetermined three-dimensional form of the thin film structure having a plurality of buckled regions characterized by an anisotropic distribution of periodicities, amplitudes or both.

In an aspect, a spatially varying structure comprises a deformable substrate, such as a stretchable, flexible or elastic substrate, having a surface and a thin film structure supported by the surface; wherein the thin film structure is bound to the surface at a plurality of bonding regions and not bound to the surface at a plurality of non-bonding regions; wherein the thin film structure has a spatially varying density along a longitudinal axis; wherein each of said non-bonding regions physically contacts the deformable substrate when the deformable substrate is in an expanded state and none of the non-bonding regions physically contacts the deformable substrate when the deformable substrate is in a contracted state. In an embodiment, the thin film structure varies in thickness and/or lateral dimensions along the longitudinal axis, thereby providing the thin film structure having the spatially varying density. In an embodiment, the spatially varying density varies periodically or non-periodically.

In an embodiment, strain is reversibly or irreversibly transferable from the deformable substrate, such as a stretchable, flexible or elastic substrate, to the thin film structure. In an embodiment, the structure has an overall strain greater than or equal to 10%. In an embodiment, the structure has an overall strain selected from the range of 10% to 2000%. As used in this context, the term "strain" as applied to the structure provides a system level description of the 3D structure characterizing the extent of compressive deformation (e.g., buckling, folding, bending and/or twisting). In some embodiments, for example, the strain of a structure reflects a comparison of features of the precursor, such as bonding sites, with that of the 3D structure wherein the relative positions of the bonding sites may have changed for example due to undergoing deformation (e.g., buckling, folding, bending and/or twisting). In an embodiment, for example, strain refers to the extent of change in the distance between bonding sites of the precursor relative to the 3D structure, for example, a change in the distance between adjacent bonding sites or nearest neighbor bonding sites; In an embodiment, for example, strain refers to the extent of change in features, such as bonding regions, that define a region of compressive deformation in the 3D structure relative to that of a 2D precursor.

In an embodiment, the non-bonding regions of the thin film structure are suspended above the deformable substrate by a compressive force, for example, of at least 0.01 MPa, and optionally for some embodiments at least 0.1 MPa, and optionally for some embodiments at least 1 MPa, and optionally for some embodiments at least 10 MPa. In an embodiment, the non-bonding regions of the thin film structure are suspended above the deformable substrate by a compressive force selected from the range of 0.01 MPa to 200 GPa, optionally for some embodiments 0.1 MPa to 10 MPa In an embodiment, the non-bonding regions of the thin film structure are buckled away from the surface of the deformable substrate. In an embodiment, the non-bonding regions of the thin film structure are buckled toward the surface of the deformable substrate.

In an embodiment, the deformable substrate is a uniaxially expanded substrate, a biaxially expanded substrate or a multiaxially expanded substrate. In an embodiment, the deformable substrate has a uniform thickness. In an embodiment, the deformable substrate has an average thickness less than or equal to 10 cm, and optionally for some examples less than or equal to 10 mm, and optional less than or equal to 1000 μm. In an embodiment, the deformable substrate has an average thickness selected from the range of 1 μm to 10 cm, optionally for some embodiments 1 μm to 1 mm. In an embodiment, the deformable substrate has an average modulus less than or equal to 50 MPa. In an embodiment, the deformable substrate has an average modulus selected from the range of 10 kPa to 200 GPa. In an embodiment, the deformable substrate comprises a material selected from the group consisting of: elastomers based on silicones, polyurethanes, perfluoropolyethers and other materials. In an embodiment, the deformable substrate is a stretchable substrate. In an embodiment, the deformable substrate is an elastic substrate.

In an embodiment, the deformable substrate is an engineered substrate. For example, an engineered substrate may have a spatially varying thickness and/or a spatially varying modulus.

In an embodiment, the thin film structure has an average thickness less than or equal to 10 cm, optionally for some embodiments less than or equal to 1 mm and optionally for some embodiments less than or equal to 100 μm. In an embodiment, the thin film structure has an average thickness selected from the range of 10 nm to 10 cm, optionally for some embodiments selected from the range of 10 μm to 1000 μm. In an embodiment, the thin film structure has lateral dimensions less than or equal to 100 cm. In an embodiment, the thin film structure has lateral dimensions selected from the range of 100 nm to 100 cm. In an embodiment, the thin film structure has a spatially varying thickness, for example, a thickness that varies by at least a factor of 2, and optionally for some embodiments a factor of 10, and optionally for some embodiments a factor of 100.

In an embodiment, the thin film structure has spatially varying lateral dimensions, for example, lateral dimensions that vary by at least a factor of 2, and optionally for some embodiments a factor of 10, and optionally for some embodiments a factor of 100.

In an embodiment, the thin film structure has a filamentary geometry. In an embodiment, for example, the thin film structure has a least one region characterized by an aspect ratio (e.g., length to width or width to length) greater than or equal to 5:1, optionally for some embodiments, greater than or equal to 10:1.

In some embodiments, the thin film structure is characterized by a two dimensional sheet geometry. In an embodiment, for example, the thin film structure has a least one region characterized by an aspect ratio (e.g., length to width or width to length) less than or equal to 5:1, optionally for some embodiments less than or equal to 2:1. In some embodiments, the thin film structure is characterized by a two dimensional sheet geometry with a plurality of cut outs, for example, wherein the cut outs correspond to at least 0.05%, optionally at least 1% and optionally at least 10% of the area (e.g., area of the foot print) of the thin film structure. In some embodiment, the thin film structure is characterized by a two dimensional sheet geometry with a plurality of cut outs, for example, wherein the cut outs correspond to less than 10%, optionally less than 5% and optionally less than 1% of the area (e.g., area of the foot print) of the thin film structure.

In an embodiment, the thin film structure has a least one region characterized by a ratio of length to width less than or equal to 5:1.

In an embodiment, the thin film structure comprises filaments, square plates, rectangular plates, triangular plates, diamond plates, hexagonal plates, pentagonal plates, oval plates, circular plates, fractional pieces of these and combinations thereof. In an embodiment, the thin film structure is a two-dimensional nanomembrane or a two-dimensional micromembrane.

In an embodiment, the thin film structure comprises a material selected from the group consisting of semiconductor, polymer, metal, dielectric and combinations thereof. In an embodiment, the thin film structure is a single crystalline semiconductor material. In an embodiment, the thin film structure is an insulator.

In an embodiment, the thin film structure possesses chirality.

In an embodiment, the thin film structure comprises a plate portion and three or more compressible interconnects each having first ends attached to the plate portion and second ends attached to the deformable substrate at the bonding regions.

In an embodiment, the thin film structure is a device component selected from the group consisting of an electrical interconnect, a structural component, a photonic element, a strain gauge, an acoustic element, an antenna, a tissue engineering scaffold, an optical shutter, an optoelectronic device, a solar cell, a photodetector, and a microelectromechanical system. In an embodiment, the thin film structure is an electrical circuit for an electronic device. In an embodiment, the thin film structure an electrical interconnect configured as a three-dimensional coil.

In an embodiment, the structure further comprises one or more materials for at least partially encapsulating and supporting at least a portion of the thin film structure. For example, the material may be selected from the group consisting of foams, shape memory polymers, hydrogels, directional polymers, elastomers, polymer and combinations thereof.

In an aspect, a method of making a three-dimensional structure comprises: providing a prestrained elastic substrate in an expanded state; the substrate having a receiving surface; providing a two-dimensional thin film structure to the receiving surface, wherein the two-dimensional thin film structure comprises a pattern of cut-outs configured to allow said two-dimensional thin film structure to convert into a predetermined three-dimensional complex shape upon application of a compressive force; and allowing the prestrained elastic substrate to relax so as to provide the compressive force, thereby generating the three-dimensional structure.

In an aspect, a method of making a three-dimensional structure comprises: providing a prestrained elastic substrate characterized by an anisotropic spatial distribution of state of strain; the substrate having a receiving surface; providing a thin film structure to the receiving surface, the thin film structure having a geometry allowing conversion into a predetermined three-dimensional complex shape upon application of an anisotropic compressive force; and allowing the prestrained elastic substrate to relax, thereby generating the anisotropic compressive force for making the three-dimensional structure.

In some embodiments, selected bonding regions of the thin film structure are bonded to the receiving surface of the prestrained elastic substrate. In some embodiments, selected bonding regions are nonuniformly distributed on the receiving surface.

In some embodiments, the prestrained elastic substrate has a nonuniform thickness and/or nonuniform modulus.

In some embodiments, the step of applying a thin film structure to a surface, such as a supporting or receiving surface of a substrate, comprises dry contract transfer printing.

In an aspect, a method of making a structure having a predetermined three-dimensional geometry comprises: providing an assembly substrate having a first state characterized by a first shape; wherein the assembly substrate has a receiving surface; bonding selected regions of a thin film structure having a planar geometry to the receiving surface of the assembly substrate; transitioning the assembly substrate from the first state into a second state characterized by a second shape different from the first shape; thereby generating a nonuniform spatial distribution of compressive forces resulting in transformation of the planar geometry into the predetermined three-dimensional geometry. In an embodiment, the three-dimensional geometry is characterized by a complex three-dimensional shape.

In an aspect, a method of making a structure having a predetermined three-dimensional geometry comprises: providing an assembly substrate having a first state characterized by a first shape; wherein the assembly substrate has a receiving surface; bonding selected regions of a thin film structure having a planar geometry to the receiving surface of the assembly substrate; transitioning the assembly substrate from the first state into a second state characterized by a second shape different from the first shape; thereby generating a spatial distribution of compressive forces resulting in transformation of the planar geometry into the predetermined three-dimensional geometry; and at least partially embedding the predetermined three-dimensional geometry in an encapsulating material to rigidify the predetermined three-dimensional geometry.

In an aspect, a method of making a structure having a predetermined three-dimensional geometry comprises: providing an assembly substrate having a first state characterized by a first shape; wherein the assembly substrate has a receiving surface; bonding selected regions of a thin film structure having a planar geometry to the receiving surface of the assembly substrate; transitioning the assembly substrate from the first state into a second state characterized by a second shape different from the first shape; thereby generating a spatial distribution of compressive forces resulting in transformation of the planar geometry into the predetermined three-dimensional geometry; and rigidifying the assembly substrate. In an embodiment, the step of rigidifying the assembly substrate comprises laminating the assembly substrate to a rigid secondary substrate, cross-linking the assembly substrate, photopolymerizing the assembly substrate or combinations thereof.

In an aspect, a method of making a structure having a predetermined three-dimensional geometry comprises: providing an assembly substrate having a first state characterized by a first shape; wherein the assembly substrate has a receiving surface; bonding selected regions of a thin film structure having a planar geometry to the receiving surface of the assembly substrate; transitioning the assembly substrate from the first state into a second state characterized by a second shape different from the first shape; thereby generating a spatial distribution of compressive forces resulting in transformation of the planar geometry into the predetermined three-dimensional geometry; and transferring the predetermined three-dimensional geometry to a rigid secondary substrate.

In an embodiment, the spatial distribution of compressive forces is nonuniform. In an embodiment, the nonuniform spatial distribution of compressive forces provides a strain gradient selected from a range of 0.05/meter to 5000/meter, or selected from a range of 0.5/meter to 500/meter, or selected from a range of 5/meter to 50/meter. In an embodiment, the compressive force is selected from a range of 0 N to 5 N, or from a range of 0.5 N to 3 N. In an embodiment, the compressive force is greater than 0 N, or greater than 0.5 N, or greater than 1 N.

In an aspect, a method of making a structure having a predetermined three-dimensional geometry comprises: providing an assembly substrate having a first state characterized by a first shape; wherein the assembly substrate has a receiving surface; bonding selected regions of a thin film structure having a planar geometry to the receiving surface of the assembly substrate; transitioning the assembly substrate from the first state into a second state characterized by a second shape different from the first shape; thereby generating a spatial distribution of compressive forces resulting in transformation of the planar geometry into the predetermined three-dimensional geometry; and rigidifying the predetermined three-dimensional geometry. In an embodiment, the step of rigidifying the three-dimensional geometry comprises cross-linking the thin film structure, photopolymerizing the thin film structure or combinations thereof.

In some embodiments, the thin film structure has bonding regions bonded to the receiving surface and nonbonding regions not bonded to the receiving surface; wherein the compressive forces cause at least a portion of the nonbonded regions to buckle, coil or bend away from the receiving surface. In some embodiments, the compressive forces result in anisotropic coiling, bending or buckling of the nonbonded regions of the thin film structure.

In some embodiments, the transition from the first state to the second state is reversible. In some embodiments, the transition from the first state to the second state is irreversible. In some embodiments, the first state corresponds to the substrate provided in an expanded state and said second state corresponds to a relaxed state.

In some embodiments, the first shape corresponds to one or more lateral dimensions that are greater than the lateral dimensions of the second shape. In some embodiments, the lateral dimensions are length, width or a combination of these. In some embodiments, the lateral dimensions of the first shape are at least a factor of 1.1 greater than that of the second shape, and optionally at least a factor of 1.5 greater than that of the second shape.

In some embodiments, the first state is characterized by a nonuniform spatial distribution of tensile strain. In some embodiments, the second state is characterized by a nonuniform spatial distribution of tensile strain.

In some embodiments, the substrate is a prestrained elastic substrate. In some embodiments, relaxation of the prestrained elastic substrate provides the transformation from the first state to the second state. In some embodiments, relaxation of the prestrained elastic substrate results in the nonuniform spatial distribution of compressive forces. In some embodiments, the substrate is a prestrained elastic substrate having a nonuniform spatially varying thickness.

In some embodiments, the substrate comprises an elastomer, oriented polymer, hydrogel, shape memory polymer or any combination of these. In some embodiments, the substrate has one or more cut out regions allowing for the transition from the first state to the second state. In some embodiments, the thin film structure is a filamentary structure or a sheet.

In some embodiments, the thin film structure is provided to the receiving surface by dry contact printing.

In some embodiments, a portion but not all of the thin film structure is bonded to the receiving surface. In some embodiments, the bonding regions are providing in a nonuniform spatial distribution on the receiving surface.

In some embodiments, the bonding to the receiving surface is achieved via chemical bonding, van der Waals interactions, adhesive or any combination of these.

In an aspect, a method of making a structure having a predetermined three-dimensional geometry comprises: providing an assembly substrate provided in a first state characterized by a first nonuniform spatial distribution of tensile strain; wherein the assembly substrate has a receiving surface; bonding selected regions of a thin film structure having a planar geometry to the receiving surface of the assembly substrate; transitioning the assembly substrate from the first state into a second state characterized by a second nonuniform spatial distribution of tensile strain different from the first nonuniform spatial distribution of tensile strain; thereby generating a nonuniform spatial distribution of compressive forces resulting in transformation of the planar geometry into the predetermined three-dimensional geometry.

In an embodiment, the assembly substrate is an elastomeric substrate. In an embodiment, the first state of the assembly substrate is achieved by expanding the elastomeric substrate. In an embodiment, the step of transitioning the assembly substrate from the first state into the second state comprises allowing the assembly substrate to at least partially relax.

BRIEF DESCRIPTION OF THE DRAWINGS

FIG. 2A-2D: Experimental and computational studies of various 3D mesostructures and classification according to their modes of deformation. (FIG. 2A) Average curvature components and mode ratio of a 3D mesostructure (3D wavy ribbon) that involves only bending, as a function of prestrain in the stretched assembly platform. (FIG. 2B) Similar results for a 3D mesostructure (3D single helical coil) that involves both bending and twisting. 2D precursors, mode ratios, optical micrographs and FEA predictions for nine 3D mesostructures that exhibit, (FIG. 2C), bending dominated, and (FIG. 2D), bending-twisting mixed modes, respectively. The dots in (FIG. 2A) and (FIG. 2B) represent FEA results, and the solid lines represent the scaling law. The colors in the 3D FEA for (FIG. 2A) and (FIG. 2B) correspond to the maximum principal strains. The scale bars in (FIG. 2C) and (FIG. 2D) are 200 μm.

(FIG. 3A) 2D precursors, FEA predictions and optical micrographs for six 3D mesostructures that have double- or triple-level configurations. (FIG. 3B) Distributed 3D mesoscale networks comprised of interconnected collections of the 3D structures in FIGS. 2A-2D and 3A. The scale bars in (FIG. 3A) and (FIG. 3B) are 200 μm and 400 μm, respectively.

In FIG. 28(A)-(F), the color in the FEA results corresponds to the magnitude of maximum principal strain in Si, and the scale bars are 200 μm. In FIG. 28(G), the scale bars are 20 μm, 200 μm and 20 mm, respectively, from left to right.

In FIG. 57(b), (c), (e)-(h), the color in the FEA results corresponds to the magnitude of maximum principal strain. Scale bars, 200 μm.

DETAILED DESCRIPTION OF THE INVENTION

Figure 1:
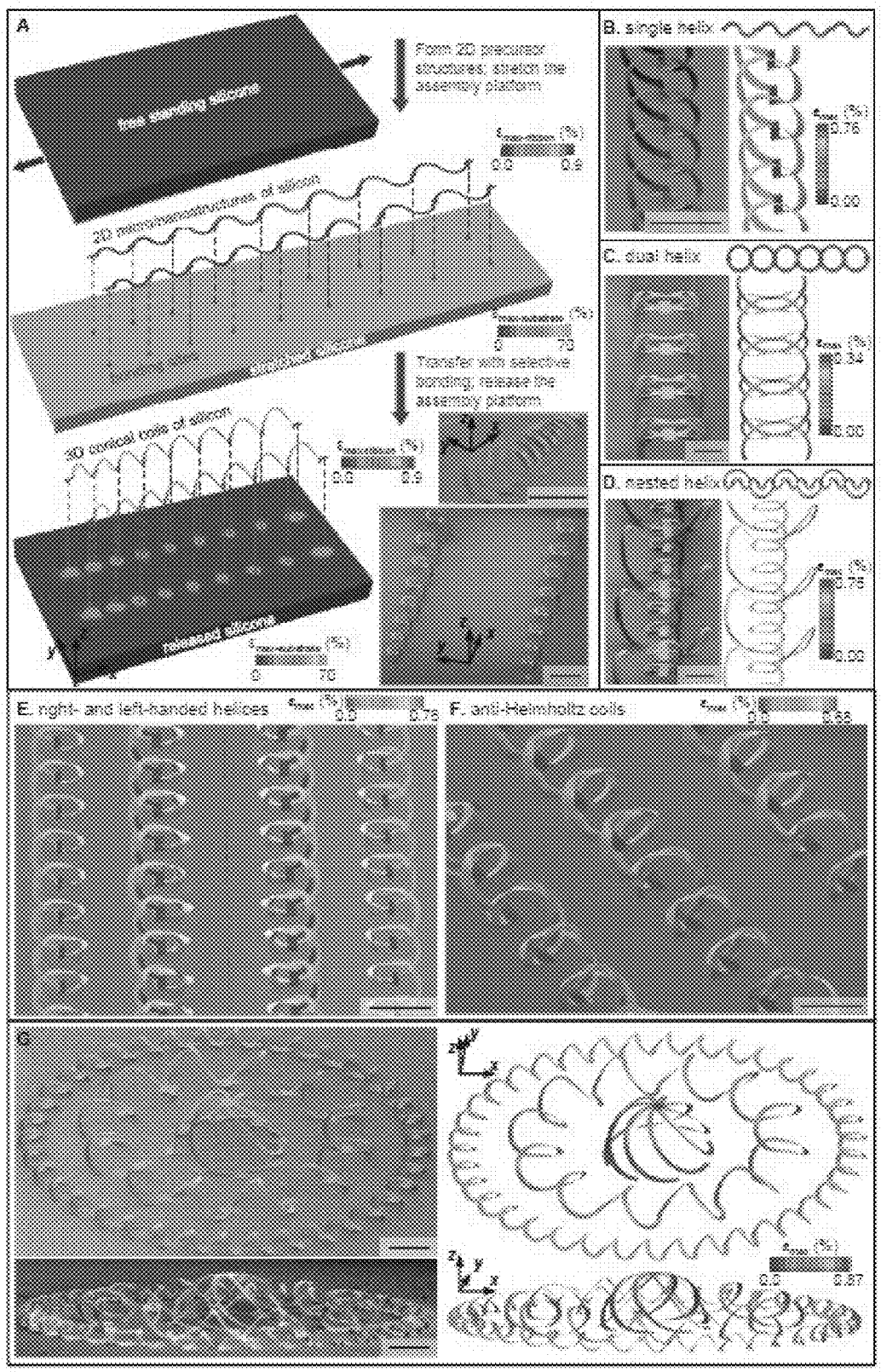
FIG. 1: Process for deterministic assembly of 3D mesostructures of monocrystalline silicon from 2D precursors, as summarized in schematic illustrations, finite element analyses (FEA) and experimental results for some representative cases. (A) FEA results that correspond to the formation of 3D conical helices from 2D filamentary serpentine ribbons of silicon bonded at selected points (red dots) to a stretched slab of silicone. Compressive forces induced by relaxing the strain in the silicone lead to coordinated out-of-plane buckling, twisting and translational motions in the silicon, to yield 3D mesostructures. The SEM images at the bottom right show an experimental result. (B) Schematic diagram of a 2D silicon precursor and its bonding sites (top), an SEM image of a single helical coil formed from this precursor (left), and corresponding FEA prediction (right). Similar results for a double helical coil (C), and a nested, coaxial pair of connected helical coils (D). (E) SEM image with overlaid FEA prediction of helical coils with right and left handed chirality, on the left and right sides of the dashed red line, respectively. (F) SEM image with overlaid FEA prediction of structures whose chirality changes abruptly at the location defined by the dashed red line. (G) SEM images and FEA prediction of a complex 3D mesostructure formed from a 2D precursor that consists of closed-loop circular filamentary serpentines and radially oriented ribbons, selectively bonded to a biaxially stretched silicone substrate. In all cases, the color in the FEA results corresponds to the maximum principal strains. The scale bars in all images are 400 μm.
Figure 2A:
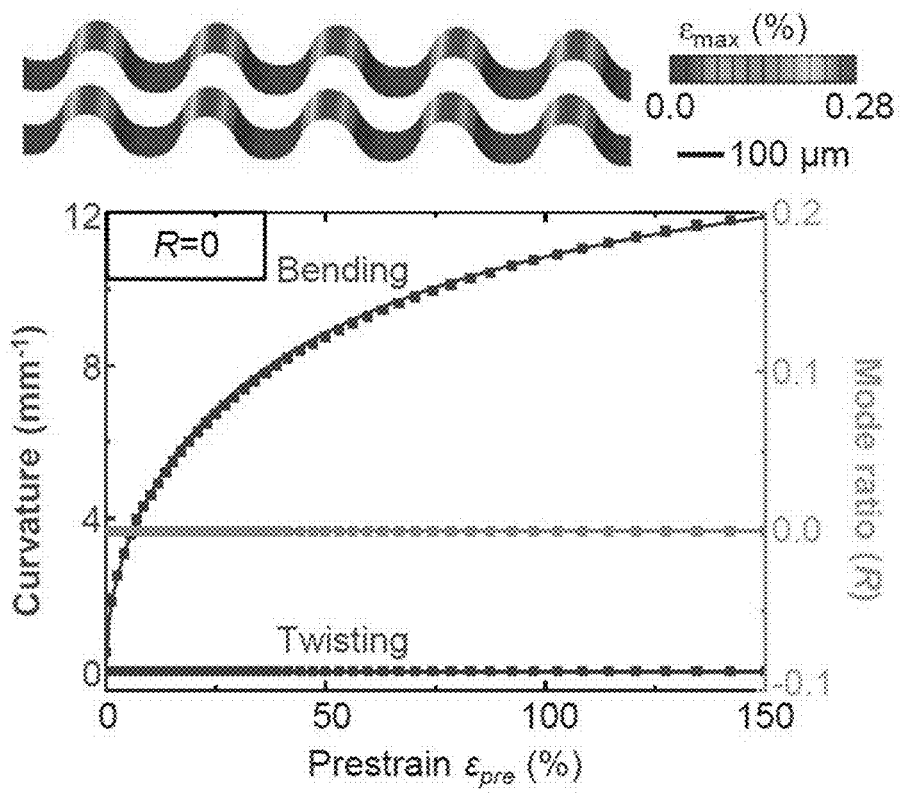
Figure 2B:
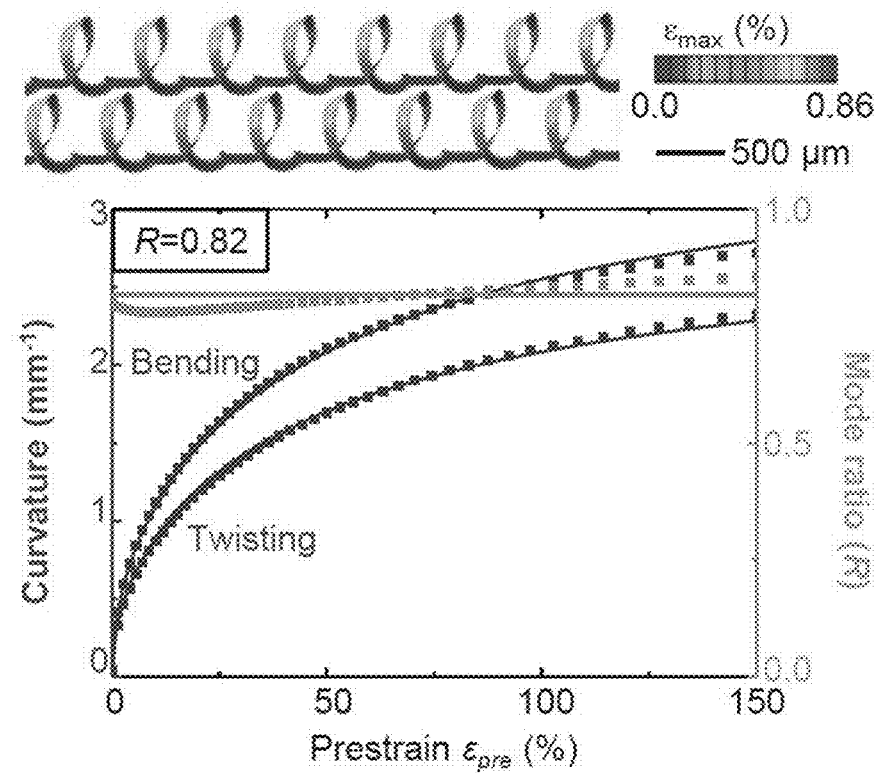

In general, the terms and phrases used herein have their art-recognized meaning, which can be found by reference to standard texts, journal references and contexts known to those skilled in the art. The following definitions are provided to clarify their specific use in the context of the invention.

The terms "foldable", "flexible" and "bendable" are used synonymously in the present description and refer to the ability of a material, structure, device or device component to be deformed into a curved shape without undergoing a transformation that introduces significant strain, such as strain characterizing the failure point of a material, structure, device or device component. In an exemplary embodiment, a flexible material, structure, device or device component may be deformed into a curved shape without introducing strain larger than or equal to about 5%, preferably for some applications larger than or equal to about 1%, and more preferably for some applications larger than or equal to about 0.5% in strain-sensitive regions.

"Stretchable" refers to the ability of a material, structure, device or device component to be strained without undergoing fracture. In an exemplary embodiment, a stretchable material, structure, device or device component may undergo strain larger than about 0.5% without fracturing, preferably for some applications strain larger than about 1% without fracturing and more preferably for some applications strain larger than about 3% without fracturing.

"Elastomeric" refers to a polymeric material which can be stretched or deformed and return, at least partially, to its original shape without substantial permanent deformation. Elastomeric substrates commonly undergo substantially elastic deformations. Exemplary elastomeric substrates useful in the present invention include, but are not limited to, elastomers and composite materials or mixtures of elastomers, and polymers and copolymers exhibiting elasticity. In some methods, the elastomeric substrate is prestrained via a mechanism providing for expansion of the elastic substrate along one or more principle axes. For example, prestraining may be provided by expanding the elastic substrate along a first axes, including expansion in a radial direction to transform a hemispherical surface to a flat surface. Alternatively, the elastic substrate may be expanded along a plurality of axes, for example via expansion along first and second axes orthogonally positioned relative to each other. Means of prestraining elastic substrates via mechanisms providing expansion of the elastic substrate include bending, rolling, flexing, flattening, expanding or otherwise deforming the elastic subtrate. The prestraining means also includes prestraining provided by raising the temperature of the elastic substrate, thereby providing for thermal expansion of the elastic substrate. Elastomers useful in the present invention may include, but are not limited to, thermoplastic elastomers, styrenic materials, olefenic materials, polyolefin, polyurethane thermoplastic elastomers, polyamides, synthetic rubbers, PDMS, polybutadiene, polyisobutylene, poly(styrene-butadiene-styrene), polyurethanes, polychloroprene and silicones.

"Complex shape" refers to the shape of an object, structure or component or the simplest repeating unit in an array of objects, structures or components wherein each object, structure or component contacts a supporting material at at least three bonding regions, and wherein said object, structure or component is not a single linear filament, a square having bonding regions at each corner, or a cross/intersection having bonding regions at each terminus. In an embodiment, a complex shape has a nonuniform distribution of bonding regions to a supporting substrate.

A "nonuniform distribution" is an arrangement of points, regions or areas in a two- or three-dimensional pattern that is nonlinear in one or two dimensions such that the nonuniform distribution does not form a line or series of evenly spaced lines (e.g., a regular grid).

"Linear" refers to the geometry of an object or series of objects forming a substantially straight line (e.g., where edges of the object have a curvature less than about 5 degrees) or a filamentary structure forming a substantially straight line (e.g., where edges of the filamentary structure have a curvature less than about 5 degrees), at least when the filament is placed under tension.

"Functional layer" refers to a layer that imparts some functionality to the device. For example, the functional layer may contain semiconductor components. Alternatively, the functional layer may comprise multiple layers, such as multiple semiconductor layers separated by support layers. The functional layer may comprise a plurality of patterned elements, such as interconnects running between or below electrodes or islands. The functional layer may be homogeneous or may have one or more properties or materials that are inhomogeneous. "Inhomogeneous property" refers to a physical parameter that can spatially vary, thereby effecting the position of the neutral mechanical plane or neutral mechanical surface within a multilayer device.

"Neutral mechanical plane" (NMP) refers to an imaginary plane existing in the lateral, b, and longitudinal, I, directions of a device. The NMP is less susceptible to bending stress than other planes of the device that lie at more extreme positions along the vertical, h, axis of the device and/or within more bendable layers of the device. Thus, the position of the NMP is determined by both the thickness of the device and the materials forming the layer(s) of the device.

"Coincident" refers to the relative position of two or more objects, planes or surfaces, for example a surface such as a neutral mechanical plane that is positioned within or is adjacent to a layer, such as a functional layer, substrate layer, or other layer. In an embodiment, a neutral mechanical plane is positioned to correspond to the most strain-sensitive layer or material within the layer.

"Proximate" refers to the relative position of two or more objects, planes or surfaces, for example a neutral mechanical plane that closely follows the position of a layer, such as a functional layer, substrate layer, or other layer while still providing desired conformability, foldability or bendability without an adverse impact on the strain-sensitive material physical properties. "Strain-sensitive" refers to a material that fractures or is otherwise impaired in response to a relatively low level of strain. In general, a layer having a high strain sensitivity, and consequently being prone to being the first layer to fracture, is located in the functional layer, such as a functional layer containing a relatively brittle semiconductor or other strain-sensitive device element. A neutral mechanical plane that is proximate to a layer need not be constrained within that layer, but may be positioned proximate or sufficiently near to provide a functional benefit of reducing the strain on the strain-sensitive device element.

"Unitary" refers to an object formed as a single piece or undivided whole.

The terms "direct and indirect" describe the actions or physical positions of one component relative to another component, or one device relative to another device. For example, a component that "directly" acts upon or touches another component does so without intervention from an intermediary. Contrarily, a component that "indirectly" acts upon or touches another component does so through an intermediary (e.g., a third component).

"Electronic device" generally refers to a device incorporating a plurality of components.

A "component" is used to broadly refer to an individual part of an electrical, optical, mechanical or thermal device. Component can be one or more of a photodiode, LED, TFT, electrode, semiconductor, other light-collecting/detecting components, transistor, integrated circuit, contact pad capable of receiving a device component, thin film devices, circuit elements, control elements, microprocessors, transducers and combinations thereof. A device component can be connected to one or more contact pads as known in the art, such as by metal evaporation, wire bonding, application of solids or conductive pastes, for example. Electrical device generally refers to a device incorporating a plurality of device components, and includes large area electronics, printed wire boards, integrated circuits, device components arrays, biological and/or chemical sensors, physical sensors (e.g., temperature, light, radiation, etc.), solar cell or photovoltaic arrays, display arrays, optical collectors, systems and displays.

An "interconnect" is one example of a component and refers to an electrically conducting material capable of establishing an electrical connection with a component or between components. In particular, the interconnect may establish electrical contact between components that are separate and/or that can move with respect to each other. Depending on the desired device specifications, operation, and application, the interconnect is made from a suitable material. For applications where a high conductivity is required, typical interconnect metals may be used, including but not limited to copper, silver, gold, aluminum and the like, including alloys. Suitable conductive materials may include a semiconductor like silicon, indium tin oxide, or GaAs.

As used herein, "lateral dimensions" refer to dimensions perpendicular to the thickness dimension, and optionally dimensions parallel to a receiving surface of the substrate. Lateral dimensions include, for example, length and width dimensions. In embodiments, the term "thickness" refers to a dimension of a component perpendicular to a supporting substrate.

An interconnect that is "stretchable" is used herein to broadly refer to an interconnect capable of undergoing a variety of forces and strains such as stretching, bending and/or compression in one or more directions without adversely impacting electrical connection to, or electrical conduction from, a device component. Accordingly, a stretchable interconnect may be formed of a relatively brittle material, such as GaAs, yet remain capable of continued function even when exposed to a significant deformatory force (e.g., stretching, bending, compression) due to the interconnect's geometrical configuration. In an exemplary embodiment, a stretchable interconnect may undergo strain larger than about 1%, 10% or about 30% or up to about 100% without fracturing. In an example, the strain is generated by stretching an underlying elastomeric substrate to which at least a portion of the interconnect is bonded.

"Substrate" refers to a material, layer or other structure having a surface, such as a receiving surface or supporting surface, that is capable of supporting one or more components or devices. A component that is "bonded" to the substrate refers to a component that is in physical contact with the substrate and unable to substantially move relative to the substrate surface to which it is bonded. Unbonded components or portions of a component, in contrast, are capable of substantial movement relative to the substrate. The unbonded portion of a component generally corresponds to that portion having a "bent configuration," such as by strain-induced bending.

A "NMS adjusting layer" refers to a layer whose primary function is adjusting the position of the NMS in the device. For example, the NMS adjusting layer may be an encapsulating layer or an added layer such as an elastomeric material.

In the context of this description, a "bent configuration" refers to a structure having a curved conformation resulting from the application of a force. Bent structures in the present invention may have one or more folded regions, convex regions, concave regions, and any combinations thereof. Bent structures useful in the present invention, for example, may be provided in a coiled conformation, a wrinkled conformation, a buckled conformation and/or a wavy (i.e., wave-shaped) configuration.

Bent structures, such as stretchable bent interconnects, may be bonded to a flexible substrate, such as a polymer and/or elastic substrate, in a conformation wherein the bent structure is under strain. In some embodiments, the bent structure, such as a bent ribbon structure, is under a strain equal to or less than about 30%, a strain equal to or less than about 10%, a strain equal to or less than about 5% and a strain equal to or less than about 1% in embodiments preferred for some applications. In some embodiments, the bent structure, such as a bent ribbon structure, is under a strain selected from the range of about 0.5% to about 30%, a strain selected from the range of about 0.5% to about 10%, a strain selected from the range of about 0.5% to about 5%. Alternatively, the stretchable bent interconnects may be bonded to a substrate that is a substrate of a device component, including a substrate that is itself not flexible. The substrate itself may be planar, substantially planar, curved, have sharp edges, or any combination thereof. Stretchable bent interconnects are available for transferring to any one or more of these complex substrate surface shapes.

A "pattern of bond sites or bonding regions" refers to spatial application of bonding means to a supporting substrate surface and/or to the thin film structure so that a supported thin film structure has bonding regions and non-bonding regions with the substrate. For example, a thing film structure that is bonded to the substrate at its ends and not bonded in a central portion. Further shape control is possible by providing an additional bonding site within a central portion, so that the non-bonding region is divided into two distinct central portions. Bonding means can include adhesives, adhesive precursors, welds, and photocurable polymers. In general, bond sites can be patterned by a variety of techniques, and may be described in terms of surface-activated ($W_{act}$) areas capable of providing strong adhesive forces between substrate and feature (e.g., interconnect) and surface-inactive ($W_{in}$) where the adhesive forces are relatively weak. A substrate that is adhesively patterned in lines may be described in terms of $W_{act}$ and $W_{in}$ dimensions. Those variables, along with the magnitude of prestrain, $\varepsilon_{pre}$, affect interconnect geometry.

"Ultrathin" refers to devices of thin geometries that exhibit extreme levels of bendability. In an aspect, ultrathin refers to circuits or films having a thickness less than 1 µm, less than 600 nm or less than 500 nm. In an aspect, a multilayer device that is ultrathin has a thickness less than 200 µm, less than 50 µm, or less than 10 µm.

"Elastomer" refers to a polymeric material which can be stretched or deformed and return to its original shape without substantial permanent deformation. Elastomers commonly undergo substantially elastic deformations. Exemplary elastomers useful in the present invention may comprise, polymers, copolymers, composite materials or mixtures of polymers and copolymers. Elastomeric layer refers to a layer comprising at least one elastomer. Elastomeric layers may also include dopants and other non-elastomeric materials. Elastomers useful in the present invention may include, but are not limited to, thermoplastic elastomers, styrenic materials, olefenic materials, polyolefin, polyurethane thermoplastic elastomers, polyamides, synthetic rubbers, silicon-based organic polymers including polydimethylsiloxane (PDMS), polybutadiene, polyisobutylene, poly(styrene-butadiene-styrene), polyurethanes, polychloroprene and silicones. In some embodiments, an elastomeric stamp comprises an elastomer.

"Elastomeric stamp" or "elastomeric transfer device" are used interchangeably and refer to an elastomeric material having a surface that can receive as well as transfer a feature. Exemplary elastomeric transfer devices include stamps, molds and masks. The transfer device affects and/or facilitates feature transfer from a donor material to a receiver material. Exemplary elastomers include, but are not limited to silicon containing polymers such as polysiloxanes including poly(dimethyl siloxane) (i.e. PDMS and h-PDMS), poly(methyl siloxane), partially alkylated poly(methyl siloxane), poly(alkyl methyl siloxane) and poly(phenyl methyl siloxane), silicon modified elastomers, thermoplastic elastomers, styrenic materials, olefinic materials, polyolefin, polyurethane thermoplastic elastomers, polyamides, synthetic rubbers, polyisobutylene, poly(styrene-butadiene-styrene), polyurethanes, polychloroprene and silicones. In an embodiment, a polymer is an elastomer.

"Conformable" refers to a device, material or substrate which has a bending stiffness that is sufficiently low to allow the device, material or substrate to adopt any desired contour profile, for example a contour profile allowing for conformal contact with a surface having a pattern of relief features.

"Conformal contact" refers to contact established between surfaces, coated surfaces, and/or surfaces having materials deposited thereon which may be useful for transferring, assembling, organizing and integrating structures on a substrate surface. In one aspect, conformal contact involves a macroscopic adaptation of one or more contact surfaces of a conformable transfer device to the overall shape of a substrate surface or the surface of an object. In another aspect, conformal contact involves a microscopic adaptation of one or more contact surfaces of a conformable transfer device to a substrate surface leading to an intimate contact without voids. The term conformal contact is intended to be consistent with use of this term in the art of soft lithography. Conformal contact may be established between one or more bare contact surfaces of a foldable device and a substrate surface. Alternatively, conformal contact may be established between one or more coated contact surfaces, for example contact surfaces having a transfer material, device component and/or device deposited thereon, of a conformable transfer device and a substrate surface. Alternatively, conformal contact may be established between one or more bare or coated contact surfaces of a conformable transfer device and a substrate surface coated with a material such as a transfer material, solid photoresist layer, prepolymer layer, liquid, thin film or fluid.

"Low modulus" refers to materials having a Young's modulus less than or equal to 10 MPa, less than or equal to 5 MPa, or less than or equal to 1 MPa, or less than or equal to 0.5 MPa, or less than or equal to 200 KPa. A low modulus material may have a Young's modulus selected from the range of 1 MPa to 1 KPa, or 0.5 MPa to 1 KPa, or 200 KPa to 1 KPa, 100 KPa to 1 KPa, or 50 KPa to 1 KPa.

"Ultra low modulus" refers to materials having a Young's modulus less than or equal to 150 KPa, less than or equal to 100 KPa or less than or equal to 50 KPa.

"Young's modulus" is a mechanical property of a material, device or layer which refers to the ratio of stress to strain for a given substance. Young's modulus may be provided by the expression;

$$E = \frac{(stress)}{(strain)} = \left(\frac{L_0}{\Delta L} \times \frac{F}{A}\right); \tag{I}$$

wherein E is Young's modulus, $L_0$ is the equilibrium length, $\Delta L$ is the length change under the applied stress, F is the force applied and A is the area over which the force is applied. Young's modulus may also be expressed in terms of Lame constants via the equation:

$$E = \frac{\mu(3\lambda + 2\mu)}{\lambda + \mu}; \tag{II}$$

wherein $\lambda$ and $\mu$ are Lame constants. High Young's modulus (or "high modulus") and low Young's modulus (or "low modulus") are relative descriptors of the magnitude of Young's modulus in a given material, layer or device. In the present invention, a high Young's modulus is larger than a low Young's modulus, preferably about 10 times larger for some applications, more preferably about 100 times larger for other applications and even more preferably about 1000 times larger for yet other applications. In an embodiment, a low modulus layer has a Young's modulus less than 100 MPa, optionally less than 10 MPa, and optionally a Young's modulus selected from the range of 0.1 MPa to 50 MPa. In an embodiment, a high modulus layer has a Young's modulus greater than 100 MPa, optionally greater than 10 GPa, and optionally a Young's modulus selected from the range of 1 GPa to 100 GPa.

"Strain gradient" or "gradient of forces" refers to the extent of nonuniformity, where larger strain gradients correspond to higher extents, degrees or amounts of nonuniformity. Strain gradient can be estimated by the maximum strain for a given material (typically 0.5% in silicon) over the characteristic length scale L of the 3D structure. Therefore, for micrometer-sized structures, the strain gradient is $0.5\%/[10^{-6}$ meter], which equals 5000/meter, while for larger structures, on the order of 10 cm=0.1 meter, the strain gradient is on the order of $0.5\%/(0.1$ meter$)=0.05$/meter.

"Inhomogeneous Young's modulus" refers to a material having a Young's modulus that spatially varies (e.g., changes with surface location). A material having an inhomogeneous Young's modulus may optionally be described in terms of a "bulk" or "average" Young's modulus for the entire layer of material.

"Thin layer" or "thin film" refers to a material that at least partially covers an underlying substrate, wherein the thickness is less than or equal to 300 µm, less than or equal to 200 µm, or less than or equal to 50 µm. Alternatively, the layer is described in terms of a functional parameter, such as a thickness that is sufficient to isolate or substantially reduce the strain on the electronic device, and more particularly a functional layer in the electronic device that is sensitive to strain. "Isolate" refers to the presence of an elastomer layer that substantially reduces the strain or stress exerted on a functional layer when the device undergoes a stretching or folding deformation. In an aspect, strain is said to be "substantially" reduced if the strain is at least a factor of 20, at least a factor of 50, or at least a factor of 100 times reduced compared to the strain in the same system without the elastomer layer.

"Structural layer" refers to a layer that imparts structural functionality, for example by supporting and/or encapsulating and/or partitioning device components.

"Semiconductor" refers to any material that is an insulator at a very low temperature, but which has an appreciable electrical conductivity at a temperature of about 300 Kelvin. In the present description, use of the term semiconductor is intended to be consistent with use of this term in the art of microelectronics and electronic devices. Useful semiconductors include those comprising elemental semiconductors, such as silicon, germanium and diamond, and compound semiconductors, such as group IV compound semiconductors such as SiC and SiGe, group III-V semiconductors such as AlSb, AlAs, AlN, AlP, BN, BP, BAs, GaSb, GaAs, GaN, GaP, InSb, InAs, InN, and InP, group III-V ternary semiconductors such as $Al_xGa_{1-x}As$, group II-VI semiconductors such as CsSe, CdS, CdTe, ZnO, ZnSe, ZnS, and ZnTe, group I-VII semiconductors such as CuCl, group IV-VI semiconductors such as PbS, PbTe, and SnS, layer semiconductors such as $PbI_2$, $MoS_2$, and GaSe, and oxide semiconductors such as CuO and $Cu_2O$. The term semiconductor includes intrinsic semiconductors and extrinsic semiconductors that are doped with one or more selected materials, including semiconductors having p-type doping materials and n-type doping materials, to provide beneficial electronic properties useful for a given application or device. The term semiconductor includes composite materials comprising a mixture of semiconductors and/or dopants. Specific semiconductor materials useful for some embodiments include, but are not limited to, Si, Ge, Se, diamond, fullerenes, SiC, SiGe, SiO, $SiO_2$, SiN, AlSb, AlAs, AlIn, AlN, AlP, AlS, BN, BP, BAs, $As_2S_3$, GaSb, GaAs, GaN, GaP, GaSe, InSb, InAs, InN, InP, CsSe, CdS, CdSe, CdTe, $Cd_3P_2$, $Cd_3As_2$, $Cd_3Sb_2$, ZnO, ZnSe, ZnS, ZnTe, $Zn_3P_2$, $Zn_3As_2$, $Zn_3Sb_2$, $ZnSiP_2$, CuCl, PbS, PbSe, PbTe, FeO, $FeS_2$, NiO, EuO, EuS, PtSi, TlBr, $CrBr_3$, SnS, SnTe, $PbI_2$, $MoS_2$, GaSe, CuO, $Cu_2O$, HgS, HgSe, HgTe, $HgI_2$, MgS, MgSe, MgTe, CaS, CaSe, SrS, SrTe, BaS, BaSe, BaTe, $SnO_2$, TiO, $TiO_2$, $Bi_2S_3$, $Bi_2O_3$, $Bi_2Te_3$, $BiI_3$, $UO_2$, $UO_3$, $AgGaS_2$, PbMnTe, $BaTiO_3$, $SrTiO_3$, $LiNbO_3$, $La_2CuO_4$, $La_{0.7}Ca_{3.3}MnO_3$, CdZnTe, CdMnTe, $CuInSe_2$, copper indium gallium selenide (CIGS), HgCdTe, HgZnTe, HgZnSe, PbSnTe, $Tl_2SnTe_5$, $Tl_2GeTe_5$, AlGaAs, AlGaN, AlGaP, AlInAs, AlInSb, AlInP, AlInAsP, AlGaAsN, GaAsP, GaAsN, GaMnAs, GaAsSbN, GaInAs, GaInP, AlGaAsSb, AlGaAsP, AlGaInP, GaInAsP, InGaAs, InGaP, InGaN, InAsSb, InGaSb, InMnAs, InGaAsP, InGaAsN, InAlAsN, GaInNAsSb, GaInAsSbP, and any combination of these. Porous silicon semiconductor materials are useful for aspects described herein. Impurities of semiconductor materials are atoms, elements, ions and/or molecules other than the semiconductor material(s) themselves or any dopants provided to the semiconductor material. Impurities are undesirable materials present in semiconductor materials which may negatively impact the electronic properties of semiconductor materials, and include but are not limited to oxygen, carbon, and metals including heavy metals. Heavy metal impurities include, but are not limited to, the group of elements between copper and lead on the periodic table, calcium, sodium, and all ions, compounds and/or complexes thereof.

A "semiconductor component" broadly refers to any semiconductor material, composition or structure, and expressly includes high quality single crystalline and polycrystalline semiconductors, semiconductor materials fabricated via high temperature processing, doped semiconductor materials, inorganic semiconductors, and composite semiconductor materials.

"Sensing" refers to detecting the presence, absence, amount, magnitude or intensity of a physical and/or chemical property. Useful electronic device components for sensing include, but are not limited to electrode elements, chemical or biological sensor elements, pH sensors, accelerometers, temperature sensors and capacitive sensors.

"Island" refers to a relatively rigid component of an electronic device comprising a plurality of semiconductor components. "Bridge" refers to structures interconnecting two or more islands or one island to another component. The invention includes electronic devices having bridge structures comprising electrical interconnects, such as stretchable electrical interconnects provided between and in electrical contact with semiconductor device components.

"Encapsulate" refers to the orientation of one structure such that it is at least partially, and in some cases completely, surrounded by one or more other structures. "Partially encapsulated" refers to the orientation of one structure such that it is partially surrounded by one or more other structures, for example, wherein 30%, or optionally 50% or optionally 90%, of the external surfaces of the structure is surrounded by one or more structures. "Completely encapsulated" refers to the orientation of one structure such that it is completely surrounded by one or more other structures.

"Contiguous" refers to materials or layers that are touching or connected throughout in an unbroken sequence. In one embodiment, a contiguous layer of a device has not been manipulated to remove a substantial portion (e.g., 10% or more) of the originally provided material or layer.

"Discontinuous" refers to materials or layers that are not contiguous or connected along every imaginary straight line drawn through the material or layer. In embodiments, discontinuous materials or layers contain a significant amount (e.g., 10% or more) void space.

"Dielectric" refers to a non-conducting or insulating material. In an embodiment, an inorganic dielectric comprises a dielectric material substantially free of carbon. Specific examples of inorganic dielectric materials include, but are not limited to, silicon nitride, silicon dioxide and non-conjugated polymers.

"Polymer" refers to a macromolecule composed of repeating structural units connected by covalent chemical bonds or the polymerization product of one or more monomers, often characterized by a high molecular weight. The term polymer includes homopolymers, or polymers consisting essentially of a single repeating monomer subunit. The term polymer also includes copolymers, or polymers consisting essentially of two or more monomer subunits, such as random, block, alternating, segmented, grafted, tapered and other copolymers. Useful polymers include organic polymers or inorganic polymers that may be in amorphous, semi-amorphous, crystalline or partially crystalline states. Crosslinked polymers having linked monomer chains are particularly useful for some applications. Polymers useable in the methods, devices and components include, but are not limited to, plastics, elastomers, thermoplastic elastomers, elastoplastics, thermoplastics and acrylates. Exemplary polymers include, but are not limited to, acetal polymers, biodegradable polymers, cellulosic polymers, fluoropolymers, nylons, polyacrylonitrile polymers, polyamide-imide polymers, polyimides, polyarylates, polybenzimidazole, polybutylene; polycarbonate, polyesters, polyetherimide, polyethylene, polyethylene copolymers and modified polyethylenes, polyketones, poly(methyl methacrylate), polymethylpentene, polyphenylene oxides and polyphenylene sulfides, polyphthalamide, polypropylene, polyurethanes, styrenic resins, sulfone-based resins, vinyl-based resins, rubber (including natural rubber, styrene-butadiene, polybutadiene, neoprene, ethylene-propylene, butyl, nitrile, silicones), acrylic, nylon, polycarbonate, polyester, polyethylene, polypropylene, polystyrene, polyvinyl chloride, polyolefin or any combinations of these.

"Bending stiffness" is a mechanical property of a material, device or layer describing the resistance of the material, device or layer to an applied bending moment. Generally, bending stiffness is defined as the product of the modulus and area moment of inertia of the material, device or layer. A material having an inhomogeneous bending stiffness may optionally be described in terms of a "bulk" or "average" bending stiffness for the entire layer of material.

"Deformable substrate" refers to a substrate capable of undergoing a change in physical dimensions (length, width, etc.), shape, contour (e.g. planar, curved or bent) or any combination of these. In some embodiments, deformable substrates include flexible and/or stretchable substrates, such as elastic substrates. Alternatively, the invention includes methods, structures and systems, including rigid and/or inelastic substrates. Substrates useful for certain applications include elastomers, shape memory polymers, directional polymers and hydrogels.

Strain is defined as: $\varepsilon=\Delta L/L$ for lengths changed from L (at rest) to L+$\Delta L$ (under an applied force), where $\Delta L$ is the displacement distance from a reference condition, such as a rest. Axial strain refers to a force applied to an axis of the substrate to generate the displacement $\Delta L$. Strain is also generated by forces applied in other directions, such as a bending force, a compressive force, a shearing force, and any combination thereof. Strain or compression may also be generated by stretching a curved surface to a flat surface, or vice versa.

As used in some contexts, strain may be reversibly or irreversibly transferable from the deformable substrate to the thin film structure, for example, via a process involving a controlled deformation of the structure, for example via compressive deformation (e.g., buckling, folding, bending and/or twisting). As used in this context, the term "strain" as applied to the structure provides a system level description of the 3D structure characterizing the extent of compressive deformation (e.g., buckling, folding, bending and/or twisting). In some embodiments, for example, the strain of a structure reflects a comparison of features of the precursor, such as bonding sites, with that of the 3D structure wherein the relative positions of the bonding sites may have changed for example due to undergoing deformation (e.g., buckling, folding, bending and/or twisting). In an embodiment, for example, strain refers to the extent of change in the distance between bonding sites of the precursor relative to the 3D structure, for example, a change in the distance between adjacent bonding sites or nearest neighbor bonding sites. In an embodiment, for example, strain refers to the extent of change in features, such as bonding regions, that define a region of compressive deformation in the 3D structure relative to that of a 2D precursor.

Compression is used herein in a manner similar to the strain, but specifically refers to a force that acts to decrease a characteristic length, or a volume, of a substrate, such that $\Delta L<0$.

As used herein, the terms "three-dimensional form", "three-dimensional shape" and "three-dimensional geometry" are used interchangeably to describe three-dimensional structures that are formed by compressive buckling, bending or lift-off, for example, of a two-dimensional precursor, such as a substantially planar two-dimensional precursor, from an assembly substrate. In an embodiment, for example, a distinction between a two-dimensional precursor and a three-dimensional structure, according to the present invention, is that a two dimensional structure has a substantially planar geometry and a three dimensional structure has a nonplanar, buckled or bent geometry. In a specific embodiment, for example, a two-dimensional precursor is substantially planar (e.g., has an out-of-plane height deviation relative to a basal plane of the precursor less than or equal to 5%, or less than or equal to 2%), whereas a three-dimensional structure comprises at least one non-planar region characterized by an out-of-plane height deviation relative to a basal plane of the precursor greater than 5%, and for some embodiments, greater than 20%, and optionally greater than 30%. An out-of-plane height deviation of 0% would indicate a perfectly planar material aligned with the basal plane of the precursor and an out-of-plane height deviation of 100% would indicate a planar material in a perfectly perpendicular orientation relative to the starting basal plane of the precursor.

Figure 85:
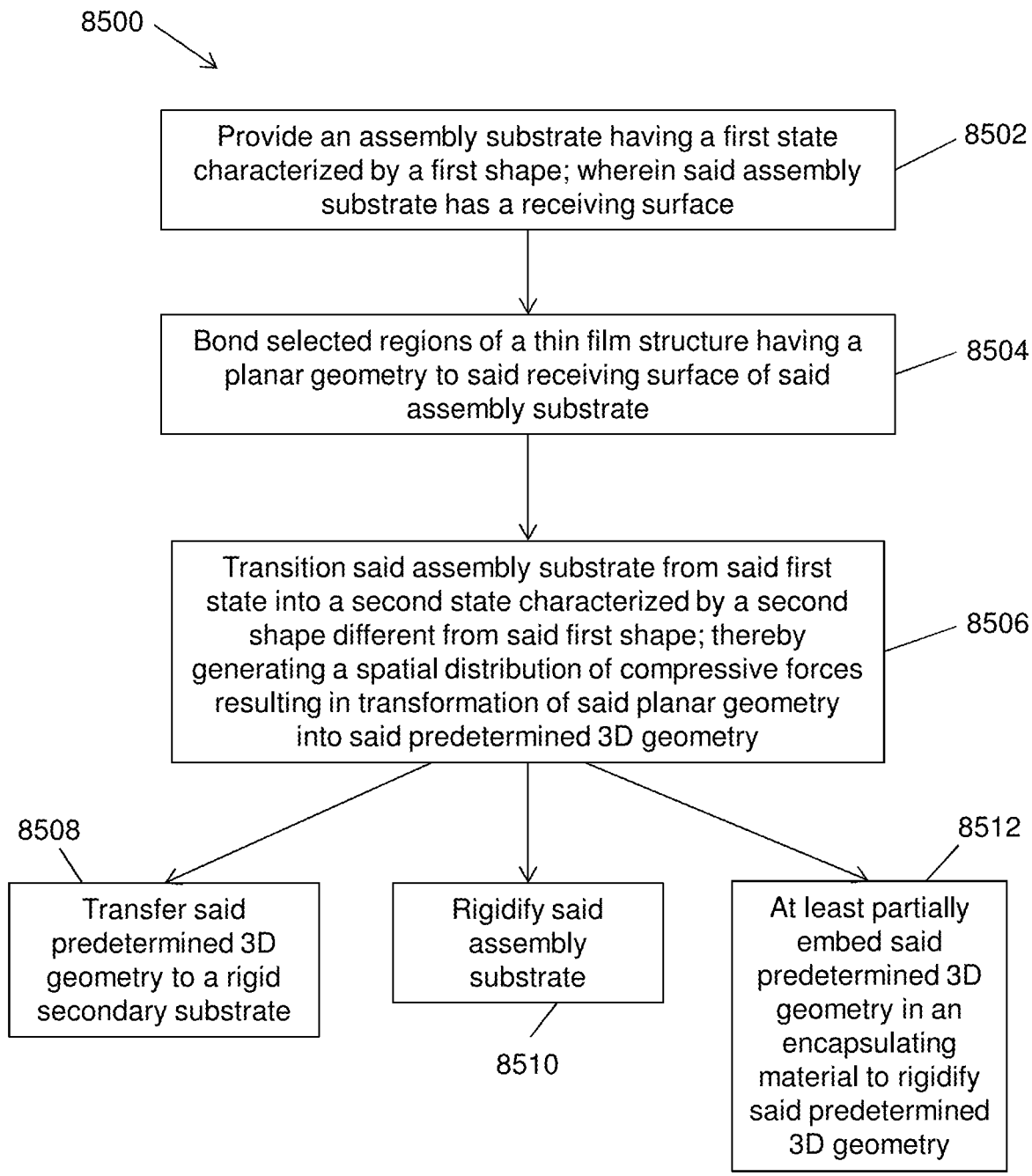
FIG. 85: Flowchart showing several exemplary methods for forming three-dimensional thin film structures according to the invention.

FIG. 85 illustrate a flowchart 8500 showing steps for exemplary methods of forming three-dimensional thin film structures. In step 8502, an assembly substrate is provided, where the assembly substrate has a first state characterized by a first shape and a receiving surface. In step 8504, selected regions of a thin film structure having a planar geometry are bonded to the receiving surface of the assembly substrate. In step 8506, the assembly substrate is transitioned from the first state into a second state characterized by a second shape different from the first shape, thereby generating a spatial distribution of compressive forces resulting in transformation of the planar geometry into the predetermined three-dimensional geometry. In a subsequent step, the predetermined three-dimensional geometry may be at least partially embedded in an encapsulating material (step 8512), transferred to a rigid secondary substrate (step 8508) and/or the assembly substrate may be rigidified (step 8510), thereby limiting deformation of the three-dimensional geometry to less than 5%.

The invention can be further understood by the following non-limiting examples.

Example 1: Deterministic Assembly of Functional Micro/Nanomaterials into Complex, Three-Dimensional Architectures by Compressive Buckling Complex, three dimensional (3D) assemblies of nanomaterials form naturally in all biological systems, where they provide essential functions in even the most basic forms of life. Compelling opportunities exist for analogous 3D structures in man-made devices, but design options are constrained by comparatively primitive capabilities in materials growth and assembly. Here we report simple, rapid routes to previously inaccessible classes of 3D architectures in advanced materials, with characteristic dimensions that range from nanometers to centimeters and areas that span square centimeters or more. The approach relies on geometric transformation of two dimensional (2D) micro/nanostructures into extended 3D layouts by controlled processes of substrate-induced compressive buckling. Demonstrations include combined experimental and theoretical studies of more than forty representative geometries, from single and multiple helices, toroids and conical spirals to constructs that resemble spherical baskets, cuboid cages, raised platforms, starbursts, flowers, scaffolds, fences and frameworks. Nested and/or interconnected collections of these and other building blocks yield 3D mesoscale networks with single and/or multiple level arrangements. Materials examples range from device-grade monocrystalline silicon to metals, dielectrics and heterogeneous combinations of these, in 3D forms that can be dynamically adjusted. A tunable toroidal inductor provides a simple device illustration that foreshadows unique possibilities for wide-ranging classes of 3D microsystems technologies.

Formation of complex, three dimensional configurations of advanced materials and devices via geometric transformation of two dimensional micro/nanostructures creates unique design possibilities in wide-ranging classes of microsystems technologies, with potential significance in areas that span microelectronics, photonics and biomedicine.

Controlled formation of 3D functional mesostructures is a topic of broad and increasing interest, particularly in the last decade (1-15), due to important envisioned uses in nearly every type of micro/nanosystem technology, from biomedical devices (8) to microelectromechanical components (1, 2, 9, 15), metamaterials (11, 13), sensors (12), electronics (3, 7) and others. Although volumetric optical exposures (4, 5, 14), colloidal self-assembly (16-18), residual stress induced bending (1, 2, 19) and bio-templated growth (20) can be used to realize certain classes of structures in certain types of materials, techniques that rely on rastering of fluid nozzles or focused beams of light, ions or electrons provide the greatest versatility in design (4, 5, 14). Applicability of these latter methods, however, only extends directly to materials that can be formulated as inks or patterned by exposure to light/energetic particles, and indirectly to those that can be deposited onto or into sacrificial 3D structures formed with these materials (5, 6, 9, 14). Integration of more than one type of any material into a single structure can be challenging. Furthermore, the serial nature of these processes sets practical constraints on operating speeds and overall addressable areas. These and other limitations stand in stark contrast with the exceptional capabilities that exist for fabrication of functional 2D micro/nanostructures in modern semiconductor technologies (21). Here, we describe a route to 3D mesostructures that exploits this existing base of competencies, in which spatially controlled compressive buckling induces rapid, large area geometric extension of 2D precursors into the third dimension.

Figure 5:
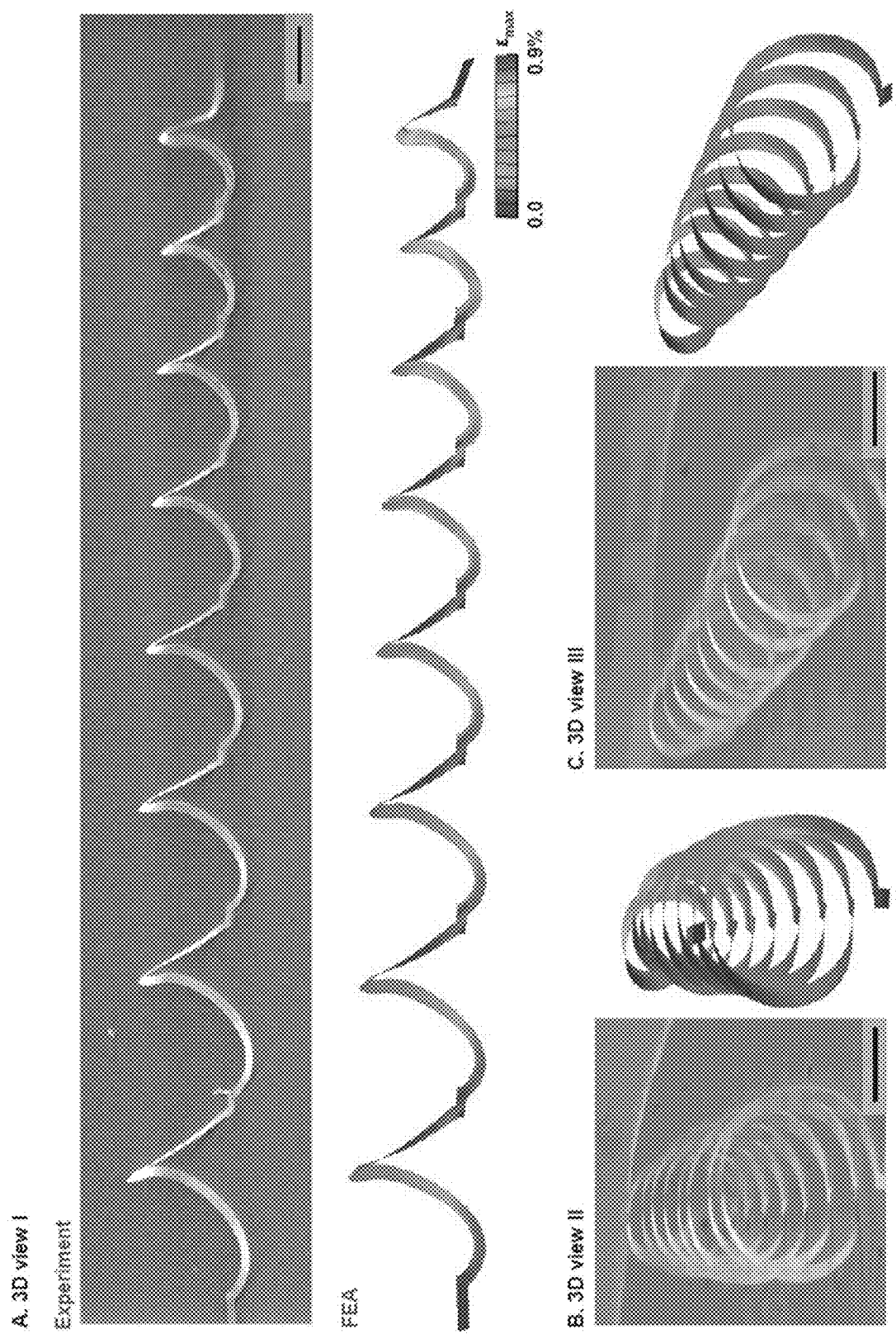
FIG. 5: (A)-(C) show experimental images and corresponding FEA predictions for a 3D conical helix based on silicon ribbons, viewed at three different angles. The color in the FEA results represents the maximum principal strain. The scale bars in all images are 200 μm.
Figure 6:
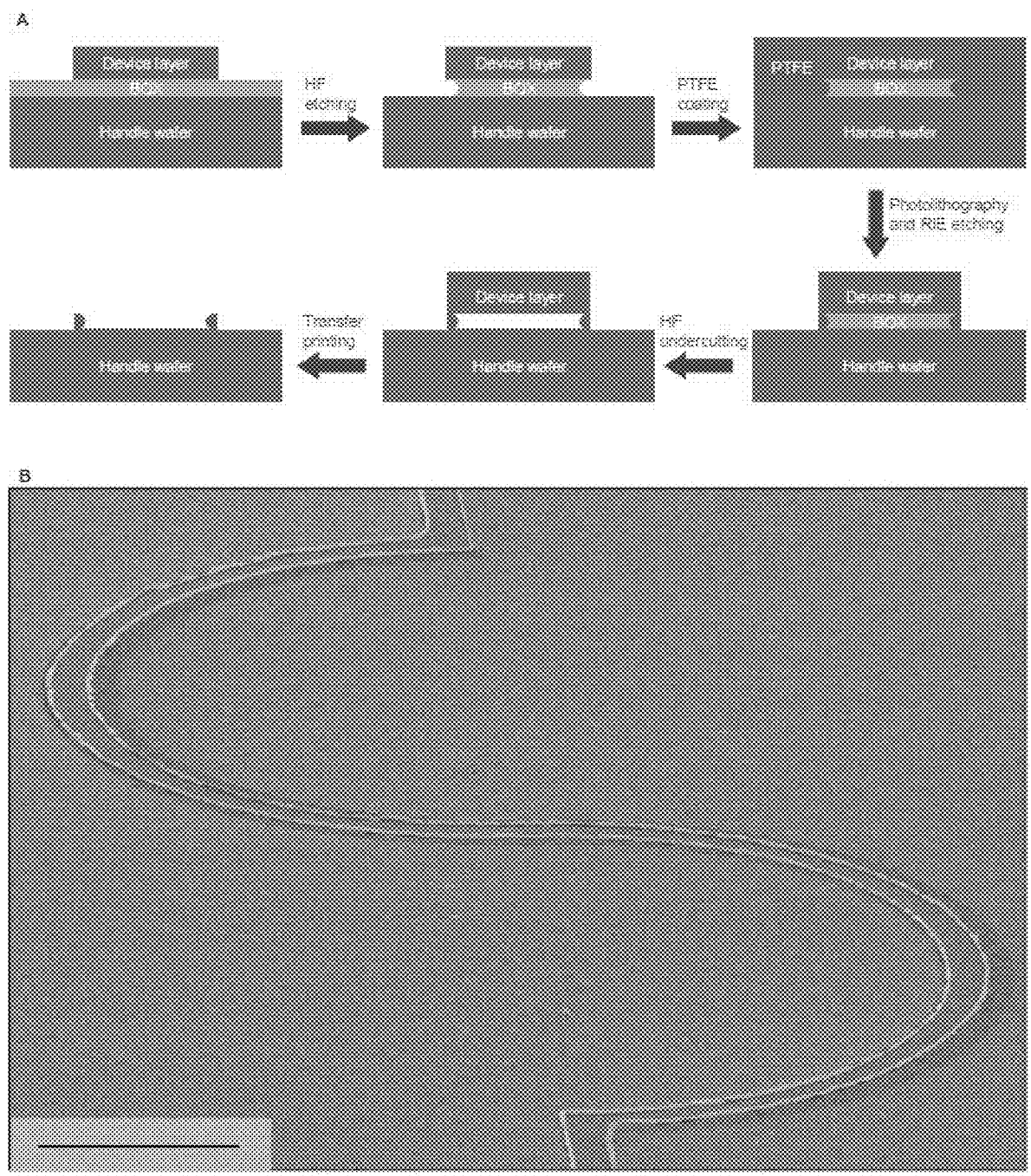
FIG. 6: (A) Schematic fabrication flow chart for the Si structure from SOI wafer, to illustrate the PTFE anchors from undercutting the buried oxide (BOX) layer. (B) SEM image of the PTFE anchors after transfer printing the Si membranes. The scale bar in (B) is 100 μm.

As a simple illustrative example, we present results of finite element analyses (FEA) (See Supplementary Text for details) of the steps for assembly of a pair of 3D conical helices made of single crystalline silicon in FIG. 1(A). The process begins with planar micro/nanofabrication of two-dimensional (2D) filamentary serpentine silicon ribbons (2 µm thick, 60 µm wide), with continuous spatial gradients in their arc radii. Lithographically defined exposure of these structures to UV ozone creates precisely controlled patterns of surface hydroxyl terminations at strategic locations (red dots in FIG. 1(A) along their lengths. A soft silicone substrate (Dragon Skin, Smooth-On) that is uniaxially stretched a large level of prestrain ($\varepsilon_{pre}=\Delta L/L$ for lengths changed from L to $\Delta L/L$, where $\Delta L$ is comparable to or larger than L; $\varepsilon_{pre}\cong 70\%$ for the case shown here) and exposed to ozone to generate spatially uniform hydroxyl groups, serves as a platform that guides the mechanical assembly process. Transfer printing the 2D serpentines onto this surface leads to strong, spatially selective bonding (work of adhesion >8 J/m$^2$; see Supplemental Text) via covalent linkages that form upon contact, as a result of condensation reactions at the regions of the silicon that present hydroxyl groups (7, 22). Comparatively weak van der Waals forces dominate interfacial interactions at all other locations (work of adhesion ~0.2 J/m$^2$, Ref. 23). Allowing the substrate to return to its original shape induces large compressive forces on the serpentine precursors. Forces above a certain threshold initiate a controlled buckling process that lifts the weakly bonded regions of the serpentines out of contact with the substrate surface and, at the same time, induces spatially dependent deformations (in terms of twisting and bending) and translations in- and out-of-plane. The 3D structures formed by these correlated motions represent self-supporting frameworks that remain tethered to the assembly platform at the covalent bonding sites. This process leaves residual strains in the substrate that are negligible everywhere except for the immediate vicinity of these sites, and strains in the silicon that are well below fracture thresholds (FIG. 1(A)). This mechanically guided, deterministic process of geometric transformation from 2D to 3D is governed by (i) the 2D layout of the precursor materials, their dimensions and mechanical properties, (ii) the pattern of sites for selective bonding, and (iii) the nature and magnitude of the prestrain in the assembly platform. Quantitative analysis captures all of these aspects, as illustrated by the excellent agreement between experiment and computation in FIG. 1(A) and FIG. 5. The coils shown here have 8 turns, with a pitch (i.e., dimension along x axis) that varies continuously from ~454 µm to ~817 µm, a width (i.e., dimension along y axis) from ~252 µm to ~474 µm, and a height (i.e., dimension along z axis) from ~240 µm to ~459 µm. The relative differences between the experimentally observed structural geometries and those from FEA prediction are <8.5%. Even this relatively simple class of 3D mesostructure would be impossible to achieve in a high performance inorganic semiconductor material like device-grade monocrystalline silicon with any other existing approach to micro/nanofabrication or assembly. Details on the materials and fabrication procedures are available as supplementary materials (Materials and Methods, FIGS. 6 and 7).

Figure 8:
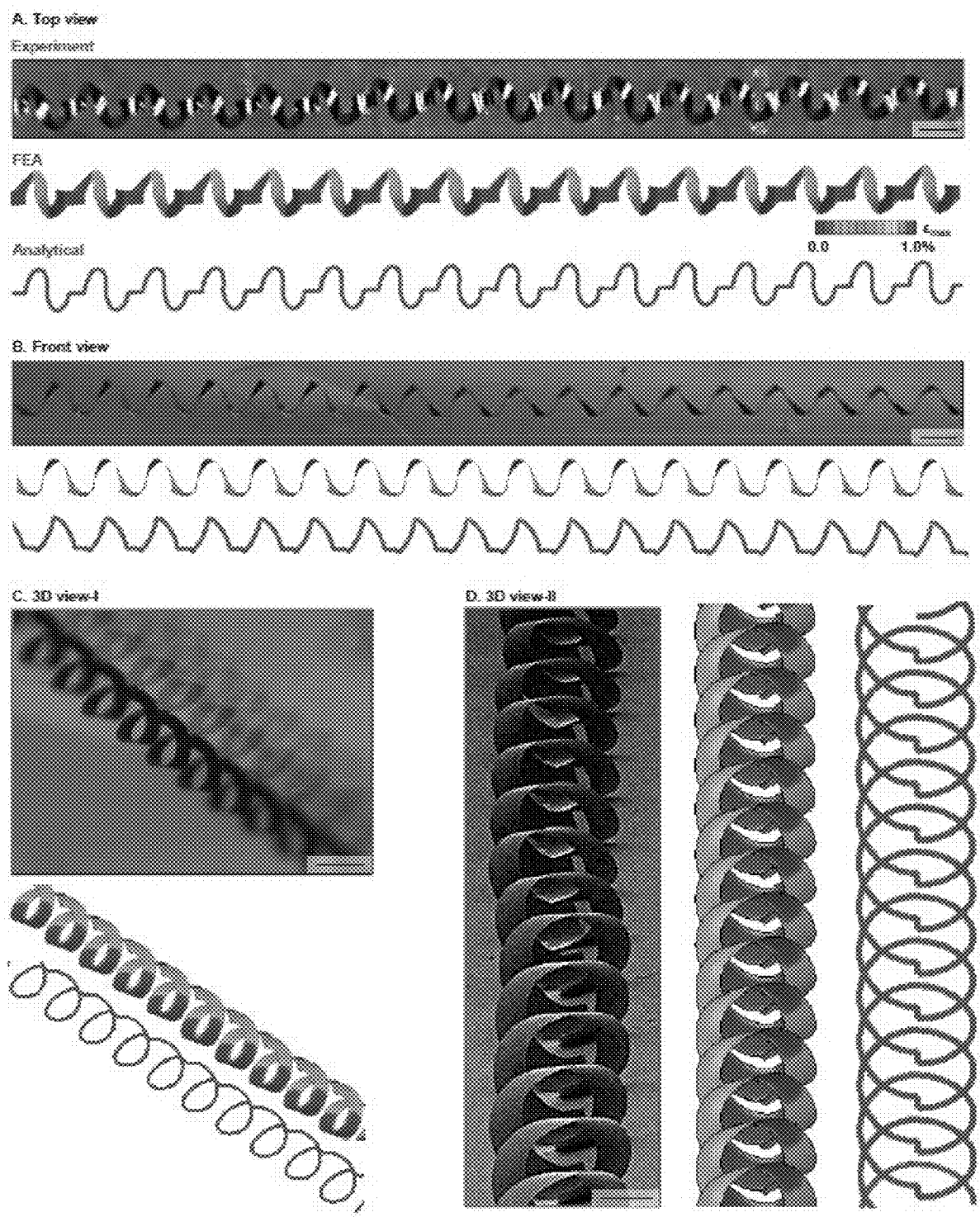
FIG. 8: Experimental images, FEA predictions and corresponding analytic results for a straight helix based on silicon ribbons, viewed at different angles: (A) top view, (B) front view, (C) and (D) 3D views. The experimental images in (A), (B), and (C) and optical images; (D) is a SEM image. The color in the FEA results represents the maximum principal strain. The scale bar in (A), (B) and (C) is 500 μm, and that in (D) is 200 μm.
Figure 9:
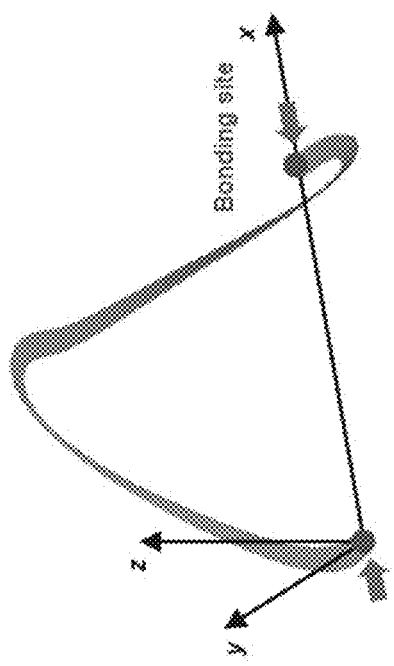
FIG. 9: Schematic illustration and FEA results for the theoretical model of geometric configurations of a 3D helix: (A) top view of a serpentine wire consisting of two arcs. (B) 3D view of the deformed configuration after compression from the two ends. (C) FEA results of the displacement components as a function of the parametric coordinate θ for three different levels of substrate prestrain. (D) FEA results of the non-uniform part of the displacement component along the x axis, as a function of the parametric coordinate θ for three different levels of substrate prestrain. The geometric parameters adopted in the FEA are t=2.0 μm, w=60 μm, $r_0$=500 μm, and $\theta_0$=180°.
Figure 9:
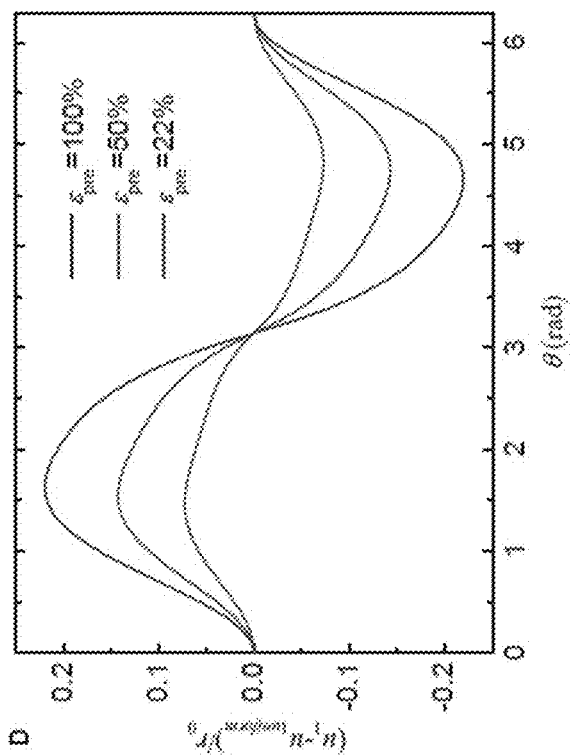
Figure 9:
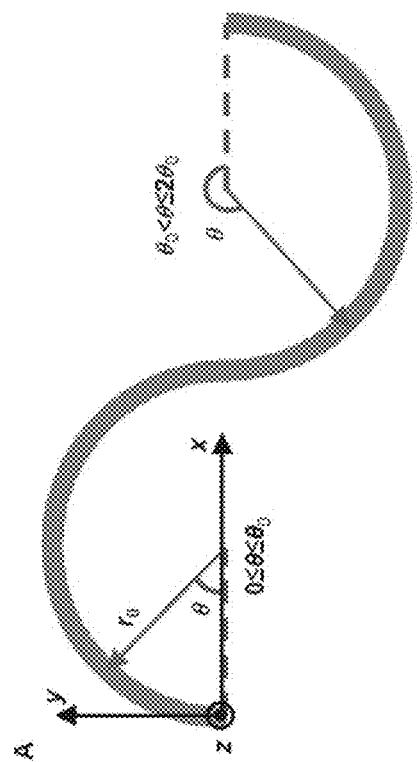
Figure 9:
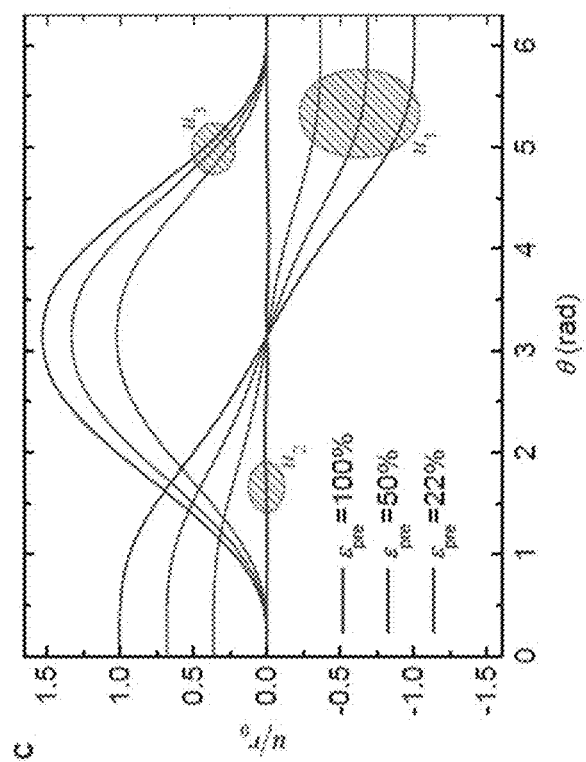
Figure 10:
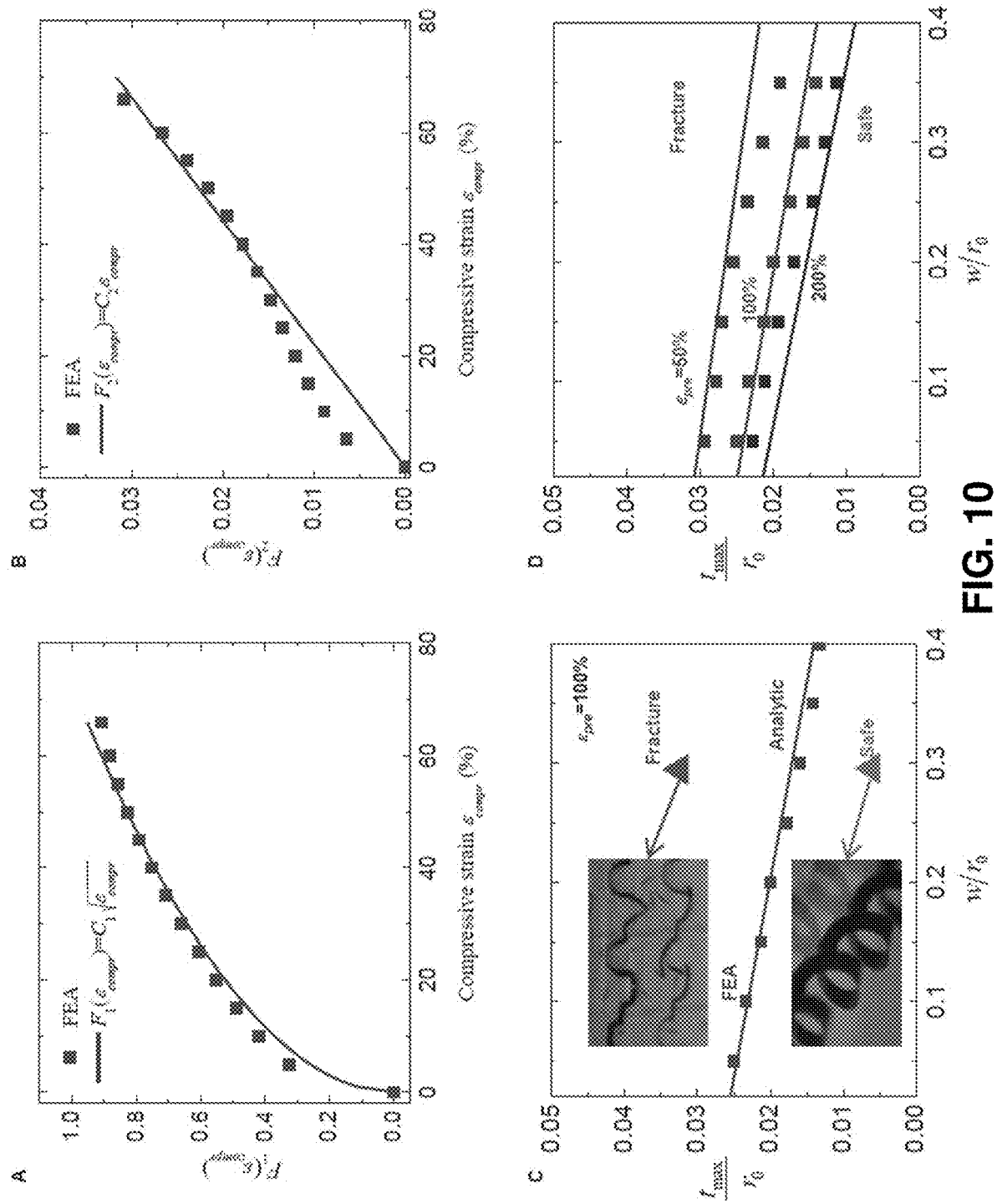
FIG. 10: Scaling law for the maximum principal strain in a 3D helix during the post-buckling process and a design criterion to avoid fracture. Dependence of the functions $F1(\varepsilon_{compr})$ (A) and $F2(\varepsilon_{compr})$ (B) on applied compressive strain. The coefficient $F1(\varepsilon_{compr})$ of the dominant strain component (due to out-of-plane bending and twisting) is proportional to the square root of the applied strain. The coefficient $F2(\varepsilon_{compr})$ of the minor strain component (due to in-plane bending) is approximately proportional to the applied strain. (C) Maximum dimensionless thickness as a function of the dimensionless width for 100% prestrain, in which the green and red triangles correspond to 3D helices that are observed to remain intact and fracture, respectively, in experiments. (D) Fracture map constructed by the analytic model for different levels of prestrain.

With this scheme, diverse feature sizes and wide-ranging geometries can be realized in many different classes of materials. A simple case related to that in FIG. 1A results from a precursor that consists of a 2D serpentine ribbon in a spatially invariant periodic geometry (2 µm thick, 50 µm wide; schematic top view illustration in the top frame of FIG. 1(B)). Here, selective bonding to an assembly platform that is strained uniaxially to $\varepsilon_{pre}=90\%$ yields a uniform, single helical coil, as illustrated in FIG. 1B. The experimental results are in quantitative agreement with FEA (FIG. 1(B) and FIG. 8) and with analytical parametric equations that use values of the pitch determined from $\varepsilon_{pre}$ (See Supplementary Text and FIG. 9 for details). Such models indicate that the heights of the helices increase with $\varepsilon_{pre}$, while the widths remain largely unchanged, as might be expected. Modifying the structure of the 2D precursor within this theme while changing the distribution of the bonding sites enables access to dual helices (FIG. 1(C)), nested, coaxial structures (FIG. 1(D)), helices with different chirality (FIG. 1(E)), and even structures whose chirality changes abruptly at selected locations (FIG. 1(F)). In all examples of FIG. 1, the maximum principal strains (from ~0.34% to 0.90%) occur at locations of large changes in curvature. Computational models provide quantitative guidance in the selection of designs that avoid strains at levels that could result in fracture of the constituent materials. For simple cases, these guidelines can be captured in analytical forms (Supplementary Text and FIG. 10). In single helices, the maximum strains increase linearly with both the thicknesses and widths of the 2D precursors, with greater sensitivity to the former parameter.

Figure 11:
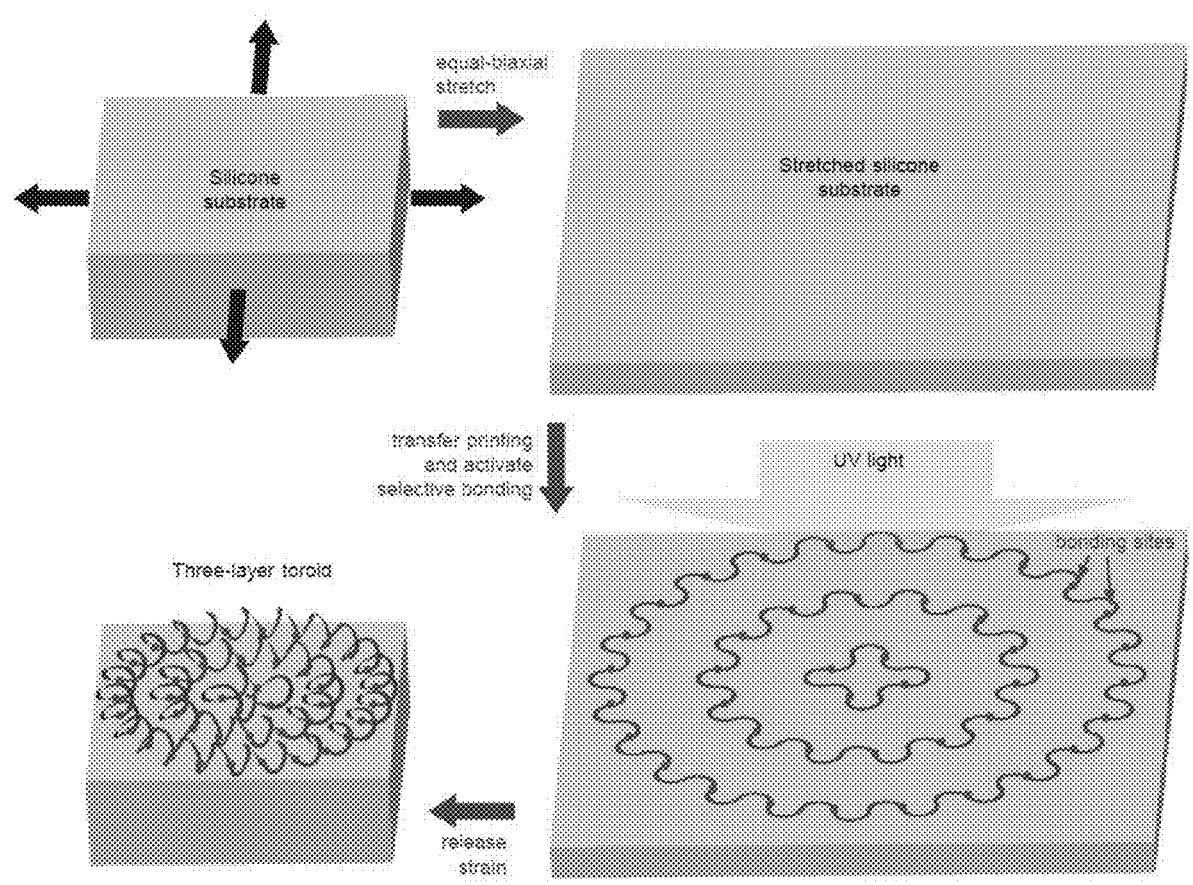
FIG. 11: Schematic illustration of the process for generating 3D structures by using biaxial prestrain in an elastomeric substrate.
Figure 12:
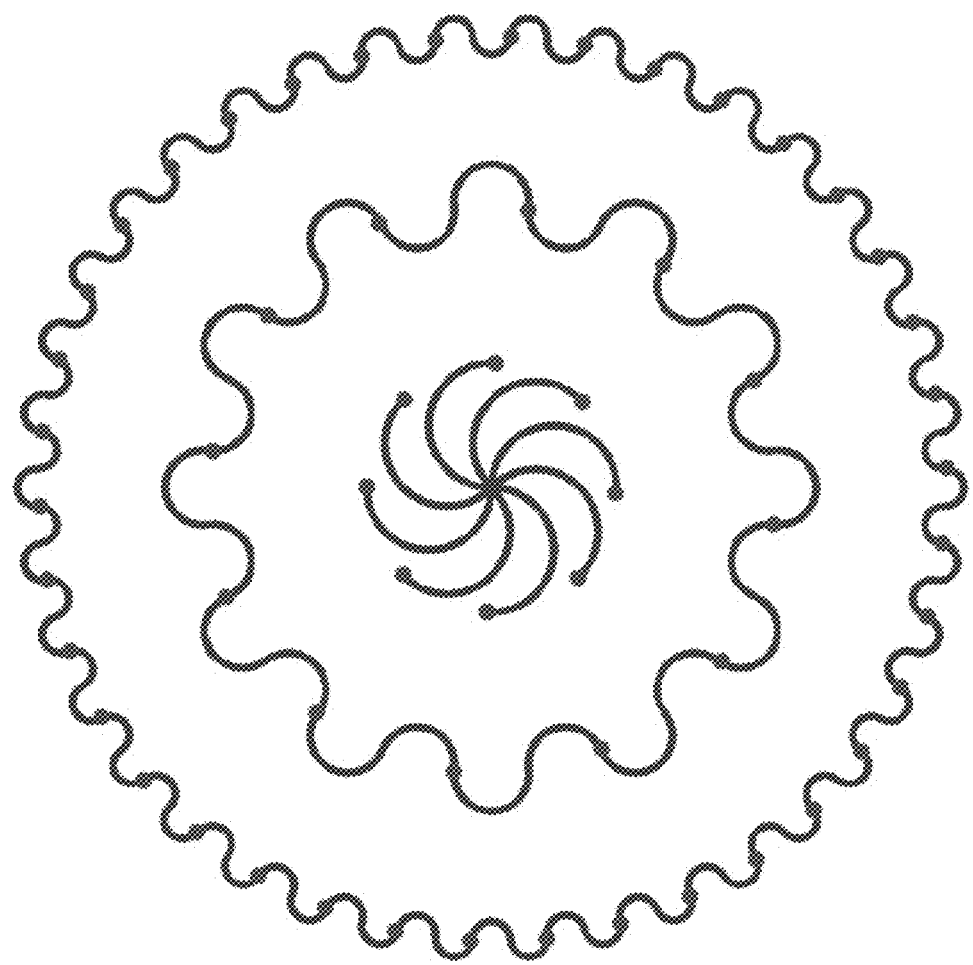
FIG. 12: 2D precursor of the three-layer structure shown in FIG. 1G, where the bonding sites are represented by red dots.

The assembled structures are not restricted to geometries with axial symmetry. Joining closed-form circular 2D serpentines with equal-biaxially stretched assembly platforms (FIG. 11) yields toroidal coils, in isolation, in extended arrays or in nested configurations. An elaborate 3D silicon mesostructure that consists of a concentric pair of toroids, with a separate hemi-spherical 'cage' construct at the center appears in FIG. 1(G); the corresponding 2D precursor appears in FIG. 12. The remarkably good agreement between experimental results and FEA prediction for this highly complex architecture provides further evidence of the fidelity of the assembly process and the accuracy of the models. The result is a deterministic route to 3D mesostructures with validated design tools that can assist in the selection of 2D precursor geometries, bonding sites and stretching configurations for wide-ranging classes of topologies/architectures.

Figure 13:
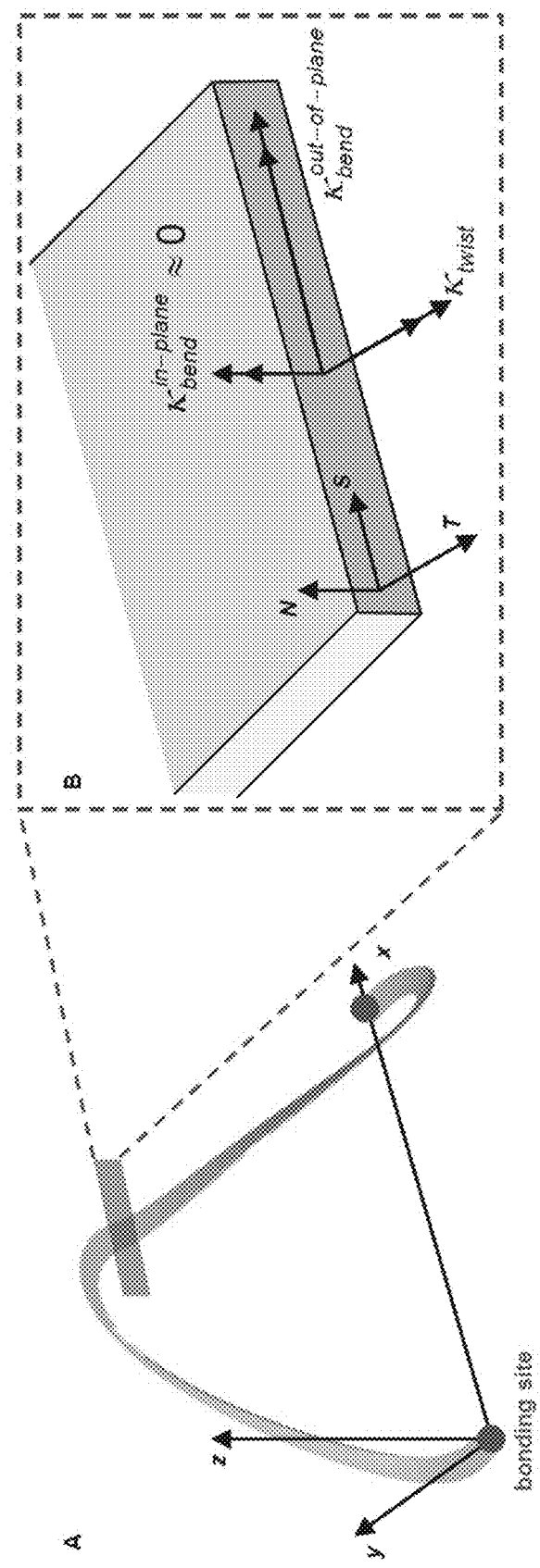
FIG. 13: Schematic illustration of the local coordinate system for a representative 3D structure (i.e., straight helix). (A) 3D helix in a global coordinate system (x,y,z). (B) Local coordinate system (N,T,S), where N denotes the normal direction, T denotes the tangential direction, and S denotes another principal direction. Consistent with the right-hand rule, the in-plane bending, out-of-plane bending and twisting are along the axes of N, S and T, respectively. Because of the ultrathin nature of the filamentary ribbon, in-plane bending is energetically unfavorable. As a result, the induced change in curvature is negligible, as compared to that associated with twisting or out-of-plane bending.
Figure 14:
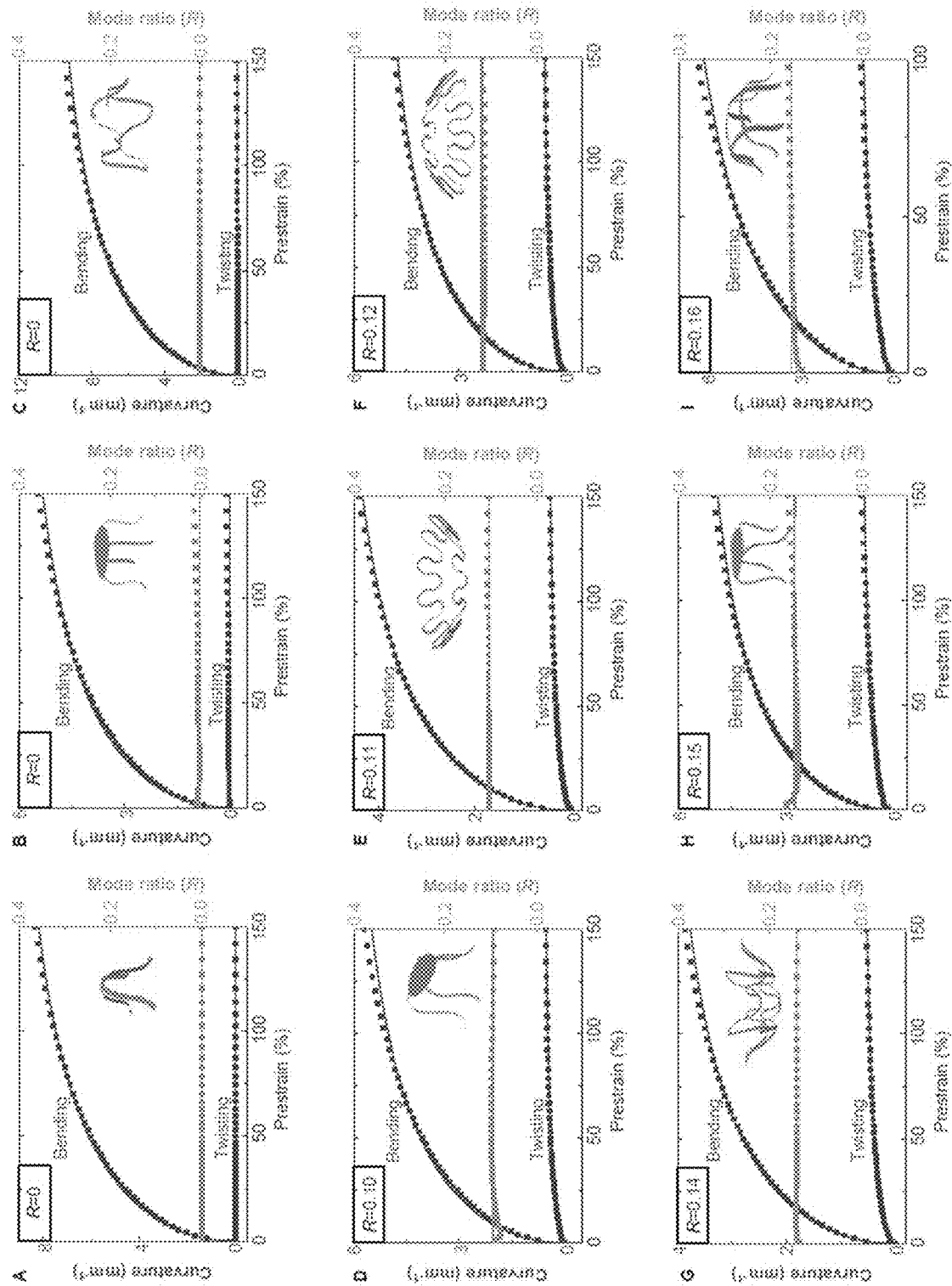
FIG. 14: Curvature components due to bending and twisting as a function of prestrain, for various 3D pop-up structures that have a bending dominated buckling mode: (A) tent; (B) regular table; (C) box I; (D) tilted table; (E) flower; (F) inverted flower; (G) two-layer flower; (H) rotated table; (I) box II.
Figure 15:
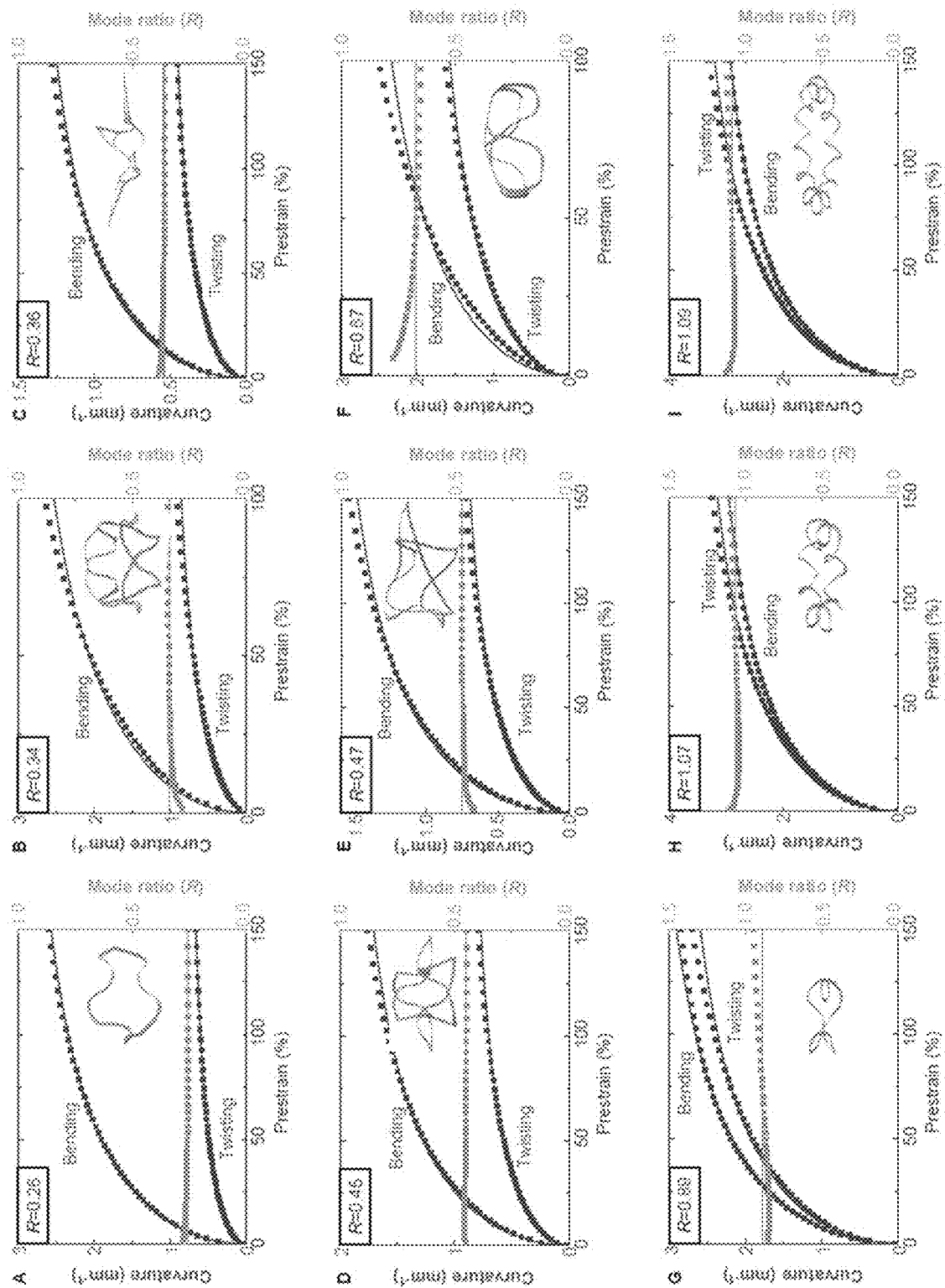
FIG. 15: Curvature components due to bending and twisting as a function of prestrain, for various 3D pop-up structures that have a bending-twisting mixed buckling mode: (A) folded box; (B) basket; (C) star; (D) butterfly; (E) starfish; (F) box with roof; (G) circular helix with 4 cells; (H) circular helix with 8 cells; (I) circular helix with 12 cells.

Dozens of basic 3D shapes, each identified with a descriptive name, are summarized in FIG. 2A-2D. A quantitative classification scheme follows from consideration of the buckling characteristics. In general, motions of ribbon type precursors (i.e. thickness t much smaller than the width w) during 3D assembly are dominated by out-of-plane bending and twisting deformations, coupled with large-scale translational motion (FIG. 13). By comparison, in-plane bending is energetically unfavorable because the corresponding stiffness ($\infty$ $w^3$t) is much larger than that for out-of-plane bending or twisting ($\infty$ $wt^3$) (24). The magnitudes of bending and twisting deformations can be quantified by evaluating curvatures defined using a local coordinate system (FIG. 13). Buckling always involves considerable bending, whereas the amount of twisting depends strongly on the 2D structural details. One means of classification, then, relies on a quantity, R, defined by the ratio of the average twisting curvature ($K_{twist}$) to the average bending curvature ($K_{bend}$), which can be determined by FEA (Supplementary Text). A given 3D mesostructure belongs to the bending dominated mode when R, referred to as the mode ratio, is smaller than a critical value (i.e., 0.2 for present purposes); otherwise, it belongs to the bending-twisting mixed mode. Representative examples presented in FIGS. 2A and 2B fall clearly into these two different regimes: a 3D wavy ribbon (R=0) and a 3D helical coil (R=0.82). The magnitudes of both $k_{twist}$ and $k_{bend}$ increase with compressive strain ($\varepsilon_{compr}$) applied to the 2D precursor, where $\varepsilon_{compr} = \varepsilon_{pre}/(1+\varepsilon_{pre})$. Quantitative analyses show that both curvature components follow a simple scaling law with $\varepsilon_{compr}$, i.e. $K_{bend}$, $K_{twist} \infty \sqrt{\varepsilon_{compr}}$ thereby suggesting that R is independent of the compression level. This finding appears to be generally valid, as it applies to all of the many 3D mesostructures examined here, representing a diverse set of topologies, formed on assembly platforms with uniaxial as well as biaxial strains (FIGS. 2A and 2B, 14 and 15).

Figures 2C, 2D:
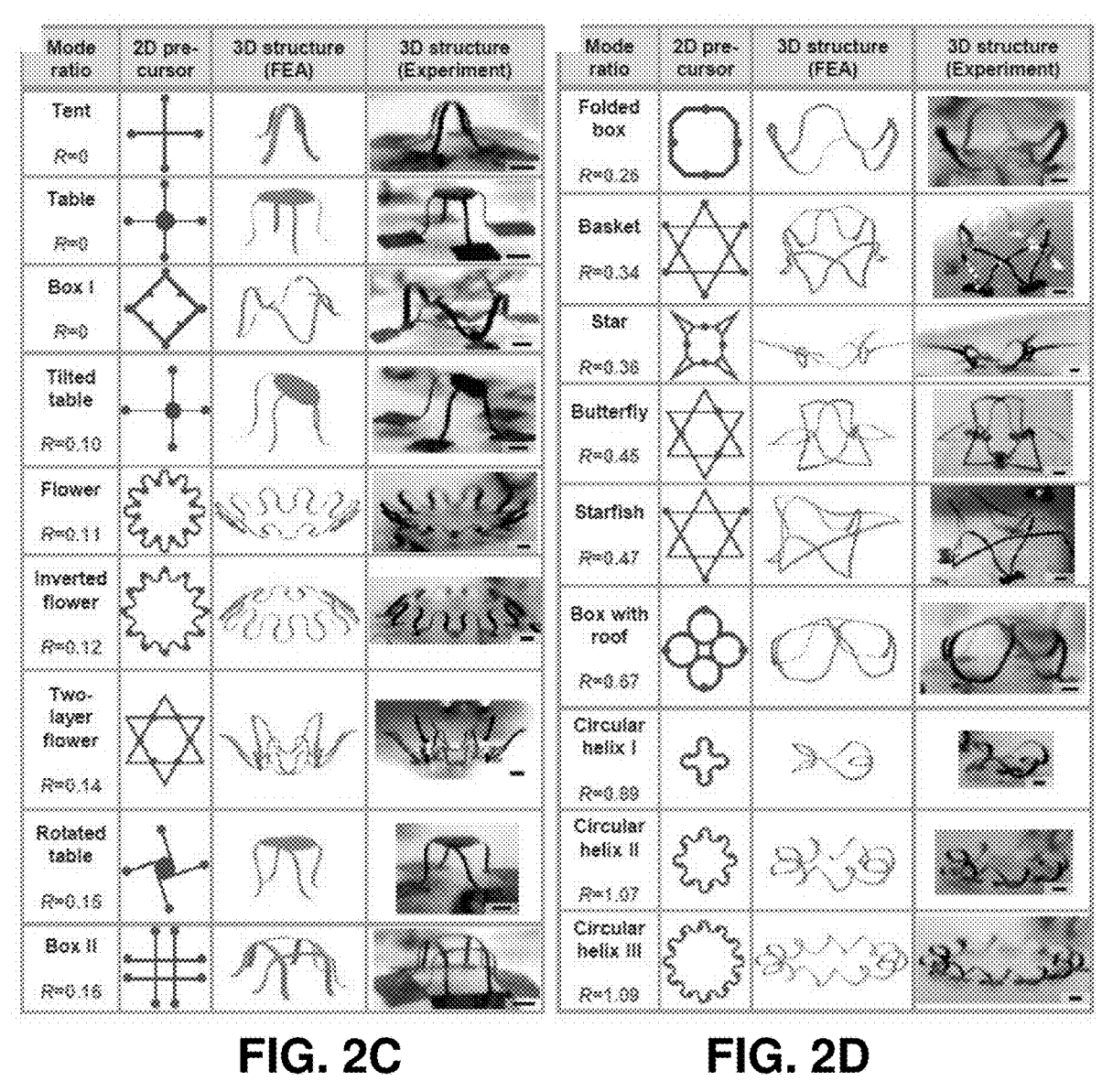
Figure 16:
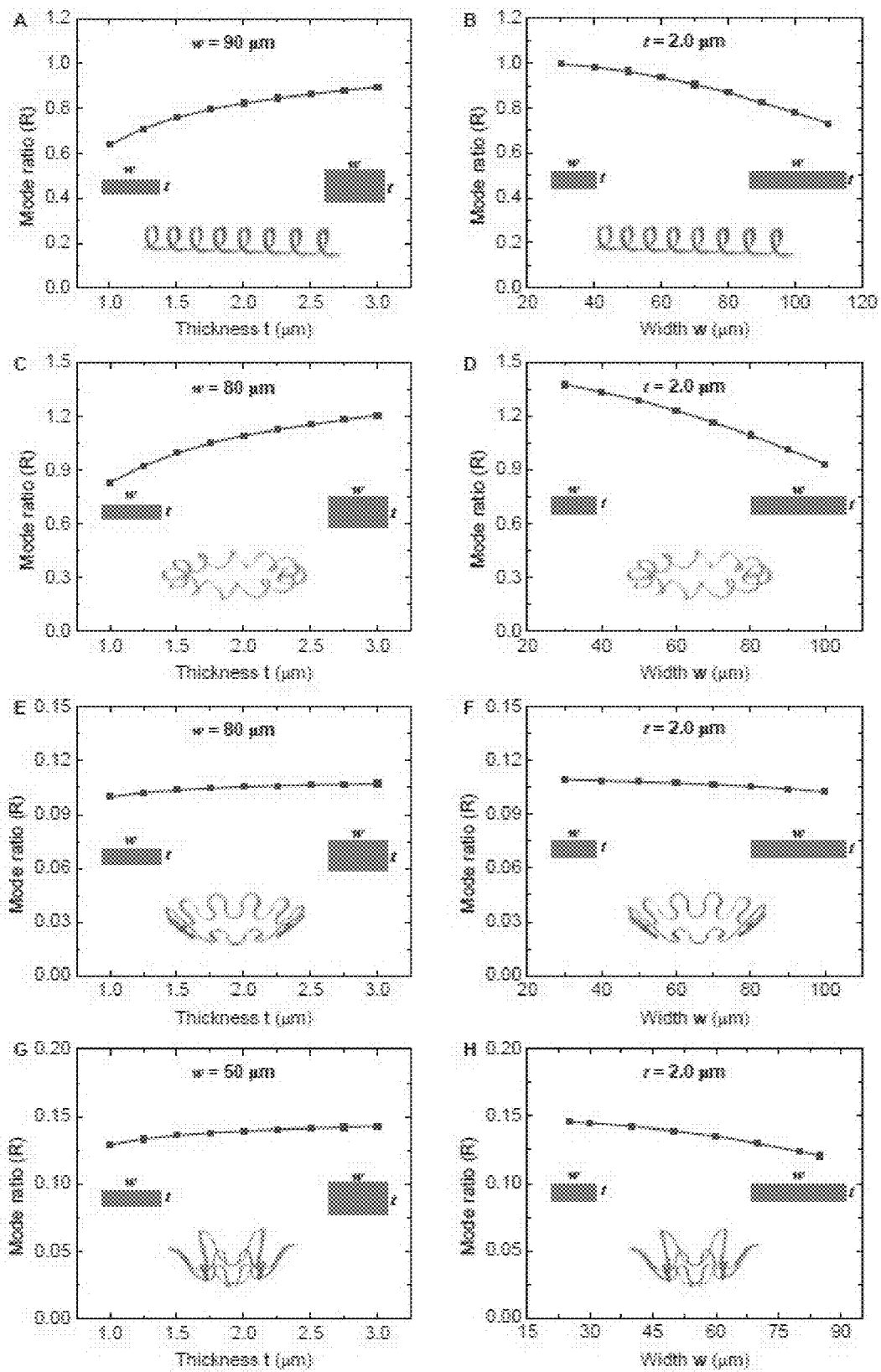
FIG. 16: Effect of cross-sectional geometry on the mode ratio. Mode ratio as a function of thickness and width for a straight helix (A, B), a circular helix (C, D), a flower (E, F), and a two-layer flower (G, H). For the two examples (flower and two-layer flower) that show a bending dominated mode, the mode ratio is insensitive to changes in the cross-sectional parameters. For the two examples (straight helix and circular helix) that show a bending-twisting mixed mode, the mode ratio changes significantly when the thickness (or width) is changed by ~3 times, but is not sufficiently large to induce a mode transition (i.e. from bending-twisting mixed mode into bending dominated mode).

The layout of the 2D precursor and the configuration of the bonding sites both play crucial roles in determining the final 3D geometry, as shown in FIGS. 2C and 2D. With the same 2D precursor (e.g., the circular serpentine pattern, or Kagome lattice), different distributions of bonding sites yield completely different 3D configurations, with widely varying values of R. By comparison to these two factors, the cross-sectional dimensions (i.e. w and t) of the precursor have minor effect. For 3D mesostructures that exhibit a bending dominated mode (e.g., the flower and two-layer flower of FIG. 2C), R is insensitive to changes in the width or thickness (FIG. 16). For bending-twisting mixed modes (e.g., straight helix in FIG. 1B and circular helix in FIG. 2D), the width and thickness can lead to changes in R, but with magnitudes insufficient to induce a transition into the bending dominated mode.

Figure 3A:
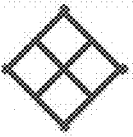
FIG. 3A-3B: 3D mesostructures with multilevel configurations and/or extended network architectures.

Multiple, hierarchical scales of buckling are also possible, with appropriate designs. Examples of 3D mesostructures that have multi-level constructions in the out-of-plane direction are presented in FIG. 3A. Such layouts can be achieved by adding filamentary ribbons to 2D precursors that yield single-level 3D shapes like those of FIG. 2A-2D. In the most extreme examples, these additional ribbons connect the precursor structures together at regions where the assembly process would otherwise yield the maximum out-of-plane displacements. Upon release of strain in the assembly platform, these ribbons, such as those that form the cross in the double-floor tent structure, or the array of vertical ribbons in the peacock and gallery structures, or the horizontally aligned serpentine ribbons in the double-floor helix structure, undergo an additional level of buckling to form an elevated '2nd floor' suspended above the reach of buckling that represents the '1st floor'. This process significantly extends the maximum elevation above the substrate, thereby enhancing the 3D nature of the system. The triple-floor building structure provides a specific example. Here, the maximum out-of-plane displacement is ~1 mm for assembly using a biaxial prestrain of ~100%. This distance is up to ~2 times larger than the maximum in-plane extent of the structure.

Figure 3B:
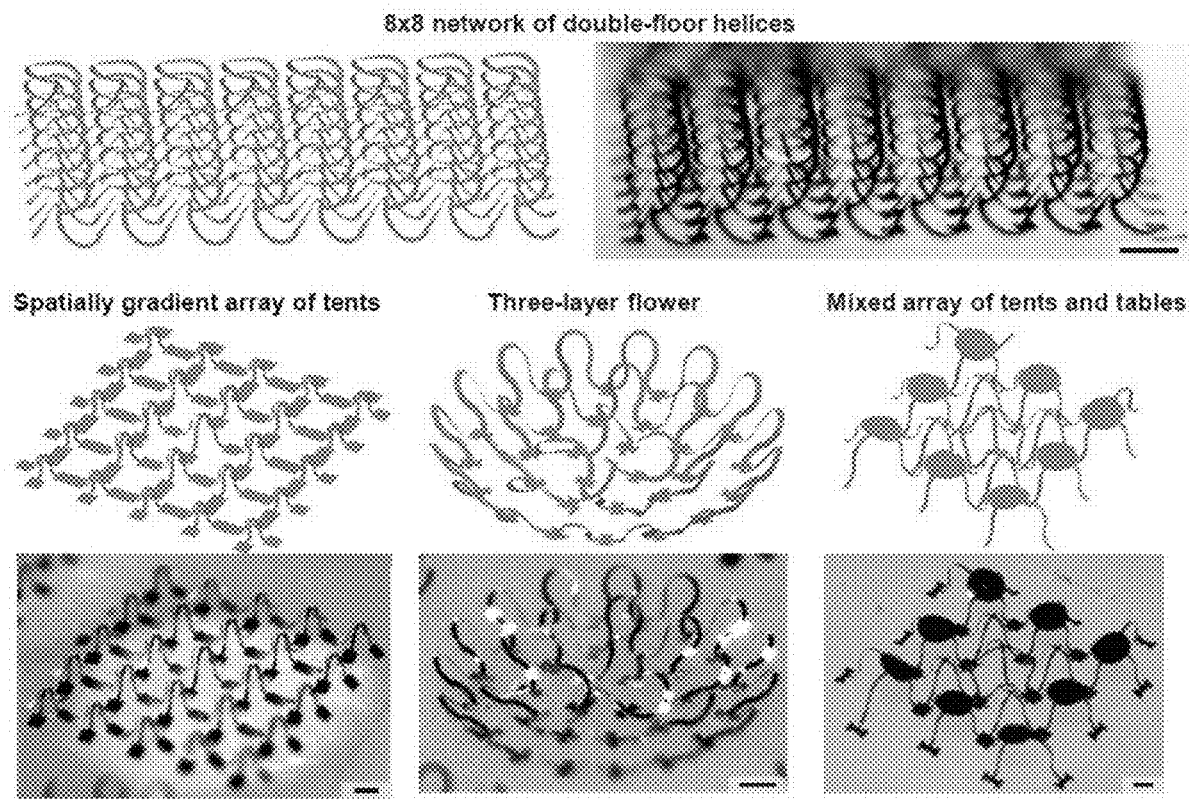
Figure 17:
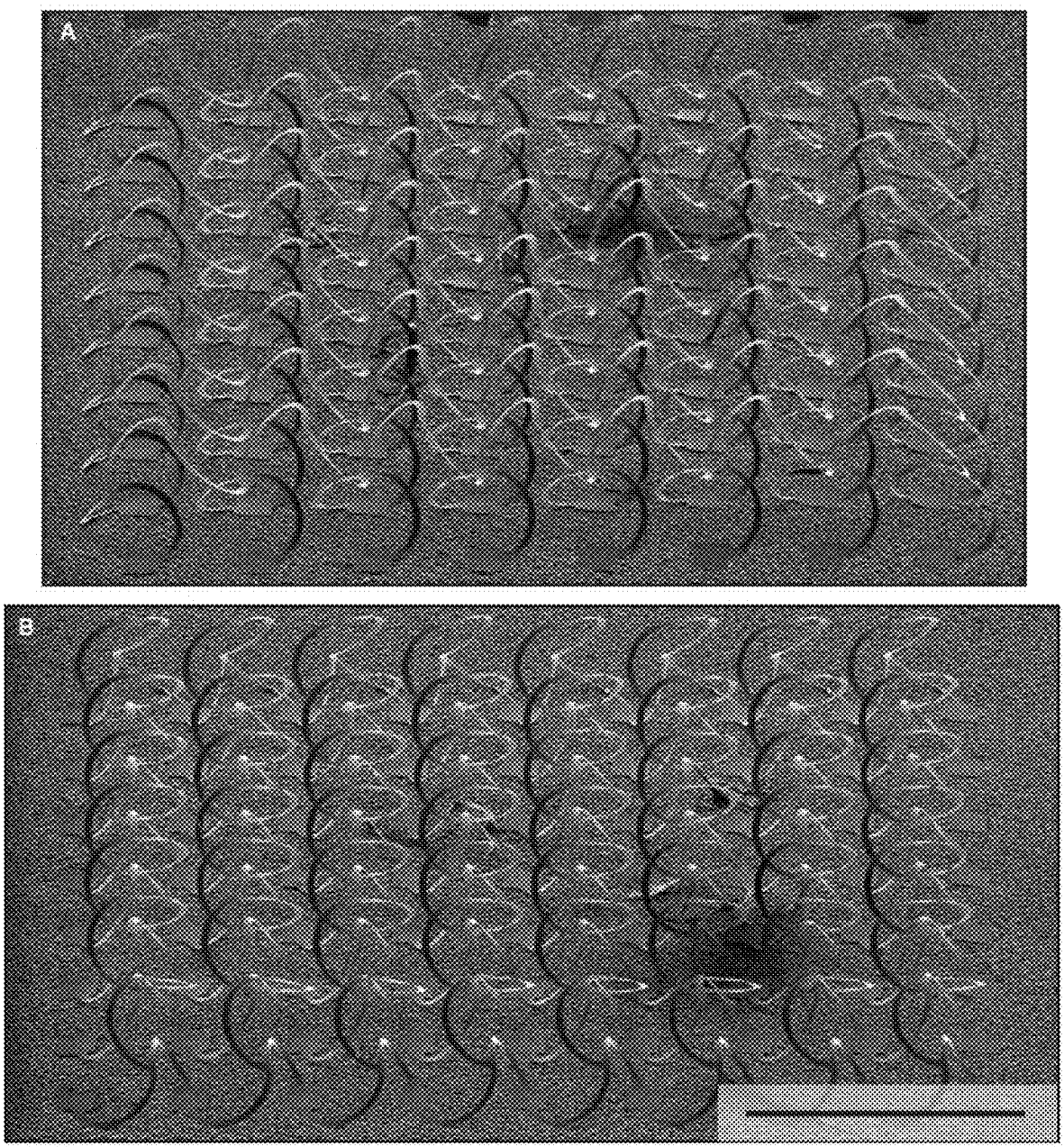
FIG. 17: SEM images with orthogonal viewing angles of the 8×8 array of the double-floor helix structure, to highlight (A) 8 evenly spaced helices on the 1st floor, and (B) another 8 evenly spaced helices on the $2^{nd}$ floor. The scale bar is 1 mm.
Figure 18:
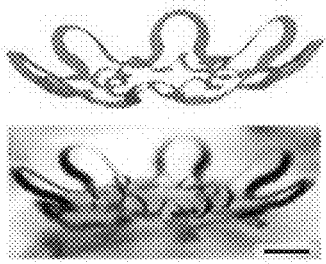
FIG. 18: Various 3D pop-up structures and their corresponding FEA results that do not appear in FIG. 2 or 3. (A) Basic 3D ring structure, and three 3D structures (ring, inverted flower II, inverted flower III, scaffold, double-floor building, and coil on a gallery) generated by hierarchical buckling. (B) Advanced assembly of two different types of 3D structures. The scale bars in all images are 200 μm.
Figure 18:
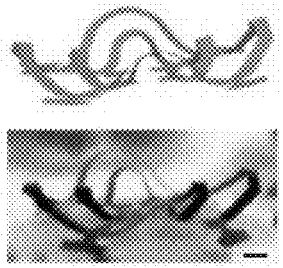
Figure 19:
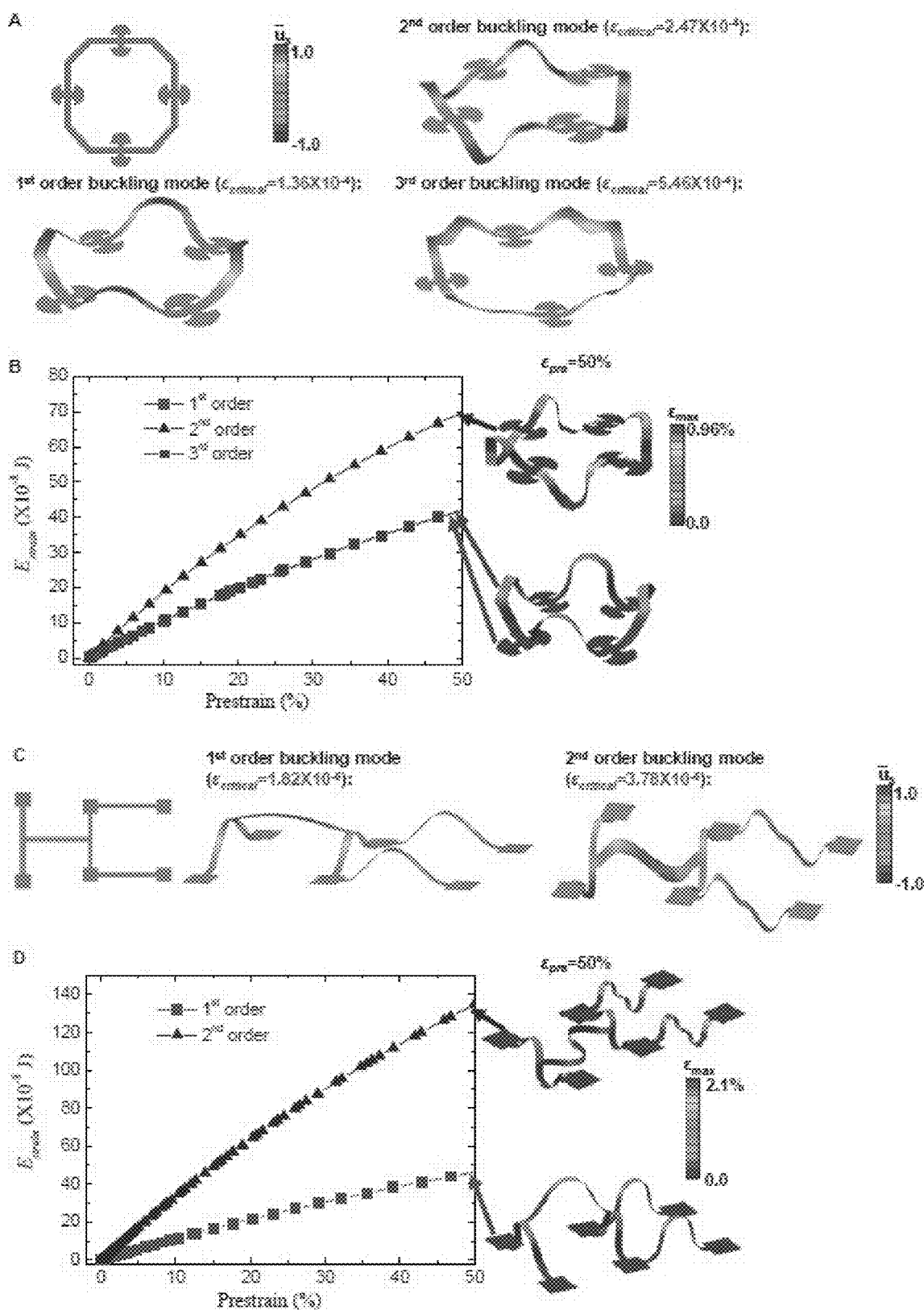
FIG. 19: Uniqueness of the 3D structures. (A) 2D precursor of a folded box and its lowest 3 orders buckling modes, where the critical buckling strains (of substrate prestretch) are 0.014%, 0.025% and 0.055%. (B) Strain energy as a function of prestrain for the lowest 3 orders buckling modes, in which the 3rd order mode cannot stabilize and therefore transforms rapidly into the 1st order mode as the compression proceeds. (C) 2D precursor of the two-floor building and its lowest 2 orders buckling modes, where the critical buckling strains (of substrate prestretch) are 0.0018% and 0.0038%. (D) Strain energy as a function of prestrain for the lowest 2 orders buckling modes. The color in (A) and (C) denotes the normalized out-of-plane displacement, and that in (B) and (D) denotes the maximum principal strain. The 1st order mode always corresponds to the lowest strain energy. Therefore, in the absence of defects that coincide with the 2nd order mode, the 1st order mode will be the unique solution. This conclusion is consistent with experimental observations.

The 3D mesostructures shown in FIGS. 2A-2D and 3A can be viewed as building blocks, where repeating, mixing, joining and/or nesting them together can yield large-scale, interconnected 3D mesoscale networks. A range of examples are provided in FIG. 3B. The top frame shows an 8×8 array of the double-floor helix structure that consists of 8 evenly spaced helices on the 1st floor, and another 8 helices, with the axial direction rotated by 90°, on the 2nd floor (FIG. 17). The bottom left frame illustrates a 5×5 array of the 3D tent structure, with a spatial gradient in the height, such that the largest tent appears at the center, and smaller ones reside at the outermost peripheral regions. The bottom middle frame shows a dual, nested 3D flower structure, with a four-fold symmetric toroid at the center. The fourth example corresponds to a mixed array consisting of four regular table structures, four tilted tables, four tents, and one double-floor tent at the center. Others appear in FIG. 18. All such networks exhibit geometries that agree quantitatively with FEA predictions. An important point is that all 3D mesostructures, even those with the highest complexity and largest extent in the out-of-plane direction, are deterministic and form consistently into unique geometries because the strain energies of the 1st order buckling modes (i.e., energetically the most probable configuration) are lower than those of all other modes by ~2 times or more (FIG. 19).

Figure 4:
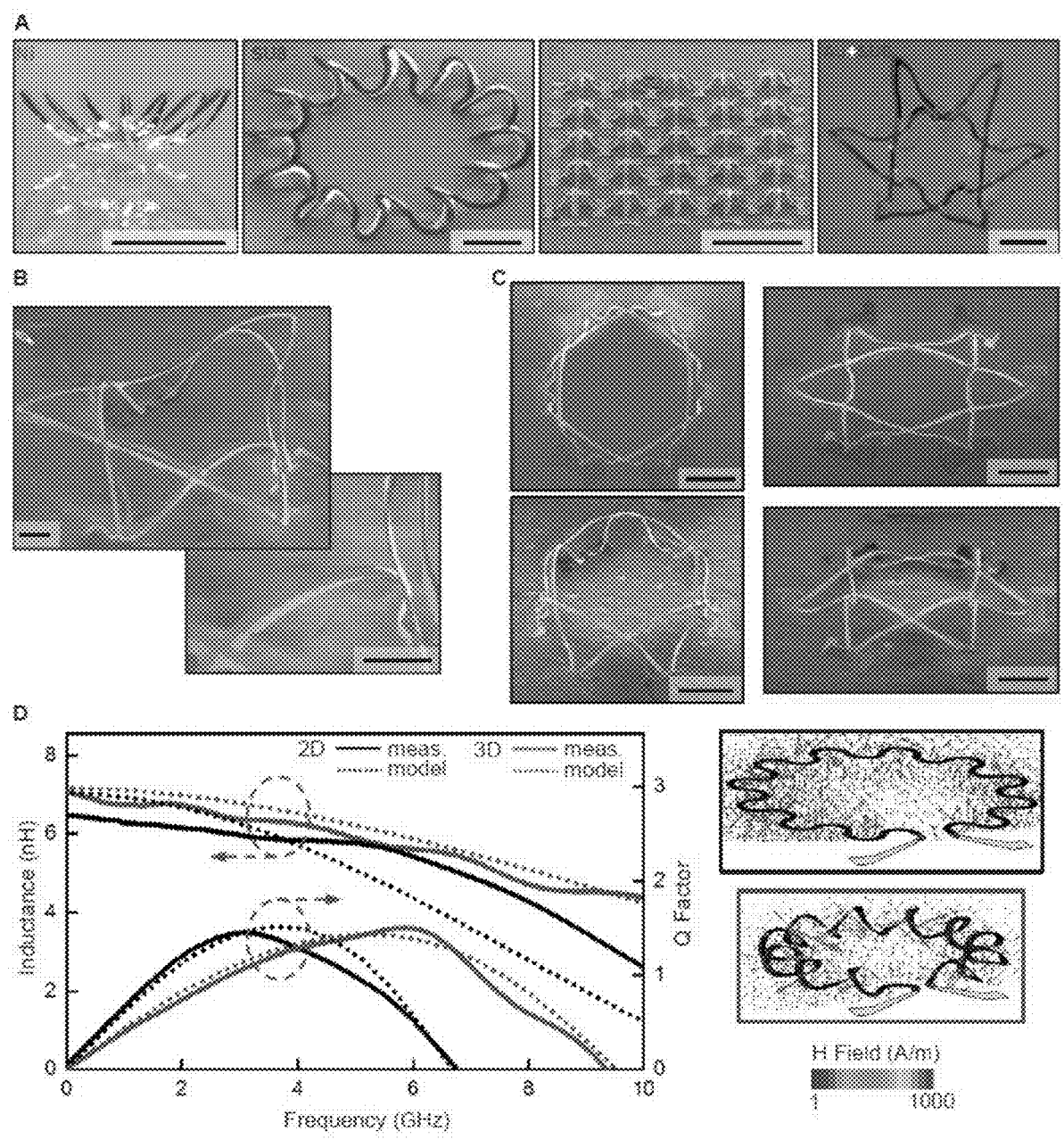
FIG. 4: 3D structures with various material compositions and dimensions between nanometers to millimeters, and experimental and computational results for electrical behaviors in a 3D toroidal inductor. (A) Experimental images and overlaid FEA predictions of 3D mesostructures made of metal (Ni), polymer (SU8 and PI), and heterogeneous combinations of materials (Au and SU8). (B) 3D mesostructures of silicon with lateral dimensions and thicknesses in the sub-micron regime, with overlaid FEA predictions. (C) 3D mesostructure of silicon in its as-fabricated state (left column), and in configurations that result from uniaxially stretching the substrate (right column), all with overlaid FEA predictions. The scale bars in (A), (B) and (C) are 500 μm, 5 μm and 50 μm, respectively. (D.) Measured and computed frequency dependence of the inductance and the Q factor of a 3D toroidal inductor and its corresponding 2D precursor. The frames on the right show simulated magnetic field distributions of these structures for 1 W feed-in power.
Figure 20:
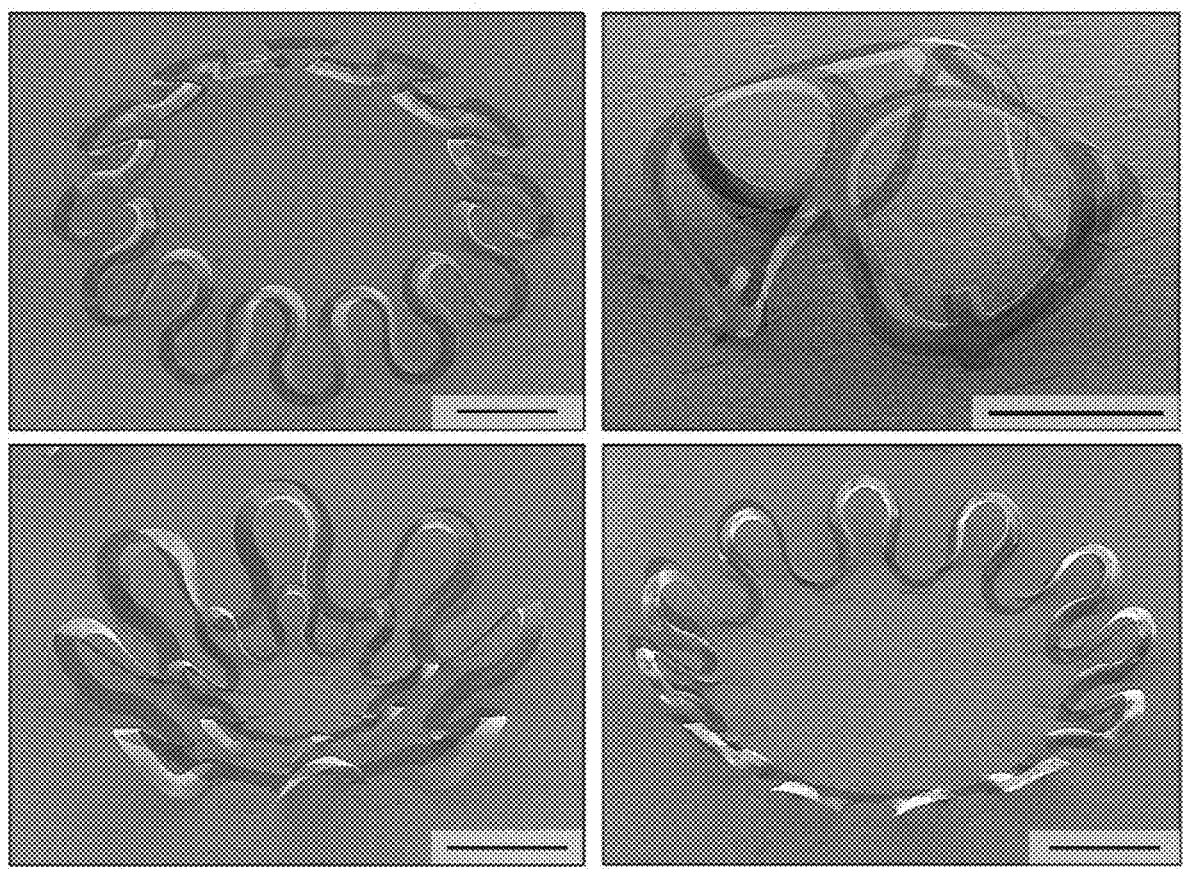
FIG. 20: Experimental images and overlaid FEA predictions of various 3D pop-up structures made from SU8. The scale bars in all images are 500 μm.
Figure 21:
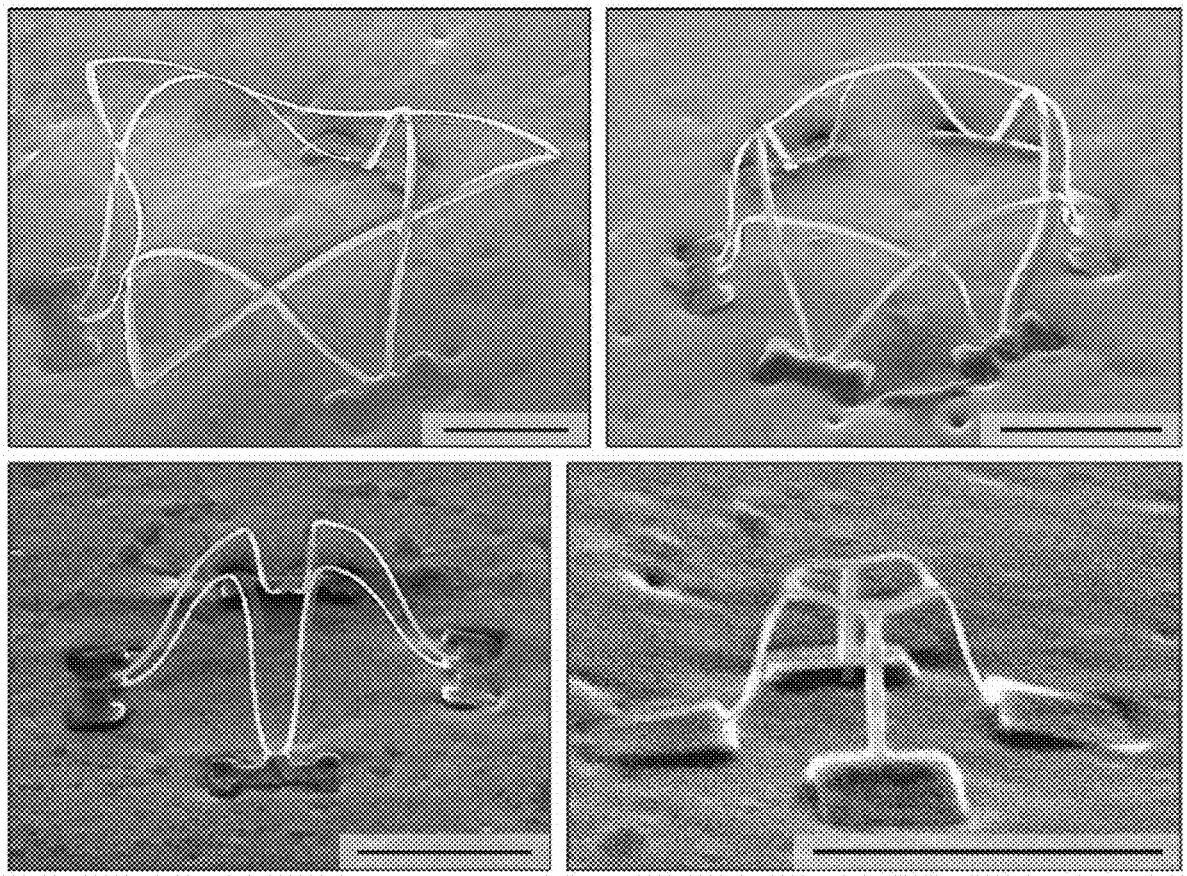
FIG. 21: Experimental images and overlaid FEA predictions of various sub-microscale 3D pop-up structures made from Si, with the ribbon width at ~800 nm and the ribbon thickness at ~100 nm. The scale bars in all images are 15 μm.
Figure 22:
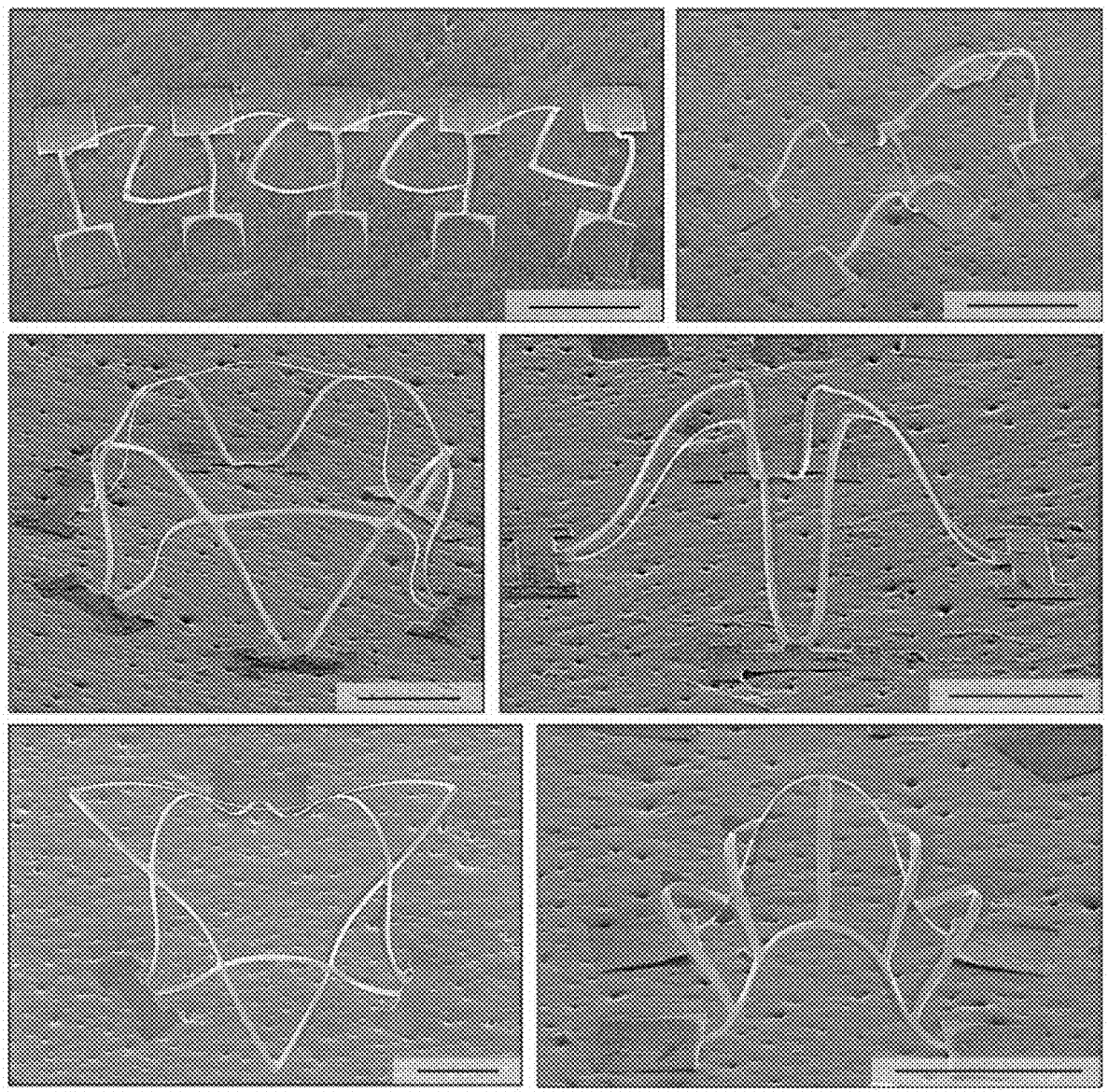
FIG. 22: Experimental images and overlaid FEA predictions of various small-scale 3D pop-up structures made from Si, with the ribbon width at ~3 μm and the ribbon thickness at ~300 nm. The scale bars in all images are 50 μm.
Figure 23:
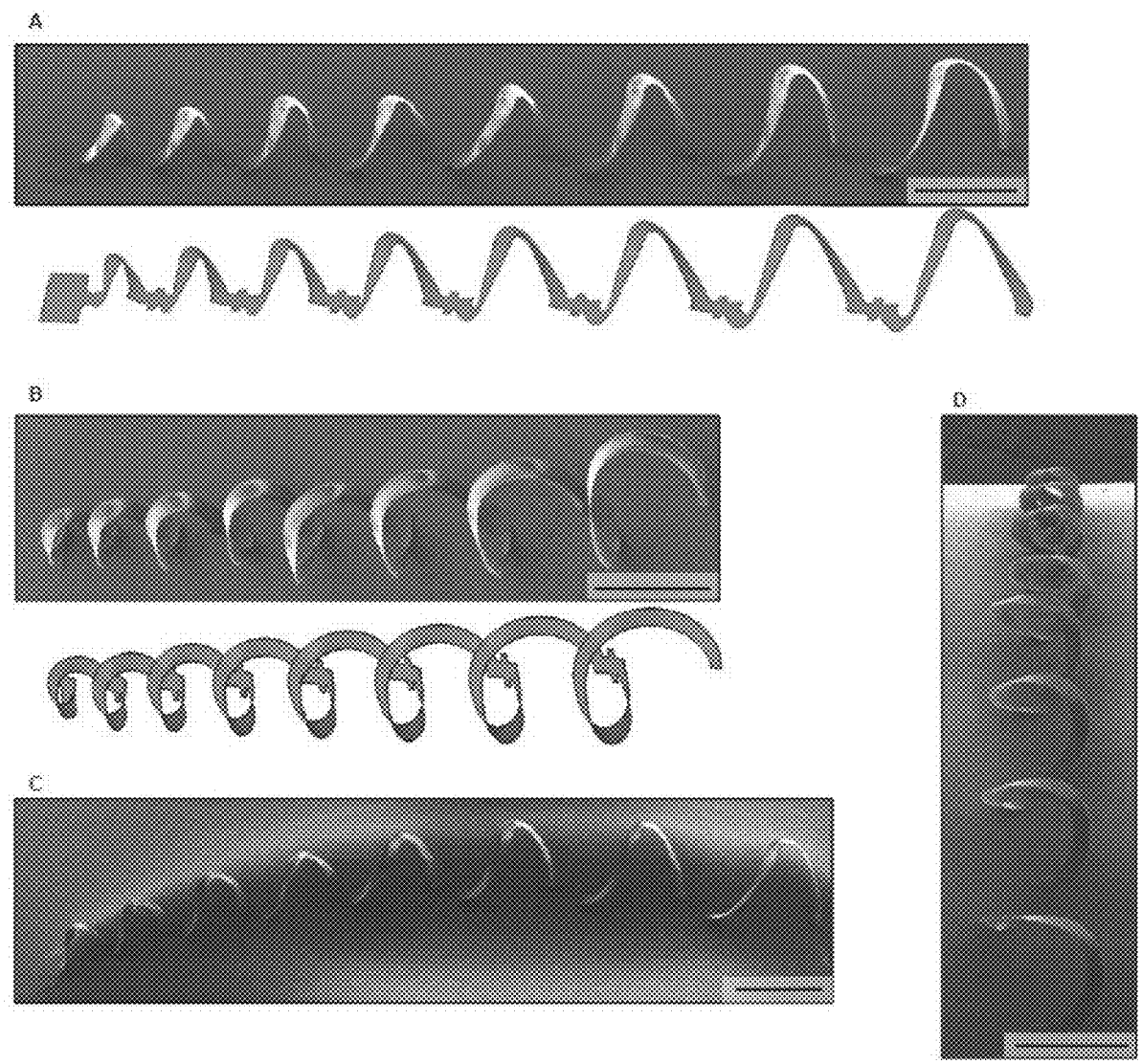
FIG. 23: (A) and (B) demonstrate SEM images and FEA predictions of a 8-period gradient SU8 coil on a planar surface. (C) and (D) provide SEM images of the same sample in (A) and (B), which is conformally placed on a curvilinear pen surface, with a bending radius of 5 mm. The scale bars in all images are 400 μm.

Summarized in FIGS. 4A and 20 are results that illustrate the applicability of this assembly approach to additional classes of materials, including metals (e.g. Ni), dielectrics (e.g. polyimide and epoxy) and patterned combinations of these, in single crystalline, polycrystalline, and amorphous forms. Sub-micron features are also possible, as demonstrated in a 'starfish' framework that incorporates silicon ribbons with widths of 800 nm and thicknesses of 100 nm (FIG. 4B). Several more examples of sub-micron features are provided in FIG. 21. Here, the large differences in contact areas between the filaments and the bonding sites provide the necessary contrast in adhesion. The same strategy also enables the assembly of micron-sized 3D silicon features with the ribbon widths of 3 μm and thicknesses of 300 nm (FIG. 22). In these and all other cases, mechanical strain applied to the assembly platforms can affect reversible, controlled changes in the geometries of the supported structures. The results in FIG. 4C show top and angled views of the influence of uniaxial tensile deformation (50%) on a structure with a variant of the 'starfish' layout, in which all six tip corners serve as sites for bonding. Overlaid FEA results demonstrate quantitative agreement with the observed geometries. Results in FIG. 23 demonstrate that the 3D mesostructures are bendable and can be placed on curved surfaces.

The ability to naturally integrate state-of-the-art electronic materials and devices represents an essential, defining characteristic of these approaches. A mechanically tunable inductor based on a 3D toroidal structure with feed and ground lines, all constructed with polyimide encapsulation (1.2 µm) and Ni conducting layers (400 nm), provides an example. Here, the geometry is similar to the 'circular helix III' in FIG. 2D, with the addition of contact pads located at the periphery for electrical probing. The graph of FIG. 4D shows measurements and modeling results for the frequency dependence of the inductance and the quality (Q) factor for the 2D closed loop serpentine precursor and the corresponding 3D toroid formed using 54% prestrain. The 3D cage structure leads to an enhanced mutual inductance between adjacent twisted turns. The maximum Q factors are comparable (~1.5) but the 3D structure has much higher resonant frequency (~9 GHz) than the 2D precursor due to the reduced substrate parasitic capacitive effect (25). The measured results correspond well to modeling that involves computation of the electromagnetic properties associated with the predicted 3D structure from FEA, as shown in the right panels of FIG. 4D. Details can be found in the Supplementary Text and FIGS. 24 to 27.

As suggested by this simple 3D inductor, the ideas introduced here foreshadow powerful options in 3D micro/nanosystem design. Compatibility with materials and planar processing methods that have emerged from a half century of global research and development in the semiconductor and photonics communities suggest the possibility for sophisticated 3D electronic, optoelectronic, and electromagnetic systems. Exploring the full range of addressable topologies and developing inverse design algorithms will yield improved understanding of and access to the complete types of structures that are possible. Additional options may follow from the combined use of such high-performance 3D frameworks with features, such as electrical interconnects, passive photonic elements or structural components, derived using complementary techniques such as 3D ink writing and/or optical exposures. Active scaffolds that incorporate sensors, actuators, transducers and, potentially, pumped microfluidic systems could provide compelling modes of operation when used in and/or on biological systems. In such cases, bioresorbable devices based on silicon and other water-soluble, biocompatible electronic materials could also be interesting.

REFERENCES AND NOTES

1. P. X. Gao et al., Science 309, 1700-1704 (2005).
2. X. Y. Kong, Y. Ding, R. Yang, Z. L. Wang, Science 303, 1348-1351 (2004).
3. D. Y. Khang, H. Q. Jiang, Y. Huang, J. A. Rogers, Science 311, 208-212 (2006).
4. T. A. Schaedler et al., Science 334, 962-965 (2011).
5. C. N. LaFratta, J. T. Fourkas, T. Baldacchini, R. A. Farrer, Angewandte Chemie-International Edition 46, 6238-6258 (2007).
6. S. Kawata, H. B. Sun, T. Tanaka, K. Takada, Nature 412, 697-698 (2001).
7. Y. G. Sun, W. M. Choi, H. Q. Jiang, Y. G. Y. Huang, J. A. Rogers, Nat. Nanotechnol. 1, 201-207 (2006).
8. B. Tian et al., Nature Mater. 11, 986-994 (2012).
9. J. Kim, J. A. Hanna, M. Byun, C. D. Santangelo, R. C. Hayward, Science 335, 1201-1205 (2012).
10. W. L. Noorduin, A. Grinthal, L. Mahadevan, J. Aizenberg, Science 340, 832-837 (2013).
11. S. Babaee et al., Adv. Mater. 25, 5044-5049 (2013).
12. V. Penmatsa et al., Nanoscale 4, 3673-3678 (2012).
13. X. Zheng et al., Science 344, 1373-1377 (2014).
14. D. Jang, L. R. Meza, F. Greer, J. R. Greer, Nature Mater. 12, 893-898 (2013).
15. J. Zang et al., Nature Mater. 12, 321-325 (2013).
16. Q. Chen, S. C. Bae, S. Granick, Nature 469, 381-384 (2011).
17. E. Gonzalez, J. Arbiol, V. F. Puntes, Science 334, 1377-1380 (2011).
18. X. M. Mao, Q. Chen, S. Granick, Nat. Mater. 12, 217-222 (2013).
19. O. G. Schmidt, K. Eberl, Nature 410, 168-168 (2001).
20. W. Gao et al., Nano Lett. 14, 305-310 (2013).
21. J. A. Rogers, M. G. Lagally, R. G. Nuzzo, Nature 477, 45-53 (2011).
22. D. C. Duffy, J. C. McDonald, 0. J. A. Schueller, G. M. Whitesides, Anal. Chem. 70, 4974-4984 (1998).
23. D. H. Kim et al., Science 333, 838-843 (2011).
24. S. P. Timoshenko, J. M. Gere, New York; McGraw-Hill, (1961).
25. C. P. Yue, S. S. Wong, IEEE Trans. Electron Devices 47, 560-568 (2000).

Supplementary Materials

Materials and Methods

Fabrication Methods of 3D Mesostructures in Silicon, Metal, Polyimide (Pl), Photodefinable Epoxy (SU8) and Combinations of these Materials.

Figure 7:
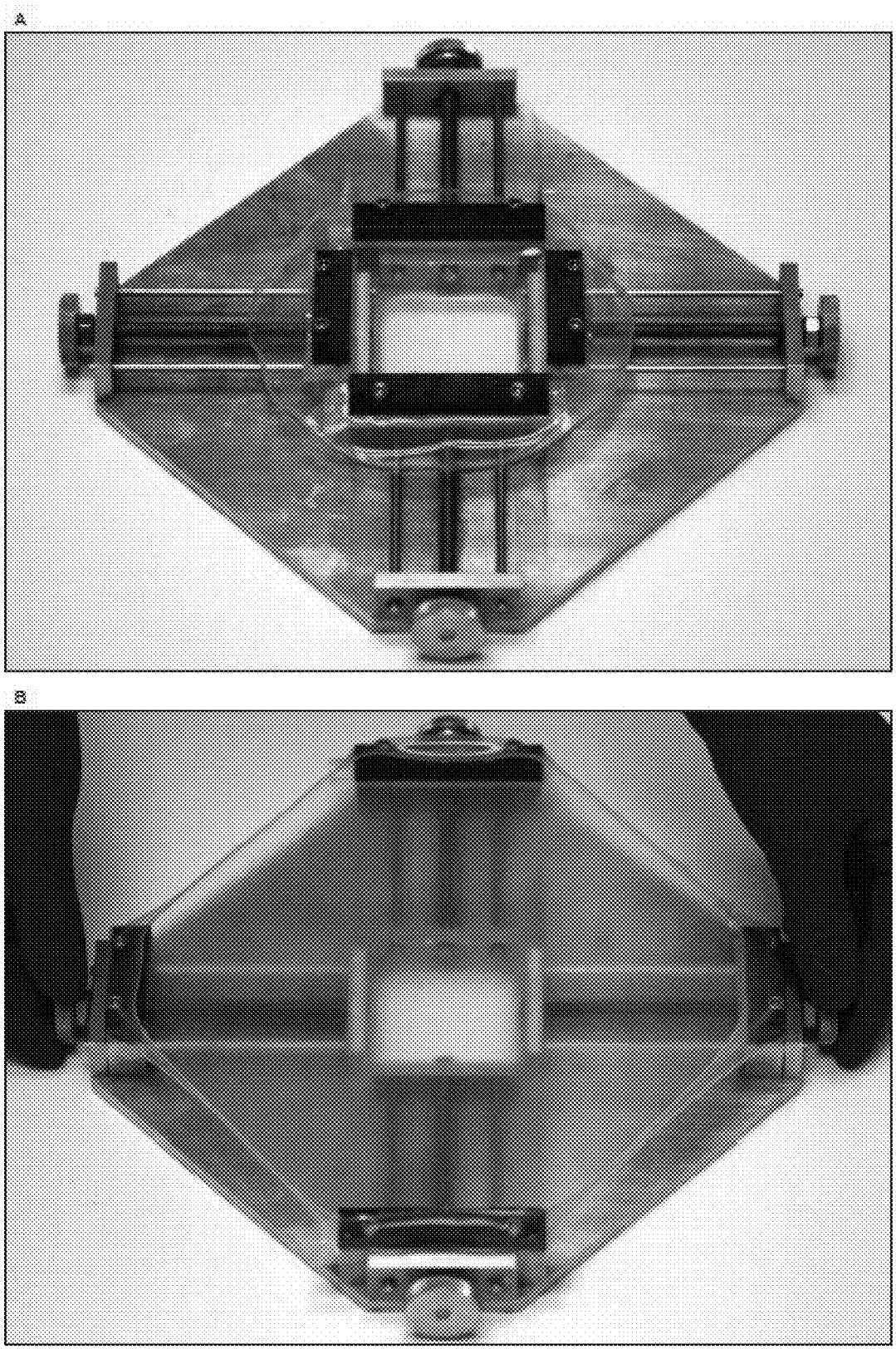
FIG. 7: Optical images of a customized equal-biaxial stretching stage with an elastomer assembly platform, (A) before and (B) after prestraining to 120%. Here, Dragon Skin (Smooth-On Inc.) is used as the elastomer substrate.

Preparation of most of the 3D silicon mesostructures began with photolithography and reactive ion etching (RIE) of the top silicon layer on a silicon on insulator (SOI) wafer. Immersion in hydrofluoric acid (HF) removed the buried oxide from the exposed regions and also slightly under the edges of the patterned silicon. Spin casting formed a uniform coating (~100 nm) of polytetrafluoroethylene (PTFE) across the substrate and into the undercut regions. Photolithography and wet etching of a thin (50 nm) layer of gold deposited by electron beam evaporation yielded a mask for patterning the PTFE by RIE. Following removal of the gold, immersion in HF eliminated the remaining buried oxide by complete undercut etching. The PTFE at the edge regions tethered the silicon structures to the underlying wafer. A schematic illustration of the steps is provided in FIG. 6. The techniques of transfer printing enabled retrieval of the silicon and delivery to a piece of water soluble tape (polyvinyl alcohol, PVA). A thin (~0.5 mm) sheet of silicone served as the assembly platform, stretched to well-defined levels of prestrain (either uniaxial or biaxial, up to levels exceeding ~100%) using a customized stage (FIG. 7). Exposing the prestrained elastomer and the 2D silicon precursor (on PVA) to ozone created by ultraviolet light (UVO) yielded hydroxyl termination on their exposed surfaces. Laminating the tape onto the elastomer with the exposed silicon side down, followed by baking in an oven at 70° C. for ~10 min yielded strong covalent bonds between the silicone and the exposed regions of the silicon. Washing with hot water for ~δ min dissolved away the tape. Drying the sample and then slowly releasing the prestrain completed the 3D assembly process.

Preparation of 3D silicon mesostructures with dimensions in the micron and sub-micron regimes began with deep-UV photolithography to form patterns of poly(methyl methacrylate) (PMMA) on SOI wafers (300 nm and 100 nm thicknesses of silicon for micron and sub-micron cases, respectively). RIE then removed the exposed regions of the top silicon to define the 2D precursors. Following dissolution of the PMMA in acetone, immersion in HF eliminated the buried oxide layer. Transfer printing onto PVA followed by exposure to UVO and execution of process steps similar to those described above completed the assembly.

Preparation of 3D mesostructures in metal began with spin casting a layer of PMMA on a silicon wafer followed by deposition of a coating of $SiO_2$ (50 nm) by electron beam evaporation. Photolithography and RIE patterned the $SiO_2$ into geometries that defined the bonding sites. Spin casting formed a uniform overcoat of polyimide (Pl; 1.2 mm). The metal consisted of Ni (600 nm) deposited by electron beam evaporation onto the Pl. Photolithography and etching defined the geometries of 2D precursors in the metal. Spin casting then yielded an additional overcoat of Pl. A thin layer of copper (50 nm) deposited on the Pl by electron beam evaporation and patterned by photolithography and wet etching served as a hard mask for oxygen plasma etching of the Pl. The residual copper was then removed. Immersion in hot acetone partially dissolved the underlying PMMA layer, thereby allowing the entire structure to be retrieved from the silicon wafer and transferred to a stretched silicone substrate for 3D assembly.

Preparation of 3D mesostructures in Pl began with spin casting a layer of PMMA (50 nm) followed by a layer of Pl (4 mm) on a silicon wafer. Photolithography and RIE patterned the Pl into geometries of the 2D precursors. After removing the PMMA by immersion in acetone, photolithography defined a pattern of photoresist (400 nm) on the Pl. Retrieving the structure from the silicon wafer, exposing it to UVO, transferring it to a stretched elastomer and washing away the photoresist configured the system for 3D assembly.

Preparation of 3D mesostructures in a photodefinable epoxy (SU8) began with the deposition of a layer of $SiO_2$ (500 nm) on a silicon wafer by electron beam evaporation. Spin casting formed a layer of SU8 (4 μm) on the top of the $SiO_2$. Photopatterning the SU8 defined the geometries of the 2D precursors. Immersion in buffered oxide etch (BOE) removed the $SiO_2$ from the exposed regions and also slightly from under the edges of the SU8. Photolithography created a pattern of photoresist (1.6 μm) on the SU8. BOE eliminated the remaining $SiO_2$ by complete undercut etching. The remaining steps followed procedures described above.

Preparation of 3D mesostructures that include both Au and SU8 began with deposition of a layer of $SiO_2$ (500 nm) on a silicon wafer by electron beam evaporation. Photopatterning the SU8 (4 μm) defined the geometries of the 2D precursors. Photolithography and lift-off created patterns of chromium (5 nm) and gold (50 nm) deposited by electron beam evaporation on top of the SU8. Spin-casting and photopatterning formed a thin (500 nm) overcoat of SU8 in a matching geometry. The remaining steps followed procedures described above.

Supplementary Text

1. Finite Element Analysis (FEA)

Full three-dimensional (3D) FEA was adopted to analyze the post-buckling behaviors of 2D structures (filamentary ribbons made of silicon, metal or polymer) under compressive forces associated with selective bonding to an elastomeric substrate (Dragon Skin; thickness 0.5 mm) that is subsequently released from a state of uniaxial or biaxial prestrain. The elastic modulus (E) and Poisson's ratio (v) are $E_{substrate}$=166 kPa and $v_{substrate}$=0.49 for substrate; $E_{Si}$=130 GPa and $v_{Si}$=0.27 for Silicon; $E_{Ni}$=200 GPa and $v_{Ni}$=0.31 for Nickel; $E_{SU8}$=4.02 GPa and $v_{SU8}$=0.22 for SU8; and $E_{Pl}$=2.5 GPa and $v_{Pl}$=0.34 for Pl. Eight-node 3D solid elements and four-node shell elements were used for the substrate and filamentary ribbons, respectively, and refined meshes were adopted to ensure the accuracy. Linear buckling analyses were carried out to determine the critical buckling strain and lowest buckling mode for the filamentary ribbons, which were then implemented as initial geometric imperfections in the post-buckling simulation. The deformed configurations of various 2D precursors were obtained from FEA under uniaxial or biaxial stretch, as shown in FIGS. 1-5, 8, 18 and 20-23. The agreement between FEA and experiment is remarkably good. The maximum principal strain during the post-bucking process can be also calculated; the results are consistent with the analytic model in FIG. 10. The average twisting curvature ($K_{twist}$) and bending curvature ($K_{bend}$) are also calculated from FEA, which can be then used to determine the magnitude of mode ratio (R) for different 3D architectures, based on $R=K_{twist}/k_{bend}$.

2. Analytic Model of the Geometrical Configuration of a 3D Helix

A simplified analytic model was developed to describe the geometrical configuration of the central axis of the 3D helix formed from our controlled buckling approach. Consider a serpentine wire consisting of two arcs, each with the radius of $r_0$ and top angle of $\theta_0$, as shown in FIG. 9A. A Cartesian coordinate system has its origin at the left end of the wire, where the x and z axes correspond to the axial and out-of-plane direction of the serpentine wire. A parametric coordinate θ denotes the location of the central axis of the arcs, such that $\theta \epsilon [0, \theta_0]$ and $[\theta_0, 2\theta_0]$ represent the first and second arc, respectively. The initial configuration of the central axis can be denoted by the following parametric equation, $$\begin{cases} x_0 = r_0 \left[ \sin\frac{\theta_0}{2} - \sin\left(\frac{\theta_0}{2} - t\right) \right] \\ y_0 = r_0 \left[ \cos\left(\frac{\theta_0}{2} - t\right) - \cos\frac{\theta_0}{2} \right] \\ z_0 = 0 \end{cases} \quad (S1a)$$

$0 \le t \le \theta_0$, and $$\begin{cases} x_0 = r_0 \left[ 3\sin\frac{\theta_0}{2} + \sin\left(\frac{\theta_0}{2} - t\right) \right] \\ y_0 = r_0 \left[ \cos\left(\frac{\theta_0}{2} - t\right) - \cos\frac{\theta_0}{2} \right] \\ z_0 = 0 \end{cases} \quad (S1b)$$

$\theta_0 \le t \le 2\theta_0$

In the controlled buckling approach, the two ends of the serpentine wire are bonded to the prestretched substrate. Upon release of the prestrain ($\varepsilon_{pre}$), the ultrathin serpentine wire undergoes compressive strain $\varepsilon_{compr}=\varepsilon_{pre}/(1+\varepsilon_{pre})$ leading to its buckling, as shown in FIG. 9B. This process can release the relatively large strain energy associated with in-plane bending. During this post-buckling process, the displacement ($u_2$) along the y axis is negligible since the compression lies along the x axis and the buckling mainly induces out-of-plane displacements (along the z axis). This expected behavior is consistent with FEA results (FIG. 9C), in which the displacement component ($u_2$) is much smaller than the other two components. FEA results (FIG. 9C) also indicate that the displacement component ($u_3$) can be characterized by a cosine function $u_3=br_0[1-\cos(\pi t/\theta_0)]$, with the non-dimensional parameter b to be determined. The axial displacement ($u_1$) consists of two parts, a uniform part ($u_{1non-uniform}=-\varepsilon_{pre}x_0(t)/(1+\varepsilon_{pre})$) due to the global compression from two ends, and a non-uniform part ($u_{1non-uniform}$) due to the local bending and twisting. FEA results (FIG. 9D)

indicate that the non-uniform part ($u_1$) can be described well by a sinusoidal function, $u_{1non-uniform}=-c_1 r_0 \sin(\pi t/\theta_0)$, with the parameter $c_1$ to be determined. FEA calculations also show that $c_1$ is approximately proportional to the compressive strain, i.e., $c_1=c_2(\theta_0)\varepsilon_{compr}$, and is almost independent of the material parameters and cross-sectional geometric parameters (width and thickness). Based on these observations, the deformed configuration of the 3D helix can be written as $$\begin{cases} x = \dfrac{r_0}{1+\varepsilon_{pre}}\left[\sin\dfrac{\theta_0}{2} - \sin\left(\dfrac{\theta_0}{2} - t\right)\right] + \\ \qquad \dfrac{c_2(\theta_0)\varepsilon_{pre} r_0}{1+\varepsilon_{pre}} \sin\dfrac{\pi t}{\theta_0} \\ y = r_0\left[\cos\left(\dfrac{\theta_0}{2} - t\right) - \cos\dfrac{\theta_0}{2}\right] \\ z = b r_0\left(1 - \cos\dfrac{\pi t}{\theta_0}\right) \end{cases} \quad (S2a)$$

$0 \le t \le \theta_0$, and $$\begin{cases} x = \dfrac{r_0}{1+\varepsilon_{pre}}\left[\sin\dfrac{\theta_0}{2} + \sin\left(\dfrac{\theta_0}{2} - t\right)\right] + \\ \qquad \dfrac{c_2(\theta_0)\varepsilon_{pre} r_0}{1+\varepsilon_{pre}} \sin\dfrac{\pi t}{\theta_0} \\ y = r_0\left[\cos\left(\dfrac{\theta_0}{2} - t\right) - \cos\dfrac{\theta_0}{2}\right] \\ z = b r_0\left(1 - \cos\dfrac{\pi t}{\theta_0}\right) \end{cases} \quad (S2b)$$

$\theta_0 \le t \le 2\theta_0$.

The pitch of the 3D helix is $4r_0 \sin(\theta_0/2)/(1+\varepsilon_{pre})$. Because the wire is highly flexible, its membrane strain can be neglected, such that the total arc length along the central axis will remain unchanged during the post-buckling. The associated requirement can be written as $$2\int_0^{\theta_0}\sqrt{(dx/dt)^2+(dy/dt)^2+(dz/dt)^2}\,dt = 2\theta_0 r_0. \quad (S3a)$$

which can be re-arranged to $$\int_0^{\theta_0}\sqrt{\left[\dfrac{\cos\left(t-\dfrac{\theta_0}{2}\right)}{1+\varepsilon_{pre}} + \dfrac{c_2(\theta_0)\varepsilon_{pre}}{1+\varepsilon_{pre}}\dfrac{\pi}{\theta_0}\cos\dfrac{\pi t}{\theta_0}\right]^2 + \sin^2\left(t-\dfrac{\theta_0}{2}\right) + b^2\left(\dfrac{\pi}{\theta_0}\right)^2\sin^2\dfrac{\pi t}{\theta_0}}\,dt = \theta_0. \quad (S3b)$$

Solving Eq. (S3b) defines the non-dimensional parameter b for a given $\varepsilon_{pre}$ and $\theta_0$, noting that $c_2$ is calculated by FEA. For $\theta_0=3\pi/4$ and $\varepsilon_{pre}=90\%$ used in the experiment of straight helix (FIGS. 1B and 8), the parameters are $b=0.85$ and $c_2=0.35$. The corresponding configurations of the 3D helix derived using this analytic model appear in FIG. 8. The results agree well with experiment and FEA. Note that straight wires were between each unit cell in FIG. 8 to capture the effects of the bonding sites adopted in the experiment.

3. Analytic Model for the Maximum Strain in a 3D Silicon Helix During Post-Buckling The effects of geometric parameters on the maximum strain in the 3D silicon helix were analyzed, and a scaling law for the maximum thickness to avoid fracture of the structure was determined. The twisting and out-of-plane bending strains during the post-buckling process are proportional to the thickness, while the in-plane bending strain is proportional to the width (29, 30). Assuming elastic behavior, the maximum principal strain in the post-buckling regime can be expressed as $$\varepsilon_{max} = F_1(\varepsilon_{compr},\theta_0)\dfrac{t}{r_0} + F_2(\varepsilon_{compr},\theta_0)\dfrac{w}{r_0}, \quad (S4)$$

where $F_1$ and $F_2$ are non-dimensional functions of the compressive strain ($\varepsilon_{compr}$) associated with prestrain in the substrate, and the top angle ($\theta_0$) of arcs in the serpentine wire. The strain component induced by out-of-plane bending and twisting is linearly proportional to the square root of the compressive strain during post-buckling (30), i.e., $F_1 \sim \sqrt{\varepsilon_{compr}}$. This relation is confirmed by FEA results in FIG. 10A. The numerical results in FIG. 10B also show that the function $F_2$ is linearly proportional to the compressive strain, $\varepsilon_{compr}$, such that Eq. (S4) can be written as $$\varepsilon_{max} = g_1(\theta_0)\sqrt{\varepsilon_{compr}}\dfrac{t}{r_0} + g_2(\theta_0)\varepsilon_{compr}\dfrac{w}{r_0}, \quad (S5)$$

where $g_1$ and $g_2$ are the coefficients of proportionality between $F_1$ and $\sqrt{\varepsilon_{compr}}$ and between $F2$ and $\varepsilon_{compr}$, respectively, and both depend on the top angle ($\theta_0$) of arcs in the serpentine wire. For $\theta_0=3\pi/4$ used in the experiment, $g_1$ and $g_2$ can be calculated as 1.47 and $8.82\times10^{-3}$, based on FEA. With Eq. (S5) and a fracture criterion of $\varepsilon_{max}=\varepsilon_{fracture}$, where $\varepsilon_{fracture}$ is the fracture strain of the serpentine material (e.g., ~2% for silicon), the maximum dimensionless thickness that can be achieved without fracture can be written as $$\dfrac{t_{max}}{r_0} = \dfrac{\varepsilon_{fracture}}{g_1(\theta_0)}\sqrt{\dfrac{1+\varepsilon_{pre}}{\varepsilon_{pre}}} - \dfrac{g_2(\theta_0)}{g_1(\theta_0)}\dfrac{w}{r_0}\sqrt{\dfrac{\varepsilon_{pre}}{1+\varepsilon_{pre}}}, \quad (S6)$$

where the relation between prestrain of substrate and the corresponding compressive strain of serpentine wire is adopted, i.e., $\varepsilon_{compr}=\varepsilon_{pre}/(1+\varepsilon_{pre})$. For a target prestrain level of 100%, the maximum dimensionless thickness ($t_{max}/r_0$) can be calculated based on Eq. (S6), as shown in FIG. 10C. The values decrease slightly with increasing dimensionless width ($w/r_0$), in a linear manner, which agrees with the corresponding FEA results. This result is also consistent with experiment measurements on two different precursor designs, in which the design with $t/r_0=0.0063$ and $w/r_0=0.29$ survives the post-buckling process, and the design with $t/r_0=0.032$ and $w/r_0=0.29$ fractures. Based on the analytic model (Eq. (S6)), it is also possible to obtain the maximum thickness for different levels of prestrain, as shown in FIG. 10D. For a typical dimensionless width of $w/r_0=0.2$, the maximum allowable thickness ($t_{max}$) reduces from ~$0.027 r_0$ to ~$0.015 r_0$, if the target prestrain of substrate increases from 50% to 200%.

4. Energetic Analysis to Estimate the Lower Bound for the Work of Adhesion at the Bonding Regions The bonding regions may delaminate for a thick 2D precursor under a large level of prestrain, or for a precursor with small bonding pads. From the energetic point of view, the failure mode of delamination only occurs if the total potential energy $U_{total}$ for the undelaminated state (i.e., the state of successfully popped-up 3D configuration) is larger than its counterpart, zero, for the delaminated state. Here $U_{total}$ can be expressed as $U_{total} = W_{strain} - A_{bonding}\gamma_{bonding}$, where $W_{strain}$ is the strain energy in the successfully popped-up configuration; the second term corresponds to the adhesion energy, with $\gamma_{bonding}$ representing the work of adhesion at the bonding region, and $A_{bonding}$ the area of bonding pads. For those 3D mesostructures that form successfully in the experiment, the corresponding total potential energy $U_{total}$ should be smaller than zero, which leads to $\gamma_{bonding} \geq W_{strain}/A_{bonding}$. Combined with FEA for the calculations of strain energy, this equation could give an approximate estimation on the lower bound of $\gamma_{bonding}$. Five representative 3D mesostructures are analyzed, including the helices with three different widths (in FIGS. 1B, 1E and 8), the two-layer flower (in FIG. 2C) and the peacock (in FIG. 3A), which suggest the work of adhesion ($\gamma_{bonding}$) to be greater than ~8.2 J/m². This magnitude is comparable to the strong adhesion (~20.6 J/m² or 10.1 J/m²) (31) between graphene and $SiO_x$/Si substrates after using vacuum annealing or rapid thermal annealing to form C—O and C=O chemical bonds at the interface, or the adhesion energy (~7.0 J/m²) (32) between silicon nitride and organosilicate glass films after using UV irradiation to form SiO—N bonds at the interface during the deposition process of silicon nitride, or the adhesion energy (~3.0 J/m²) (33) at the interface of two bonded PMMA chips after using UVO treatment to improve the bonding.

5. Cage Inductor RF Measurement De-Embedding Algorithm

Figure 24:
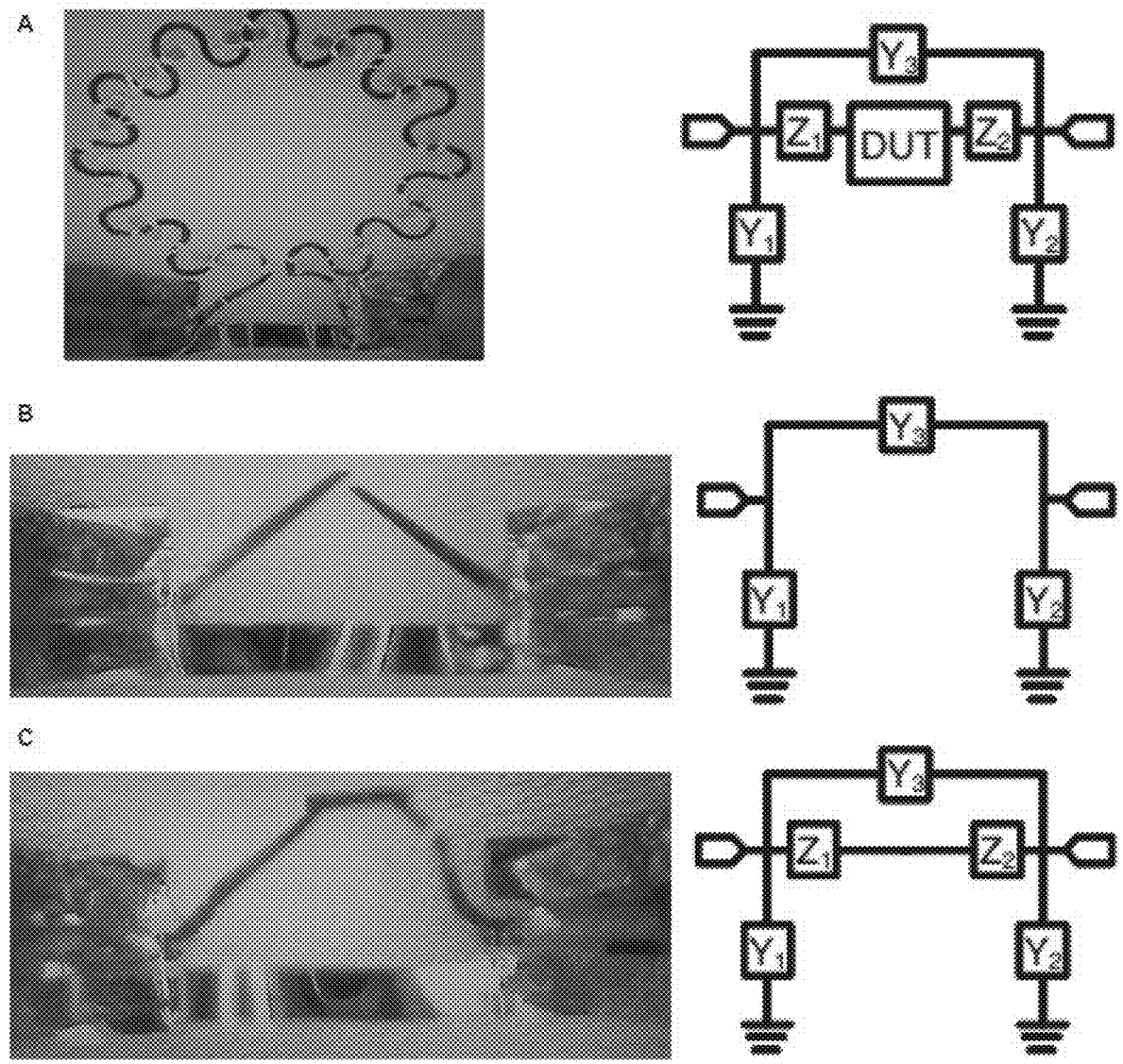
FIG. 24: Open-through de-embedding patterns on silicone rubber substrate for popped-up cage inductor RF measurement and their corresponding lumped equivalent circuits. (A) Test pattern with DUT. (B) Open pattern. (C) Short pattern.

The RF measurements used test fixtures as in FIG. 24. Parasitic effects introduced by feedlines must be removed to obtain the real performance of the device under test (DUT). An open-through de-embedding technique calibrates out the feedline effects (34). A lumped equivalent circuit model captures the physics of parasitic effects. Feedlines are designed as short as possible to minimize the distribution effect. Open-through de-embedding patterns are shown in FIG. 24. As in FIG. 24A, an admittance Π-network was used to model the capacitive effects between the contact pads and the surrounding environment including the substrate and RF ground. Series connected impedance network was used to model the resistance and inductance of the feedlines. The schematic views of patterns with the DUT, without the DUT (open case) and shorted are shown in FIGS. 24A-C. Corresponding lumped equivalent circuits were constructed to model the RF performance of each pattern.

Figure 25:
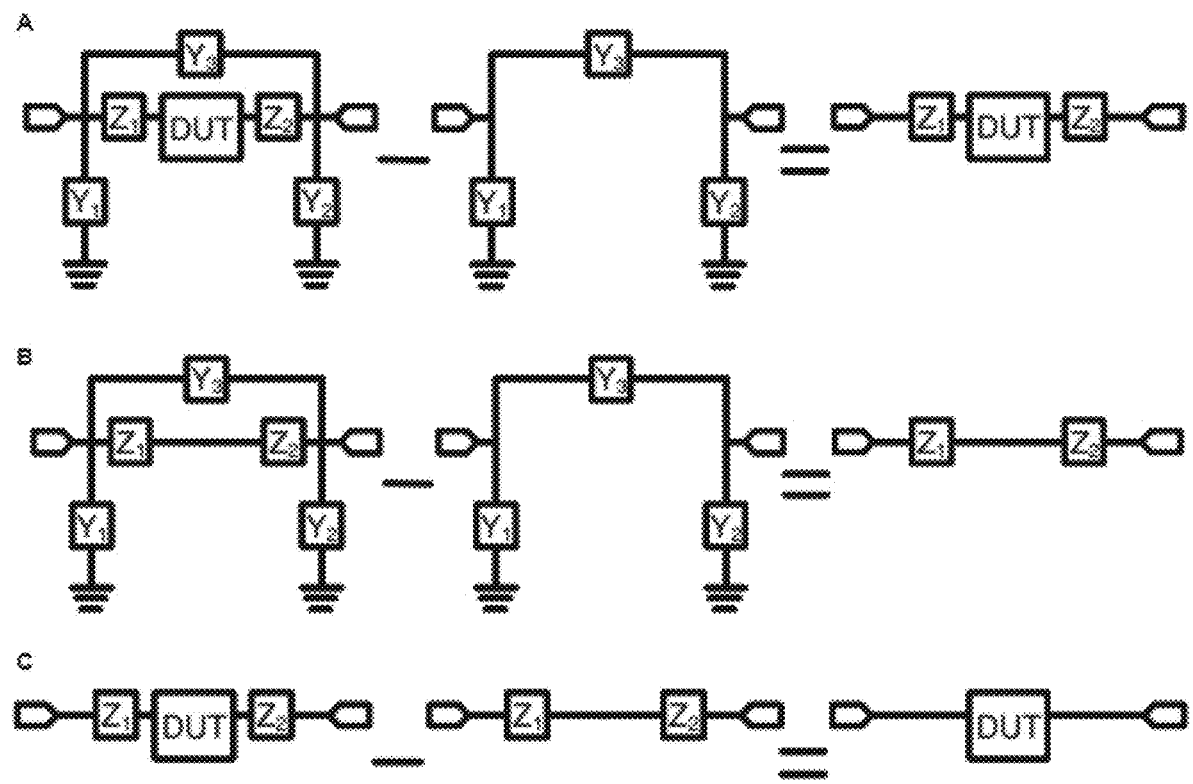
FIG. 25: Mathematic procedure to do the open-through de-embedding. (A) Subtract measured data of open pattern from raw data with DUT. (B) Subtract measured data of open pattern from data of through pattern. (C) Subtract data obtained from step 2 from data from step 1.

The mathematical procedure for open-through de-embedding is shown in FIG. 25. The first step is shown in FIG. 25A, which abstracts the admittance Π-network (open pattern) from the original data. The result still contains the parasitic resistances and inductances (Z1 and Z2) whose total effect can be calculated according to step 2 shown in FIG. 25B. Finally, the real performance of DUT can be obtained through step 3.

6. Measured Raw Data of Samples with 54% and 0% Substrate Prestrain

Figure 26:
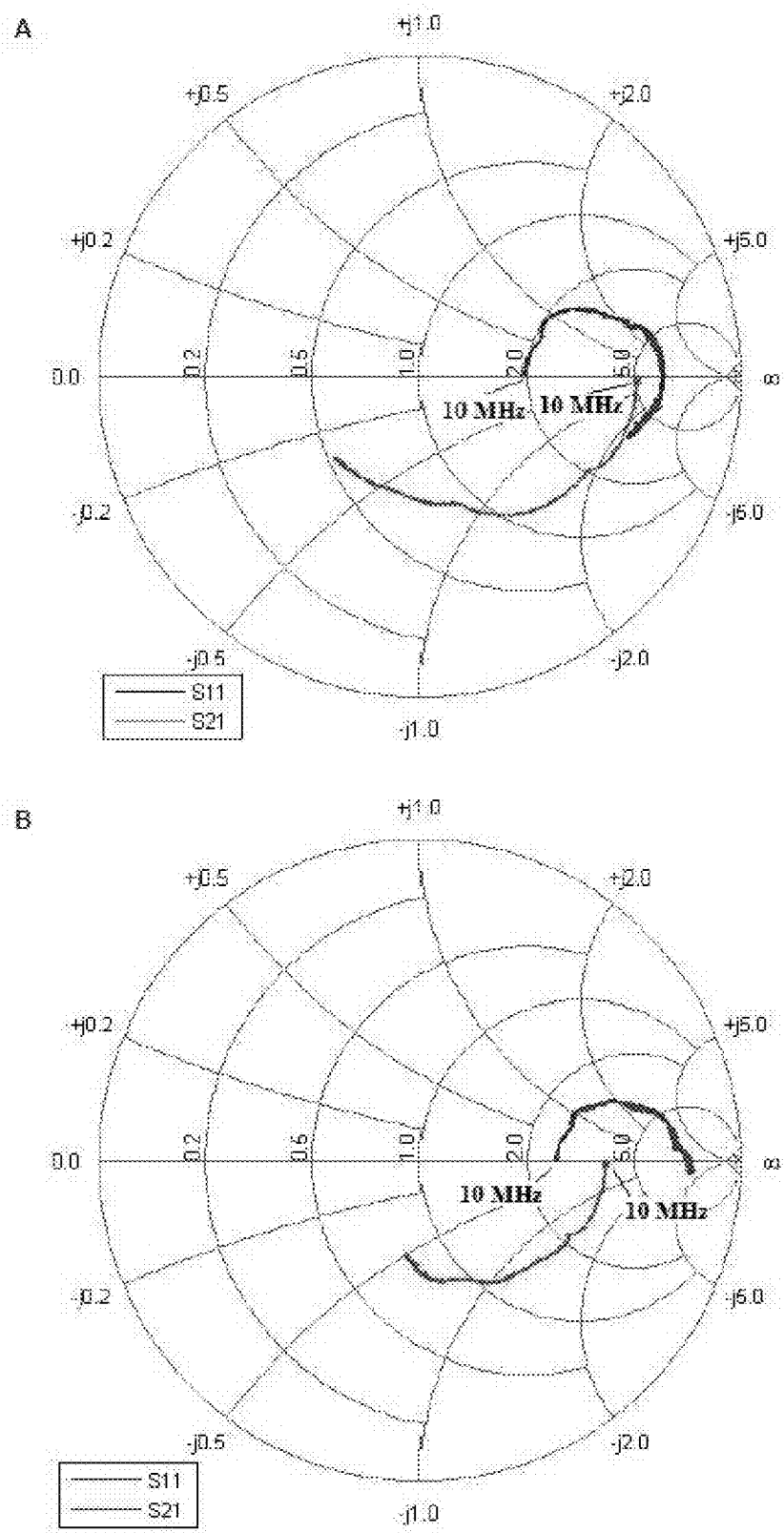
FIG. 26: Measured raw data of samples with 54% and 0% substrate prestrain from 10 MHz to 10 GHz. (A) 0% substrate prestrain, (B) 54% substrate prestrain.

The measured raw data are shown in FIG. 26 for samples with 54% and 0% substrate prestrain in the form of Smith Charts from 10 MHz to 10 GHz using an Agilent N5230A PNA-L Network Analyzer capable of measurement from 10 MHz-40 GHz. The data from the cage inductor in its 2D configuration is shown in FIG. 26A, and the data of the 3D version formed with 54% substrate prestrain is shown in FIG. 26B.

Figure 27:
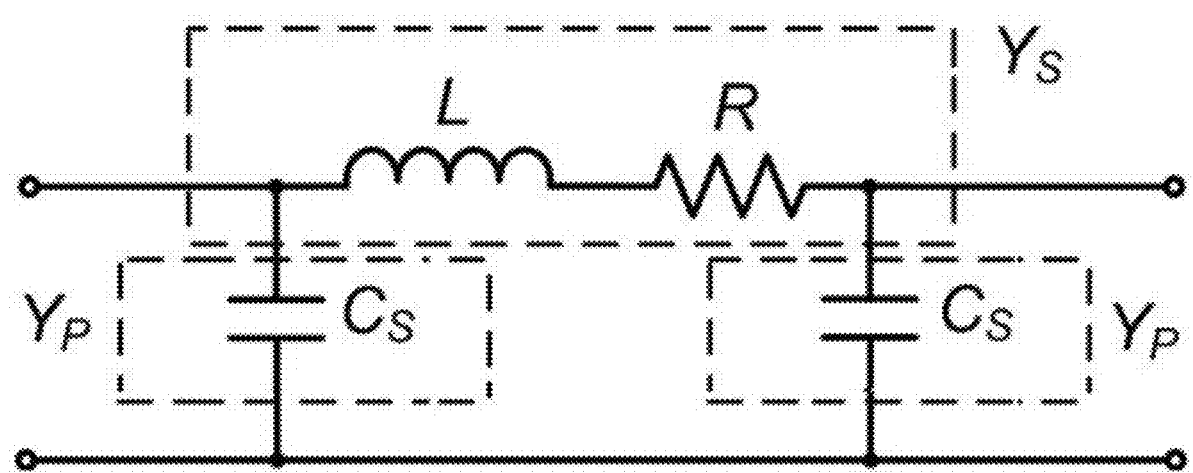
FIG. 27: Lumped equivalent circuit of cage inductor on silicone rubber substrate.

7. Derivation of Effective Inductance, Q Factor and Self-Resonance Frequency of Cage Inductors The lumped equivalent circuit of cage inductor is shown in FIG. 27. Its admittance matrix of the network is derived as $$Y = \begin{bmatrix} Y_p + Y_s & -Y_s \\ -Y_s & Y_p + Y_s \end{bmatrix}. \quad (S7)$$

Matrix Y can be obtained from the feed lines decoupled-HFSS simulated or measured S parameters. The total effective inductance $L_{etotal}$ and Q factor $Q_{total}$ can be then derived from the matrix Y as shown in Eqs. (S8) and (S9), according to Ref. (35):

$$L_{etotal} = \frac{\text{Im}\left(-\frac{1}{Y_{12}}\right)}{\omega}, \quad (S8)$$

$$Q_{total} = \frac{\text{Im}(Y_{11})}{\text{Re}(Y_{11})}. \quad (S9)$$

Self-resonance frequency $f_0$ is then derived when $Q_{total}=0$.

REFERENCES

29. Y. W. Su et al., Journal of the Mechanics and Physics of Solids 60, 487-508 (2012).
30. Y. H. Zhang et al., Soft Matter 9, 8062-8070 (2013).
31. S. Das, D. Lahiri, A. Agarwal, W. Choi, Nanotechnology 25, 045707 (2014).
32. Y. Lin, Y. Xiang, T. Y. Tsui, J. J. Vlassak, Acta Materialia 56, 4932-4943 (2008).
33. C. W. Tsao, L. Hromada, J. Liu, P. Kumar, D. L. DeVoe, Lab on a Chip 7, 499-505 (2007).
34. W. Huang et al., Nano letters 12, 6283-6288 (2012).
35. C. P. Yue, S. S. Wong, IEEE Transactions on Electron Devices 47, 560-568 (2000)

Example 2: A Mechanically Driven Form of Kirigami as a Route to 3D Mesostructures in Micro/Nanomembranes Abstract Assembly of three-dimensional (3D) micro/nanostructures in advanced functional materials has important implications across broad areas of technology. Existing approaches are compatible, however, only with narrow classes of materials and/or 3D geometries. This example introduces ideas for a form of Kirigami that allows precise, mechanically driven assembly of 3D mesostructures of diverse materials from 2D micro/nanomembranes with strategically designed geometries and patterns of cuts. Theoretical and experimental studies demonstrate applicability of the methods across length scales from macro to nano, in materials ranging from monocrystalline silicon to plastic, with levels of topographical complexity that significantly exceed those that can be achieved in any other way. A broad set of examples includes 3D silicon mesostructures and hybrid nanomembrane-nanoribbon systems, including heterogeneous combinations with polymers and metals, with critical dimensions that range from 100 nm to 30 mm. A 3D mechanically tunable optical transmission window provides an application example of this Kirigami process, enabled by theoretically guided design.

Existing options in three-dimensional (3D) assembly of micro/nanomaterials are constrained by the applicable classes of materials and/or 3D geometries. Here we introduce concepts for a form of Kirigami that allows precise, mechanically driven assembly of 3D mesostructures of diverse materials from 2D micro/nanomembranes with strategically designed geometries and patterns of cuts. Theoretical and experimental studies in a broad set of examples demonstrate applicability of the methods across length scales from macro to micro and nano, in materials ranging from monocrystalline silicon to metal and plastic, with levels of topographical complexity that significantly exceed those that can be achieved in any other way. The resulting engineering options in functional 3D mesostructures have sweeping implications for construction of advanced micro/nanosystems technologies.

3D micro/nanostructures are of growing interest (1-10), motivated by their increasingly widespread applications in biomedical devices (11-13), energy storage systems (14-19), photonics and optoelectronics (20-24), microelectromechanical systems (MEMS) (25-27), metamaterials (21, 28-32), and electronics (33-35). Of the many methods for fabricating such structures, few are compatible with the highest performance classes of electronic materials, such as monocrystalline inorganic semiconductors, and only a subset of these can operate at high speeds, across length scales, from centimeters to nanometers. Techniques that exploit bending/folding of thin plates via the action of residual stresses or capillary effects have some promise, but they are currently most well developed only for certain classes of hollow polyhedral or cylindrical geometries (1, 10, 36-39). Other approaches (40, 41) rely on compressive buckling in narrow ribbons or filaments to yield complex 3D structures, but of primary utility in open-network mesh type layouts. Attempts to apply this type of scheme to sheets/plates lead to 'kink-induced' stress concentrations that cause mechanical fracture. The concepts of Kirigami (42, 43), an ancient aesthetic pursuit, involve strategically configured arrays of cuts to guide buckling/folding processes in a manner that reduces such stresses, to enable broad and interesting classes of 3D structures, primarily in paper at centimeter and millimeter dimensions. Means for defining these cuts and for performing the folds do not extend into the micro/nanoscale regime, nor do they work effectively with advanced materials, particularly brittle semiconductors. This example introduces ideas for a form of Kirigami that can be used in these contexts. Here, precisely controlled compressive forces transform 2D micro/nanomembranes with lithographically defined geometries and patterns of cuts into 3D structures across length scales from macro to micro and nano, with levels of complexity and control that significantly exceed those that can be achieved with alternative methods. The approach is also fully compatible with previously reported schemes based on residual stresses and on buckling of filamentary ribbons. Demonstrations include a diverse set of examples formed using silicon nanomembranes, plates and ribbons and heterogeneous combinations of them with micro/nanopatterned metal films and dielectrics. A mechanically tunable optical transmission window illustrates the extent to which theoretical modeling can be used as a design tool to create targeted geometries that offer adaptable shapes and desired modes of operation.

Results and Discussion

Assembly Concepts and Design Principles.

Figure 36:
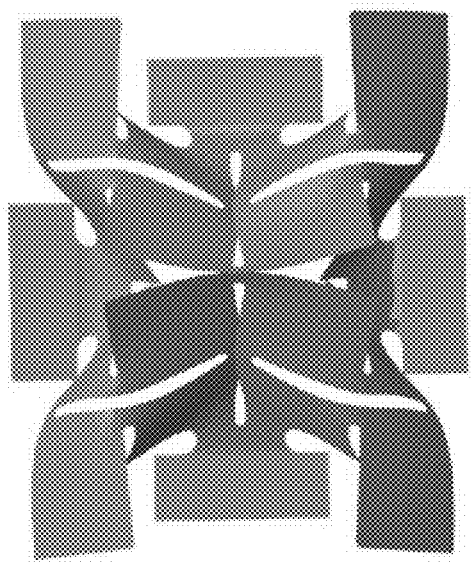
FIG. 36: Images of the complex 3D membrane mesostructure in FIG. 28(C), with three viewing angles that differ from the one in FIG. 28(C). The scale bar is 200 µm.
Figure 36:
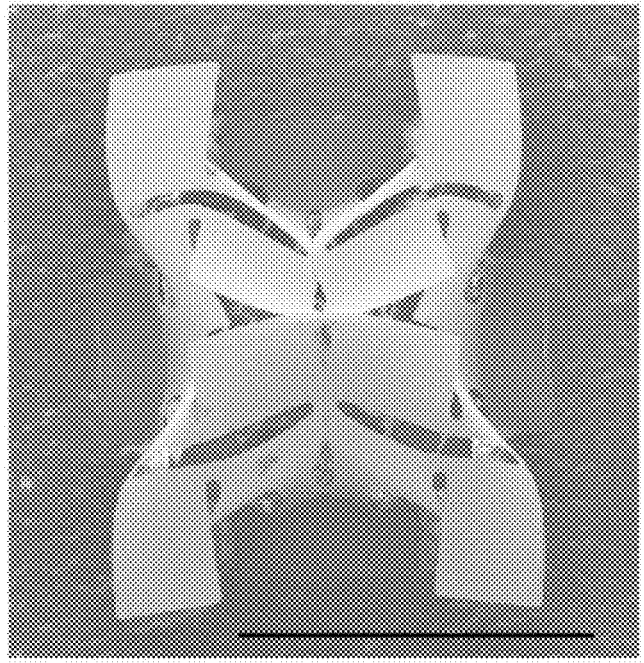
Figure 36:
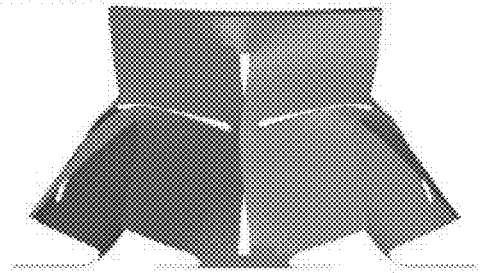
Figure 36:
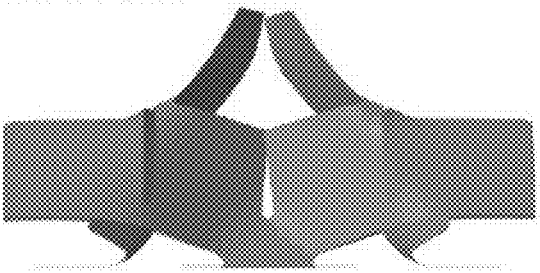
Figure 37:
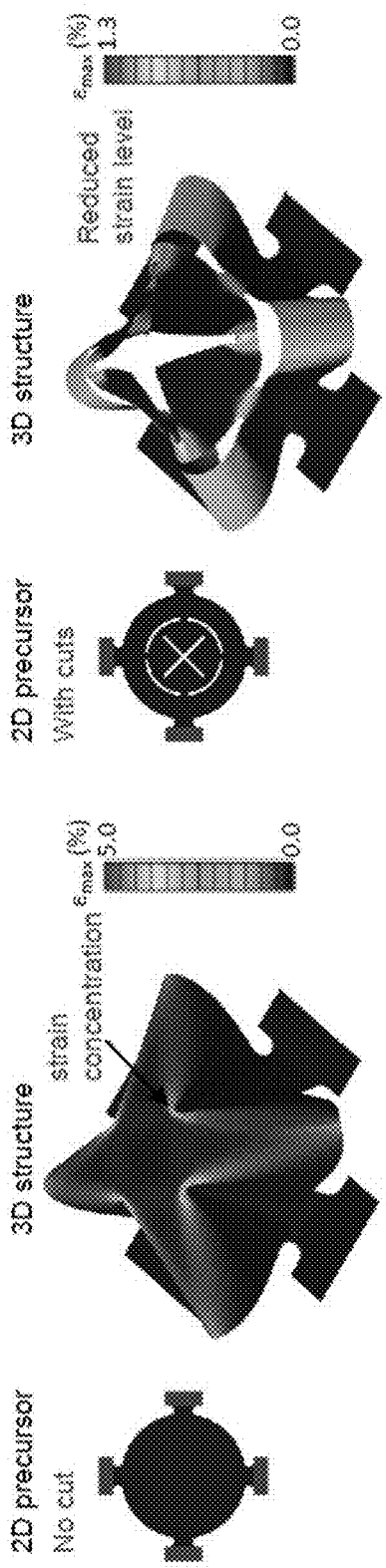
FIG. 37: Illustration of the reductions in strains that follow from the use of Kirigami. (A) Comparison of strain distributions in the silicon layers of 3D structures formed with two different 2D circular membranes (left: without any cuts; right: with cuts). (B) Comparison of strain distributions in the silicon layers of 3D structures formed with two different 2D square membranes (left: without any cuts; right: with cuts). All of these structures incorporate bilayers of silicon/polymer (each ~300 nm in thickness). The prestrain used in all cases is 80%. The color represents the magnitude of the strain.
Figure 37:
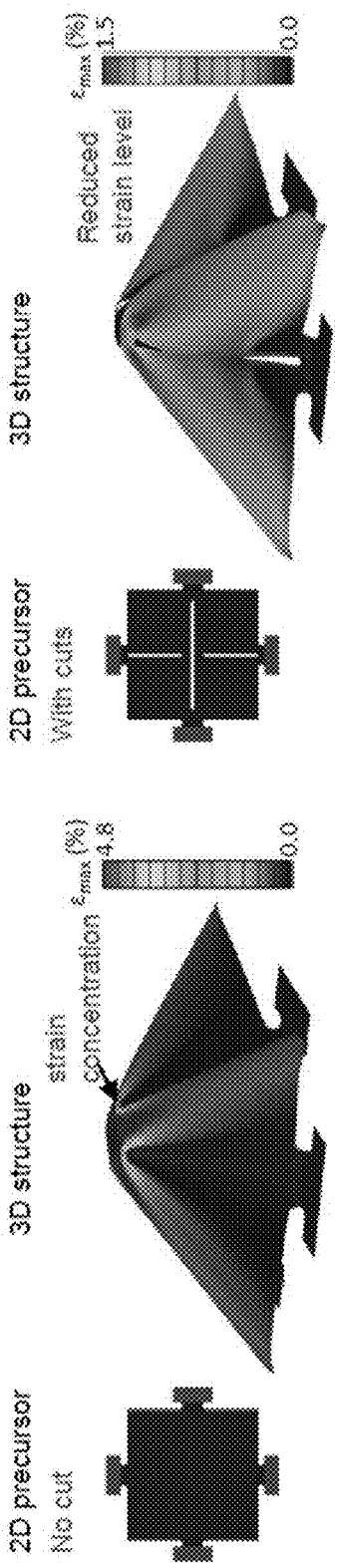
Figure 38:
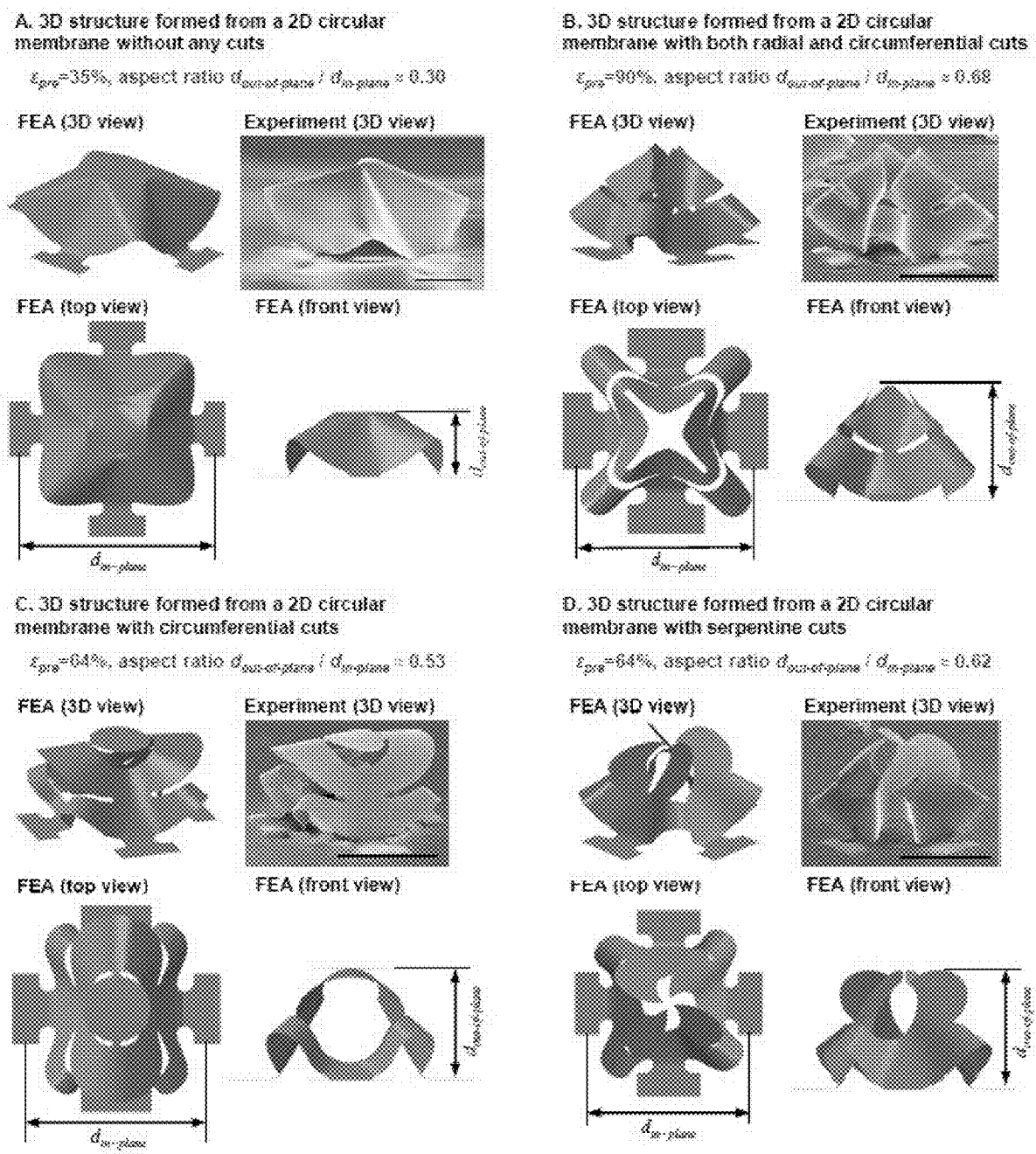
FIG. 38: Effect of Kirigami design on the shapes of 3D structures. (A) Images with different viewing angles of a 3D structure formed from a 2D circular membrane without any Kirigami cuts and with a prestrain of 35%. (B) Images with different viewing angles of a 3D structure formed from a 2D circular membrane with both radial and circumferential cuts and with a prestrain of 90%. (C) Images with different viewing angles of a 3D structure formed from a 2D circular membrane with circumferential cuts and a prestrain of 64%. (D) Images with different viewing angles of a 3D structure formed from a 2D circular membrane with serpentine cuts and a prestrain of 64%. The design without any cuts yields a mesostructure with a basic, modest type of 3D configuration, as evidenced by the small aspect ratio ($\alpha = d_{out-of-plane}/d_{in-plane}$, where $d_{out-of-plane}$ and $d_{in-plane}$ denote the maximum out-of-plane dimension and in-plane extent, respectively; $\alpha = 0.3$ for the case shown here). This ratio is ~2.3 times smaller than that of the 3D structure formed with Kirigami cuts in (B). The scale bars in all SEM images are 200 µm.

FIGS. 28A-E, 34 and 35 present examples of this type of Kirigami process for assembly of 3D mesostructures from corresponding 2D bilayers consisting of nanomembranes of monocrystalline silicon (Si NMs; 300 nm in thickness) and films of a photodefinable epoxy (SU8; 300 nm in thickness). Here, photolithography and etching define patterns of cuts in these structures to yield enhanced flexibility in certain orientations, at specific locations. Compressive forces imparted in the plane at selected points (anchors; red, in illustrations of FIG. 35) deform the systems into engineered 3D configurations via lateral buckling (44), using a concept similar to the one exploited in 3D filamentary networks (41). The left frame of FIG. 28A illustrates a simple case that includes five square regions connected by narrow joints. Here, the outer squares attach to small rectangular anchors that adhere strongly to a biaxially prestrained elastomer substrate through covalent bonding. All other regions release from the substrate via elimination of a sacrificial interface layer, as described in the Methods. Relaxing the prestrain generates compressive stresses that induce these regions to buckle out of the plane, as shown in an intermediate state of assembly (center results from finite element analysis (FEA), FIG. 28A). The final configuration corresponds to that of a square cuboid, as given by the right FEA result and the scanning electron micrograph (SEM, colorized, rightmost frame). The color indicates the maximum principal strains. Peak values remain well below the fracture thresholds for the Si NMs, owing to the stress-reducing effects of the Kirigami cuts that form the narrow hinges between the sides. These cuts also play critical roles in defining the final 3D geometries. FIG. 28B shows an example in which a cross cut pattern divides a large square into four smaller ones. Here, assembly forms a curved pyramidal mesostructure. Repeated implementation of such crosses (FIG. 28B) in the sub-squares (i.e., the smaller squares) yields a fractal-inspired pattern of cuts (45) that divides the original square into interconnected small pieces with similar shapes and sizes. The resulting 3D structure adopts a highly complex configuration, where bending and twisting deformations localize at the joints defined by the cuts, with strains that remain below the fracture threshold. The image in the right panel of FIG. 28C and those in FIG. 36 offer multiple viewing angles of the topology. Many other geometries are possible, including those with circular symmetry, as shown in FIGS. 28D and E. The latter case has a well-defined chirality, set by the configuration of Kirigami cuts. In all cases examined in this example, 2D precursors without carefully placed cuts tend to undergo sharp, localized deformations with associated stress concentrations (FIG. 37) that lead to fracture. For unpatterned, circular 2D precursors, the maximum strains reach values that are nearly 4 times larger than those with Kirigami designs under otherwise similar conditions. Consequently, even at the largest level of prestrain (~35%) that can be accommodated without cuts, the corresponding maximum 3D extension is small (FIG. 38A), as defined by the aspect ratio, $\alpha$=dout-of-plane/din-plane, where dout-of-plane and din-plane denote the maximum out-of-plane dimension and in-plane extent, respectively. Specifically, the value of a without Kirigami cuts (0.3) is nearly 2.5 times smaller than that achievable with cut geometries demonstrated in FIGS. 28D, 28E and 38B.

Figure 28:
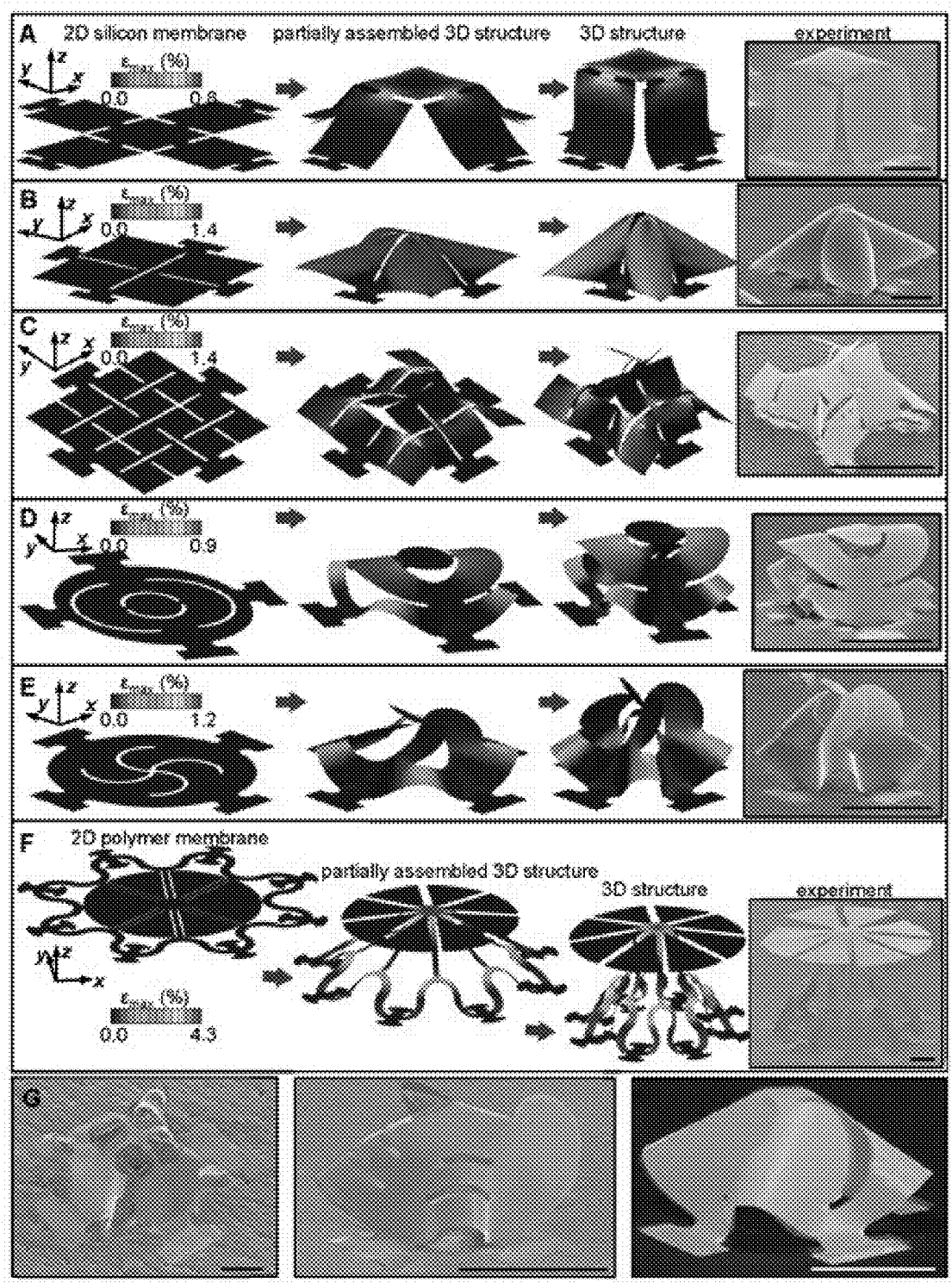
FIG. 28: Illustrative examples of a mechanically driven form of Kirigami patterns for deterministic assembly of 3D mesostructures from corresponding 2D nanomembranes. (A) FEA results (the left three panels) that describe the formation of a square cuboid made of bilayers consisting of silicon nanomembranes (Si NM) and a polymer, along with corresponding SEM image (colorized; rightmost panel) of the final configuration. (B) and (C) Similar results for complex 3D structures transformed from membranes with Kirigami patterns of the 1st and 2nd order cross cuts. (D) and (E) 3D structures transformed from circular membranes with symmetric cuts along the circumferential directions, and anti-symmetric cuts in serpentine configurations. (F) Complex 3D 'jellyfish' structure made of a polymer film initially in a 2D geometry with closed-loop circular serpentines joined with a circle and radially (approximately) oriented Kirigami cuts. (G) 3D mesostructures across length scales from 100 nm (thickness, left) to 30 mm (lateral dimensions, right), in a bare Si NM (left), a Si NM/polymer bilayer (center) and plastic sheet (right).
Figure 39:
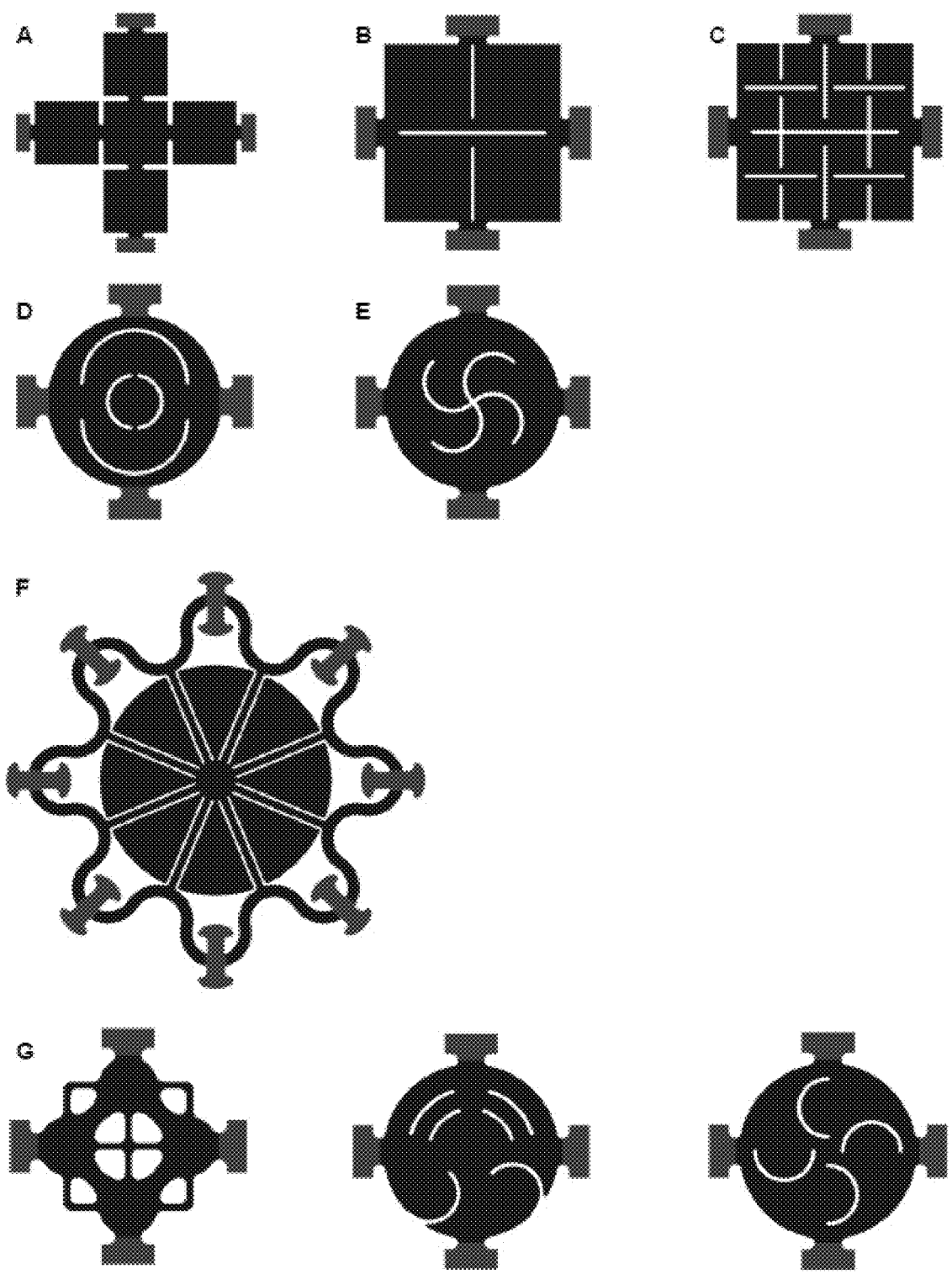
FIG. 39: (A)-(G) show 2D precursor patterns for the 3D structures shown in FIG. 28(A)-(G), where the bonding regions are highlighted in red.

These concepts can be implemented across a broad range of lengths scales, with nearly any type of material, and in systems that include filamentary 3D networks and/or hierarchical layouts. An example of a polymer structure appears in FIG. 28F, where a Kirigami-based circular pattern connects to serpentine ribbons organized in a circular, closed form to yield an elaborate 3D mesostructure that resembles a jellyfish (FIG. 28F). The buckling begins with the ribbons at the periphery, followed by the eight straight ribbons in the central circular membrane, leading to a 3D configuration with multiple levels. FIG. 28G shows structures that have characteristic dimensions ranging from 100 nm (thickness of the bare Si NM in the example on the left) to ~30 mm (lateral dimensions of the 3D plastic sheet on the right), each overlaid with results from FEA simulations. Throughout all examined geometries, materials and length scales, experimental results exhibit excellent quantitative agreement with FEA predictions, thereby establishing computation as a means for rapid design iterations, as demonstrated subsequently in the engineering of a tunable optical device. The 2D precursors of all examples in FIG. 28 are in FIG. 39.

Figure 29:
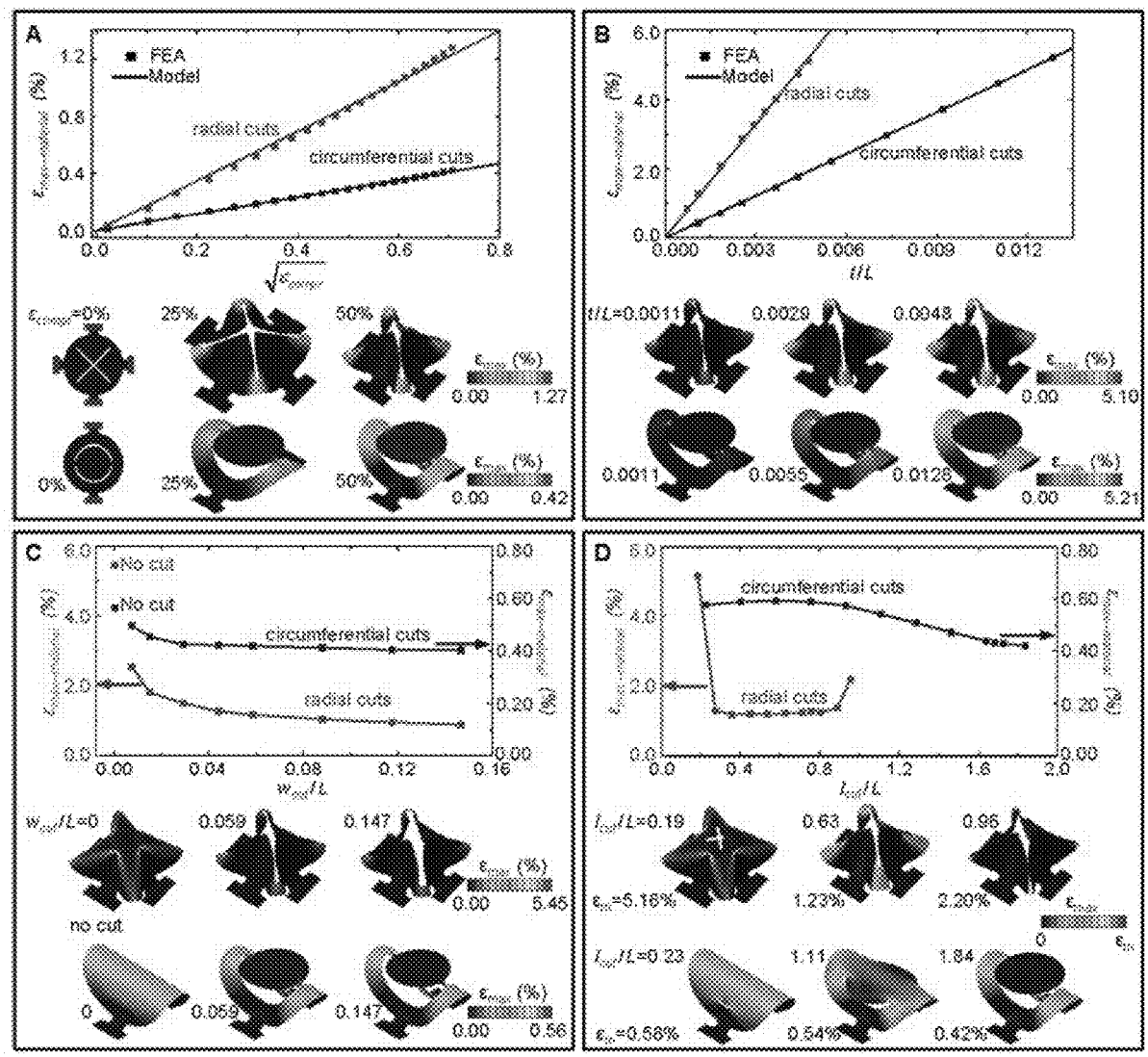
FIG. 29: Computational results that highlight fundamental aspects of Kirigami designs in examples with purely radial and purely circumferential cuts. (A) Maximum material strain as a function of the square root of the compressive strain for membranes with t/L=0.0011, $w_{cut}$/L=0.044, and $l_{cut}$/L=1.68 (for circumferential cuts) or 0.76 (for radial cuts), and the associated strain distributions. (B) Maximum material strain as a function of the dimensionless thickness for membranes with $w_{cut}$/L=0.044 and $l_{cut}$/L=1.68 (for circumferential cuts) or 0.76 (for radial cuts), under a compressive strain of 50%, and the associated strain distributions. (C) Maximum material strain as a function of the dimensionless widths of Kirigami cuts in membranes with t/L=0.0011 and $l_{out}$/L=1.68 (for circumferential cuts) or 0.76 (for radial cuts), under a compressive strain of 50%, and the associated strain distributions. (D) Maximum material strain as a function of the dimensionless cut lengths for membranes with t/L=0.0011 and $w_{cut}$/L=0.044, under a compressive strain of 50%, and the associated strain distributions. In all cases, the color in the FEA results corresponds to the magnitude of the maximum principal strain.
Figure 40:
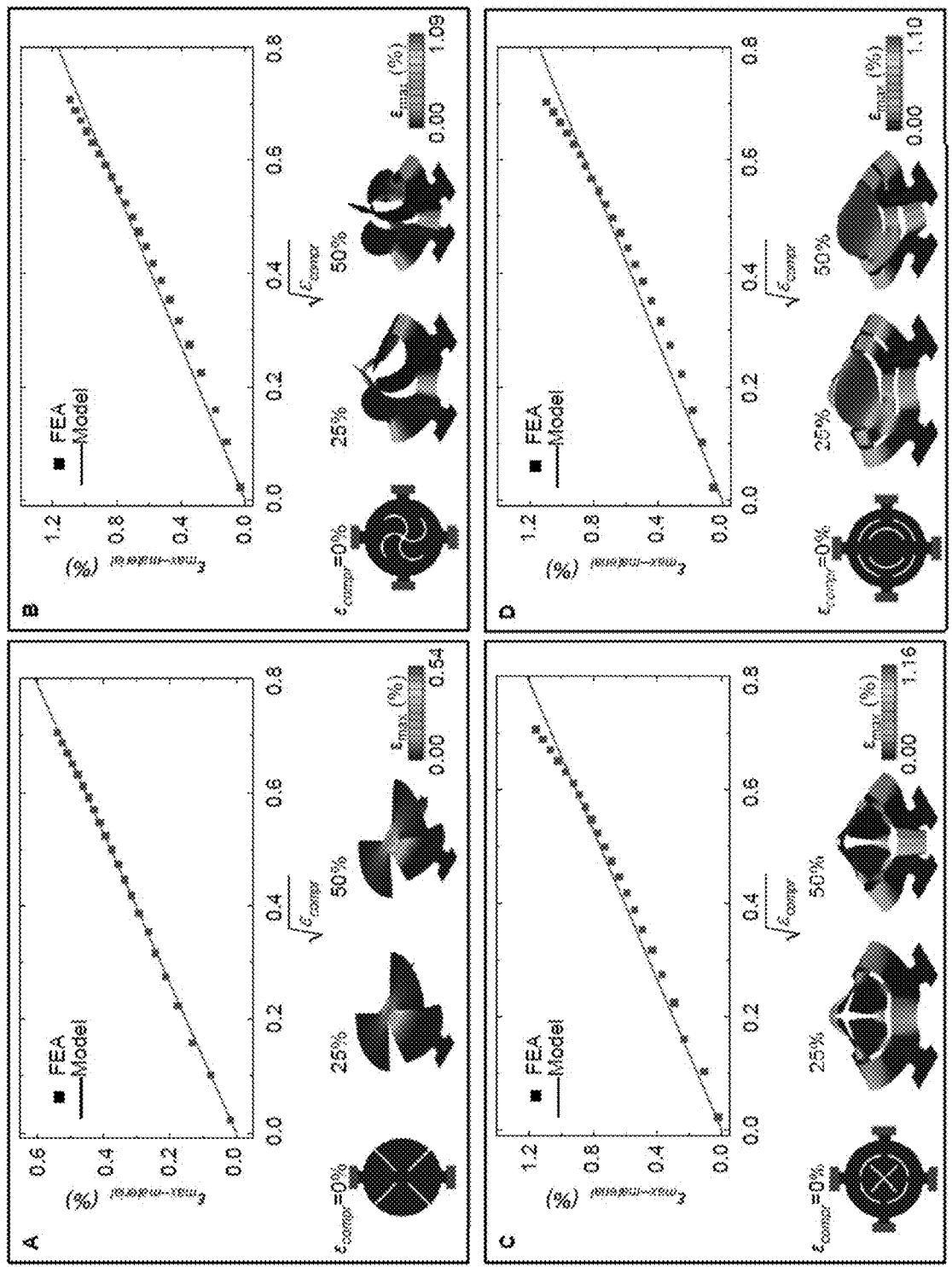
FIG. 40: Maximum material strain as a function of the square root of the compressive strain, for various 3D structures formed using different Kirigami cuts: (A) symmetric cuts along the radial direction (with t/L=0.0011, $w_{cut}$/L=0.044, and $l_{cut}$/L=0.77); (B) anti-symmetric cuts in a serpentine configuration (with t/L=0.0011, $w_{cut}$/L=0.044, and $l_{cut}$t/L=1.03); (C) symmetric cuts partially along the radial direction and partially along the circumferential direction (with t/L=0.0011, $w_{cut}$/L=0.044, and $l_{cut}$/L=0.72); D) symmetric cuts along the circumferential direction (with t/L=0.0011, $w_{cut}$/L=0.044, and $l_{cut}$/L=0.77). The results show a proportional dependence of the maximum material strain on the square root of the compressive strain. For the Kirigami patterns in (C) and (D), the lengths ($l_{cut}$) correspond to the circumferential cuts located at the outer region of the membrane.
Figure 41:
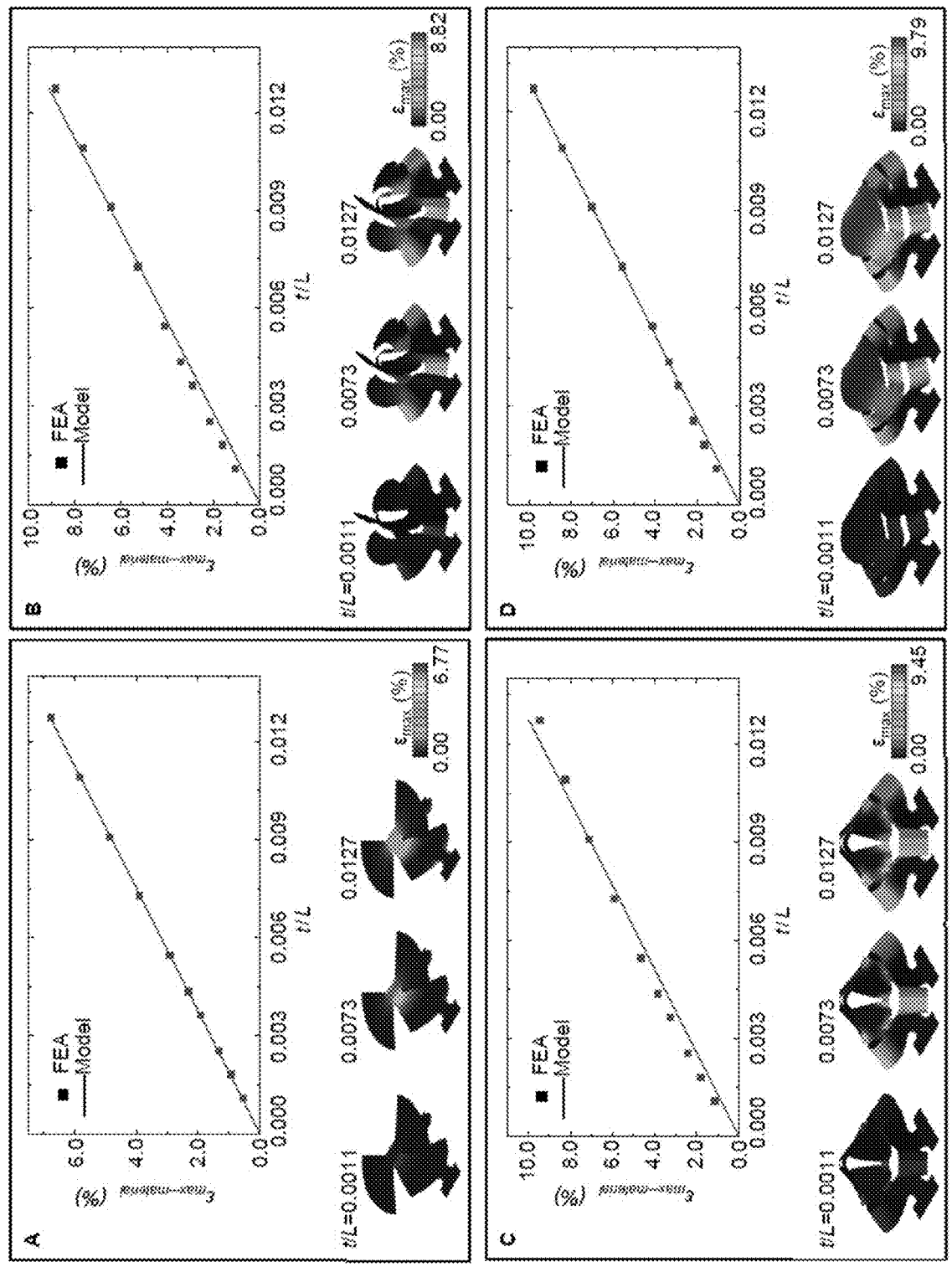
FIG. 41: Maximum material strain as a function of dimensionless thickness, for various 3D structures formed using 100% prestrain (i.e., corresponding to 50% compressive strain) and different Kirigami patterns: (A) symmetric cuts along the radial direction (with $w_{cut}$/L=0.044 and $l_{cut}$/L=0.77); (B) anti-symmetric cuts in the serpentine configuration (with $w_{cut}$/L=0.044 and $l_{cut}$/L=1.03); (C) symmetric cuts partially along the radial direction and partially along the circumferential direction (with $w_{cut}$/L=0.044 and $l_{cut}$/L=0.72); (D) symmetric cuts along the circumferential direction (with $w_{cut}/L=0.044$ and $l_{cut}/L=0.77$). The results show a proportional dependence of the maximum material strain on the normalized thickness. For cases in (C) and (D), the lengths ($l_{cut}$) correspond to the circumferential cuts located at the outer region of the membrane.
Figure 42:
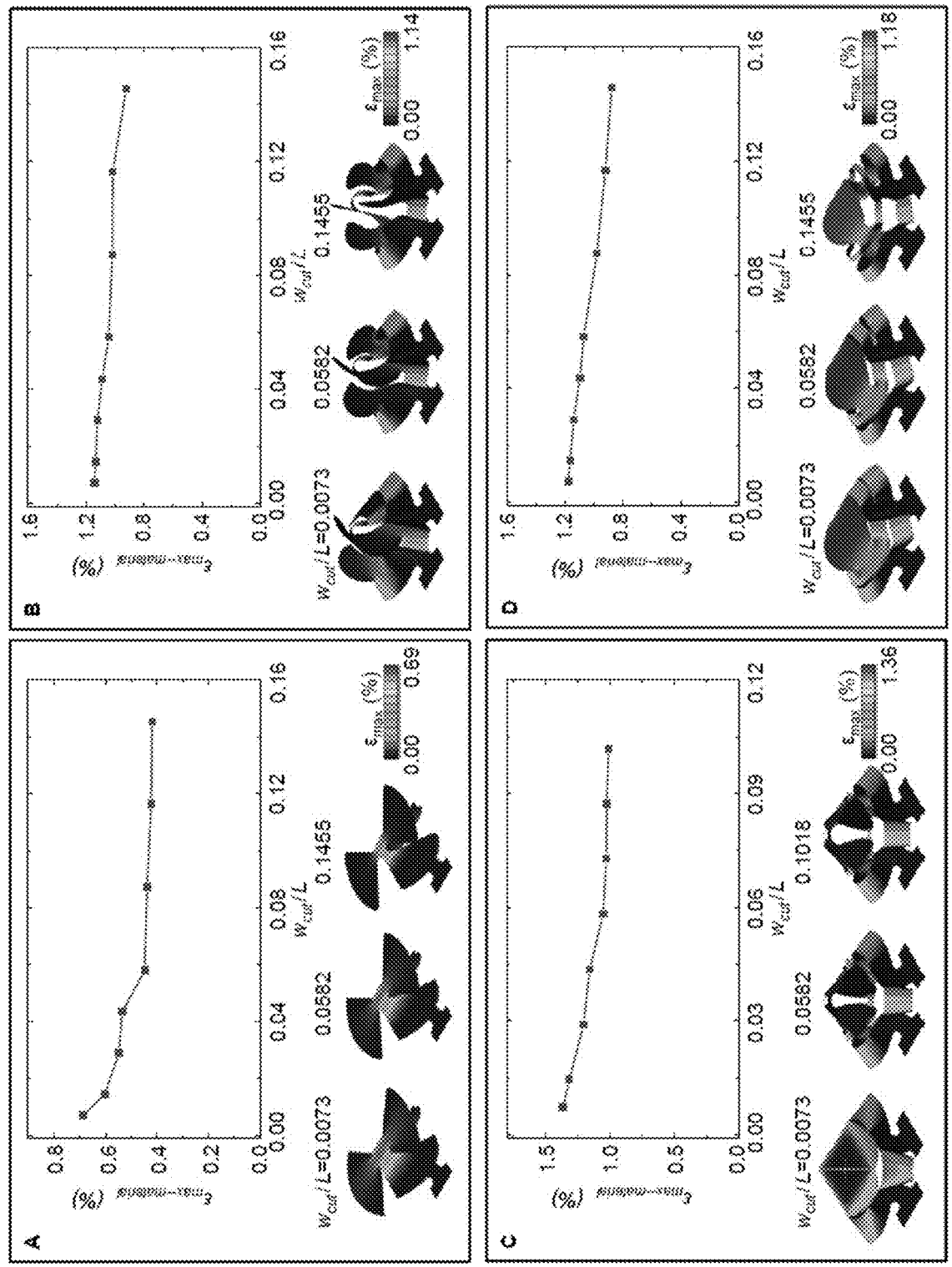
FIG. 42: Maximum material strain as a function of dimensionless cut width, for various 3D structures formed using 100% prestrain (i.e., corresponding to 50% compressive strain) and different Kirigami patterns: (A) symmetric cuts along the radial direction (with $t/L=0.0011$ and $l_{cut}/L=0.77$); (B) anti-symmetric cuts in the serpentine configuration (with $t/L=0.0011$ and $l_{cut}/L=1.03$); (C) symmetric cuts partially along the radial direction and partially along the circumferential direction (with $t/L=0.0011$ and $l_{cut}/L=0.72$); D) symmetric cuts along the circumferential direction (with $t/L=0.0011$ and $l_{cut}/L=0.77$). The results show that the material strain decreases with increasing cut width. For the cases in (C) and (D), the lengths ($l_w$) correspond to the circumferential cuts located at the outer region of the membrane.
Figure 43:
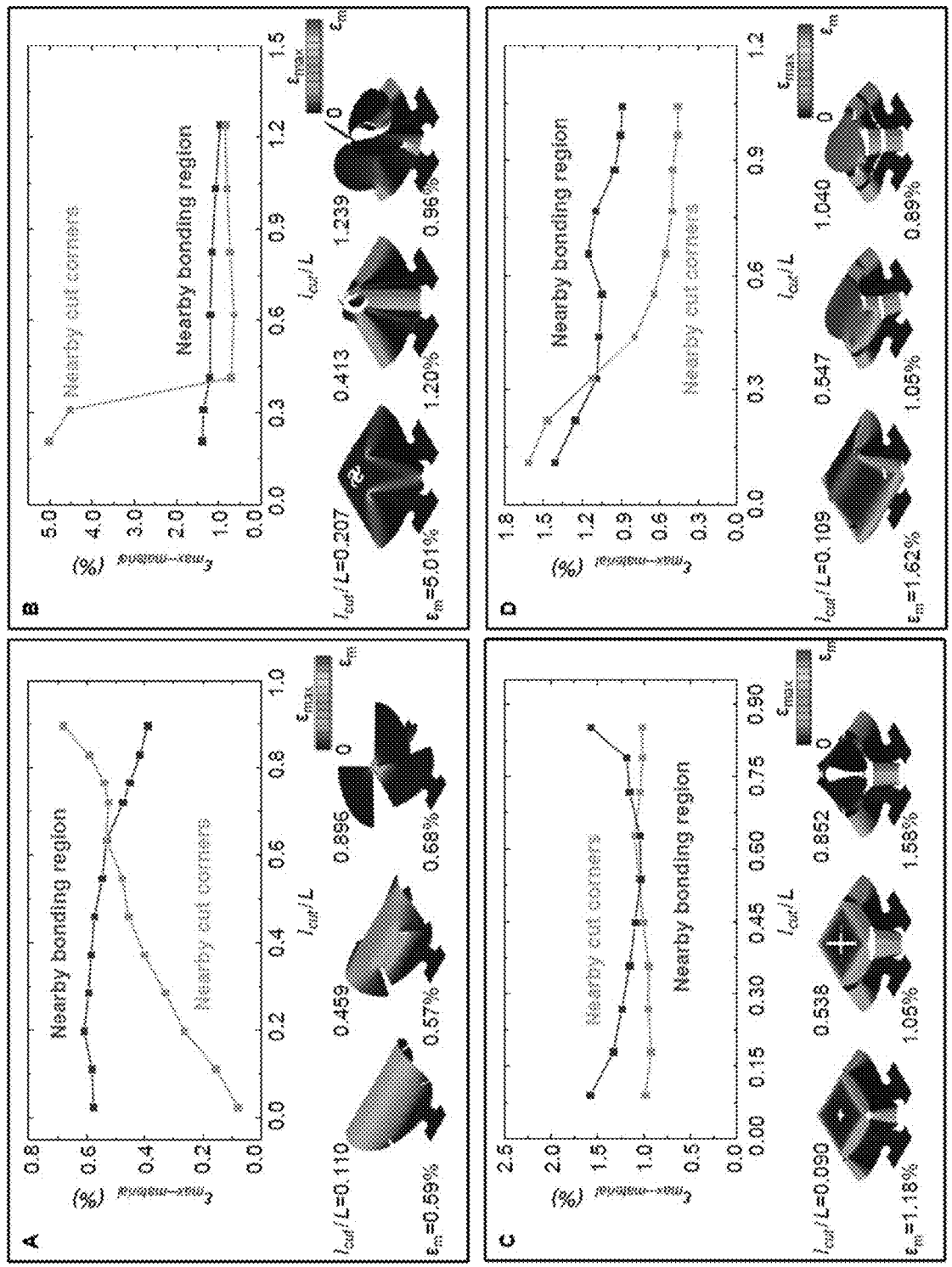
FIG. 43: Maximum material strains near the corners of the Kirigami cuts and near the bonding region as a function of the dimensionless cut length, for various 3D structures formed using 100% prestrain (i.e., corresponding to 50% compressive strain) and different Kirigami patterns: (A) symmetric cuts along the radial direction (with $t/L=0.0011$ and $w_{cut}/L=0.044$); (B) anti-symmetric cuts in the serpentine configuration (with $t/L=0.0011$ and $w_{cut}/L=0.044$); (C) symmetric cuts partially along the radial direction and partially along the circumferential direction (with $t/L=0.0011$ and $w_{cut}/L=0.044$); D) symmetric cuts along the circumferential direction (with $t/L=0.0011$ and $w_{cut}/L=0.044$). For the cases in (C) and (D), the lengths ($l_{cut}$) correspond to the circumferential cuts that are located at the outer region of the membrane. The lengths of the inner cuts scale with those of the outer cuts, with both reaching the corresponding limit (i.e., representing a throughout cut) simultaneously.

FEA can also reveal the dependence of the maximum principal strains on the prestrain in the elastomer substrate, as a function of geometric parameters related to the membrane structure and Kirigami cuts, as shown in FIG. 29. During lateral buckling, the 2D precursors undergo complex out-of-plane bending deformations, with associated spatially dependent variations in the curvature. The maximum strains occur at locations with the highest change in curvature; these locations typically remain constant throughout the buckling process. Quantitative analyses of representative Kirigami patterns (FIGS. 29A and B) with purely radial and circumferential cuts show that the maximum strains ($\varepsilon_{max\text{-}material}$) are proportional to the normalized thickness for a single-layer Si membrane, i.e., t/L, where L measures the overall dimension of the 2D precursor (e.g., the radii of the circular geometries in FIG. 29) and the square root of the compressive strain ($\varepsilon_{compr}$) applied to the 2D precursor, where $\varepsilon_{compr}=\varepsilon_{pre}/(1+\varepsilon_{pre})$. This scaling, i.e., $\varepsilon_{max\text{-}material} \propto t\sqrt{\varepsilon_{compr}}/L$, also applies to the other 3D structures examined here (see FIGS. 40 and 41), including those with various Kirigami cuts (e.g., with anti-symmetric cuts in the serpentine configuration, or with combinations of radial and circumferential cuts) as well as uniaxial and biaxial prestrains in the elastomer substrate. Although the effect of the widths of the cuts ($w_{cut}$) cannot be captured with a simple scaling law, the qualitative dependence consistently involves a decrease in the maximum strain with increase in $w_{cut}$ (e.g. FIGS. 29C and 42). This trend further highlights the critical, enabling role of Kirigami concepts in this approach to 3D assembly. The effect of cut length is even more complicated, partly because this parameter significantly affects the nature of deformation modes in a qualitative sense, as shown in the results of FIGS. 29D and 43. These calculations indicate, in fact, that the lengths must be sufficiently large to avoid stress concentrations (e.g., in FIG. 29D, and FIGS. 43B-D). These qualitative and quantitative rules, together with the high accuracy in the FEA, provide a strong foundation for systematic, engineering design.

3D Mesostructures in Membranes and in Membranes/Ribbons, with Diverse Geometries.

Figure 30:
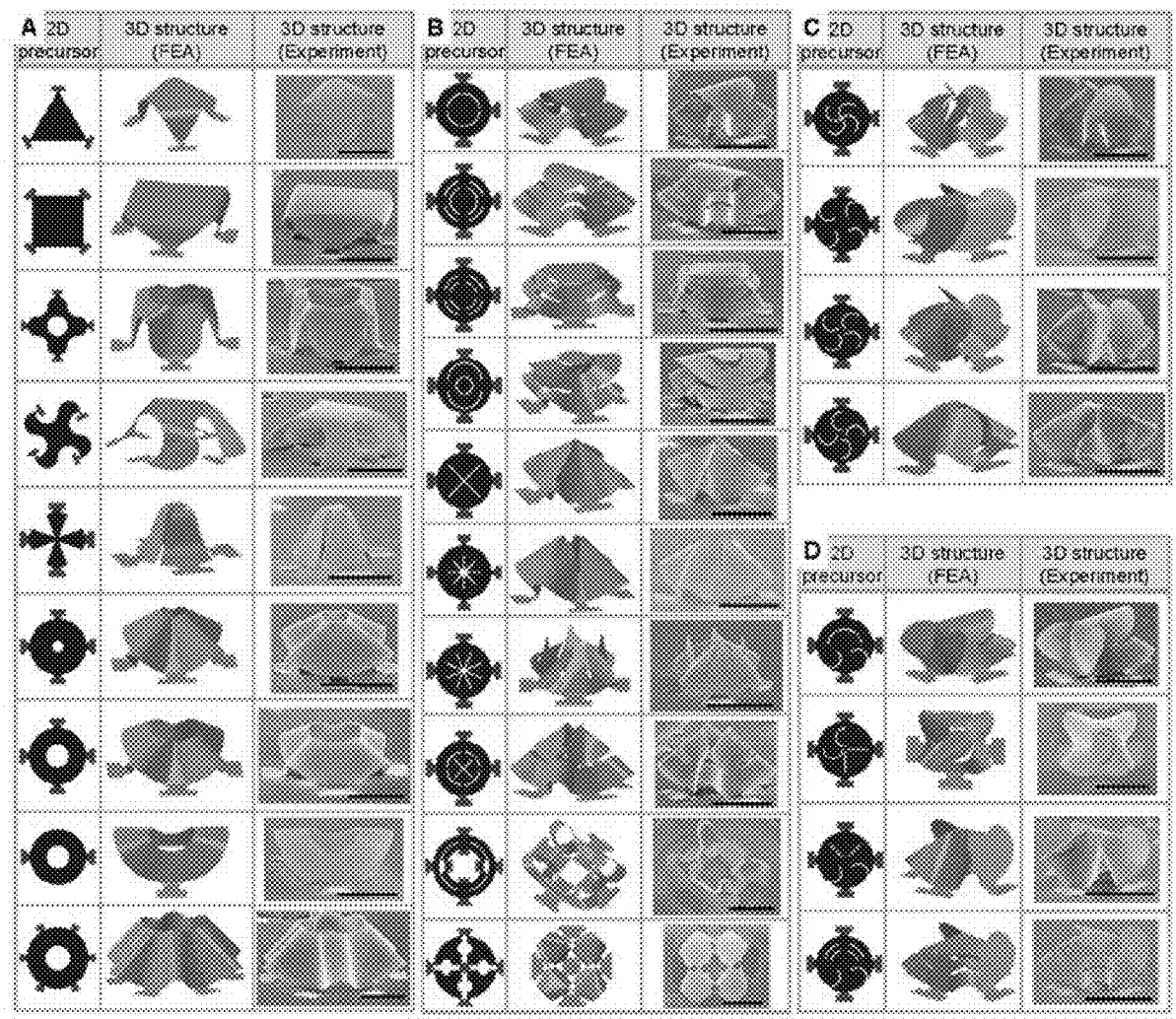
FIG. 30: Experimental and computational studies of various 3D silicon/polymer mesostructures and their classification according to geometric characteristics of the Kirigami cuts. 2D precursors, SEM images and FEA predictions for twenty-seven 3D mesostructures formed with precursor patterns without any cuts (A), with symmetric cuts (B), with anti-symmetric cuts (C), and with asymmetric cuts (D). All scale bars are 200 µm.

FIG. 30 presents a collection of experimental results and FEA predictions for dozens of 3D structures formed with Si NM/polymer precursors (both layers, 300 nm in thickness). The nature of the Kirigami cuts in the 2D precursors provides the basis for a classification scheme: i) membranes without any cuts; ii) membranes with symmetric cuts; iii) membranes with anti-symmetric cuts; and iv) membranes with asymmetric cuts. Without cuts (FIG. 30A), the bonding locations, the overall shapes and/or the addition of holes must be selected carefully to avoid the type of stress concentrations mentioned previously. These considerations impose tight restrictions on the 3D geometries that are possible. Kirigami cuts avoid these constraints, such that even for a given overall membrane shape and set of bonding locations, as shown in FIG. 30B-D (except for the last two designs in FIG. 30B), a rich range of 3D topologies can be realized. For circular shapes, cuts along the radial or circumferential directions serve as the basis for symmetric Kirigami patterns. Cuts with serpentine configurations provide anti-symmetric examples. FIGS. 30B-D demonstrate how the orientations of the cuts dictate the assembly process. Including additional bonding locations at the inner regions of the precursors further enhances the spatial variations in the modes of deformation. The last two cases in FIG. 30B provide examples where the positions of holes help to avoid self-contact of the membrane during the 3D assembly.

Figure 31:
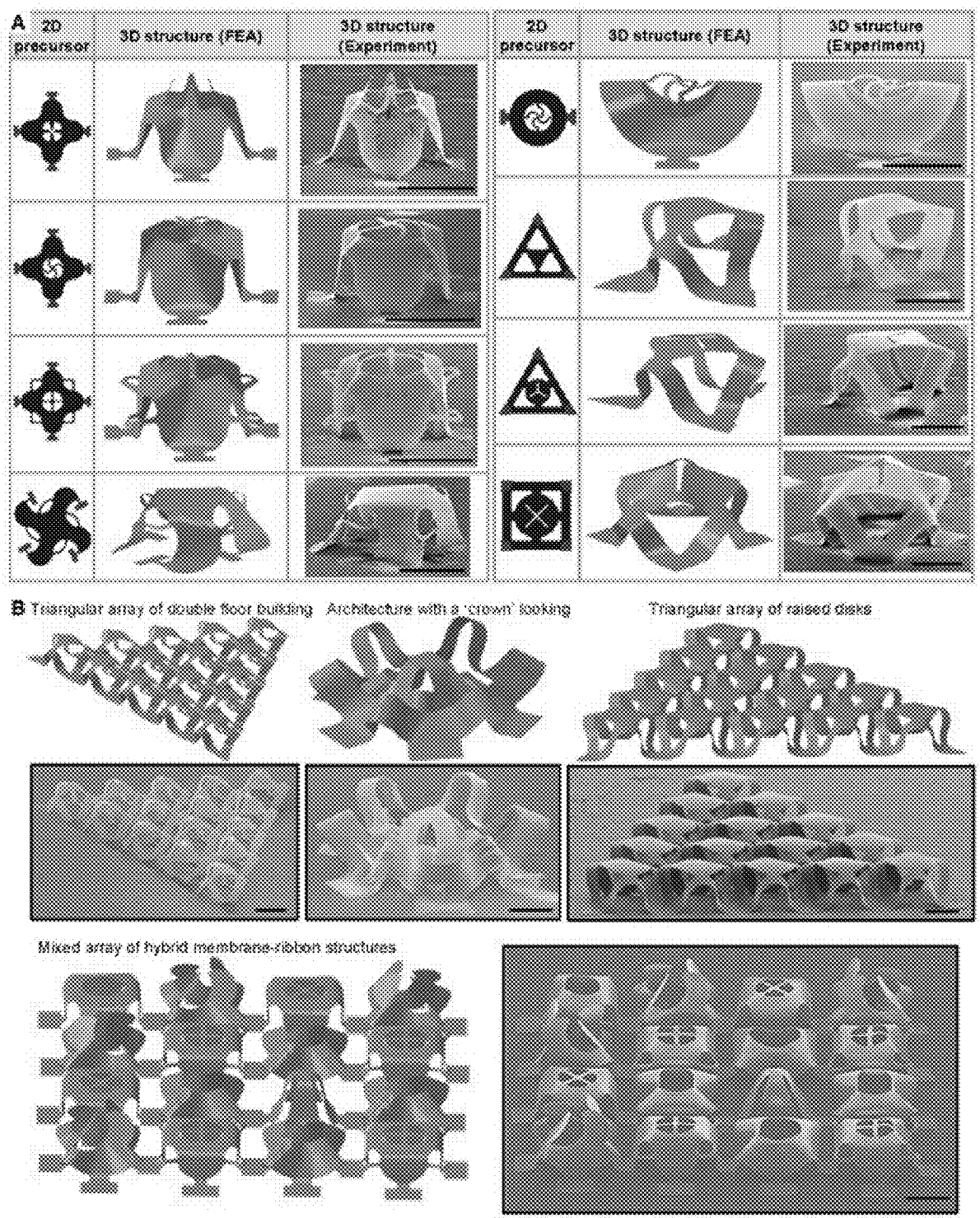
FIG. 31: Experimental and computational studies of 3D mesostructures with hybrid membrane-ribbon configurations and extended array architectures. (A) 2D precursors, FEA predictions, and SEM images for five 3D membrane-ribbon hybrid mesostructures (four on the left, and one on the upper right) that are supported by 3D membranes, and three 3D membrane-ribbon hybrid mesotructures (on the lower right) that are supported by ribbons. All of these structures incorporate bilayers of silicon/polymer (each ~300 nm in thickness). (B) Array architectures that include interconnected collections of 3D mesostructures with the identical or similar configurations to those in FIGS. 30 and 31A. The first two of these use silicon/polymer bilayers (each ~300 nm in thickness), and the others use polymer membranes (~4 µm in thickness). All scale bars are 200 µm.
Figure 44:
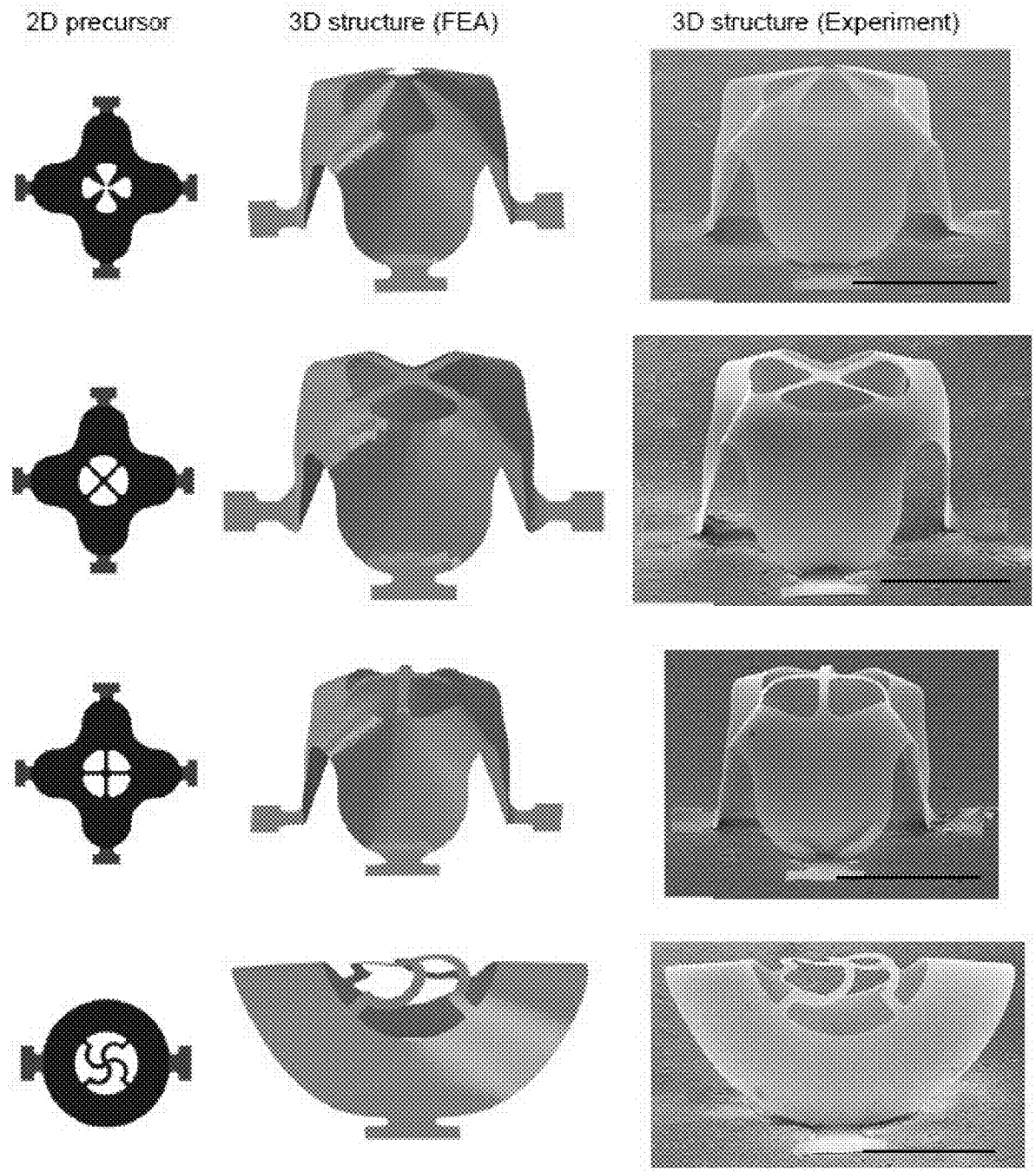
FIG. 44: Four 3D structures (with hybrid configurations consisting of both membranes and ribbons) and their corresponding FEA results. The scale bars in all images are 200 μm.

As demonstrated in FIG. 28, these Kirigami concepts can naturally include ribbon-shaped precursors (41), to yield complex 3D structures, including those with multiple levels of buckling. FIGS. 31A and 44 present an additional twelve examples. For the first five (i.e., four on the left and one on the upper right), buckling occurs first in the membranes; these motions then induce compression in the supported ribbons, leading to subsequent buckling processes. The first structure represents an exception, where the untethered ends of the ribbons allow freedom of motion, with little intrinsic deformation throughout the assembly process. Here, the ribbons simply follow the supporting membranes, to final orientations that are almost perpendicular to the plane of the substrate. In such designs, the ribbons have negligible effects on the 3D configurations of the membranes. The three examples on the lower right of FIG. 31A represent cases where buckled ribbons play an essential role in the assembly, via their selective bonding to the substrate, to form a first level of construction. Membranes raised upward by these ribbons form a second. The comparatively high stiffnesses of the membranes affect deformations of the supporting ribbons, as evidenced by their rotation with respect to the corresponding length directions.

Figure 45:
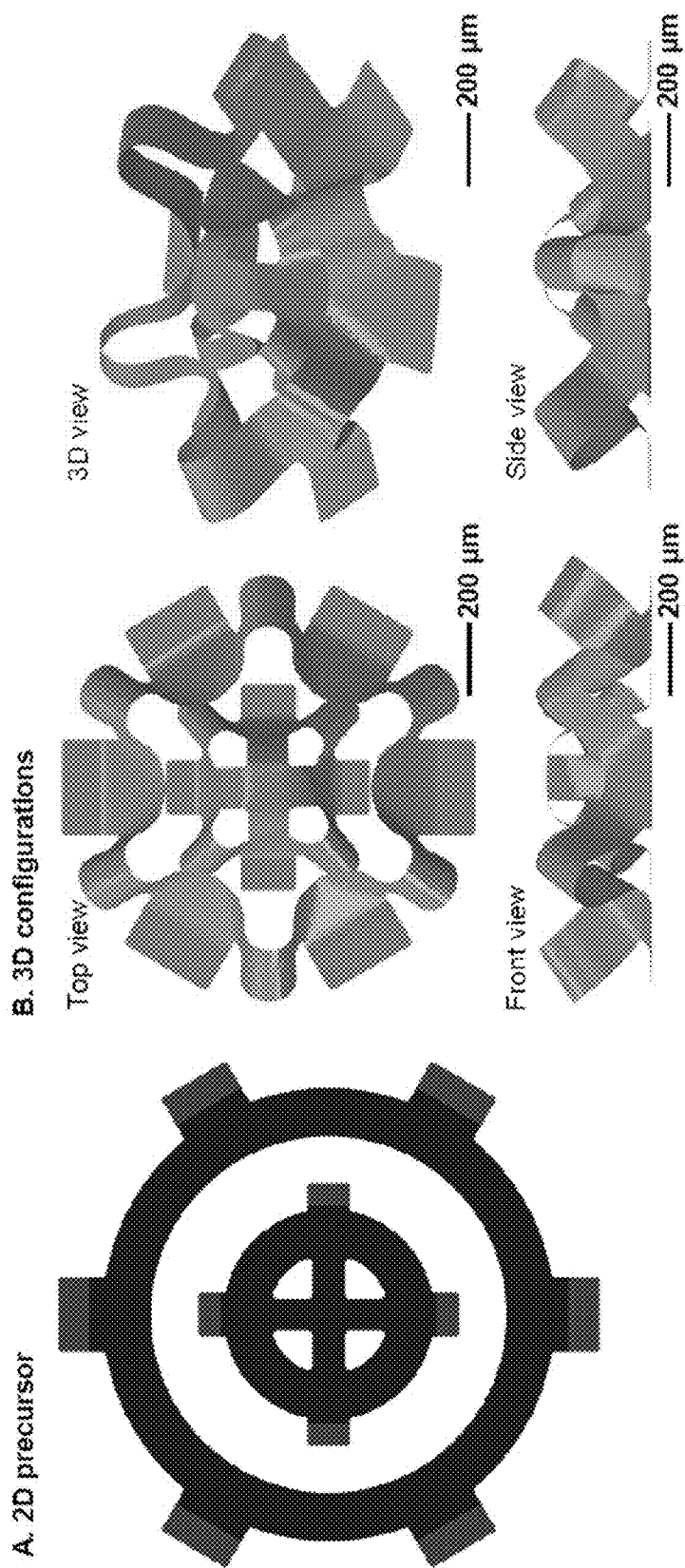
FIG. 45: (A) 2D precursor for complex architecture with a geometry that resembles a 'crown', as shown in the top middle panel of FIG. 31(B), where the bonding regions are highlighted in red. (B) Images of the 3D configurations with four different viewing angles.

Using the membrane and/or hybrid membrane-ribbon configurations as building blocks, arrays or nested architectures can be formed, as shown in FIG. 31B. The first example involves an evenly spaced, triangular collection of double-level membrane-ribbon mesostructures (in FIG. 31A), with five unit cells along each edge. To the right is a double-level architecture that resembles a 'crown', achieved with a 2D precursor illustrated in FIG. 45A. Images at multiple view angles (FIG. 45B) highlight the geometrical complexity. The third example (on the upper right) represents a triangular array of membrane-ribbon mesostructures with raised circular disks that adopt nearly planar shapes, owing to their relatively large stiffnesses. The last corresponds to a mixed array comprised of six membrane mesostructures without any cuts (in two different configurations), another four membrane mesostructures with anti-symmetric cuts (with opposite chirality), and six hybrid membrane-ribbon mesostructures (in two different configurations). All of these results agree well with FEA predictions.

3D Mesostructures in Different Materials, Geometries and with Supported Micro/Nanopatterns.

Figure 32:
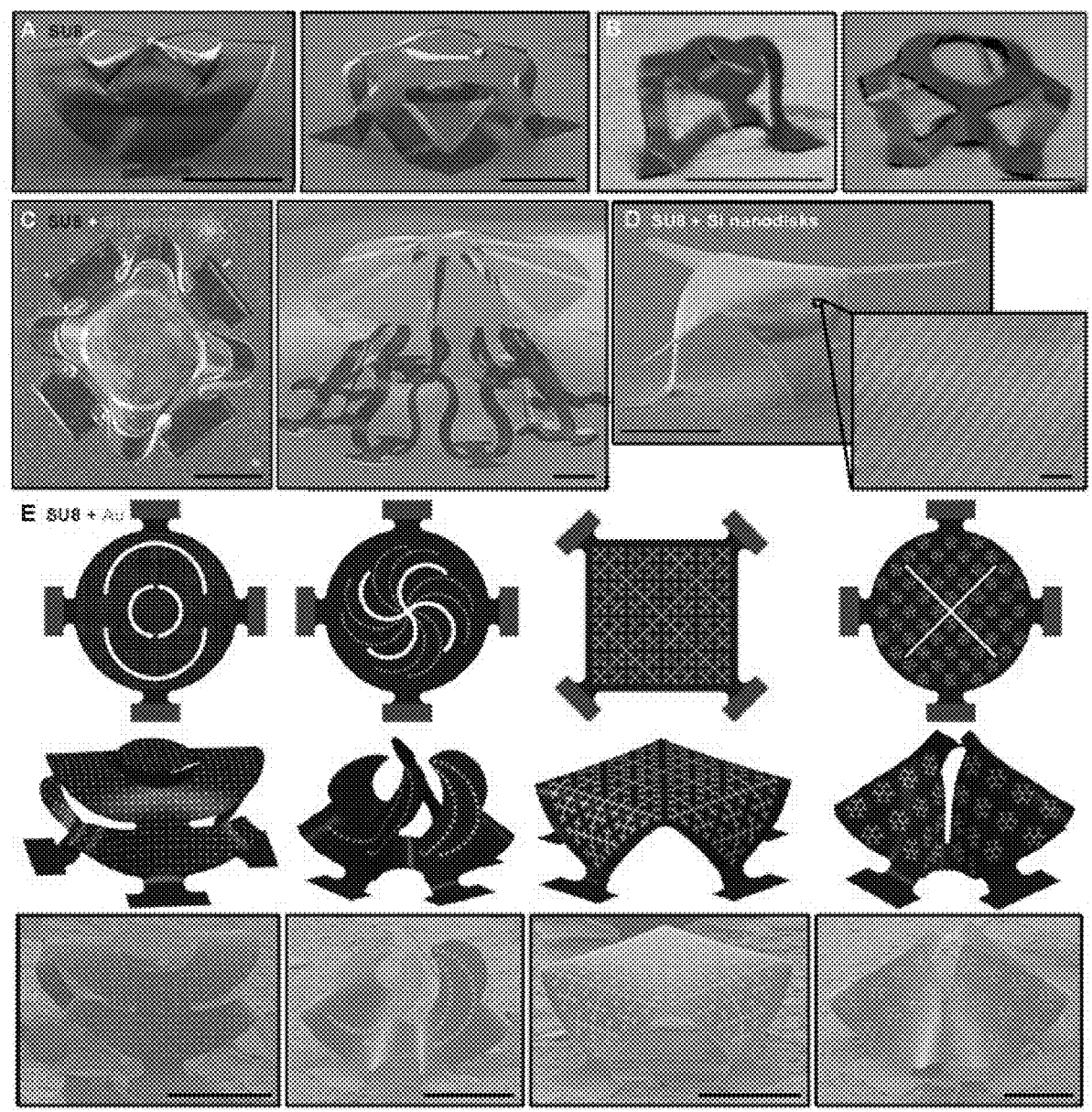
FIG. 32: 3D mesostructures of membrane and hybrid membrane-ribbon configurations with various material compositions. (A) and (B) Experimental images and overlaid FEA predictions of 3D mesostructures made of polymer and metal (Au). Scale bars, 200 µm. (C) 3D membrane mesostructures with heterogeneous combinations of silicon and polymer. Scale bars, 200 µm. (D) 3D membrane mesostructures consisting of a polymer membrane (scale bar, 200 µm) with a patterned array of silicon nano-disks on the surface, with a magnified view in the inset (scale bar, 1 µm). (E) Related 3D mesostructures with patterned arrays of Au nanostructures. Scale bars, 200 µm.
Figure 46:
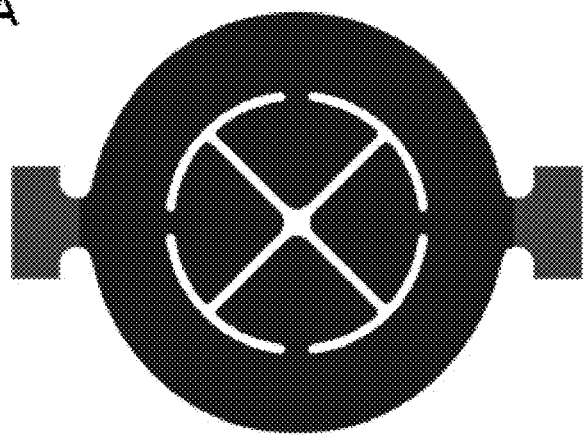
FIG. 46: (A) and (B) shows 2D precursors for the four 3D structures shown in FIG. 32(A) and in FIG. 32(B), where the bonding sites are highlighted in red.
Figure 46:
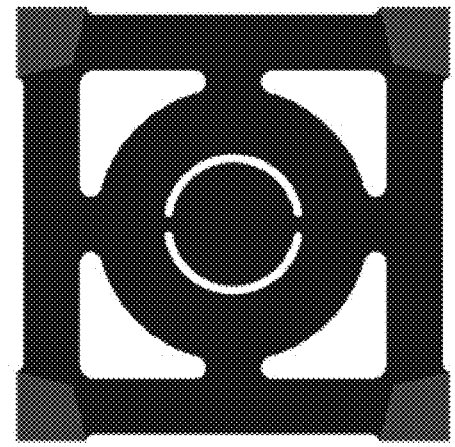
Figure 46:
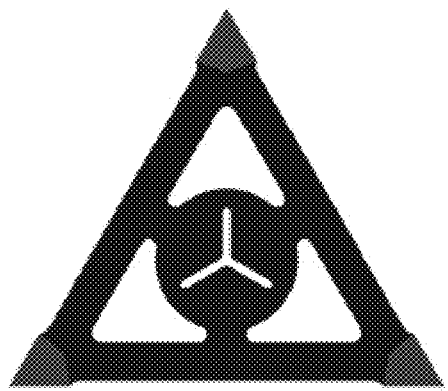
Figure 46:
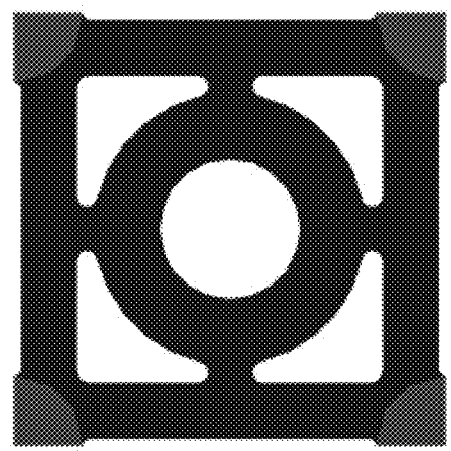
Figure 47:
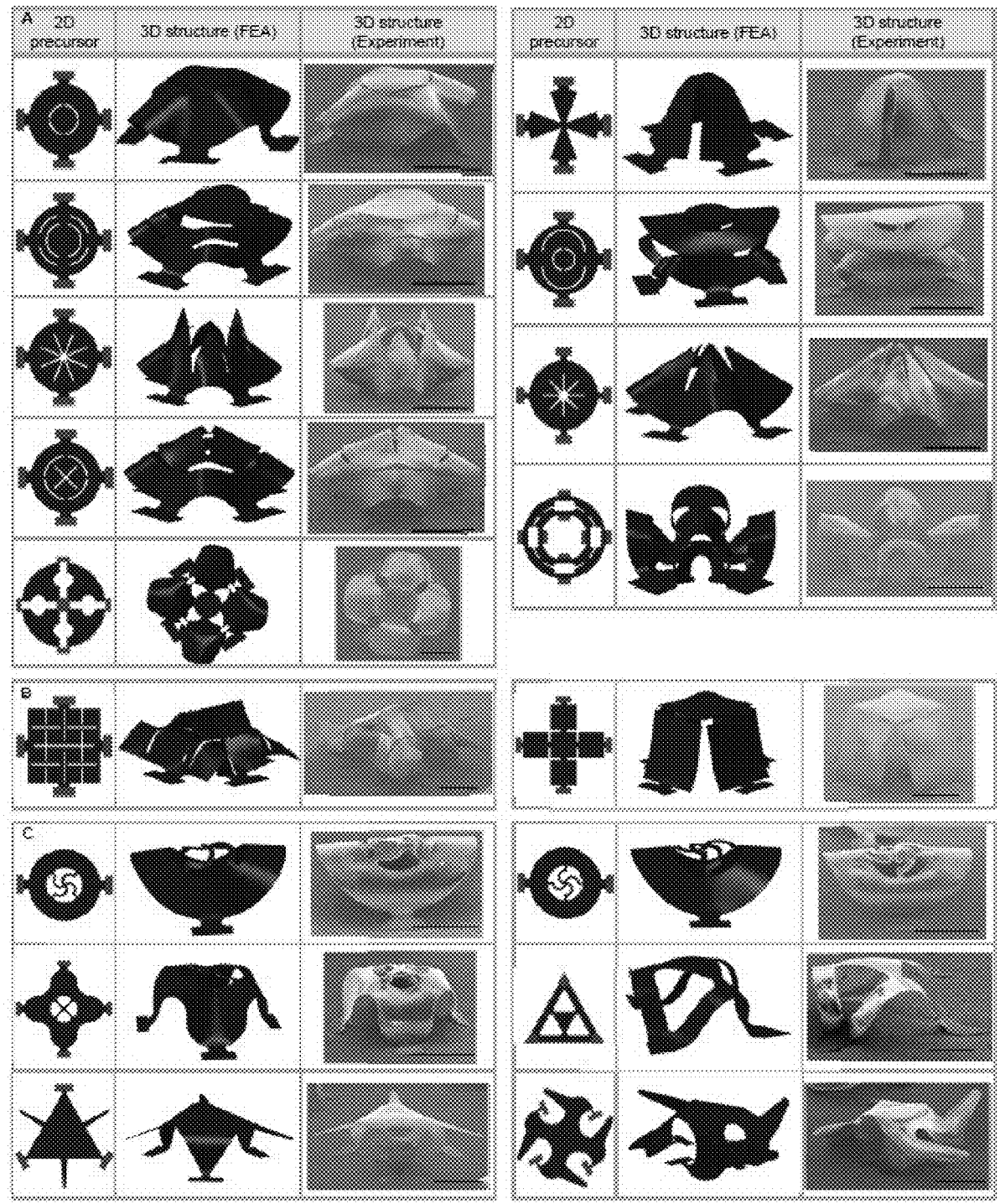
FIG. 47: (A)-(C) show a comparison between experimental images and FEA predictions for various 3D structures made from polymer (SU8). The scale bars in all images are 200 μm.
Figure 48:
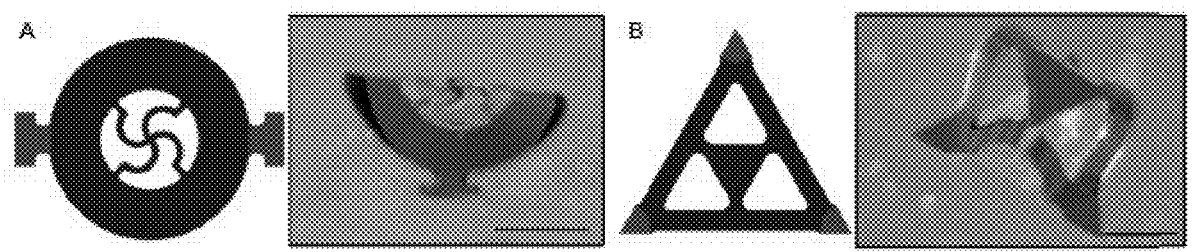
FIG. 48: (A) and (B) show a comparison between experimental images and FEA predictions for two 3D structures (made from Au). The scale bars in all images are 200 μm.
Figure 49:
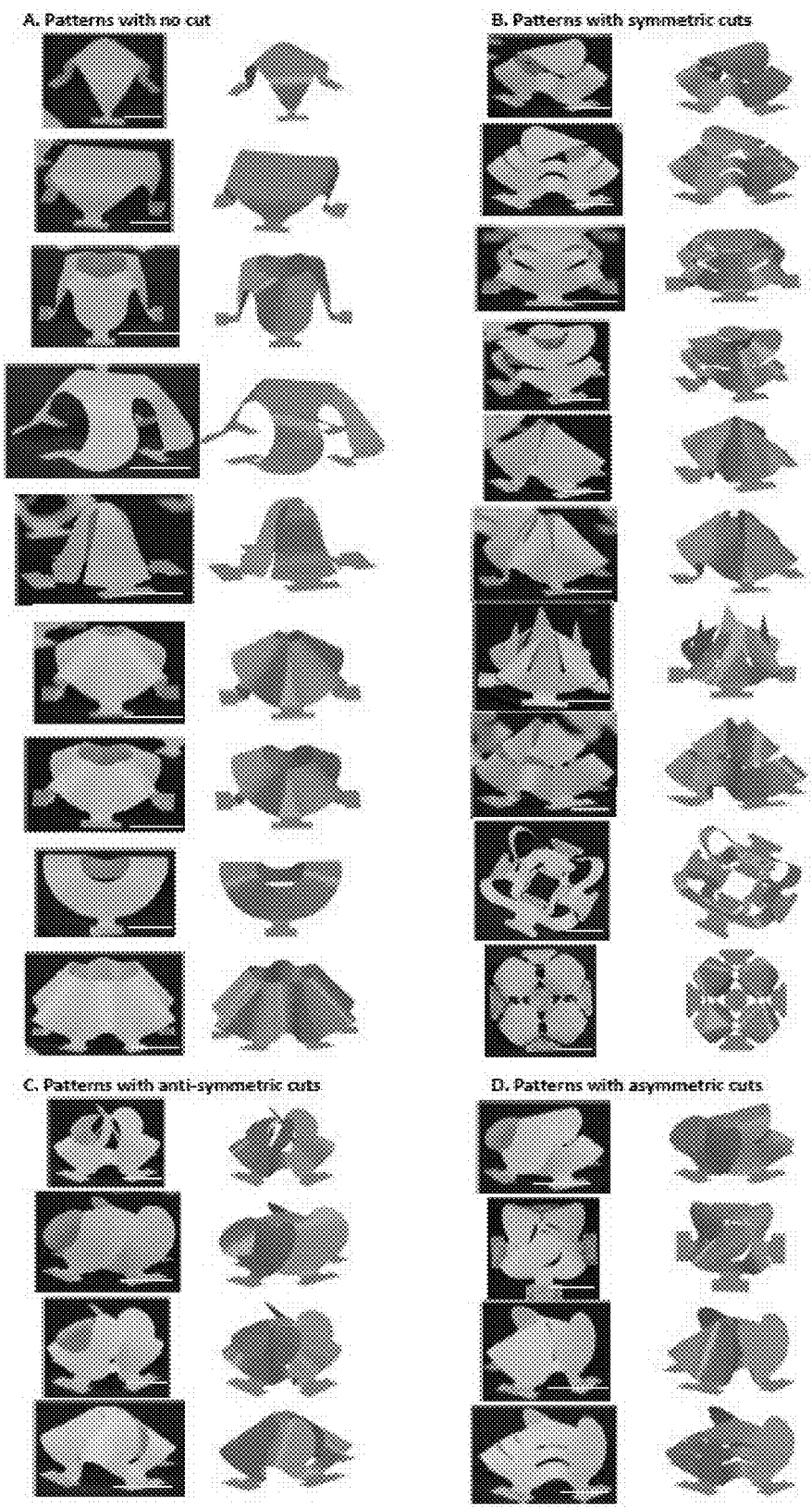
FIG. 49: (A)-(D) show a comparison between experimental images and FEA predictions for various 3D structures made from plastic films at macroscale. The scale bars in all images are 20 mm.
Figure 50:
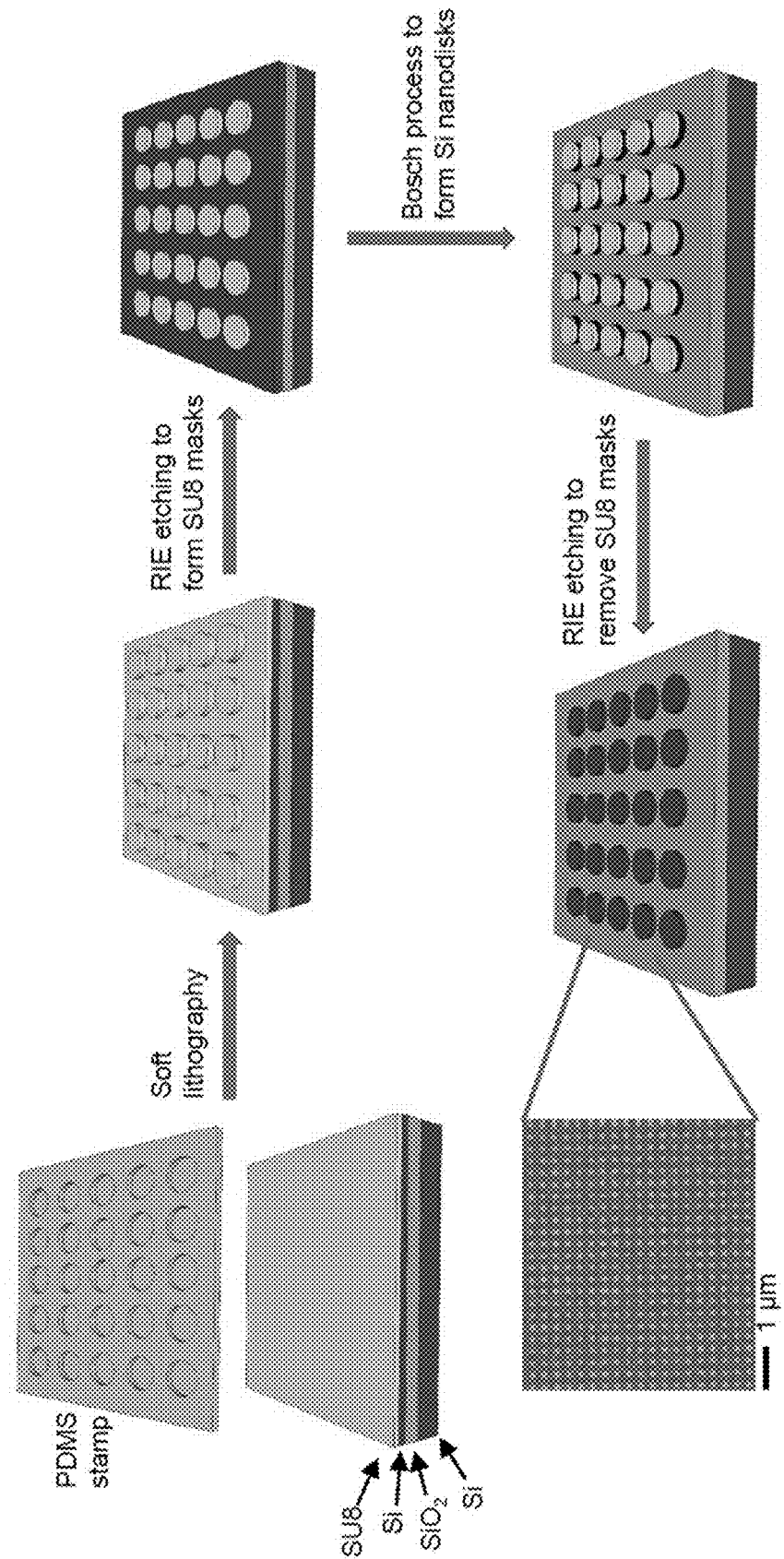
FIG. 50: Process steps for making silicon nanodisks on a silicon-on-insulator wafer (200 nm thicknesses of silicon) by soft lithography. The diameters of the nanodisks are 200 nm.
Figure 51:
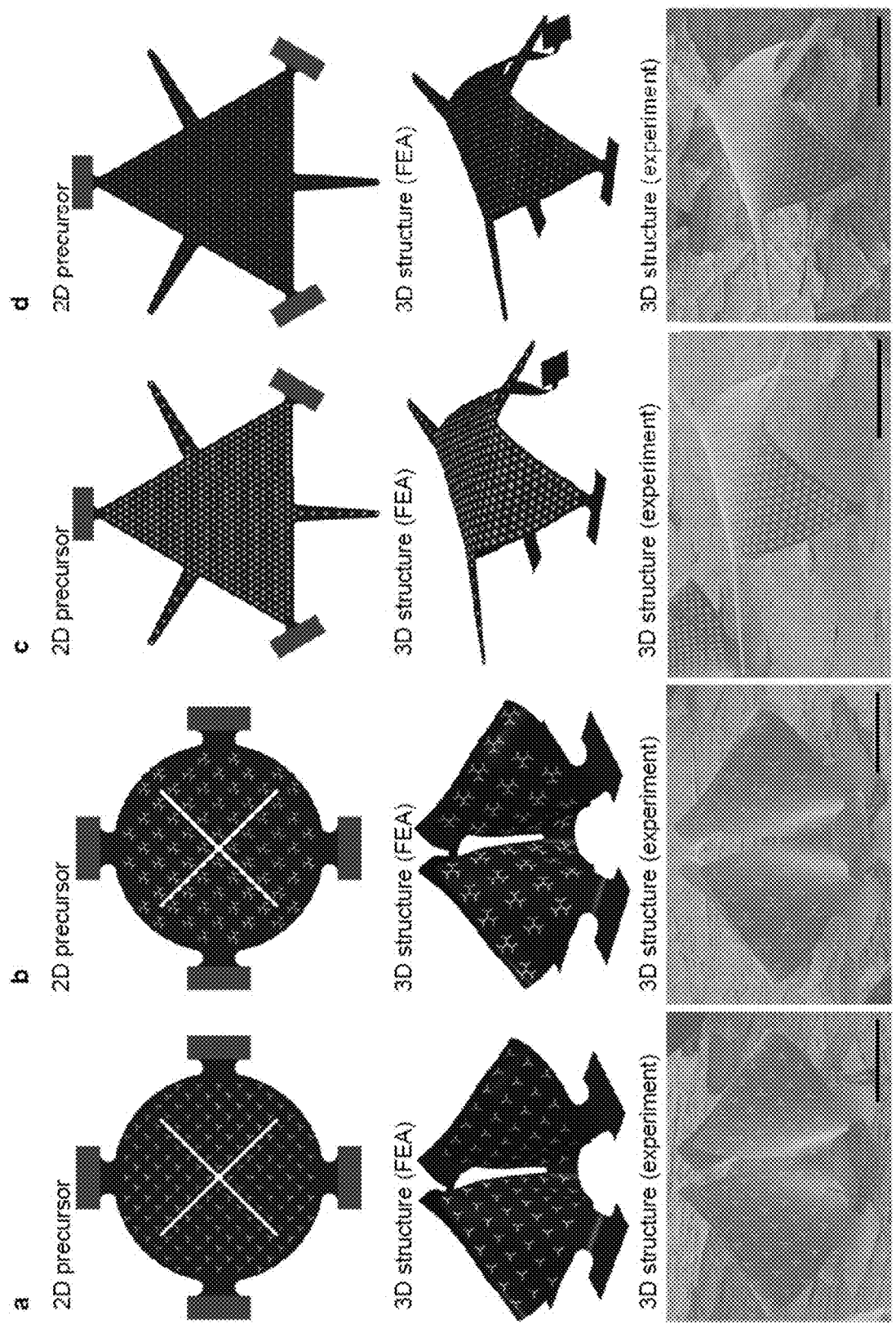
FIG. 51: (A)-(D) show a comparison between experimental images and FEA predictions for four hybrid 3D structures of polymer (SU8) and patterned Au. The scale bars in both images are 200 μm.

The physical nature of the Kirigami assembly process allows immediate application across a broad range of material types. FIGS. 32A and B present examples, including those formed using both polymers and metals (Au), with membrane or hybrid membrane-ribbon configurations. Corresponding 2D precursors appear in FIG. 46. Additional examples are in FIGS. 47 and 48. FIG. 49 includes all of the structures in FIG. 30 reproduced in millimeter-scale plastic models. Heterogeneous combinations of different materials are also possible, with two examples constructed with polymers and silicon in FIG. 32C. Furthermore, buckled membranes can be exploited as 3D platforms (with curved surfaces), for micro/nanopatterns of other materials, as demonstrated in polymer-silicon (FIG. 32D) and polymer-metal (FIG. 32E). In particular, FIG. 32D shows a square array of silicon nano-disks (~200 nm in thickness, ~200 nm in diameter) formed by soft lithography (FIG. 50) on a 2D polymer precursor that transforms into 3D structure with three untethered ribbons. The first example of FIG. 32E corresponds to a square array of Au micro-disks (~50 nm in thickness, ~5 μm in diameter) distributed across the area of a 2D precursor. The array follows the curved surfaces of the 3D architecture that forms by Kirigami assembly. The second example involves a spiral pattern of Au micro-disks (~50 nm in thickness, ~10 μm in diameter), consisting of eight unevenly spaced branches (each with ~20 micro-disks) that adapt to the anti-symmetric cuts of the supporting polymer membrane. The assembly process projects these patterns onto four petal-shaped structures, thereby placing them in a 3D configuration. To the right is an example with the configuration of a square space-filling tree (with 5th order) as a complex Au network (with 5 μm width for each wire) that is then transformed into a 3D spatial form. The last pattern of FIG. 32E corresponds to 3rd order fractal Cayley tree (46) microstructures (Au, ~5 μm width for each wire) on a 3D membrane with four identical parts. Similar hybrid architectures with 1st and 2nd order Cayley tree configurations are in FIGS. 51A and B. Two additional examples with an array of Au micro-disks assembled in a 3D polymer layout appear in FIGS. 51C and D.

A Mechanically Tunable Optical Transmission Window.

Figure 33:
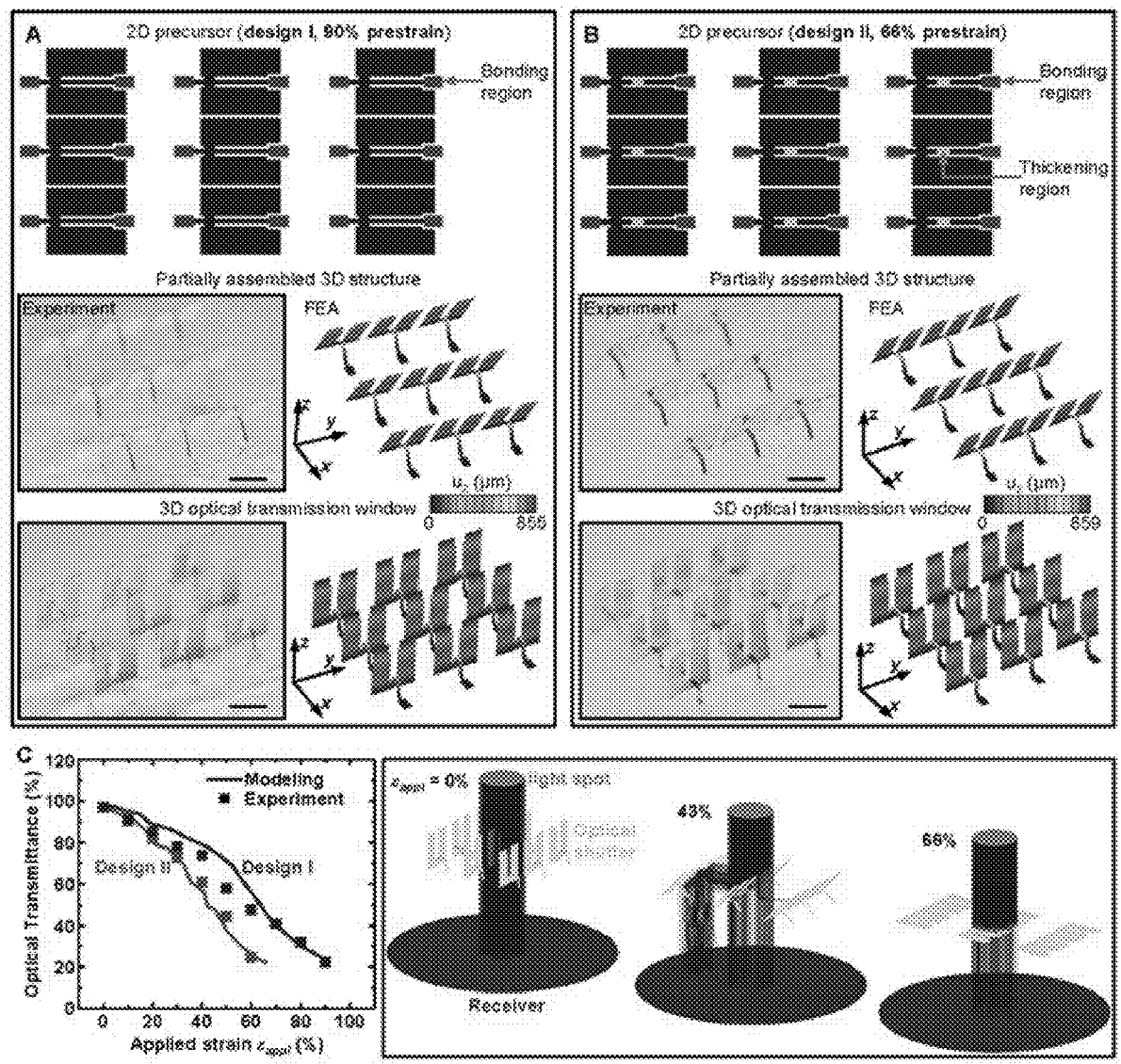
FIG. 33: A mechanically tunable optical transmission window and corresponding measurements and simulations of optical transmittance as a function of applied strain. (A) Schematic illustration of the 2D precursor and its regions of bonding (i.e., red rectangles) (top), optical micrographs and FEA predictions of the intermediate state (middle) and final state (bottom). The color in the FEA results corresponds to the magnitude of the out-of-plane component of the displacement. (B) Similar results for a design with engineered variations in thickness along the length of the support structures. The thick regions appear in yellow in the top panel. (C) Measured and calculated optical transmittance as a function of uniaxial strain applied to the elastomeric substrate for the devices illustrated in (A) and (B). The right panel indicates the simulated light path for devices with engineered thickness variations, at three different levels of stretching. All scale bars are 500 µm.
Figure 34:
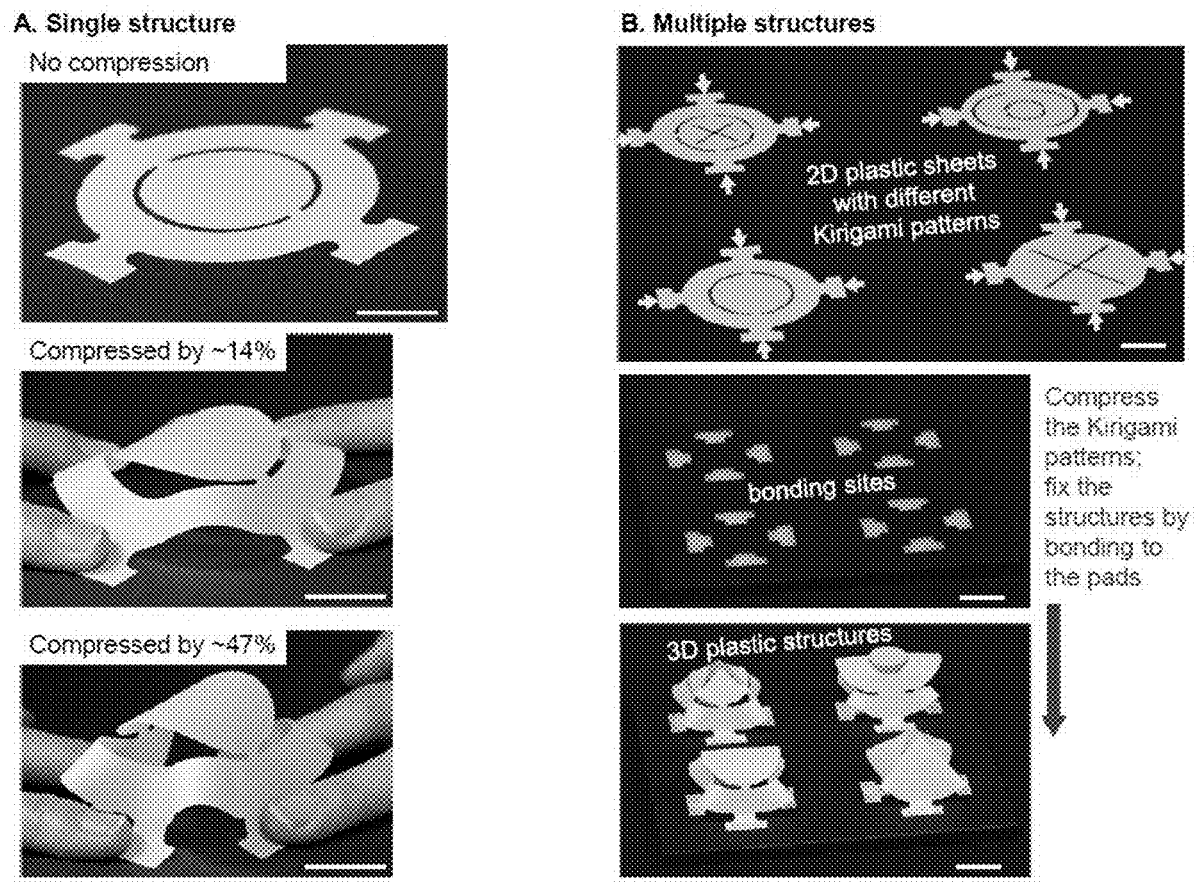
FIG. 34: Illustration of the Kirigami process applied to macroscale sheets of plastic. (A) A thin (~80 µm thick) plastic film in a freestanding state and in states of biaxial compression (14% and 47%) induced by manual application of force. (B) Four 2D plastic precursors with the same overall shape but different Kirigami cuts, and the corresponding 3D structures under compression (~47%). All scale bars are 20 mm.
Figure 35:
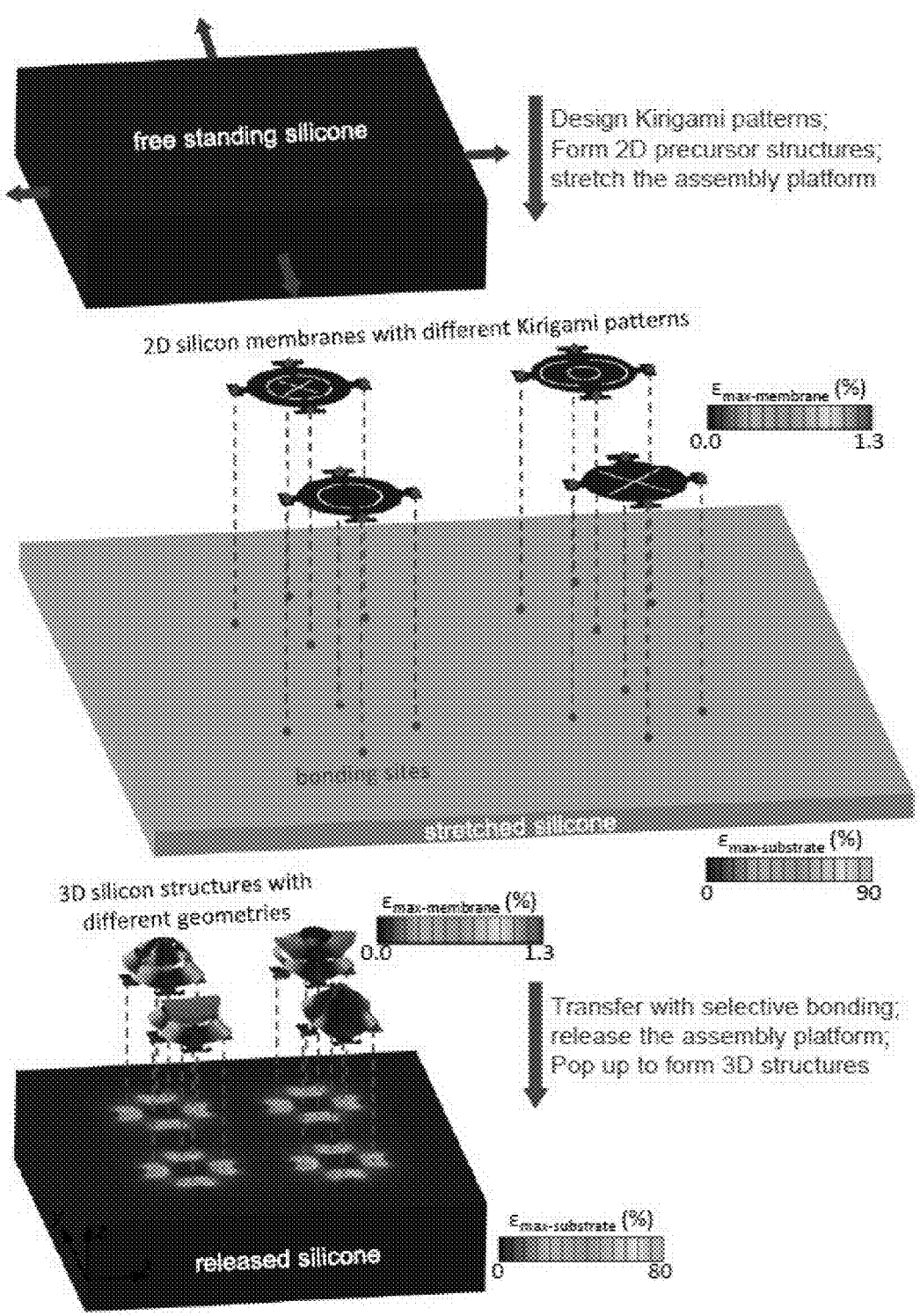
FIG. 35: Finite-element analysis (FEA) results that illustrate the formation of 3D structures from 2D silicon nano-mebranes (Si NMs) bonded at selected regions (red dots) to a biaxially stretched silicone elastomer. Compressive forces induced by relaxing the strain in the elastomer lead to coordinated out-of-plane deformations and translational motions in the Si NMs, yielding 3D structures with geometries that depend highly on the geometries of the 2D precursors and the Kirigami cuts in them.

The ability to dynamically and reversibly change the 3D shapes represents an important functional option associated with all of the mesostructures described previously. FIG. 33 provides a device demonstration in the form of a mechanically tunable optical transmission window (with 3×3 array of shutter-like structures). A representative element (top panel, FIG. 33A) consists of a reflective membrane (~50 nm thick Au on a ~8 μm thick layer of SU8) in a square shape, with two non-penetrating Kirigami cuts. The two ends bond to a transparent, uniaxially pre-strained elastomer substrate at rectangular anchors. Compressive buckling of central ribbon forces rotational motion of the membrane, as shown by both experiment and FEA results in an intermediate state of assembly (middle panel, FIG. 33A). As the membranes rotate upward, they block a decreasing fraction of normally incident light. FEA simulations identify a level of prestrain (~90%) that maximizes the range over which the transmittance can be tuned in this fashion. Here, the membranes, in their fully rotated state, are nearly perpendicular to the plane of the elastomer substrate (bottom panel, FIG. 33A). The optical micrographs and FEA images show excellent agreement for both the intermediate and final states of assembly. FIG. 33B presents a variation of this design, in which short segments (~17%) in the centers of the ribbons have increased thicknesses (corresponding to a double layer of ~50 nm thick Au and ~23 μm thick SU8). This structure offers greatly enhanced rotations for a given level of strain, as a consequence of the reduced curvature in the thickened regions of the ribbons. Here, the thin segments accommodate an increased level of deformation. Experiment and FEA results (middle and bottom panels, FIG. 33B) illustrate this characteristic. Consequently, a comparatively low level of prestrain (~66%) actuates the full, ninety degree rotation of the membrane.

FIG. 33C shows measurements and modeling results for the dependence of optical transmittance on the uniaxial strain ($\varepsilon_{appl}$) applied to the elastomeric substrate for these two different designs. The illumination spot (diameter ~1.0 mm) covers the entire active area throughout the experiments. In both cases, the optical transmittance decreases monotonically from ~97% in the zero-strain state, to ~22% at the critical state ($\varepsilon_{appl}$=90% and 66% for the two designs). Linear fits of the data yield metrics (i.e., the slopes of the fitted lines) for the sensitivity of the transmittance to strain, indicating ~40% (relative) increase in sensitivity (~1.26 versus ~0.90) enabled by the thickness-modulated design (FIG. 33B). This result indicates the potential of engineering variations in thickness to achieve desired mechanical behaviors. The measured optical properties agree reasonably well with modeling that involves calculation of the optical transmittance associated with 3D geometries predicted by FEA. Three representative states of the non-uniform design appear in the right panel of FIG. 33C.

Conclusions

The Kirigami inspired concepts, design principles and micro/nanofabrication strategies reported here provide immediate access to wide-ranging 3D membrane architectures with broad ranging critical dimensions and material compositions, including high performance semiconductor nanomaterials. The resulting engineering options in functional 3D mesostructures have sweeping implications for construction of advanced micro/nanosystems technologies. Additional opportunities may follow from the use of these concepts with fully formed devices, such as waveguides, light sources and integrated circuits, and/or with 3D structures formed using complementary techniques in 3D printing (16, 47-49).

Methods

Finite Element Analysis.

The calculations used linear buckling analyses of 2D precursor structures under compression to determine the critical buckling strains and corresponding buckling modes. These results served as initial geometric imperfections for post-buckling simulations. Eight-node 3D solid elements and four-node shell elements were used for the substrate and 2D precursor structure, respectively, with refined meshes adopted to ensure the accuracy. The elastic modulus (E) and Poisson's ratio (v) are $E_{substrate}$=166 kPa and $V_{substrate}$=0.49 for substrate; $E_{Si}$=130 GPa and $v_{Si}$=0.27 for Silicon; $E_{Au}$=78 GPa and vAu=0.44 for gold; and $E_{SU8}$=4.02 GPa and $v_{SU8}$=0.22 for SU8.

Fabrication Methods for Silicon, Metals, Polymers and Combinations of them.

Figure 52:
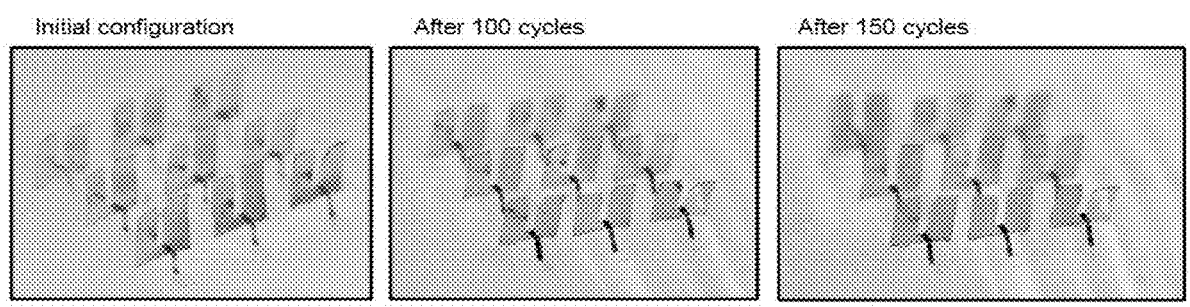
FIG. 52: Cyclic testing of an optical transmission window with engineered thickness variations, under uniaxial strain with an amplitude of ~65% at a frequency of ~0.04 Hz. The three images correspond to the initial state, and the states after 100 and 150 cycles.

Preparation of 3D mesostructures of Si NMs/SU8 (both 300 nm in thickness) began with patterning of 2D precursors in the top silicon layer of a silicon-on-insulator (SOI) wafer (300 nm thicknesses of top silicon) by photolithography and reactive ion etching (RIE). After addition of a thin reinforcement layer of a photodefinable epoxy (SU8, 300 nm in thickness) in a geometry to match the patterned silicon, immersion in hydrofluoric acid (HF) removed the buried silicon dioxide ($SiO_2$) layer from the exposed regions and also slightly from under the edges of the patterns at their periphery. Next, spin-casting and photolithography formed patterns of a photoresist (AZ5214, 1.6 μm in thickness) to define the sites for strong bonding in the Kirigami process. Re-immersion in HF completed the removal of the buried oxide by complete undercut etching. The photoresist at the edge regions tethered the silicon structures to the underlying wafer. Retrieving the structures onto a slab of PDMS (Sylgard 184 silicone elastomer, 1:4) and then transferring them to a water soluble tape (polyvinyl alcohol, PVA) oriented the 2D precursors with their top sides facing up, supported by the PVA. Exposing these precursors and a thin silicone elastomer (Dragon Skin, Smooth-On, 0.5 mm in thickness) to ultraviolet induced ozone (UVO) yielded hydroxyl termination on their surfaces. A mechanical stage allowed controlled stretching of the silicone to well-defined levels of prestrain (either uniaxial or biaxial). Laminating the PVA tape with the precursors onto the silicone followed by baking in an oven at 70° C. for 7 mins, yielded strong covalent bonds between the silicone and the exposed regions of the silicon. Washing with hot water and then acetone dissolved the PVA tape and the photoresist sacrificial layers. Slowly releasing the prestrain completed the 3D Kirigami assembly process. A schematic illustration of steps is provided in FIG. 52.

Preparation of 3D Si NM (100 nm in thickness) mesostructures involved defining 2D precursors on an SOI wafer (100 nm thicknesses of top silicon) followed by procedures described above, except without the addition of SU8.

Figure 53:
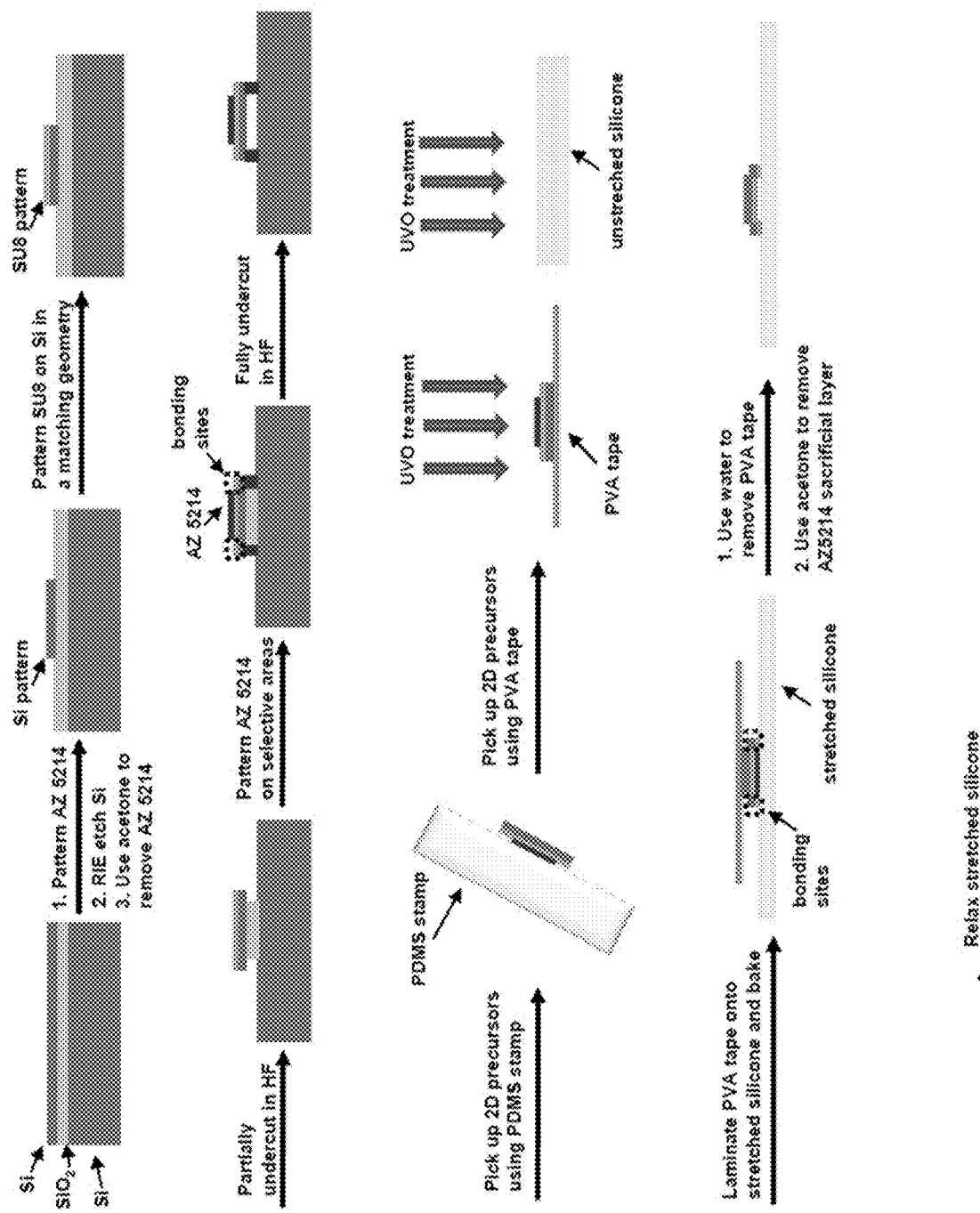
FIG. 53: Schematic illustration of steps for fabricating 3D Kirigami structures of bilayers of Si NMs and layers of polymer (SU8).

Preparation of 3D mesostructures in polymer membranes started with thermal oxidation to form a layer of $SiO_2$ (500 nm in thickness) on a silicon wafer. Next, spin-casting and photolithography formed 2D precursors of SU8 (4 μm in thickness) on the $SiO_2$. Immersion in HF removed the $SiO_2$ from the exposed regions and also slightly from under the edges of the SU8. Next, spin-casting and photolithography formed patterns of photoresist (AZ5214, 1.6 μm in thickness) to define the sites for strong bonding. Re-immersion in HF eliminated the remaining $SiO_2$ by complete undercut etching. Transfer and bonding steps similar to those used for the Si NM/SU8 structures followed by release of the prestrain completed the assembly process. A schematic illustration of steps is provided in FIG. 53.

Figure 54:
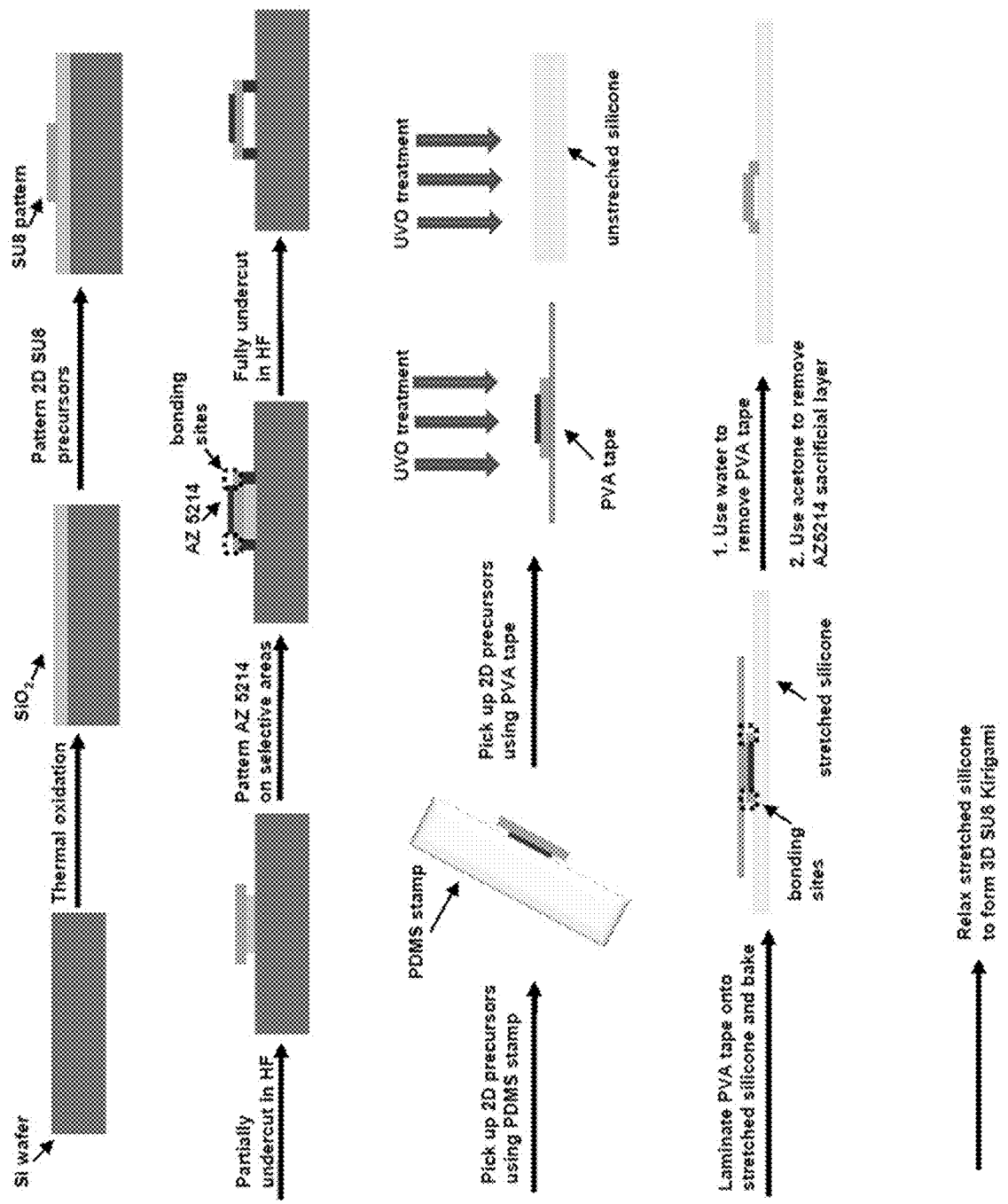
FIG. 54: Schematic illustration of steps for fabricating 3D Kirigami structures of polymer (SU8).

Preparation of 3D mesostructures that include both silicon and polymer membranes began with spin-casting a layer of photoresist (AZ 5214, 1.6 μm in thickness) on a SOI wafer (300 nm thicknesses of top silicon). Photolithography and RIE etching defined 2D patterns in the top silicon. Next, spin-casting and photolithographic patterning formed a thin layer (4 μm in thickness) of SU8, in a distinct geometry spanning both the silicon and other regions. The remaining steps followed the procedures for 3D SU8 mesostructures described above. A schematic illustration is provided in FIG. 54A.

Preparation of 3D mesostructures of SU8 with arrays of silicon nanodisks began with spin-coating of a thin layer (200 nm in thickness) of SU8 on an SOI wafer (200 nm thicknesses of top silicon). Soft imprint lithography with a mold of PDMS with relief in the geometry of cylinders (period 300 nm; diameter 200 nm; height 200 nm) defined corresponding relief in the SU8. RIE etching of the residual layer of SU8 formed isolated disks of SU8 that served as masks for inductively coupled plasma reactive ion etching (STS) to define arrays of silicon nanodisks in the top silicon layer. RIE eliminated the remaining SU8. Next, spin-casting and photolithography defined patterns of SU8 (4 μm in thickness). The remaining steps followed the procedures for 3D SU8 structures described above. A schematic illustration of steps is provided in FIG. 54B.

Figure 55:
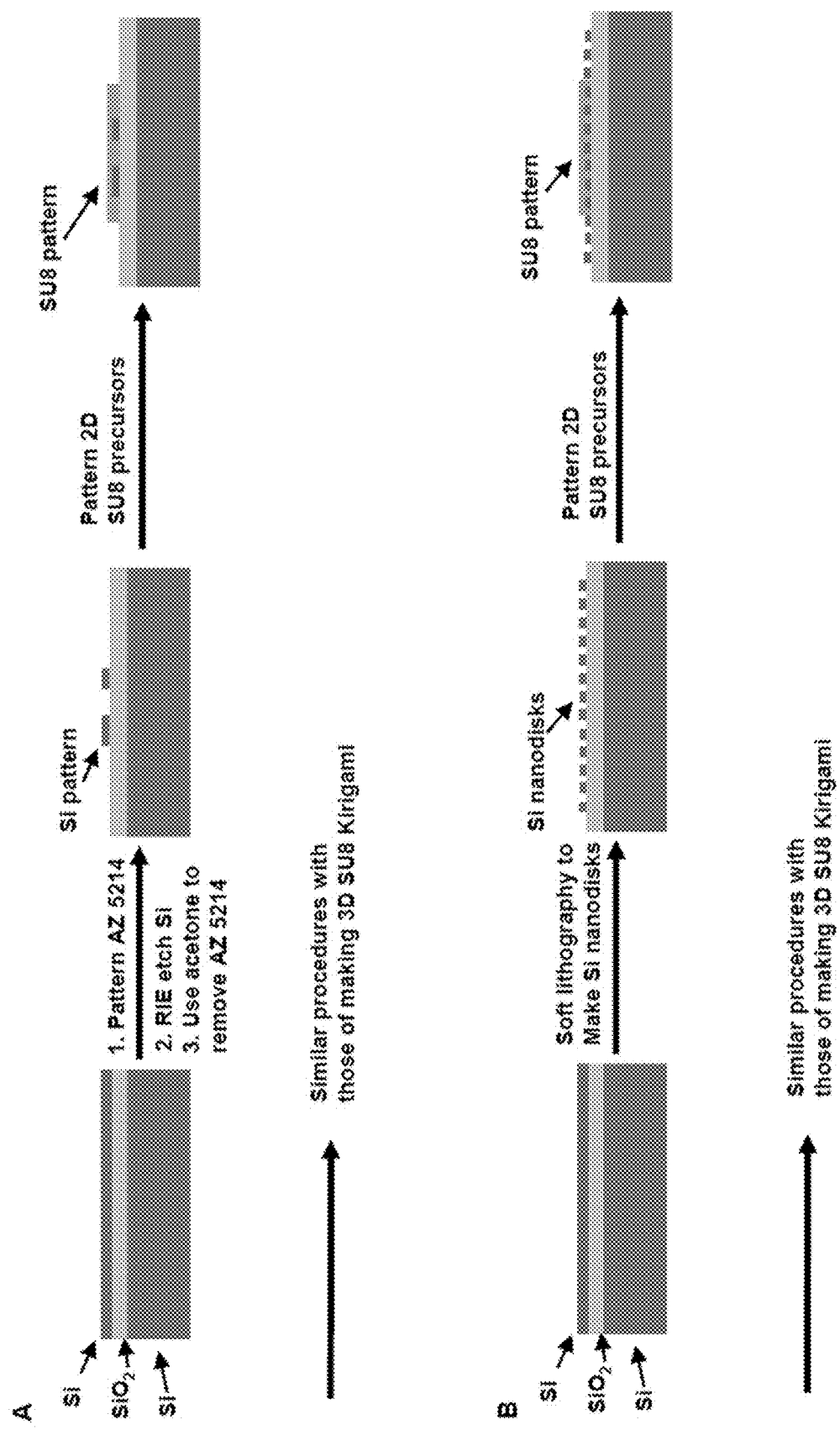
FIG. 55: (A) Schematic illustration of steps for fabricating 3D hybrid Kirigami structures of Si NMs and polymer (SU8), as shown in FIG. 32(C). (B) Schematic illustration of steps for making 3D hybrid Kirigami structures of Si nanodisks on layers of polymer (SU8) as shown in FIG. 32(D).
Figure 56:
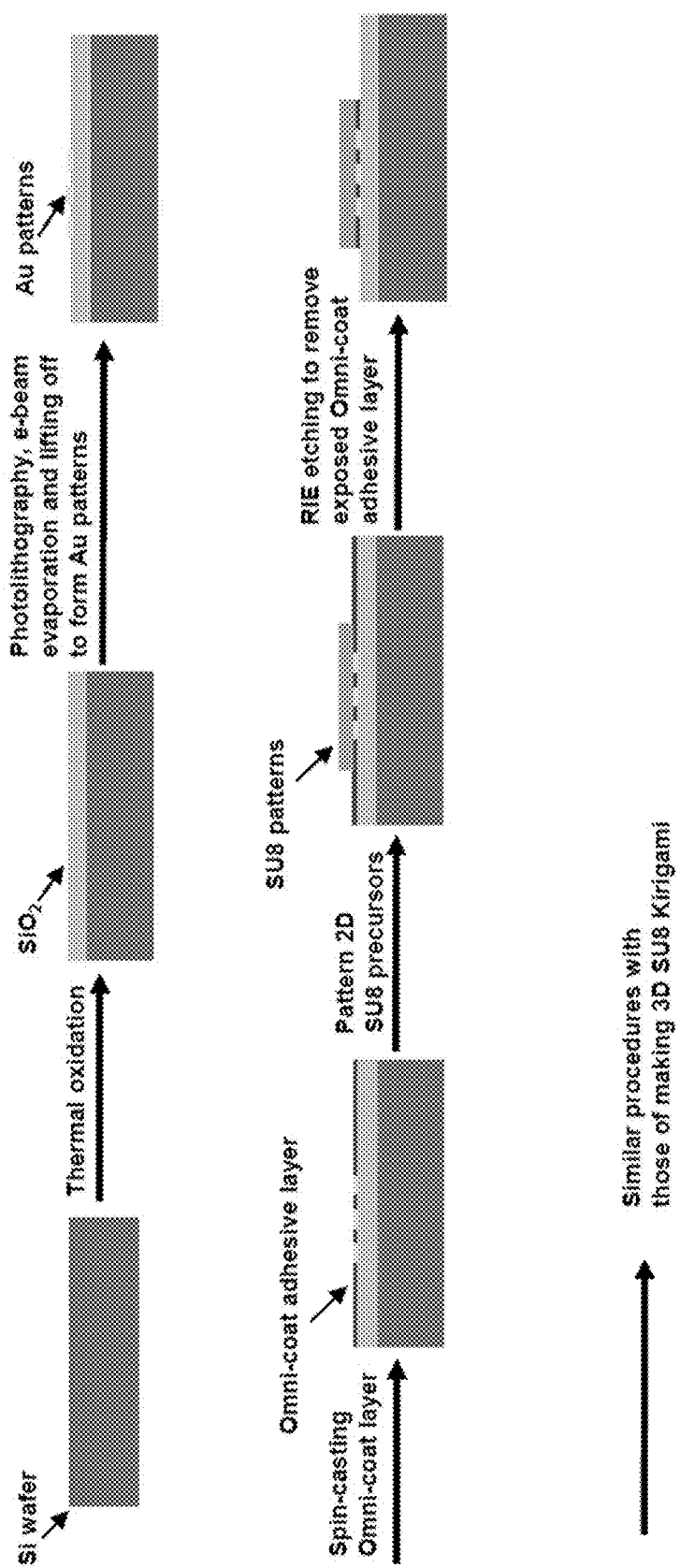
FIG. 56: Schematic illustration of steps for fabricating 3D Kirigami structures of Au and polymer (SU8).

Preparation of 3D mesostructures in metal and polymer hybrid membranes began with the thermal oxidation to form a layer of $SiO_2$ (500 nm in thickness) on a silicon wafer. Photolithography, electron beam evaporation and lift-off defined patterns of Cr (5 nm in thickness) and Au (50 nm in thickness) on the $SiO_2$. Spin-casting formed an adhesion promoting layer (Omnicoat, MicroChemicals, 30 nm in thickness) for spin-casting and photolithographic patterning of a thin (4 μm in thickness) layer of SU8 in a geometry matched to the Cr/Au. RIE etching removed the exposed regions of the adhesion promoting layer. The remaining steps followed the procedures for 3D SU8 structures described above. A schematic illustration of steps is provided in FIG. 55.

Preparation of mechanically tunable optical transmission windows with uniform thicknesses followed steps similar to those for making 3D structures in hybrid membranes of metal and polymer, except that SU8 with 8 μm thickness was used. Preparation of related structures with thickened regions involved photolithographic patterning of an additional layer of SU8 (15 μm in thickness).

REFERENCES

1. Shenoy V B, Gracias D H (2012) Self-folding thin-film materials: From nanopolyhedra to graphene origami. MRS Bull 37(9):847-854.
2. Li F, Josephson D P, Stein A (2011) Colloidal Assembly: The Road from Particles to Colloidal Molecules and Crystals. Angew Chem Int Ed 50(2):360-388.
3. Damasceno P F, Engel M, Glotzer S C (2012) Predictive Self-Assembly of Polyhedra into Complex Structures. Science 337(6093):453-457.
4. Crane N B, Onen O, Carballo J, Ni Q, Guldiken R (2013) Fluidic assembly at the microscale: progress and prospects. Microfluid Nanofluid 14(3-4):383-419.
5. Jang J H, et al. (2007) 3D micro- and nanostructures via interference lithography. Adv Funct Mater 17(16):3027-3041.
6. Fischer J, Wegener M (2013) Three-dimensional optical laser lithography beyond the diffraction limit. Laser Photonics Rev 7(1):22-44.
7. Arpin K A, et al. (2010) Multidimensional Architectures for Functional Optical Devices. Adv Mater 22(10):1084-1101.
8. Noorduin W L, Grinthal A, Mahadevan L, Aizenberg J (2013) Rationally Designed Complex, Hierarchical Microarchitectures. Science 340(6134):832-837.
9. Gao P X, et al. (2005) Conversion of zinc oxide nanobelts into superlattice-structured nanohelices. Science 309 (5741):1700-1704.
10. Huang M H, Cavallo F, Liu F, Lagally M G (2011) Nanomechanical architecture of semiconductor nanomembranes. Nanoscale 3(1):96-120.
11. Tian B Z, et al. (2012) Macroporous nanowire nanoelectronic scaffolds for synthetic tissues. Nat Mater 11(11):986-994.
12. Leong T G, et al. (2009) Tetherless thermobiochemically actuated microgrippers. Proc Nat Acad Sci USA 106(3): 703-708.
13. Yu M R, et al. (2011) Semiconductor Nanomembrane Tubes: Three-Dimensional Confinement for Controlled Neurite Outgrowth. ACS Nano 5(4):2447-2457.
14. Zhang H G, Yu X D, Braun P V (2011) Three-dimensional bicontinuous ultrafast-charge and -discharge bulk battery electrodes. Nat Nanotechnol 6(5):277-281.
15. Pikul J H, Zhang H G, Cho J, Braun P V, King W P (2013) High-power lithium ion microbatteries from interdigitated three-dimensional bicontinuous nanoporous electrodes. Nat Commun 4:1732.
16. Sun K, et al. (2013) 3D Printing of Interdigitated Li-Ion Microbattery Architectures. Adv Mater 25(33):4539-4543.
17. Deng J W, et al. (2013) Naturally Rolled-Up C/Si/C Trilayer Nanomembranes as Stable Anodes for Lithium- Ion Batteries with Remarkable Cycling Performance. Angew Chem Int Ed 52(8):2326-2330.
18. Pan L, et al. (2012) Hierarchical nanostructured conducting polymer hydrogel with high electrochemical activity. Proc Nat Acad Sci USA 109(24):9287-9292.
19. Wu H, et al. (2013) Stable Li-ion battery anodes by in-situ polymerization of conducting hydrogel to conformally coat silicon nanoparticles. Nat Commun 4:1943.
20. Songmuang R, Rastelli A, Mendach S, Schmidt O G (2007) SiOx/Si radial superlattices and microtube optical ring resonators. Appl Phys Lett 90(9):091905.
21. Lee J H, et al. (2014) 25th Anniversary Article: Ordered Polymer Structures for the Engineering of Photons and Phonons. Adv Mater 26(4):532-568.
22. Braun P V (2014) Materials Chemistry in 3D Templates for Functional Photonics. Chem Mater 26(1):277-286.
23. Schumann M, Buckmann T, Gruhler N, Wegener M, Pernice W (2014) Hybrid 2D-3D optical devices for integrated optics by direct laser writing. Light-Sci Appl 3:e175.
24. Fan Z, et al. (2009) Three-dimensional nanopillar-array photovoltaics on low-cost and flexible substrates. Nat Mater 8(8):648-653.
25. Bishop D, Pardo F, Bolle C, Giles R, Aksyuk V (2012) Silicon Micro-Machines for Fun and Profit. J Low Temp Phys 169(5-6):386-399.
26. Wood R J (2014) The Challenge of Manufacturing Between Macro and Micro. Am Sci 102(2):124-131.
27. Piyawattanametha W, Patterson P R, Hah D, Toshiyoshi H, Wu M C (2005) Surface- and bulk-micromachined two-dimensional scanner driven by angular vertical comb actuators. J Microelectromech S 14(6):1329-1338.
28. Zeng X Y, et al. (2014) Ultralight, Ultrastiff Mechanical Metamaterials. Science 344(6190):1373-1377.
29. Schaedler T A, et al. (2011) Ultralight Metallic Microlattices. Science 334(6058):962-965.
30. Soukoulis C M, Wegener M (2011) Past achievements and future challenges in the development of three-dimensional photonic metamaterials. Nat Photonics 5(9):523-530.
31. Valentine J, et al. (2008) Three-dimensional optical metamaterial with a negative refractive index. Nature 455(7211):376-379.
32. Cho J H, et al. (2011) Nanoscale Origami for 3D Optics. Small 7(14):1943-1948.
33. Ahn B Y, et al. (2009) Omnidirectional Printing of Flexible, Stretchable, and Spanning Silver Microelectrodes. Science 323(5921):1590-1593.
34. Huang W, et al. (2012) On-Chip Inductors with Self-Rolled-Up SiNx Nanomembrane Tubes: A Novel Design Platform for Extreme Miniaturization. Nano Lett 12(12):6283-6288.
35. Grimm D, et al. (2013) Rolled-up nanomembranes as compact 3D architectures for field effect transistors and fluidic sensing applications. Nano Lett 13(1):213-218.
36. Leong T G, Zarafshar A M, Gracias D H (2010) Three-Dimensional Fabrication at Small Size Scales. Small 6(7):792-806.
37. Prinz V Y, et al. (2001) A new technique for fabricating three-dimensional micro- and nanostructures of various shapes. Nanotechnology 12(4):399-402.
38. Schmidt O G, Eberl K (2001) Nanotechnology—Thin solid films roll up into nanotubes. Nature 410(6825):168-168.
39. Zhang X, et al. (2011) Optically- and Thermally-Responsive Programmable Materials Based on Carbon Nanotube-Hydrogel Polymer Composites. Nano Lett 11(8):3239-3244.
40. Sun Y G, Choi W M, Jiang H Q, Huang Y G Y, Rogers J A (2006) Controlled buckling of semiconductor nanoribbons for stretchable electronics. Nat Nanotechnol 1(3):201-207.
41. Xu S, et al. (2015) Assembly of micro/nanomaterials into complex, three-dimensional architectures by compressive buckling. Science 347(6218):154-159.
42. Sussman D M, et al. (2015) Algorithmic lattice kirigami: A route to pluripotent materials. Proc Nat Acad Sci USA 112(24):7449-7453.
43. Castle T, et al. (2014) Making the Cut: Lattice Kirigami Rules. Phys Rev Lett 113(24).
44. Timoshenko S, Gere J (1961) Theory of Elastic Stability (McGraw-Hill, New York).
45. Cho Y, et al. (2014) Engineering the shape and structure of materials by fractal cut. Proc Nat Acad Sci USA 111(49):17390-17395.
46. Gottheim S, Zhang H, Govorov A O, Halas N J (2015) Fractal Nanoparticle Plasmonics: The Cayley Tree. ACS Nano 9(3):3284-3292.
47. LaFratta C N, Fourkas J T, Baldacchini T, Farrer R A (2007) Multiphoton fabrication. Angew Chem Int Ed 46(33):6238-6258.
48. Lewis J A (2006) Direct ink writing of 3D functional materials. Adv Funct Mater 16(17):2193-2204.
49. Tumbleston J R, et al. (2015) Continuous liquid interface production of 3D objects. Science 347(6228):1349-1352.

Example 3: Origami of Micro/Nanomaterials Through Controlled Buckling

In this example, mechanical buckling schemes for autonomic origami-inspired assembly are presented in comprehensive theoretical and experimental studies, with examples in 3D architectures with a broad range of topologies and material compositions, including high-performance semiconductor nanomaterials. The resulting engineering options in the construction of functional 3D mesostructures have important implications for advanced microsystem technologies.

Origami, the ancient Japanese art of paper folding, involves the transformation of planar paper sheets into macroscopic three-dimensional (3D) sculptures with diverse topologies.[1] Origami is now a topic of rapidly growing interest in the scientific and engineering research communities, due to its potential or use in a broad range of applications, from self-folding microelectronics,[2-4] deformable batteries,[5, 6] and reconfigurable metamaterials,[7] to artificial DNA constructs.[8, 9] Important recent advances in the fundamental aspects of origami include the identification of mechanisms for bi-stability in deformed configurations,[7, 10] and the development of lattice Kirigami (a variant of origami that involves both cutting and folding) methods that solve the inverse problem of folding a flat plate into a complex targeted 3D configuration.[11, 12] In parallel, experimental methods are emerging for the assembly of origami structures at the micro/nanoscale. For example, a representative class of approaches relies on self-actuating materials, such as shape memory alloys,[13, 14] shape memory polymers,[15-17] liquid crystal elastomers,[4] and hydrogels,[18-20] for programmable shape changes. These schemes are, however, not directly applicable to many technologically important types of materials, such as semiconductors or metals. Other routes rely on capillary forces (or surface tension forces),[21-24] or residual stresses in thin films[25-28] to drive the origami assembly, with the distinct practical advantage of compatibility with established planar device technologies. In most cases, however, such approaches[21, 23-27] are irreversible and offer limited control of parameters such as the folding angle, or folding rate. The results described in the following introduce a set of concepts in which controlled mechanical buckling actuates origami type transformations, where spatial variations in thickness of a 2D precursor structure guide the deformation process, in a manner that is fully applicable across material classes, from soft polymers to brittle inorganic semiconductors, and length scales, from nanometers to centimeters. This assembly scheme also enables active, deterministic control over intermediate states in the 2D to 3D transformation, in a continuous and reversible manner. These ideas complement and extend those that exploit buckling of filamentary ribbons to yield 3D mesostructures with open mesh networks,[29, 30] and of membranes with Kirigami patterns of cuts[31] to form 3D mesostructures with closed curved surfaces, thereby opening the access to a wide range of 3D topologies with levels of geometrical complexity significantly beyond those reported previously. Demonstrations include a broad set of 3D structures formed through unidirectional, bidirectional, and even hierarchical folding, with examples ranging from half cylindrical columns and fish scales, to cubic boxes, pyramids, starfish, paper fans, skew tooth structures, in addition to amusing system-level examples of soccer balls, model houses, cars, and multi-floor textured buildings.

Figure 57:
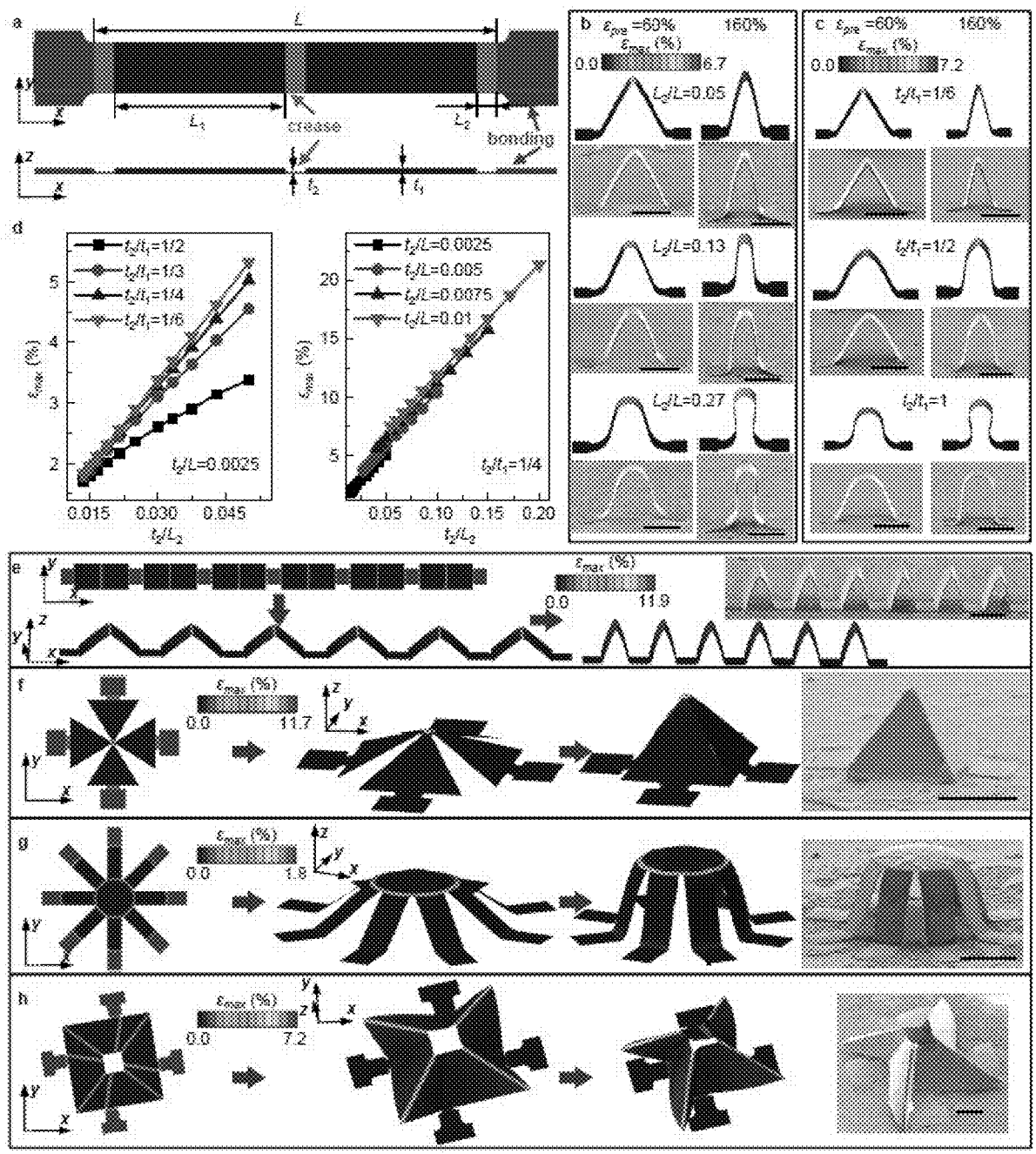
FIG. 57: Conceptual illustration of buckling guided origami and examples of origami assembly of 3D mesostructures from corresponding 2D ribbons/membranes. (a) Top and cross-sectional views of a straight ribbon consisting of two different thicknesses indicated in the schematic illustration. FEA results and corresponding SEM images of deformed mesostructures consisting of bilayers of metal (Au) and polymer (SU8) under two different levels (60% and 160%) of prestrain, for non-uniform ribbons (b) with a fixed thickness ratio ($t_2/t_1=¼$) and three different length ratios ($L_2/L$), or (c) with a fixed length ratio ($L_2/L=0.05$) and three different thickness ratios ($t_2/t_1$). (d) Maximum material strain versus the normalized thickness ($t_2/L_2$) of a straight ribbon (a) under compression with 160% prestrain, for a fixed $t_2/L=0.0025$ with a range of $t_2/t_1$ (left), and a fixed $t_2/t_1=¼$ with a range of $t_2/L$ (right). (e) FEA results (left three panels) that describe the formation of triangular columns made of polymer (SU8), along with corresponding SEM image (rightmost panel) of the final configuration. (f) to (h) Similar results that describe the formation of a 3D pyramid (SU8), cylindrical shell (bilayer of silicon and SU8), and a complex 'windmill' mesostructure (bilayer of Au and SU8).

A straight ribbon serves as a simple example to illustrate the overall design concept. Here, compressive forces associated with relaxation of prestrain in a supporting elastomer substrate exert on a ribbon structure (i.e., the 2D precursor in this case) at selected regions (i.e. bonding locations; red, FIG. 57(a)), thereby deforming the system into a 3D structure, in an overall process similar to that used previously in ribbons/membranes with uniform thickness.[30, 31] The key difference here is that the 2D precursor includes engineered variations in thickness to guide folding deformations at specific, targeted locations. In this example, the ribbon (length L, excluding the bonding locations) consists of five segments (FIG. 57(a)), two (in blue color, each with length $L_1$ and thickness $t_1$) of which are thicker than the other three (in gray color, each with length $L_2$ and thickness $t_2$). When the thickness ratio ($t_2/t_1$) is relatively small (e.g., $<1/3$), the thick segments undergo negligible deformation while the thin ones accommodate the compression via folding, simply as a consequence of the cubic downscaling of the bending stiffness with thickness. Furthermore, as the length ratio ($L_2/L$) decreases (e.g., $<0.1$) the radius of curvature associated with this folded region decreases. FIG. 57(b),(c) illustrates these behaviors through finite element analyses (FEA) and experimental observation, for various length and thickness ratios. These results indicate that both a small thickness ratio ($t_2/t_1<1/3$) and a small length ratio ($L_2/L<0.1$) are required to induce strong folding-type deformations in the thinner segments (referred to as creases in the following). Since the overall compressive deformation is almost entirely accommodated by these creases, the maximum strains must also occur at these regions. Engineering designs that avoid fracture are important. For a straight ribbon with a small thickness ratio ($t_2/t_1 \leq 1/4$), the maximum strain ($\varepsilon_{max}$) changes very slowly with further increase of $t_2/t_1$ (FIG. 57(d), left), indicating that $\varepsilon_{max}$ becomes almost independent on $t_2/t_1$ for sharp creases. Due to the nature of bending deformation in the creases, the maximum strain ($\varepsilon_{max}$) follows a proportional dependence on the normalized thickness ($t_2/L_2$) for a given prestrain ($\varepsilon_{pre}$), suggesting a general scaling law, $\varepsilon_{max} = F(\varepsilon_{pre})t_2/L_2$, where $F(\varepsilon_{pre})$ denotes a function that can be determined from FEA. This relation is well supported by FEA results in FIG. 57(d) (right) for a fixed thickness ratio ($t_2/t_1 = 1/4$) and a wide range of $t_2/L$. Reductions in the crease thickness ($t_2$) and increases in the crease width ($L_2$) act to reduce the maximum strains.

Figure 61:
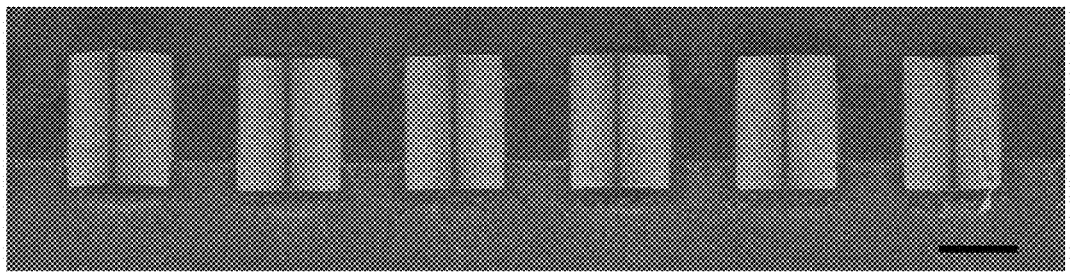
FIG. 61: (a)-(c) show a comparison between experimental images and FEA predictions for 3D origami structures in FIGS. 57(e), (g), and (h), with a top-view angle. Scale bars, 200 µm.
Figure 61:
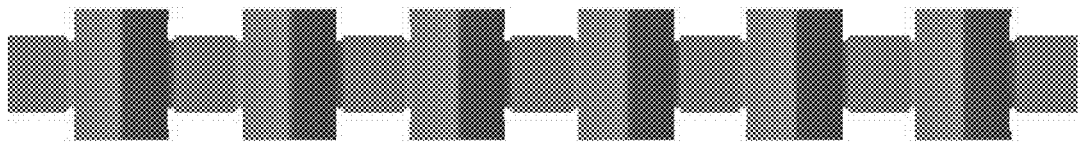
Figure 61:
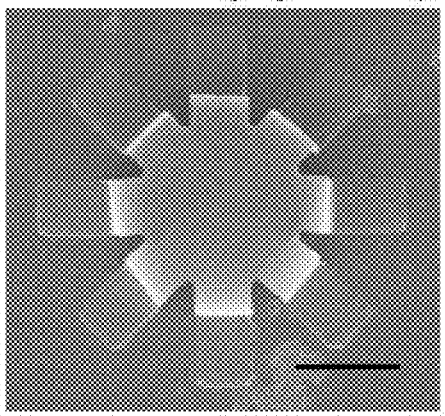
Figure 61:
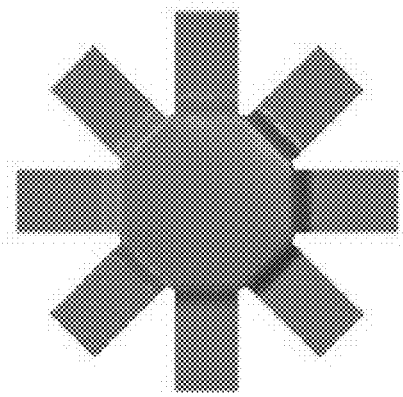
Figure 61:
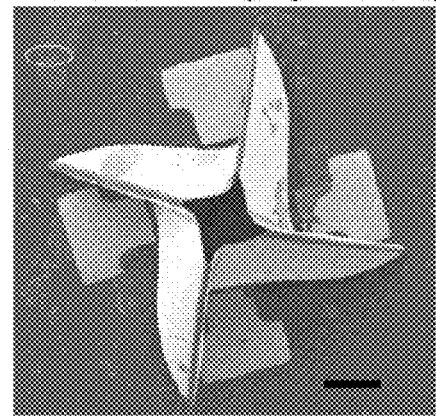
Figure 61:
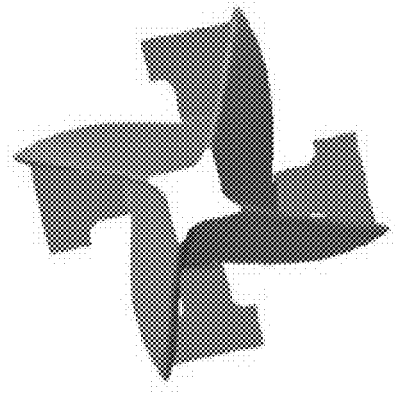
Figure 62:
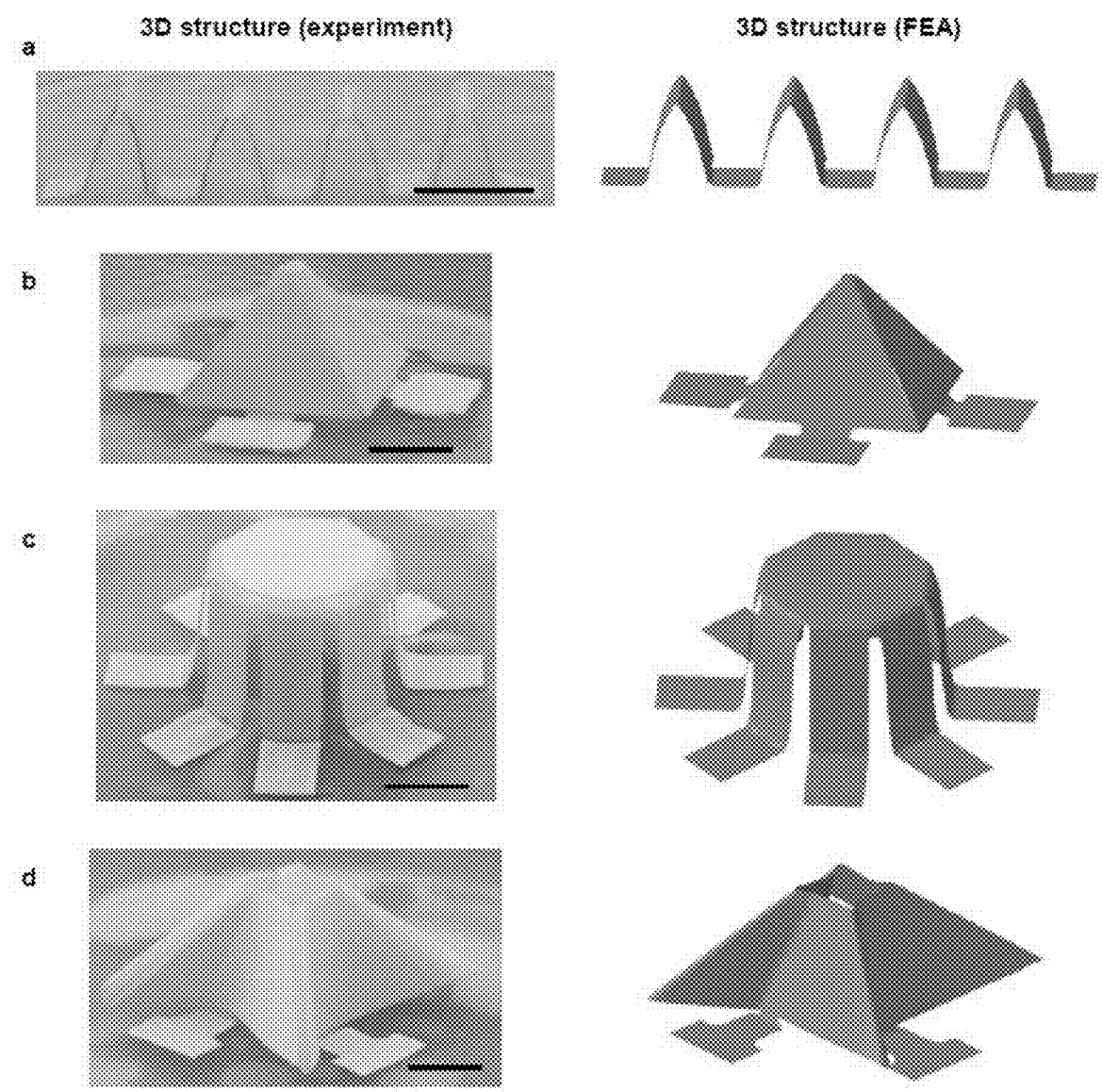
FIG. 62: (a)-(d) show a comparison between experimental images and FEA predictions for four 3D origami structures made of plastic films. Scale bars, 20 mm.
Figure 63:
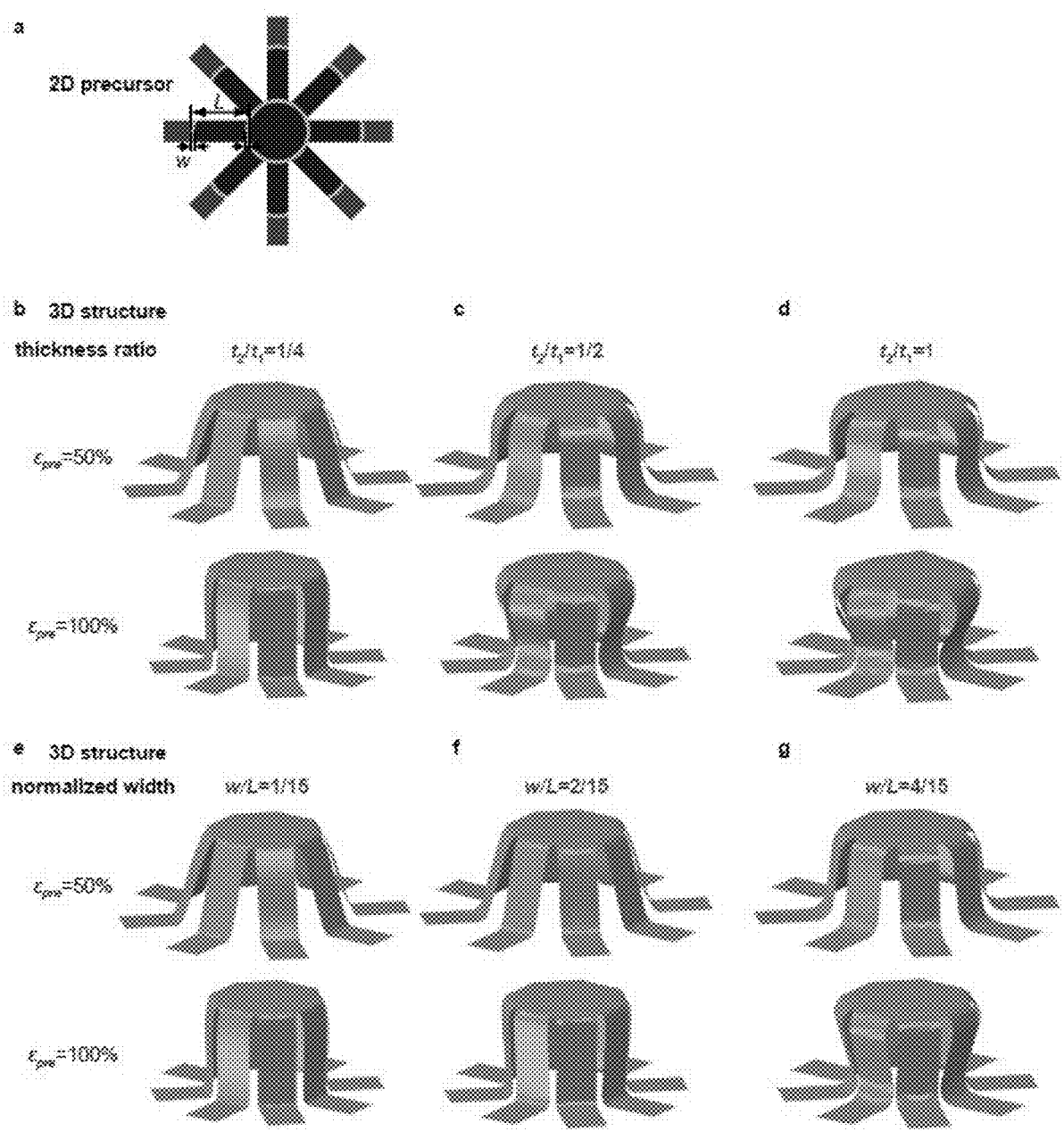
FIG. 63: Effect of geometric parameters on the shape of 3D structures. (a) 2D precursor for a 3D cylindrical shell, where w denotes the width of creases; L denotes the minimum distance between bonding pad and the central circle; and $t_1$ and $t_2$ denote the thickness of blue and gray regions, respectively. (b-d) FEA results of 3D structures formed with two different levels of prestrain, for three different thickness ratios ($t_2/t_1 = 1/4$, $1/2$, and 1). (e-g) FEA results of 3D structures formed with two different levels of prestrain, for three different normalized widths (w/L=$1/15$, $2/15$, and $4/15$).

This basic strategy in thickness engineering affords great versatility in the design of mechanical buckling approaches to 3D structures. FIG. 57(e)-(h) presents examples achieved with corresponding 2D precursors formed using a photodefinable epoxy (SU8; 2 μm in thickness at the creases, and 6 μm in thickness at the other region; FIG. 57(e), (f), or with thin silicon (200 nm in thickness; FIGS. 57(g), (h)) on top of the thick region. The left top frame of FIG. 57(e) presents an example that includes six unit cells of large rectangles with creases (gray) located at the center and two ends. The periodically distributed small rectangles (red) adhere strongly to a uniaxially prestrained elastomeric substrate through covalent chemical bonding, while all other regions of the 2D precursors release from the substrate via elimination of a sacrificial interface layer (see Methods for details). Relaxing the prestrain provides compressive forces that trigger out-of-plane buckling to thereby induce folding deformation at the creases. The final configuration corresponds to that of triangular columns, as shown by the results (FIG. 57(e), the right two frames) of FEA and the scanning electron micrograph (SEM). The color denotes the magnitudes of maximum principal strains that localize at the creases. The peak values remain below the fracture thresholds of the epoxy. FIG. 57(f) shows an example in which four triangular structures connect at the center with creases. Here, the assembly forms a pyramidal mesostructure, in which a carefully selected level of biaxial prestrain (in the substrate) yields a closed 3D topology. Many other configurations are possible with this scheme, including geometries that resemble a cylindrical shell (FIG. 57(g)) and a windmill (FIG. 57(h)). The latter case has a well-defined chirality, set by the configuration of creases. SEM images and corresponding FEA of these 3D mesostructures viewed from different angles appear in FIG. 61 (Supporting Information). The physical nature of the assembly process allows its application across a broad range of material types and length scales. For example, all of the origami inspired mesostructures in FIG. 57(e)-(h) can be reproduced using millimeter-scale plastic models, as shown by the optical images in FIG. 62 (Supporting Information). The design guidelines associated with crease geometries gleaned from the analyses of straight ribbon geometries (FIG. 57(a)-(d)) also apply to cases of bidirectional folding, in that narrow regions with small thickness ratios ($t_2/t_1<1/3$) lead to creases (FIG. 63, Supporting Information). In all of the geometries examined herein, experimental results are in excellent agreement with FEA predictions, thereby establishing the computational approaches as reliable tools for rapid design optimization.

Figure 58:
FIG. 58: Experimental and computational studies of various origami structures. (a) 2D precursors, FEA predictions and SEM images for three mesostructures formed with uniaxial prestrain in the substrate. (b) and (c) 2D precursors, FEA predictions and experimental (SEM or optical) images for twelve structures formed with biaxial prestrain in the substrate. Roof I in (b) is made of polymer (SU8). Box and semi-ellipsoid in (b) are made of bilayers of silicon and polymer (SU8). The last five structures in (c) are made of thin plastic films (~75 μm in thickness for the creases, and ~300 μm in thickness for the thickening areas). All other structures are made of bilayer of metal (Au) and polymer (SU8). The scale bars of SEM and optical images are 200 μm and 20 mm, respectively.
Figure 64:
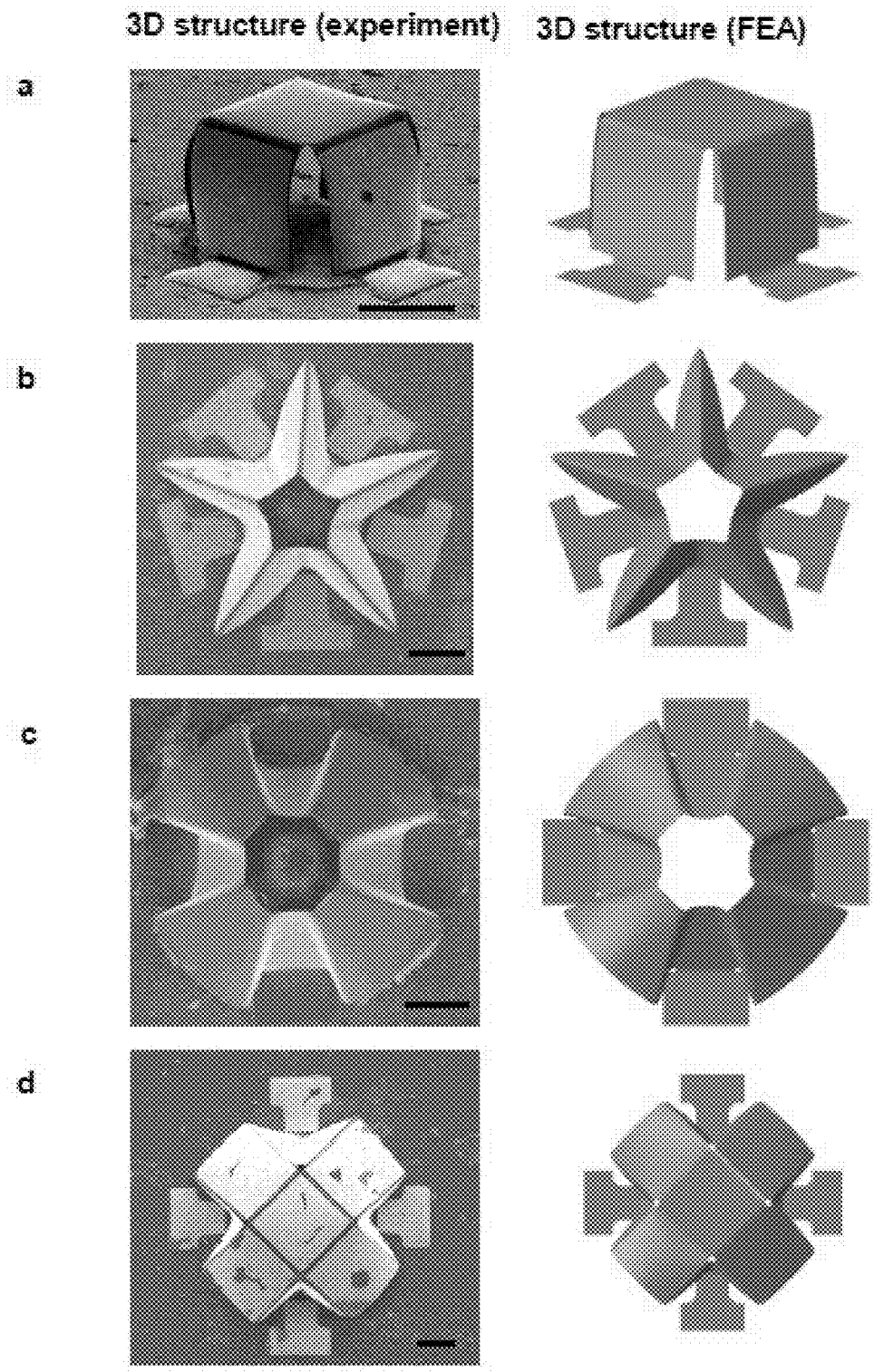
FIG. 64: (a)-(d) show a comparison between experimental images and FEA predictions for 3D origami structures in FIG. 58(b) (Box, Starfish and Roof I), and FIG. 58(c) (Altar), with view angles that differ from those in FIGS. 58(b) and (c). Scale bars, 200 µm.

A diverse range of basic origami inspired geometries, each identified with a descriptive name, can be realized with these approaches, as summarized in FIG. 58. Representative examples formed through uniaxial compression appear in FIG. 58(a), including geometries that resemble half cylindrical columns, fish scales, and columns with mixed cross-sectional shapes of triangles and rectangles. Origami mesostructures with more complex geometries can be realized using biaxial prestrain in the substrate, as demonstrated in FIG. 59(b), (c), and FIG. 64 (Supporting Information).

Figure 65:
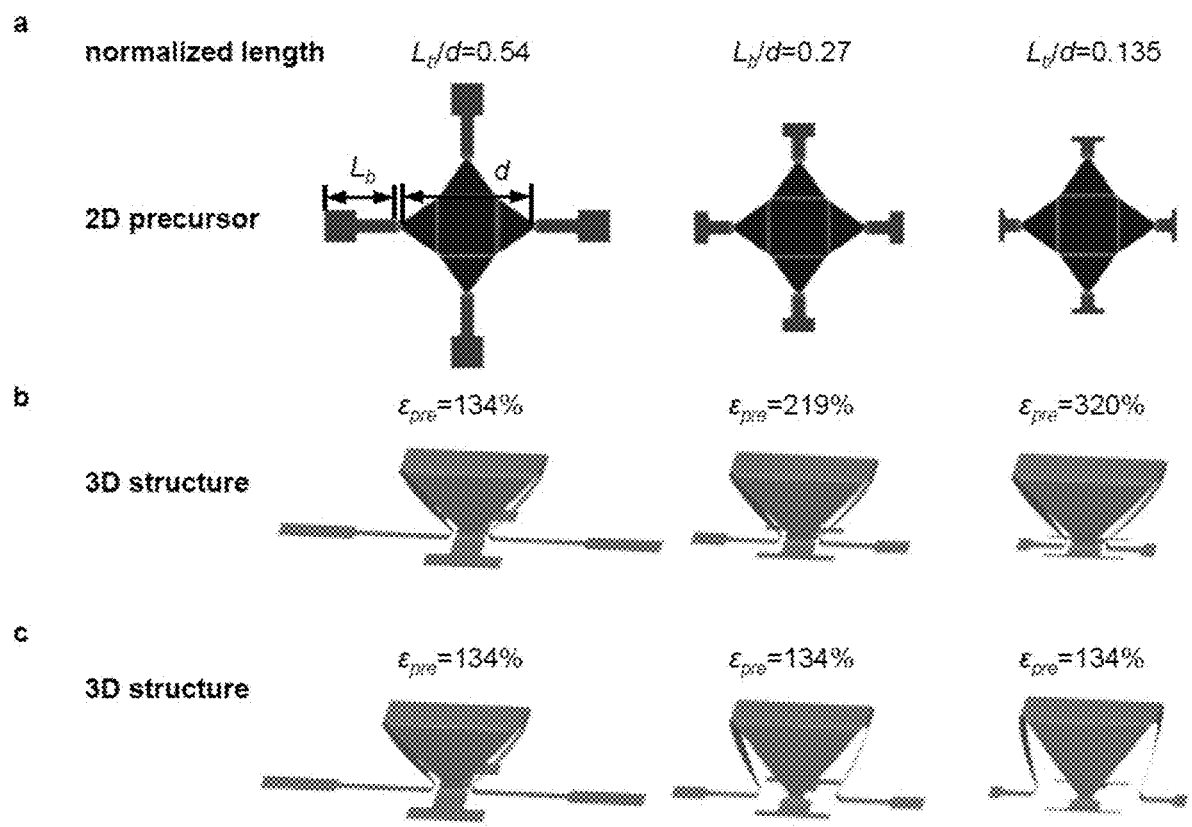
FIG. 65: Effect of the size of bonding pad on the shape of 3D structures. (a) 2D precursors for a 3D inverse pyramidal structure, with the bonding pads in three different normalized lengths, i.e., $L_b/d$=0.54, 0.27 and 0.135. (b) FEA results of 3D structures that show similar configurations, but under different prestrains (134%, 219% and 320%). (c) FEA results of 3D structures under the same prestrain of 134%.
Figure 66:
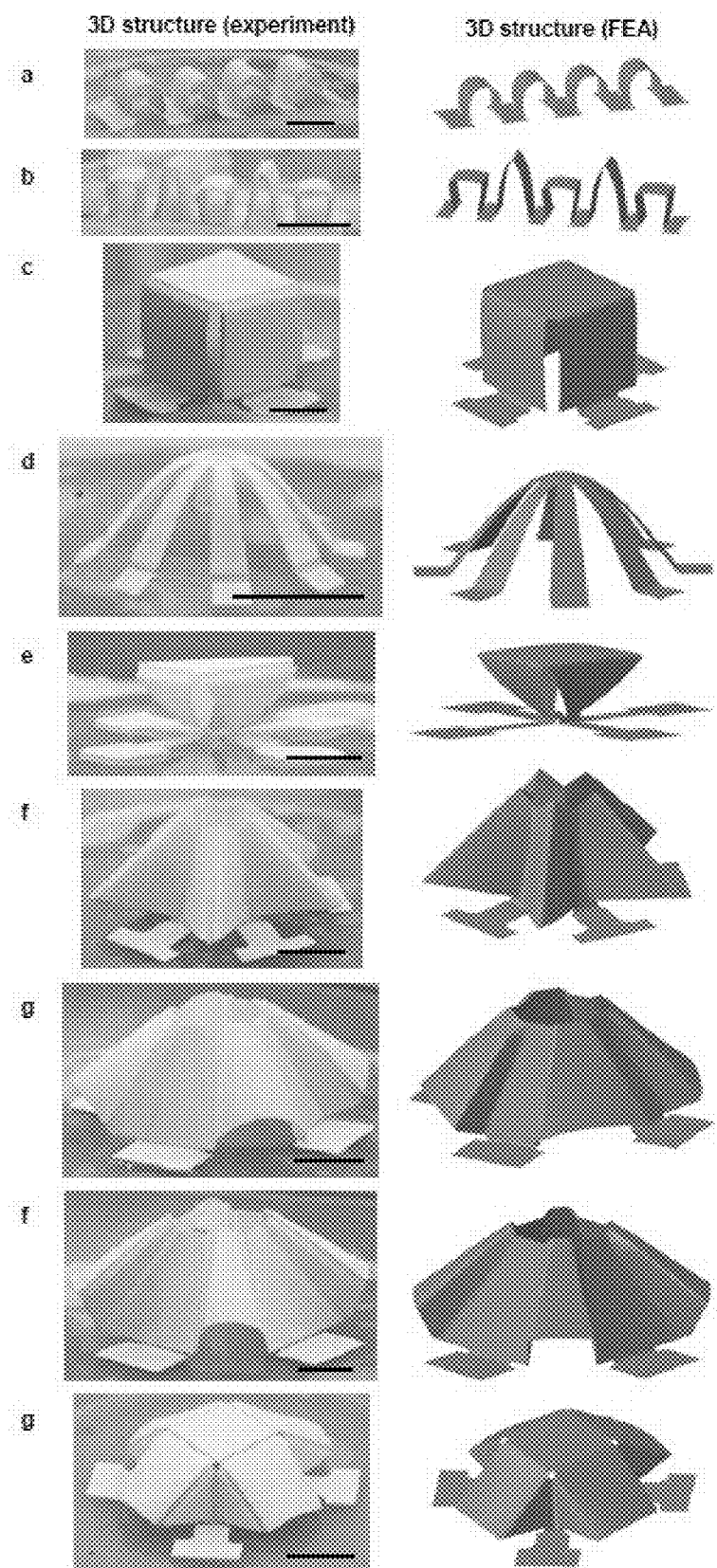
FIG. 66: (a)-(g) show a comparison between experimental images of plastic models and FEA predictions for 3D structures shown in FIG. 58. Scale bars, 20 mm.

These shapes range from semi-ellipsoids and starfish, to polyhedral topologies (e.g., cube, inverse pyramid, football, etc.), to those ('closed fan' and 'skew tooth') formed through creases organized circumferentially in an annulus. In addition to the 2D layout of the precursor materials and the locations of the bonding, the patterns of creases provide additional means to control the final 3D geometries. With the same 2D precursor (e.g., an octagonal shape bonded at the centers of four edges), different distributions of creases yield distinct 3D configurations (e.g., 'Roof I' and 'Roof II' in FIG. 58($b$)). During the assembly process, the bonding locations undergo negligible deformations, such that the compressive strains are accommodated by other regions. As a result, for some of the origami structures (e.g., inverse pyramid and 'Asparagus pea') examined herein, large bonding locations are required to form the desired configurations with levels of biaxial prestrain that can be reproducibly achieved in the silicone materials used for the substrates, e.g., $\varepsilon_{pre}$<200%. With the inverse pyramid as an example, a moderate level (~134%) of prestrain yields the structure in FIG. 58($b$). With reduced dimensions (¼ length of the original design) for the bonding locations, a substantially increased strain magnitude (~320%) is necessary to yield the same 3D configuration (FIG. 65, Supporting Information). All of the origami structures formed at microscale can also be constructed at millimeter (or larger) scale (FIG. 66, Supporting Information) with plastic films. Furthermore, the assembly process is fully reversible in nearly all cases because the process does not involve plastic deformation.

Figure 59:
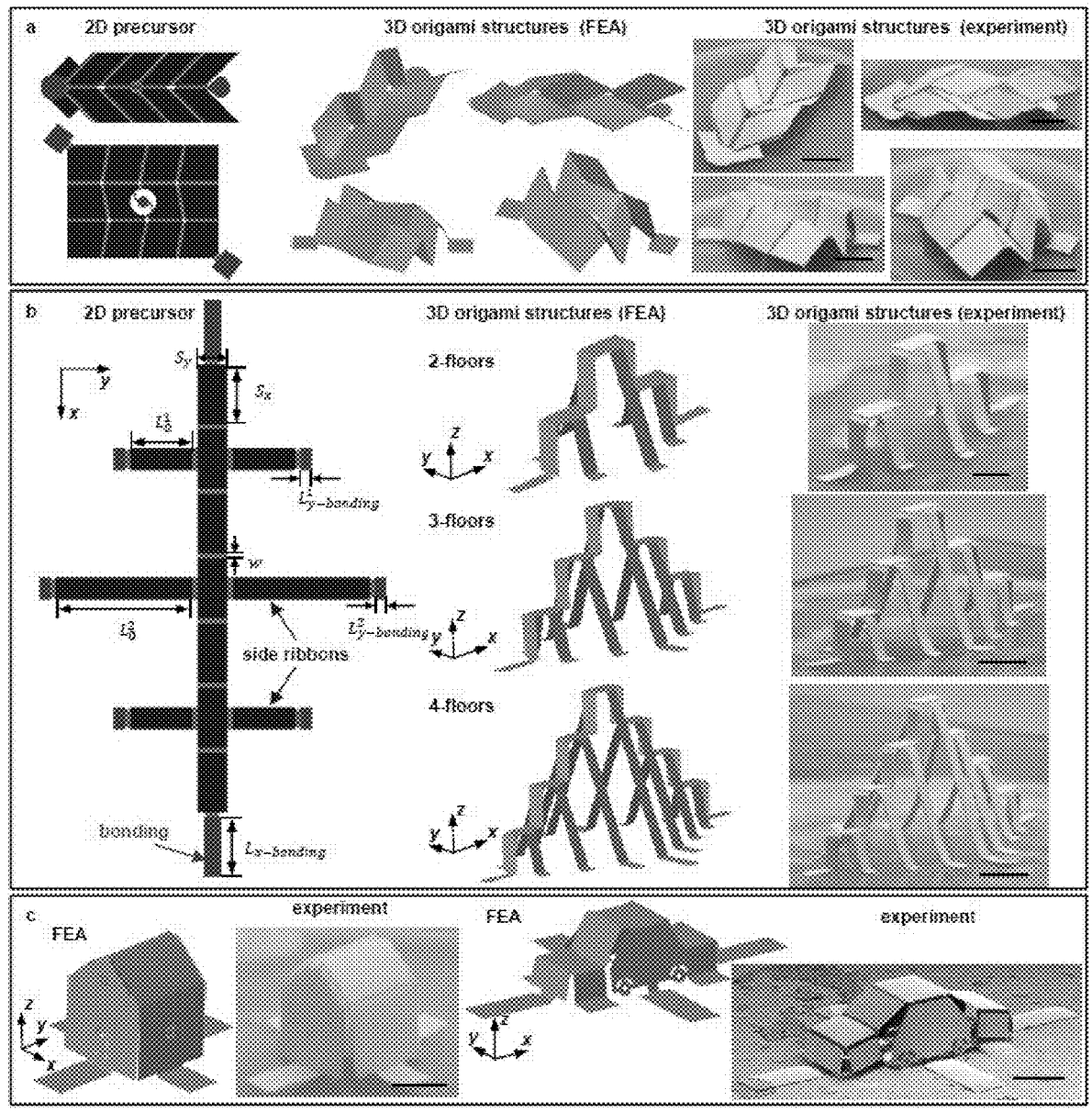
FIG. 59: 3D structures formed through multiple, hierarchical forms of folding. (a) 2D precursors, FEA predictions and optical images for two structures involving Muri-origami. (b) Schematic illustration of a representative 2D precursor for a two-floors building, FEA predictions and optical images of stepwise structures with two to four floors. (c) FEA predictions and experimental images for two origami structures (left frame, made of plastic; right frame, made of bilayer of Au and SU8) that resemble a house and a car. The scale bars of SEM and optical images are 200 μm and 20 mm, respectively.
Figure 68:
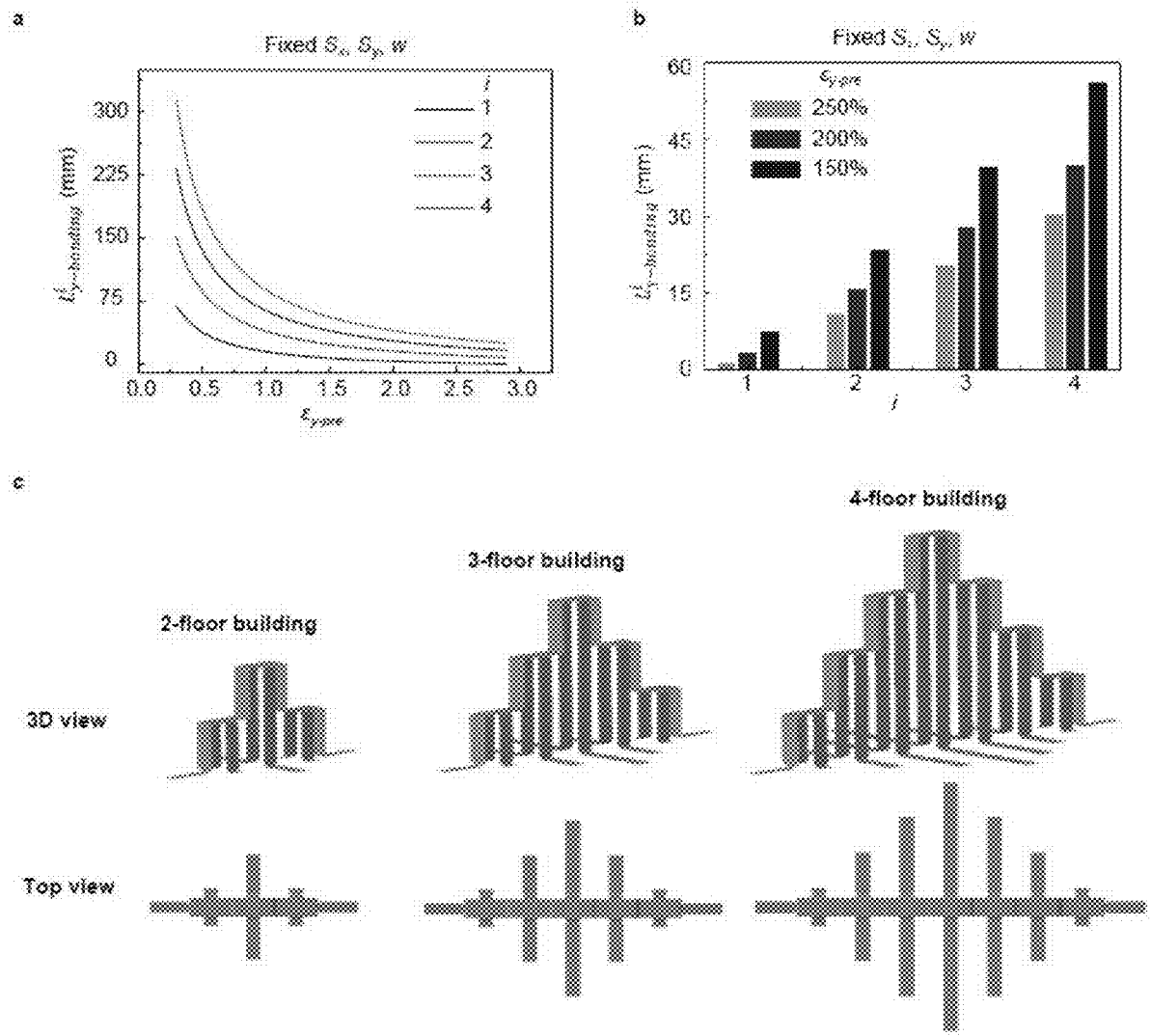
FIG. 68: (a)-(c) provide theoretical analyses and FEA calculations of stepwise 3D structures with upright side ribbons (with $\theta_i$=90°, i=1 ... n). (a) The y-directional length ($L_{y\text{-}bonding}^i$) of side bonding pads versus the y-directional prestrain component, for fixed $S_x$=11 mm, $S_y$=5.5 mm, and w=0.94 mm. (b) Bar graph of $L_{y\text{-}bonding}^i$ versus the floor number for the 3D structures with fixed $S_x$=11 mm, $S_y$=5.5 mm, and w=0.94 mm, under three different levels of prestrain. (c) FEA results of the 3D configurations formed with 250% prestrain, where the side ribbons are perpendicular to the xy plane.
Figure 69:
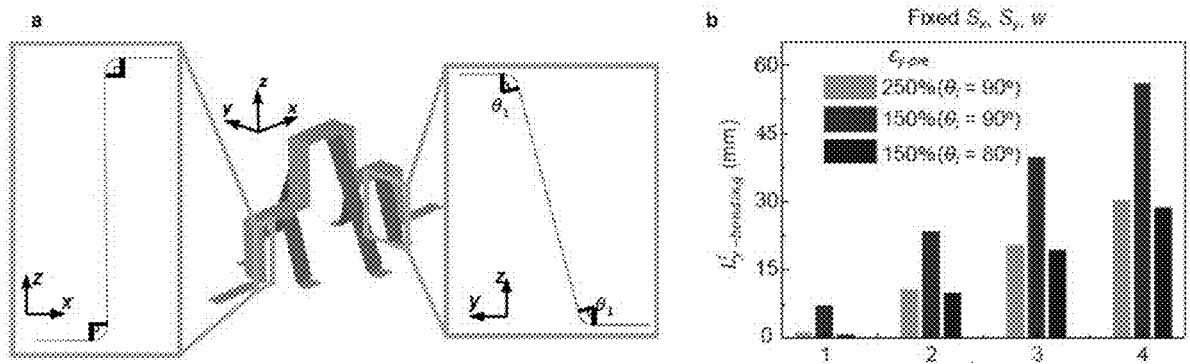
FIG. 69: (a) Schematic of a two-floors building at the final state of assembly and the definition of tilted angle ($\theta_i$, i=1 ... n). (b) Bar graph of $L_{y\text{-}bonding}^i$ versus the floor number for the 3D structures with fixed $S_x$=11 mm, $S_y$=5.5 mm, and w=0.94 mm, under three different levels of prestrain. In (b), the bars of orange and purple colors correspond to tilted angles of $\theta_i$=90°, i=1 ... n, and the bars of blue color correspond to tilted angles of $\theta_i$=80°, i=1 ... n.

Multiple, hierarchical forms of folding are also possible with appropriate choices in design. Two examples of the well-known Muri-origami construct appear in FIG. 59($a$), each of which use three bonding locations to impart the compressive forces. In the first design (FIG. 59($a$), top), the bonding locations lie at the intersection of differently oriented creases, such that creases originally along horizontal direction (in the 2D state) form a wavy configuration during assembly. In the second design (FIG. 59($a$), bottom), the bonding locations distribute along the diagonal direction of the 2D precursor, such that the assembly tends to shrink the structure into a smaller (and thicker) structure. Examples of origami structures that have multilevel constructions in the out-of-plane direction appear in FIG. 59($b$). Note that folding of creases can occur in two different directions, based on energetic considerations, for cases of multi-floor designs. This equivalence can be avoided by including supporting beams (e.g., the side ribbons in the left panel of FIG. 59($b$)) with optimized lengths to control the folding directions, thereby leading to consistent, desired multi-floor structures. FIG. 59($b$) (left) shows an example of a 2D precursor that transforms into a two-floor building. Here, the x-directional ribbon consists of seven identical segments ($S_x$ by $S_y$) connected with creases (w in width). Adhesion to the elastomeric substrate occurs at two rectangular regions (red; $L_{x-bonding}$ in the x-directional length). Three pairs of side ribbons with lengths of $L_0^1$ or $L_0^2$ connect the vertical ribbon with the bonding locations $L_{y-bonding}^1$ or $L_{y-bonding}^2$ in the y-directional length), to assist in the formation of the multi-floor design. To form a stepwise geometry in which each segment of the vertical ribbon orients perpendicular to the neighboring segments in the 3D shape, mechanics models (See Supporting Information for details) that correlate the required prestrain values ($\varepsilon_{x-pre}$ and $\varepsilon_{y-pre}$) to various geometric parameters ($S_x$, $S_y$, w, $L_0^1$, $L_0^2$, $L_{y-bonding}^1$, $L_{y-bonding}^2$ and $L_{x-bonding}$) and acute angles ($\theta_1$ and $\theta_2$) between the side ribbons and the y axis in the final geometry are useful. FIG. 59($b$) (upper middle and upper right) provides an example of a two-floor building formed with a non-equal biaxial prestrain ($\varepsilon_{x-pre}$=98%, $\varepsilon_{y-pre}$=110%), which exhibits a clear stepwise configuration along the x axis, with tilt angles of $\theta_1$=75° and $\theta_2$=68° for the side ribbons. Such designs can be, in principle, extended to origami structures with arbitrary numbers of floors (See Supporting Information for details). Two stepwise structures constructed demonstrated in FIG. 59($b$) and FIG. 67 (Supporting Information) have three and four floors, respectively, with tilt angles of $\theta_1$=75° and $\theta_2$=$\theta_3$=$\theta_4$=68°, for the side ribbons. For origami structures with multiple (e.g., n>3) floors, theoretical analyses (FIGS. 68 and 69, Supporting Information) highlight challenges in realizing upright side ribbons (with $\theta_1$=90°, i=1 . . . n) experimentally, due to the practical difficulties in achieving, simultaneously, large bonding sizes ($L_{y-bonding}^i$, i=1 . . . n) and large prestrains ($\varepsilon_{y-pre}$).

Figure 70:
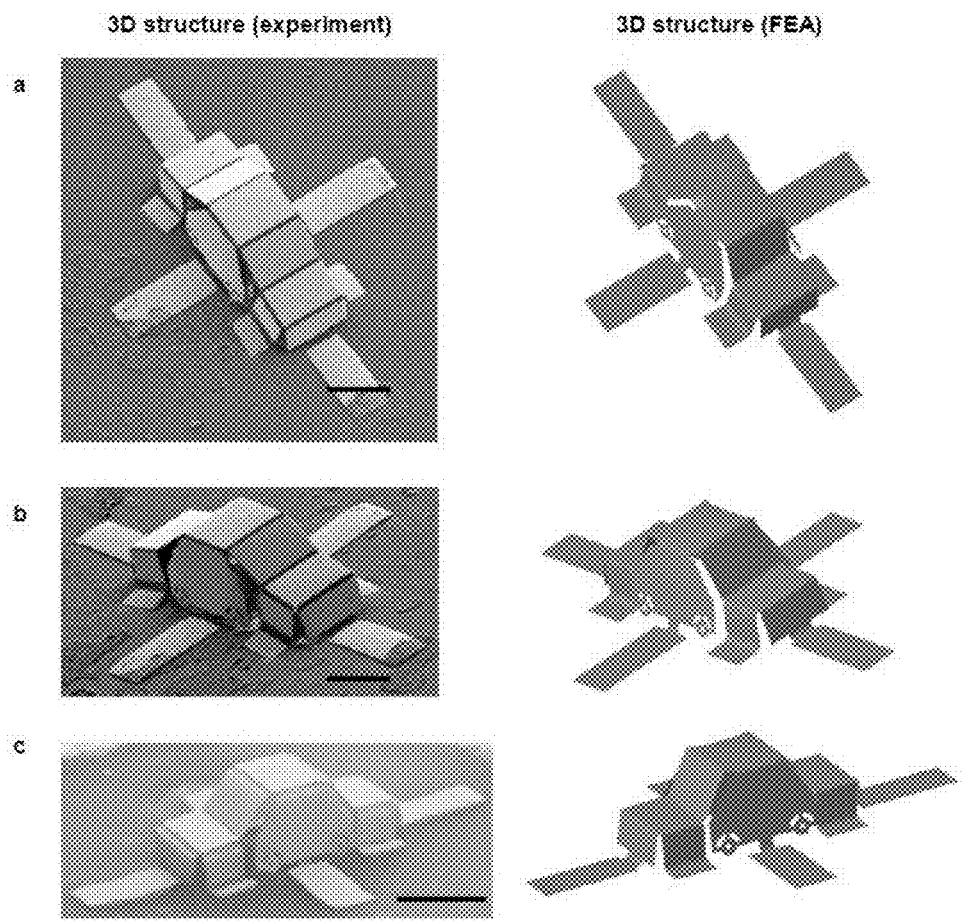
FIG. 70: (a) and (b) Experimental images and FEA predictions for a mesoscale car structure (scale bars, 200 µm), with two different viewing angles. (c) Experimental images and FEA predictions for a millimeter scale car structure (scale bar, 20 mm).
Figure 71:
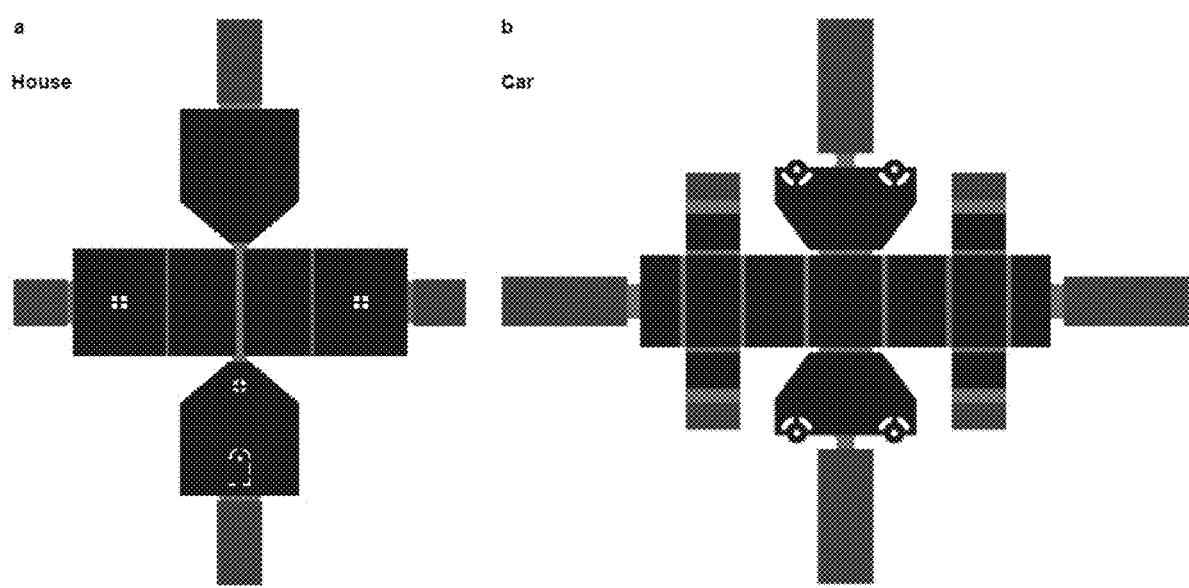
FIG. 71: (a) and (b) show 2D precursors for the house and car structures in FIG. 59(c), where the bonding sites are highlighted in red and creases are highlighted in gray.

A further extension of these design concepts in multilevel origami allows the assembly of complex recognizable 3D objects under compressive buckling. FIG. 59($c$) and FIG. 70 (Supporting Information) illustrate two structures that resemble a house and a car, respectively, achieved with tailored values of prestrain ($\Sigma_{x-pre}$=119% and $\varepsilon_{y-pre}$=138% for the house; $\varepsilon_{x-pre}$=33% and $\varepsilon_{y-pre}$=53% for the car). The 2D precursors of these two designs appear in FIG. 71 (Supporting Information). For complex origami geometries that involve hierarchical forms of folding, experimental results both in millimeter and micro-scales agree very well with FEA predictions.

Figure 60:
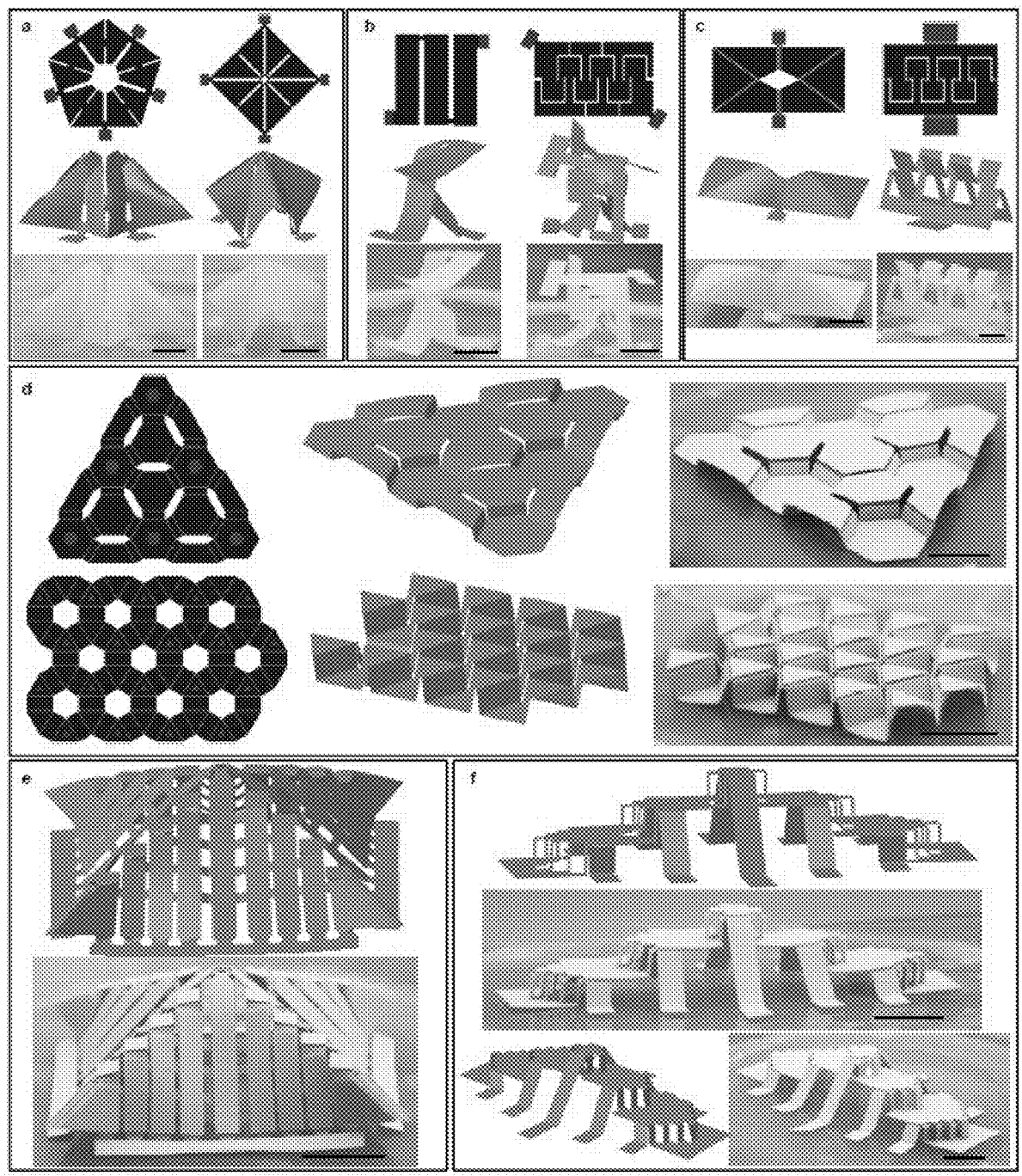
FIG. 60: 3D structures inspired from origami and Kirigami concepts, through use of creases and/or cuts. (a) 2D precursors, FEA predictions and optical images for two folding structures, transformed from Kirigami designs with uniform thicknesses. (b) Similar results for two structures that involve not only folding but also twisting, also transformed from Kirigami designs with uniform thicknesses. (c) and (d) Similar results for four origami structures, transformed from designs with combined uses of cuts and creases (through non-uniform thicknesses). (e) and (f) Two highly complex 3D structures: a 'Ziggurat' architecture, and a three-floors building with textured steps. Scale bars, 20 mm.
Figure 72:
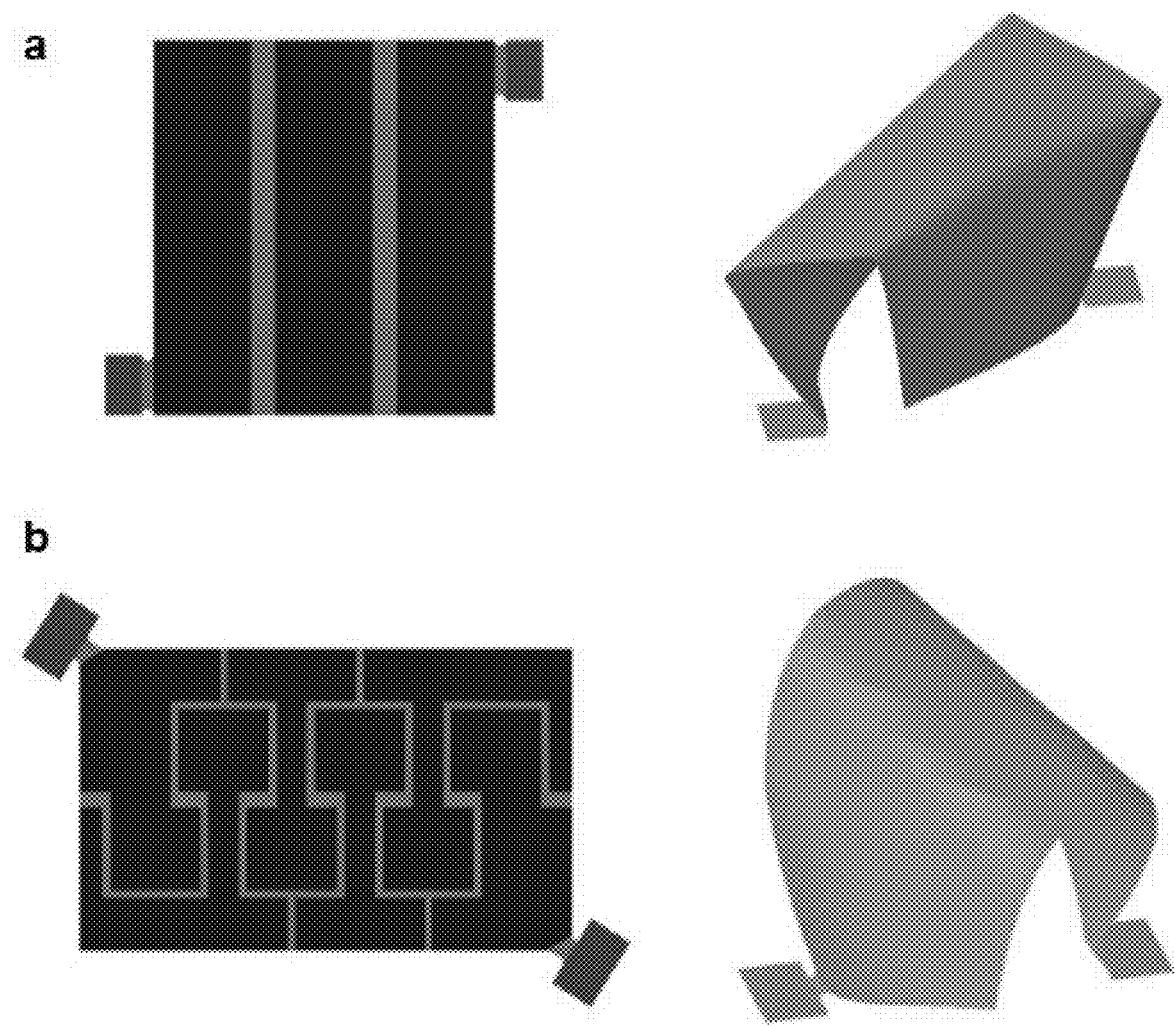
FIG. 72: (a) and (b) show 2D precursors and FEA results of two 3D structures formed with reduced thickness at the gray region of 2D precursors. The final 3D configurations are distinct from that in FIG. 60(b) (formed with cuts).
Figure 73:
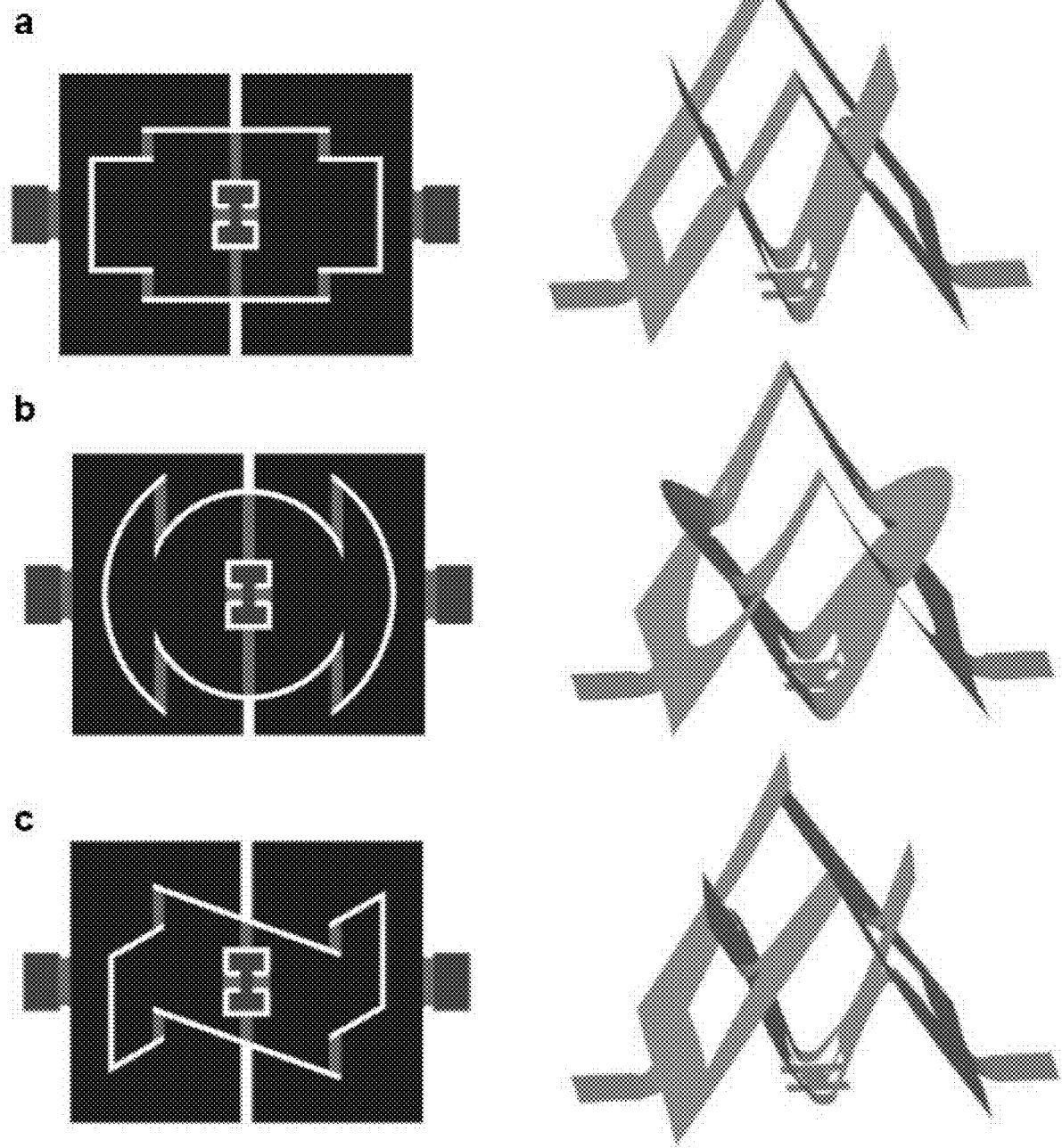
FIG. 73: (a)-(c) show 2D precursors and FEA results of three origami structures with both cuts and creases in the design.
Figure 74:
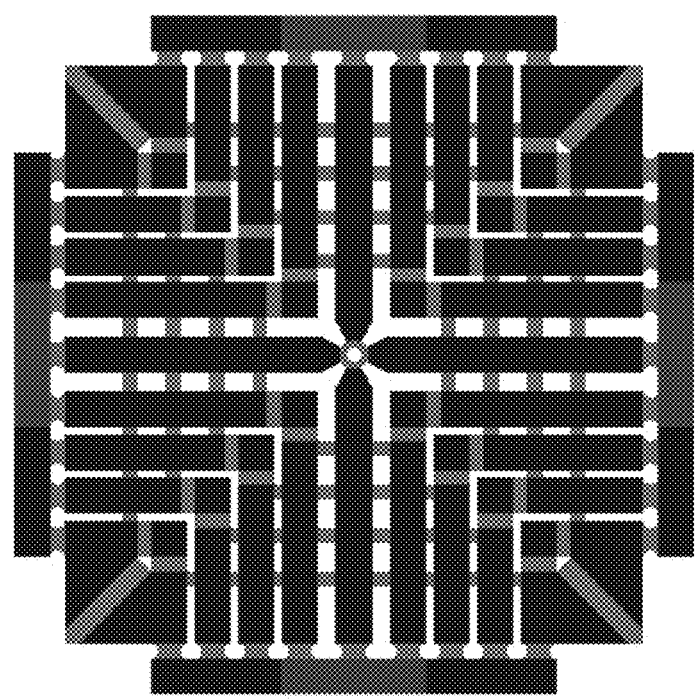
FIG. 74: 2D precursor of the 3D 'Ziggurat' architecture in FIG. 60(e), where the bonding sites are highlighted in red and creases are highlighted in gray.
Figure 75:
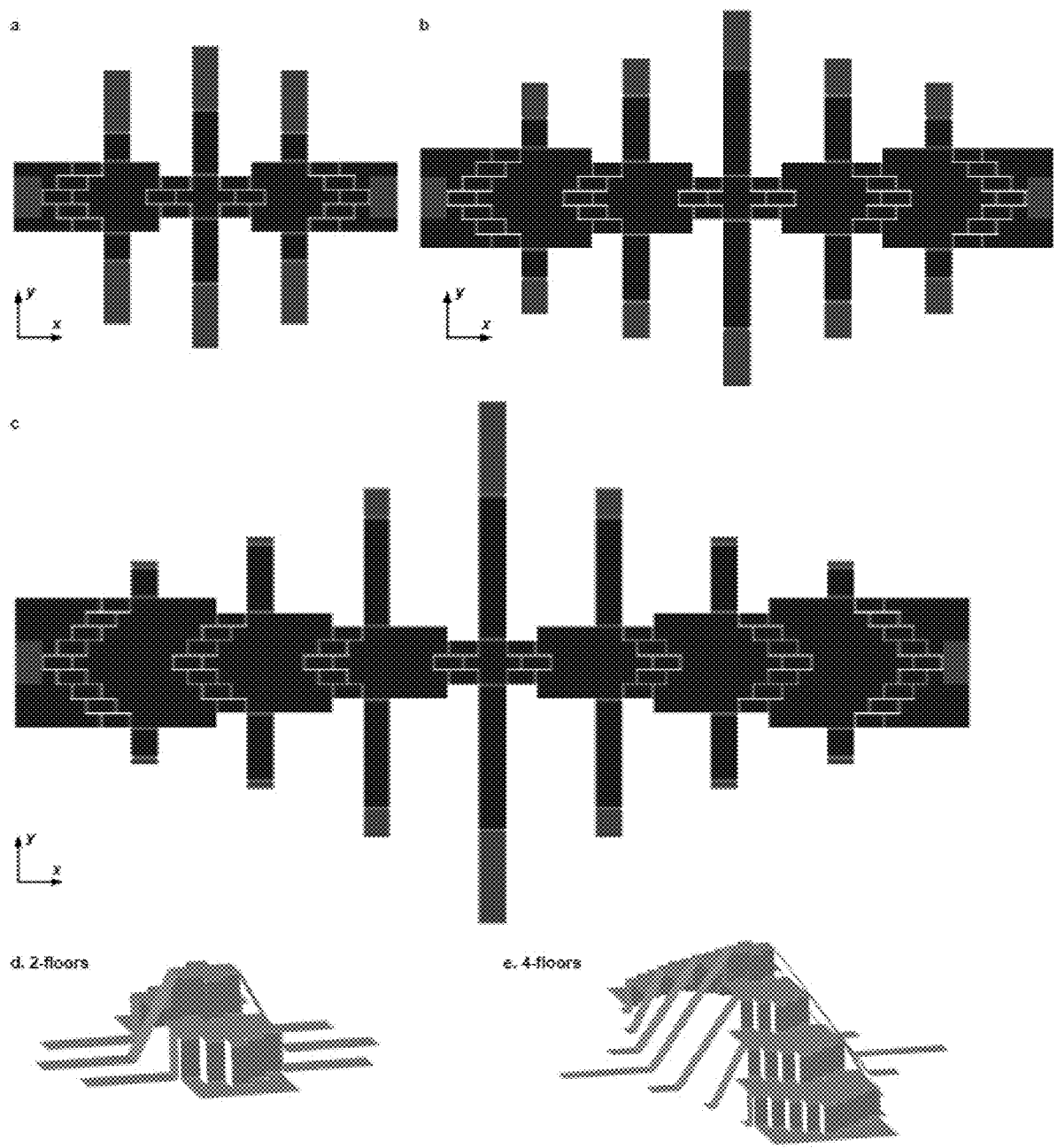
FIG. 75: (a)-(c) 2D precursors for the multilevel buildings with 2 to 4 floors, where the bonding sites are highlighted in red and creases are highlighted in gray. (d) and (e) FEA results of the 3D origami structures with two and four floors and textured steps.

Concepts inspired by Kirigami involve the addition of patterns of cuts to expand the accessible range of 3D structures. The concepts described previously are readily compatible with such approaches[31]. FIG. 60($a$), ($b$) illustrates that cuts can play similar, but different, roles in the process compared to controlled variations in thickness. For example, patterns of cuts placed at appropriate locations, like those shown in FIG. 60($a$) (top), induce folding deformations at the corresponding locations to yield origami structures that are very close to the 'starfish' in FIG. 58($b$) and 'Asparagus pea' in FIG. 58($c$). Such equivalence originates from the same effects of decreased bending stiffness at targeted regions through reduction of their width or thickness. Separately, the removal of material by introduction of cuts additionally reduces the effects of stress concentrations [31] and allows enhanced levels of flexibility in deformation (e.g., the twisting mode in FIG. 60($b$)), which are unobtainable through reductions in thickness (FIG. 72, Supporting Information). FIG. 60($c$)-($f$) and FIG. 73 (Supporting Information) demonstrate that combinations of designs increases and cuts enlarge substantially the accessible range of 3D topologies. The first structure of FIG. 60($c$) (left) corresponds to a closed 3D polyhedron that eliminates the diamond hole through contraction of surrounding surfaces. To its right is an origami structure that resembles a fence, formed mainly through rotation of two main components connected with short creases at the central region. FIG. 60($d$) presents two examples of lattice Kirigami[11, 12] implemented through the buckling guided approach. Here, bonding locations periodically distributed in a triangular lattice pattern transfer the compressive forces to the 2D precursors, deforming them into a hexagonal array of hexagonal prisms or triangular array of triangular prisms. More complex integration of crease and cut patterns appear in FIG. 74 (Supporting Information), which forms a 'Ziggurat' architecture (FIG. 60($e$)) by means of compressive buckling. FIG. 60($f$) corresponds to a variant of the three-floor building in FIG. 59($b$), in which well-arranged cuts and creases form textured steps connecting the adjacent planes (parallel with the substrate surface). Such designs can be also extended to the assembly of configurations with a different number of floors, as illustrated in FIG. 75 (Supporting Information).

In summary, this example introduces an approach that exploits controlled mechanical buckling for autonomic assembly of 3D structures across a wide range of length scales and material types, using a combination of origami inspired ideas, theoretical modeling methods and experimental techniques. These design concepts, combined with advanced microfabrication processes provide immediate access to 3D micro/nanoarchitectures with a broad range of topologies in materials that include those that form the basis of advanced microsystems technologies in electronics, photonics, sensors and microelectromechanical systems. The elastic nature of the assembly process allows continuous and reversible control of the configurations, thereby providing an additional option in tuning the behaviors of functional devices formed in this manner. The resulting engineering options have important implications for building future generations of microsystem technologies.

Experimental Section

Figure 76:
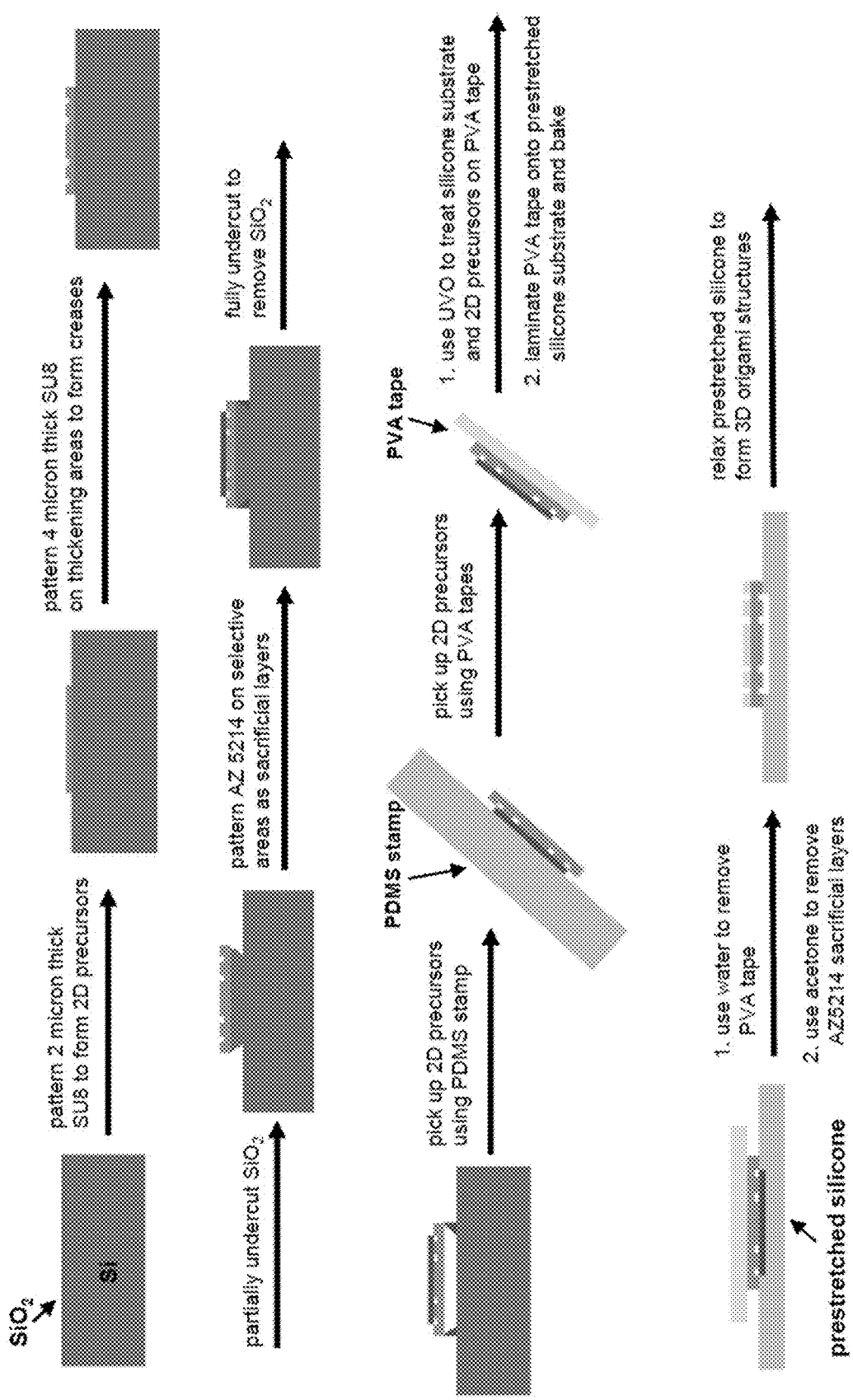
FIG. 76: Schematic illustration of steps for fabricating 3D origami polymer (SU8) structures.

Preparation of origami mesostructures in polymer began with thermal oxidation to form a layer of silicon dioxide ($SiO_2$, 500 nm in thickness) on a silicon wafer. Next, spin casting and photolithography formed patterns of photodefinable epoxy (SU8, 2 μm in thickness) on the $SiO_2$. Spin-casting and photolithography with a second layer of SU8 (4 μm in thickness) yielded 2D precursors with strategically designed variations in thickness (i.e. 2 or 6 μm). Immersion in hydrofluoric acid (HF) removed the buried $SiO_2$ layer from the exposed regions and also slightly from under the edges of the SU8. Spin casting and photolithography created patterns of photoresist (AZ 5214, 1.6 μm in thickness) on top of the SU8 layers to define the bonding sites. Immersion in HF eliminated the remaining $SiO_2$ by complete undercut etching. The techniques of transfer printing enabled retrieval of the 2D precursors and their delivery to a piece of water soluble tape (polyvinyl alcohol, PVA). A thin sheet (~0.5 mm) of silicone elastomer (Dragon Skin, Smooth-On) served as the assembly platform, stretched to well-defined levels of prestrain (either uniaxial or biaxial) using a customized stage. Exposing the prestrained elastomer and the 2D precursors (on PVA) to UV-induced ozone (UVO) yielded hydroxyl termination on their exposed surfaces. Laminating the tape onto the elastomer substrate with the exposed SU8 side down, followed by baking in an oven at 70° C. for 10 min yielded strong covalent bonds between the elastomer substrate and the exposed regions of 2D precursors. Washing with hot water and then acetone dissolved the PVA tape and the photoresist. Slowly releasing the prestrain completed the origami assembly process. A schematic illustration of steps appears in FIG. 76.

Figure 77:
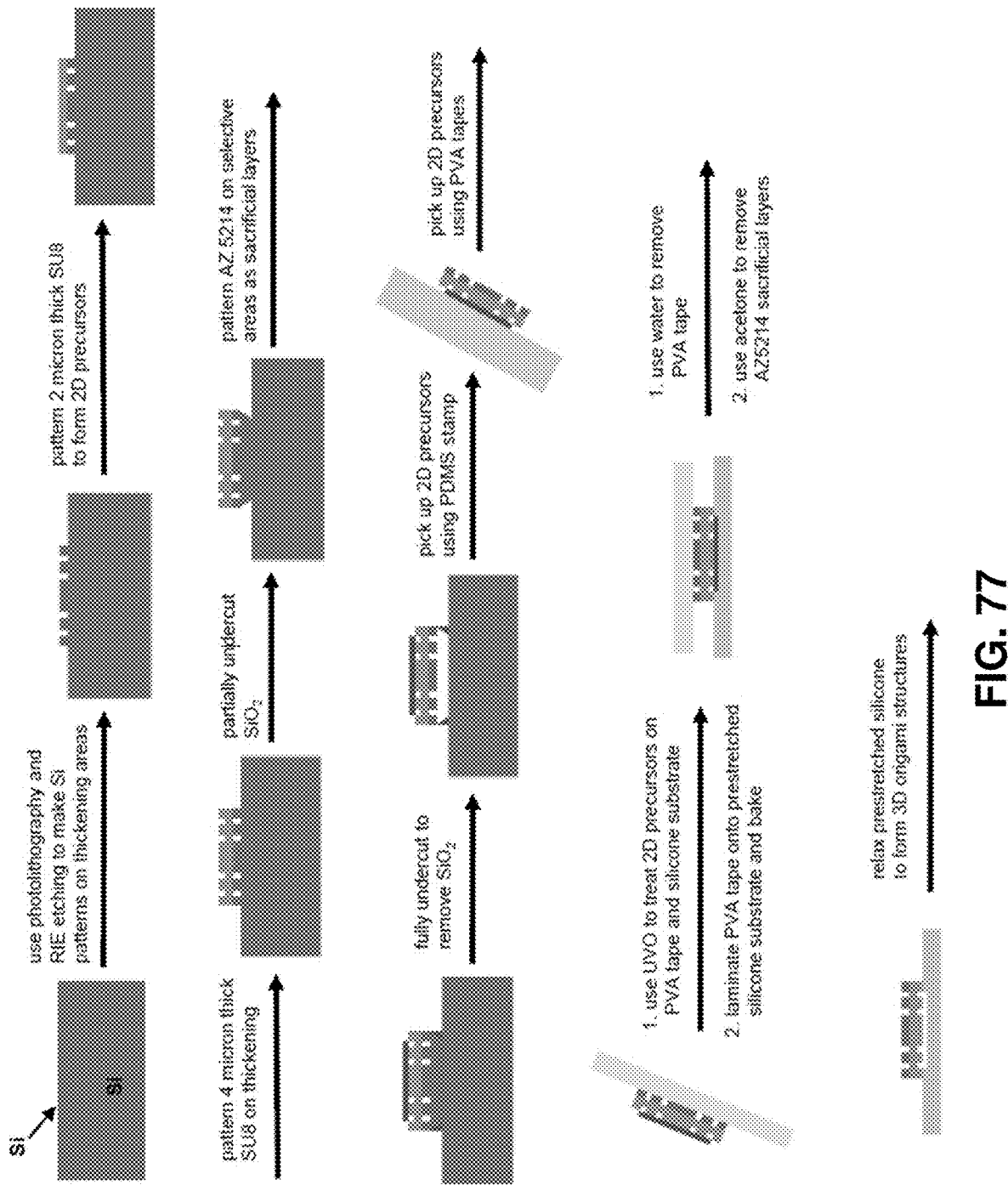
FIG. 77: illustration of steps for fabricating 3D origami structures of bilayers of Si NMs and polymer (SU8).

Preparation of mesostructures of bilayers of silicon and polymer (SU8) began with photolithographic patterning and reactive ion etching (RIE) of the top silicon layer (200 nm in thickness) to form silicon patterns on a silicon-on-insulator (SOI) wafer. Next, spin casting and photolithography defined the geometries of the first layer of SU8 (2 μm in thickness) on the silicon patterns. Spin casting and photolithography of a second layer of SU8 (4 μm in thickness) in a matching geometry with silicon patterns yielded 2D origami precursors of silicon and SU8 bilayers. The remaining steps of photoresist patterning, HF undercutting, transfer printing and 3D assembly followed procedures described above. A schematic illustration of steps appears in FIG. 77.

Figure 78:
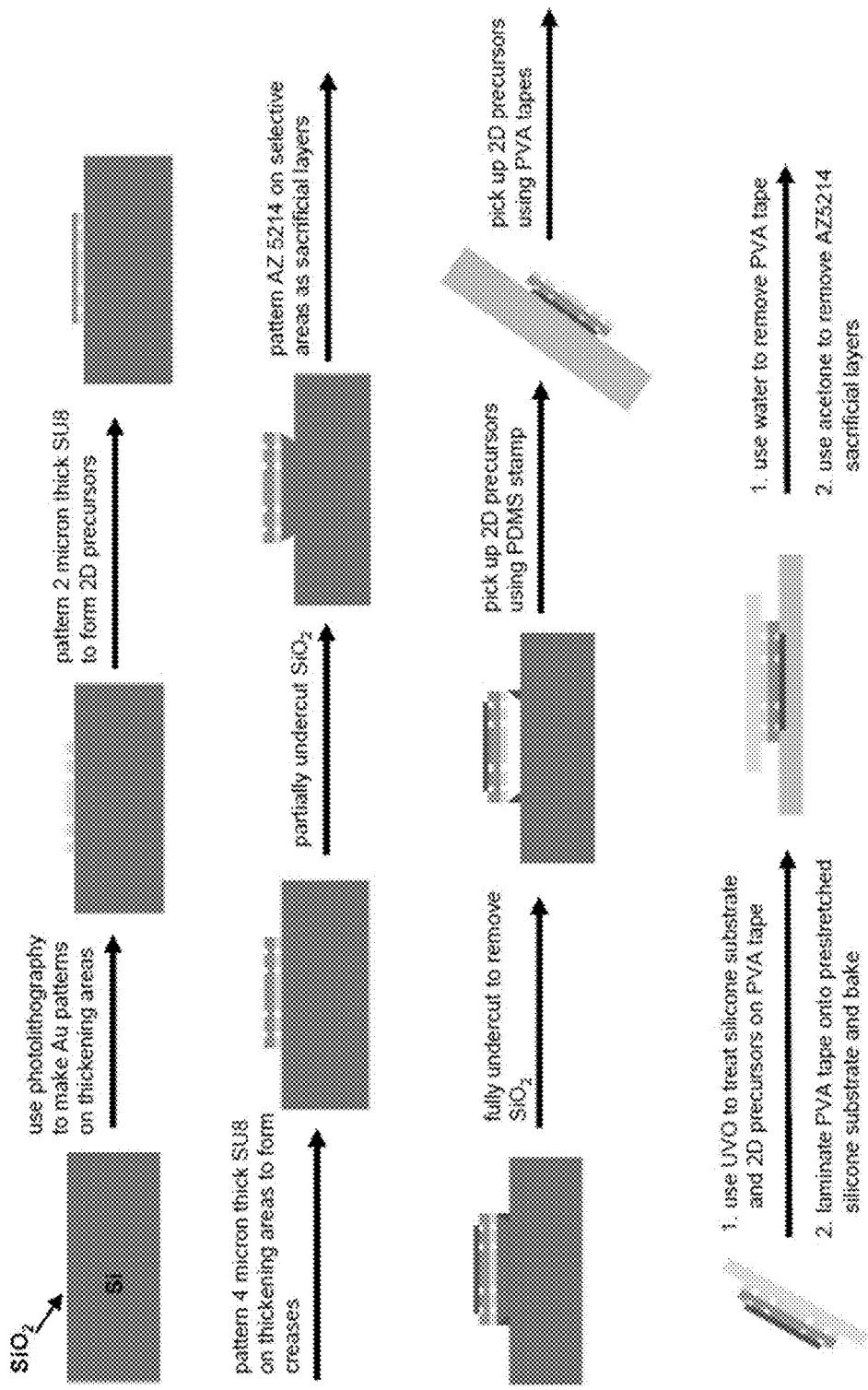
FIG. 78: Schematic illustration of steps for fabricating 3D origami structures of bilayers of metal (gold) and polymer (SU8).

Preparation of mesostructures of bilayers of metal (gold) and polymer (SU8) began with thermal oxidation to form a layer of $SiO_2$ (500 nm in thickness) on a silicon wafer. Next, photolithography, electron beam evaporation deposition and liftoff defined patterns of gold (50 nm in thickness) as 2D precursors on the $SiO_2$. Spin casting and photolithography defined the geometries of the first layer of SU8 (2 μm in thickness) on top of the gold. Spin casting and photolithography of a second layer of SU8 (4 μm in thickness) yielded 2D origami precursors of gold and SU8 bilayers. The remaining steps of photoresist patterning, HF undercutting, transfer printing and 3D assembly followed procedures described above. A schematic illustration of steps appears in FIG. 78.

Preparation of structures in plastic films began with mechanical cutting of a base layer (~75 μm in thickness) into desired patterns, followed by cutting of patterns to define the thick regions with additional layers of this same material. Most of the plastic structures used a thickness ratio of 1/4, except for the football (FIG. 58(c)), Muri-origami structures (FIG. 59(a)), multi-floors buildings (FIGS. 59(b) and 60(f)), lattice Kirigami structures (FIG. 60(d)), and 'Ziggurat' architecture (FIG. 60(e)), which used a thickness ratio of 1/8. Adhering additional layers of plastic films onto the base layer through thin, stick double-coated tape (9080A, 3M, Minnesota, USA) yielded 2D precursors for assembly using a prestrained silicone substrate. A highly viscous, organic adhesive, i.e., a RTV silicone rubber (706, NAN DA, Jiangsu, China), dispensed at desired locations on the 2D precursors resulted in strong bonding to the silicone substrate, after curing for ~2 hours at room temperature. Slowly releasing the prestrain in the substrate completed the assembly process.

REFERENCES

[1] R. J. Lang, Origami Design Secrets: Mathematical Methods for an Ancient Art, CRC Press, Natick, Mass., USA 2003.
[2] D. Bishop, F. Pardo, C. Bolle, R. Giles, V. Aksyuk, J. Low Temp. Phys. 2012, 169, 386.
[3] S. Felton, M. Tolley, E. Demaine, D. Rus, R. Wood, Science 2014, 345, 644.
[4] J. A. Fan, W.-H. Yeo, Y. Su, Y. Hattori, W. Lee, S.-Y. Jung, Y. Zhang, Z. Liu, H. Cheng, L. Falgout, M. Bajema, T. Coleman, D. Gregoire, R. J. Larsen, Y. Huang, J. A. Rogers, Nature Communications 2014, 5, 3266.
[5] Q. Cheng, Z. Song, T. Ma, B. B. Smith, R. Tang, H. Yu, H. Jiang, C. K. Chan, Nano Lett. 2013, 13, 4969.
[6] Z. Song, T. Ma, R. Tang, Q. Cheng, X. Wang, D. Krishnaraju, R. Panat, C. K. Chan, H. Yu, H. Jiang, Nat. Commun. 2014, 5, 3140.
[7] J. L. Silverberg, A. A. Evans, L. McLeod, R. C. Hayward, T. Hull, C. D. Santangelo, I. Cohen, Science 2014, 345, 647.
[8] Y. Ke, S. M. Douglas, M. Liu, J. Sharma, A. Cheng, A. Leung, Y. Liu, W. M. Shih, H. Yan, J. Am. Chem. Soc. 2009, 131, 15903.
[9] B. Sacca, C. M. Niemeyer, Angew. Chem.-Int. Edit. 2012, 51, 58.
[10] J. L. Silverberg, J.-H. Na, A. A. Evans, B. Liu, T. C. Hull, C. D. Santangelo, R. J. Lang, R. C. Hayward, I. Cohen, Nat. Mater. 2015, 14, 389.
[11] T. Castle, Y. Cho, X. Gong, E. Jung, D. M. Sussman, S. Yang, R. D. Kamien, Phys. Rev. Lett. 2014, 113, 245502.

[12] D. M. Sussman, Y. Cho, T. Castle, X. Gong, E. Jung, S. Yang, R. D. Kamien, Proc. Natl. Acad. Sci. U.S.A 2015, 112, 7449.

[13] P. Krulevitch, A. P. Lee, P. B. Ramsey, J. C. Trevino, J. Hamilton, M. A. Northrup, J. Microelectromech. S. 1996, 5, 270.

[14] E. Hawkes, B. An, N. M. Benbernou, H. Tanaka, S. Kim, E. D. Demaine, D. Rus, R. J. Wood, Proc. Natl. Acad. Sci. U.S.A 2010, 107, 12441.

[15] M. Behl, M. Y. Razzaq, A. Lendlein, Adv. Mater. 2010, 22, 3388.

[16] J. Leng, X. Lan, Y. Liu, S. Du, Prog. Mater Sci. 2011, 56, 1077.

[17] S. M. Felton, M. T. Tolley, B. Shin, C. D. Onal, E. D. Demaine, D. Rus, R. J. Wood, Soft Matter 2013, 9, 7688.

[18] M. Jamal, A. M. Zarafshar, D. H. Gracias, Nat. Commun. 2011, 2, 527.

[19] K. Malachowski, M. Jamal, Q. Jin, B. Polat, C. J. Morris, D. H. Gracias, Nano Lett. 2014, 14, 4164.

[20] T. S. Shim, S.-H. Kim, C.-J. Heo, H. C. Jeon, S.-M. Yang, Angew. Chem.-Int. Edit. 2012, 51, 1420.

[21] C. Py, P. Reverdy, L. Doppler, J. Bico, B. Roman, C. N. Baroud, Phys. Rev. Lett. 2007, 98.

[22] X. Guo, H. Li, B. Y. Ahn, E. B. Duoss, K. J. Hsia, J. A. Lewis, R. G. Nuzzo, Proc. Natl. Acad. Sci. L S. A. 2009, 106, 20149.

[23] R. R. A. Syms, E. M. Yeatman, Electron. Lett 1993, 29, 662.

[24] S. Pandey, M. Ewing, A. Kunas, N. Nghi, D. H. Gracias, G. Menon, Proc. Natl. Acad. Sci. U.S.A 2011, 108, 19885.

[25] W. J. Arora, A. J. Nichol, H. I. Smith, G. Barbastathis, Appl. Phys. Lett. 2006, 88.

[26] J. S. Randhawa, T. G. Leong, N. Bassik, B. R. Benson, M. T. Jochmans, D. H. Gracias, J. Am. Chem. Soc. 2008, 130, 17238.

[27] T. G. Leong, C. L. Randall, B. R. Benson, N. Bassik, G. M. Stern, D. H. Gracias, Proc. Natl. Acad. Sci. 0. S. A. 2009, 106, 703.

[28] N. Bassik, G. M. Stern, D. H. Gracias, Appl. Phys. Lett. 2009, 95.

[29] Y. Sun, W. M. Choi, H. Jiang, Y. Y. Huang, J. A. Rogers, Nature Nanotech. 2006, 1, 201.

[30] S. Xu, Z. Yan, K.-I. Jang, W. Huang, H. Fu, J. Kim, Z. Wei, M. Flavin, J. McCracken, R. Wang, A. Badea, Y. Liu, D. Xiao, G. Zhou, J. Lee, H. U. Chung, H. Cheng, W. Ren, A. Banks, X. Li, U. Paik, R. G. Nuzzo, Y. Huang, Y. Zhang, J. A. Rogers, Science 2015, 347, 154.

[31] Y. Zhang, Z. Yan, K. Nan, D. Xiao, Y. Liu, H. Luan, H. Fu, X. Wang, Q. Yang, J. Wang, W. Ren, H. Si, F. Liu, L. Yang, H. Li, J. Wang, X. Guo, H. Luo, L. Wang, Y. Huang, J. A. Rogers, Proc. Natl. Acad. Sci. U.S.A 2015, 112, 11757.

Supporting Information

Finite Element Analyses

1. Three-dimensional (3D) finite element analyses (FEA) was employed to simulate the process of origami assembly enabled by controlled buckling. Eight-node 3D solid elements and four-node shell elements were used to model the silicone substrate and 2D precursors, respectively. Refined meshes were adopted to ensure the computational accuracy. The critical buckling strains and corresponding buckling modes determined from linear buckling analyses were implemented as initial imperfections in the post-buckling simulations, so as to obtain the deformed configurations and strain distributions at different levels of prestrain. The elastic modulus (E) and Poisson's ratio (v) are $E_{substrate}$=166 kPa and $V_{substrate}$=0.49 for substrate; $E_{Si}$=130 GPa and $v_{Si}$=0.27 for Silicon; $E_{Au}$=78 GPa and $v_{Au}$=0.44 for gold; and $E_{SU8}$=4.02 GPa and $V_{SU8}$=0.22 for SU8.

Mechanics model for the stepwise multi-floor building

The two-floors (n=2) design serves as an example to illustrate the mechanics model. A typical pattern of 2D precursor is shown in FIG. 59(b) (left). To form a stepwise configuration shown in FIG. 69(a) (Supporting Information), all segments of the x-directional ribbon should be parallel with or perpendicular to the xy plane at the final state of assembly. Due to the large stiffness, the bonding locations undergo negligible deformation during the assembly, such that the compressive strains are accommodated by other regions. During the assembly, the creases undergo folding deformations and negligible tensile/compressive deformations. For simplicity, the deformed configurations of creases can be assumed as arcs, with the arc angles determined by the two ribbons joined by the creases. For the creases connecting the x- and y-directional ribbons, the arc angles are 90° and $\theta_i$ (i=1 or 2), respectively, as shown in FIG. 69(a) (Supporting Information).

We first consider the x-directional deformation by comparing the initial and final states of assembly. To form the stepwise configuration described above, the x-directional spacings between the centers of the bonding locations need to be the same, so as to ensure the same contraction (along the x axis) between each neighboring floor. This requires $$L_{x\text{-}bonding} = S_x, \tag{S1}$$

The x-directional prestrain component ($\varepsilon_{x\text{-}pre}$) can be determined accordingly as $$\varepsilon_{x\text{-}pre} = \frac{S_x + \left(2 - \frac{4}{\pi}\right)w}{S_x + \frac{4}{\pi}w}. \tag{S2}$$

Then we consider the y-directional deformation, accounting for the acute angles ($\theta_1$ and $\theta_2$) between the tilted side ribbons and y axis. Noting that the side ribbons remain flat during the assembly, the lengths of side ribbons can be written in terms of $S_x$, $S_y$, w, $\theta_1$ and $\theta_2$, as $$L_0^i = \left[iS_x + \frac{4i}{\pi}w - \frac{2w(1-\cos\theta_i)}{\theta_i}\right]\frac{1}{\sin\theta_i}, \text{ for } i = 1 \ldots n. \tag{S3}$$

Given the y-directional prestrain component ($\varepsilon_y$), the y-directional lengths ($L_{y\text{-}bonding}^1$ and $L_{y\text{-}bonding}^2$) of the bonding locations joining the side ribbons can be determined as $$L_{y\text{-}bonding}^i = \frac{2\left[iS_x + \frac{4i}{\pi}w - \frac{2w(1-\cos\theta_i)}{\theta_i}\right][1-(1+\varepsilon_{y\text{-}pre})\cos\theta_i]}{\varepsilon_{y\text{-}pre}\sin\theta_i} + \frac{4w\left[1 - \frac{(1+\varepsilon_{y\text{-}pre})\sin\theta_i}{\theta_i}\right]}{\varepsilon_{y\text{-}pre}} - S_y, \tag{S4}$$

for $i = 1 \ldots n$.

By inserting the basic geometric dimensions ($S_x$, $S_y$ and w), the target angles ($\theta_i$, i=1 . . . n), and the target prestrain ($\varepsilon_{y\text{-}pre}$), all the other parameters ($\varepsilon_{x\text{-}pre}$, $L_{x\text{-}bonding}^i$, i=1 . . . n) are determined from Equations (S1) to (S4). This model can be extended directly for construction of stepwise structures with an arbitrary number (n) of floors. In this case, all of the Equations from (S1) to (S4) remain true. Differences exist only in the number (n) of stepwise structures.

Figure 67:
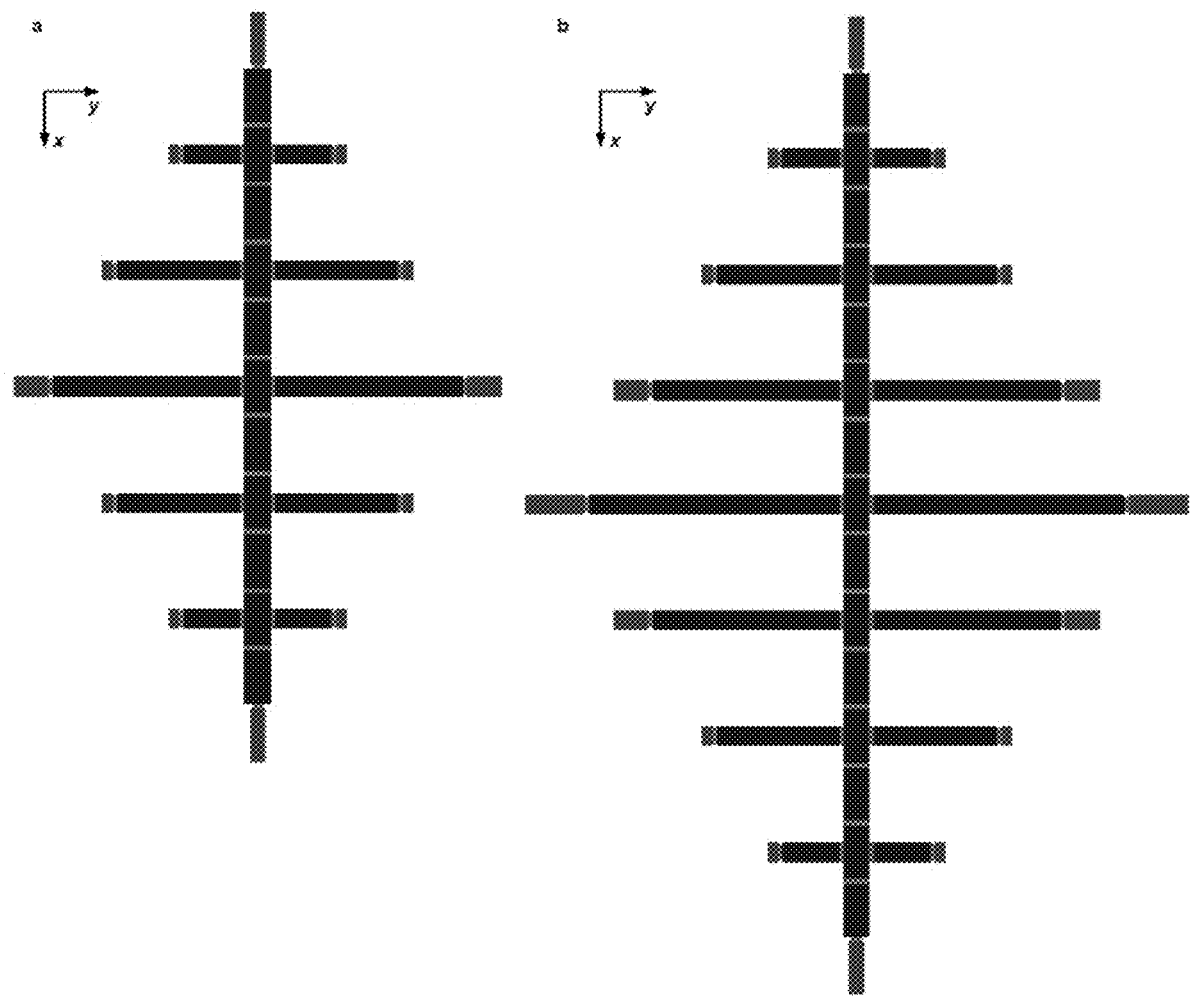
FIG. 67: (a) and (b) show 2D precursors for the multi-floors 3D structures in FIG. 59(b), where the bonding sites are highlighted in red and creases are highlighted in gray.

FIG. 59(b) and FIG. 67 (Supporting Information) present a set of 2D precursors built with the above model, and the corresponding 3D structures based on FEA calculations and experiment observation. The resulting 3D configurations indeed show evident stepwise topology along the x direction, validating the mechanics model developed above. The input parameters for this set of designs include: $\theta_1=75°$, $\theta_2=\theta_3=\theta_4=68°$; $\varepsilon_{y\text{-}pre}=110\%$; and $(S_x, S_y, w)=$(19 mm, 9.5 mm, 1.6 mm) for n=2, (14.0 mm, 7.0 mm, 1.2 mm) for n=3, and (11.0 mm, 5.5 mm, 0.94 mm) for n=4.

To construct upright side ribbons with $\theta_i=90°$ (i=1 ... n) for the stepwise structures, the required dimensions ($L_{y\text{-}bonding}^i$, i 1 ... n) of bonding locations can be determined using the above model for a range of $\varepsilon_{y\text{-}pre}$, as shown in FIGS. 68(a) and (b) (Supporting Information), for typical geometric dimensions $(S_x, S_y, w)=$(11.0 mm, 5.5 mm, 0.94 mm). The curves show a rapid increase of $\varepsilon_{y\text{-}bonding}^i$ with increasing floor number or decreasing prestrain component ($\varepsilon_{y\text{-}pre}$). Due to practical difficulties in achieving both large bonding sizes ($L_{y\text{-}bonding}^i$, i=1 ... n) and large prestrains ($\varepsilon_{y\text{-}pre}$) experimentally, it can be challenging to realize stepwise structures with upright ribbons and multiple (e.g., n>3) floors. By comparison, if the desired angle ($\theta_i$) is decreased (e.g., from 90° to 80°), the required dimensions ($L_{y\text{-}bonding}^i$, i=1 ... n) of the bonding locations can be reduced substantially for the same level of prestrain component ($\varepsilon_{y\text{-}pre}$), as shown in FIG. 69(b) (Supporting Information).

Example 4: 3D Microstructures Enabled by Engineered Substrates

Figure 79:
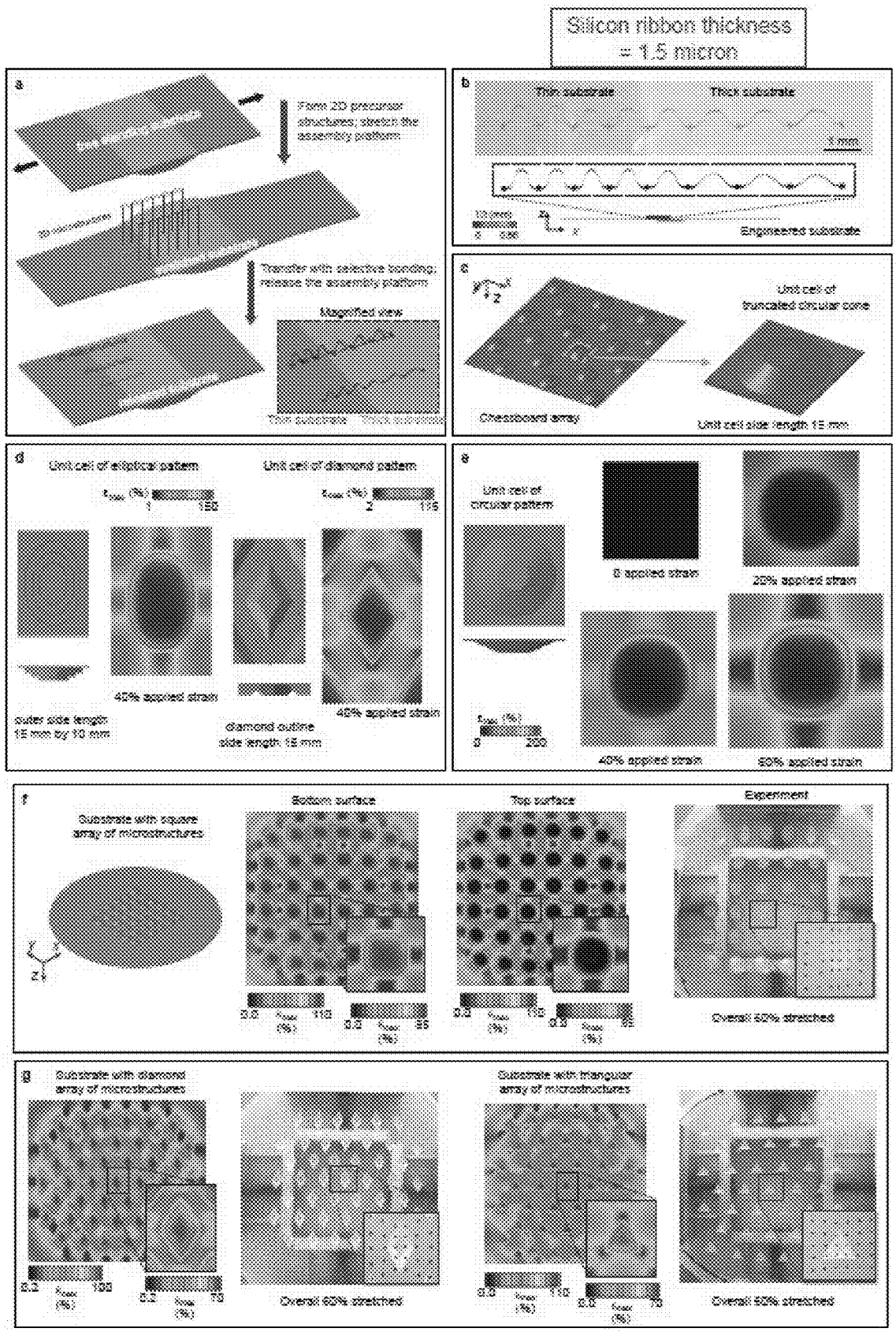
FIG. 79: (a)-(g) provide a schematic illustration of various engineered substrates comprising variable thicknesses and arrays of substrate relief features.
Figure 80:
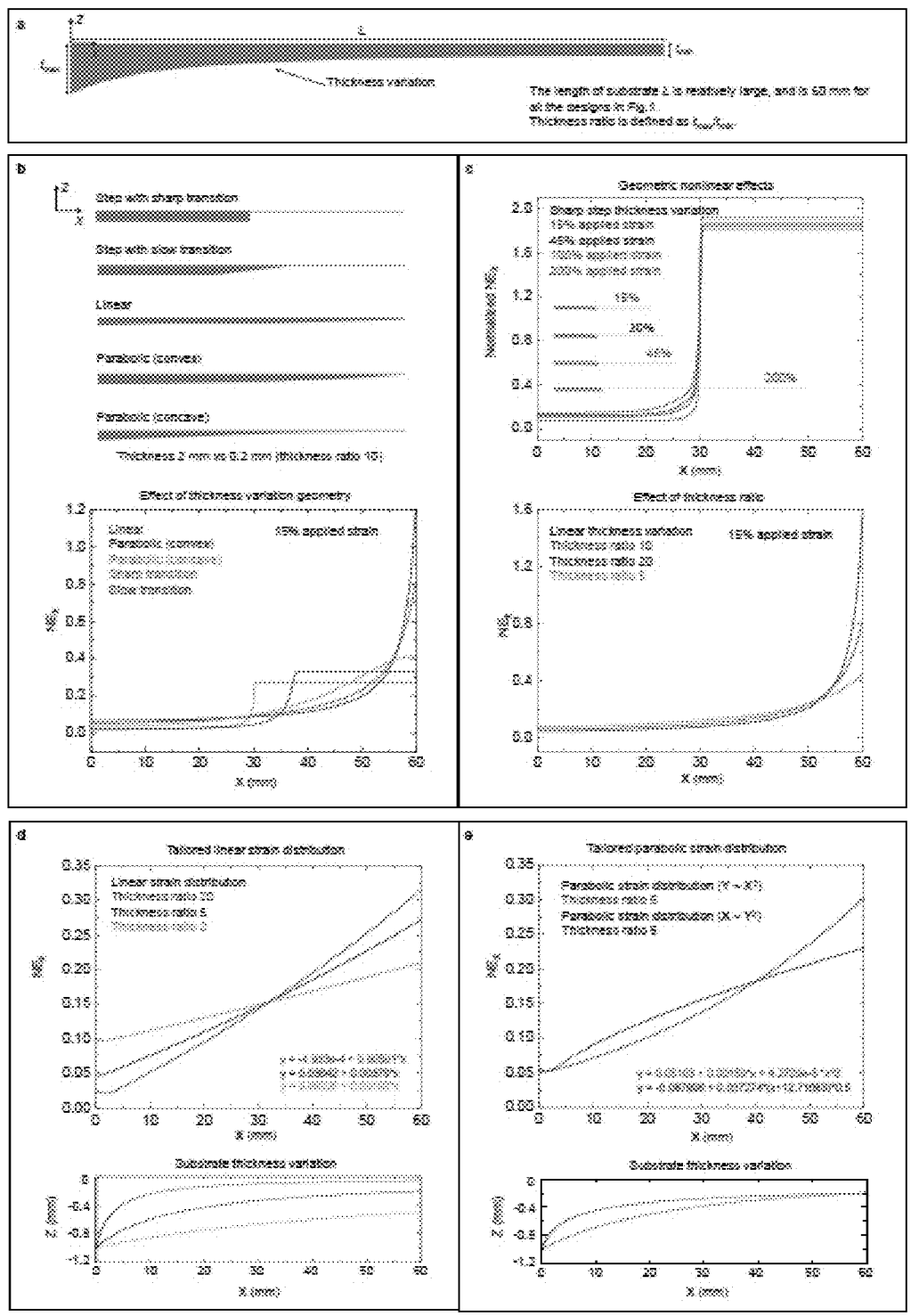
FIG. 80: (a)-(e) provide graphs showing nonlinear effects of various substrate thickness patterns.

This example explores engineered substrates of variable thicknesses, optionally including bulges, steps, tapering, convex curvature, concave curvature, relief features or arrays of relief features (FIG. 79). The nonlinear effects of some exemplary geometries are illustrated in FIG. 80.

Figure 81:
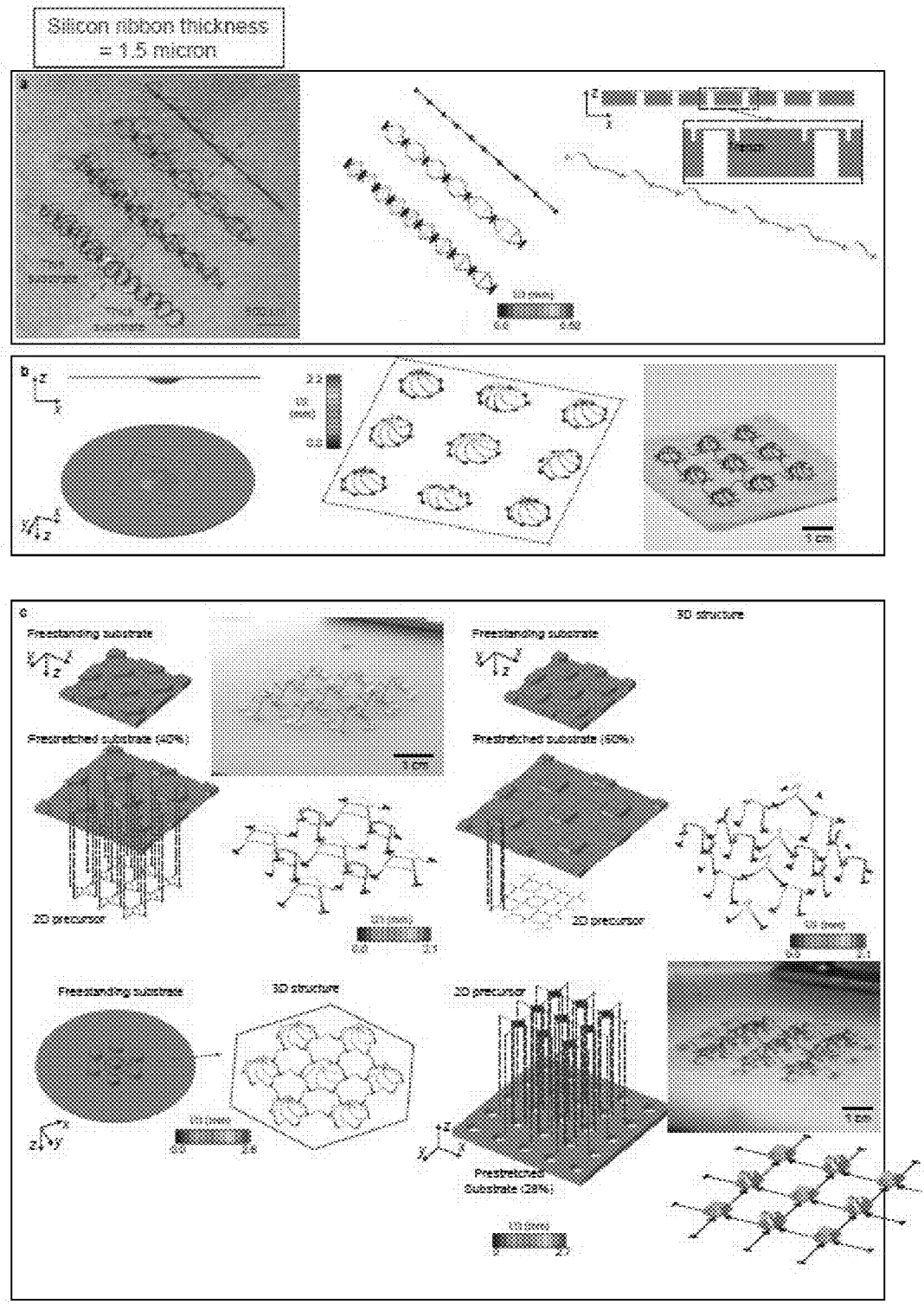
FIG. 81: (a)-(c) provide schematic illustration of various engineered substrates having positive (elevated) and negative (trenches, holes, cut outs) relief features and arrays of relief features.
Figure 82:
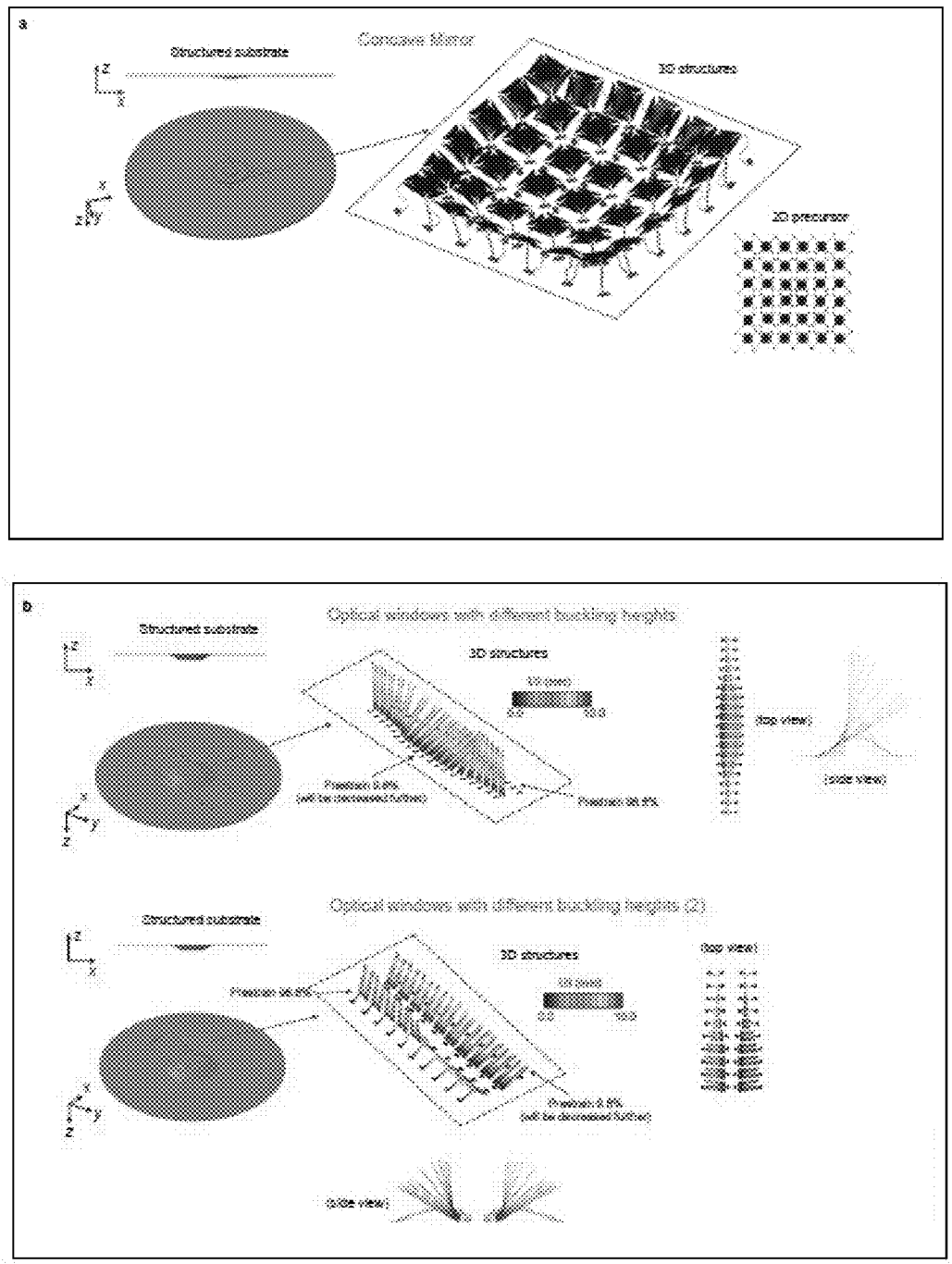
FIG. 82: (a) and (b) provide schematic of devices, such as mirrors and optical windows, incorporating engineered substrates having relief features.
Figure 83:
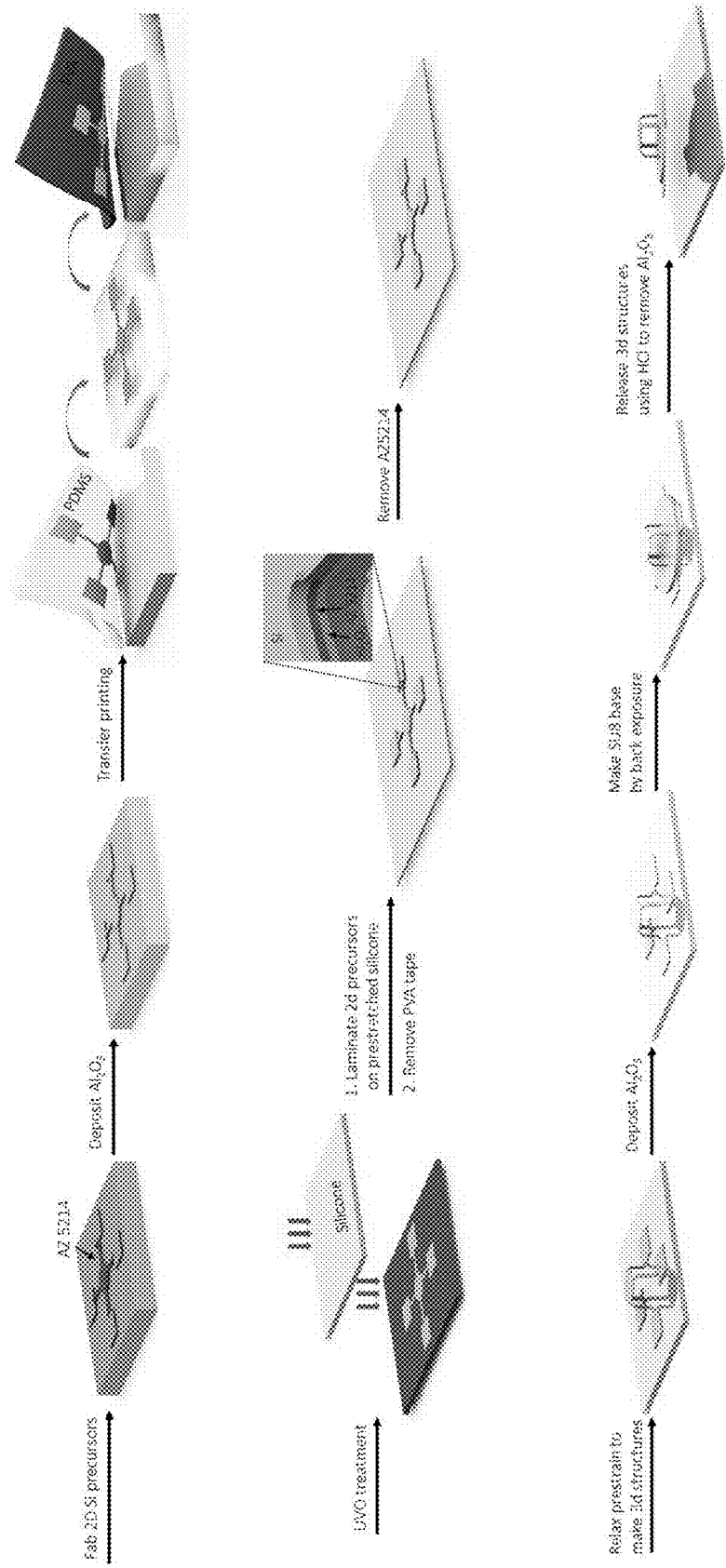
FIG. 83: Schematic illustration of formation and release of three-dimensional thin film structures from an elastomer substrate.
Figure 84:
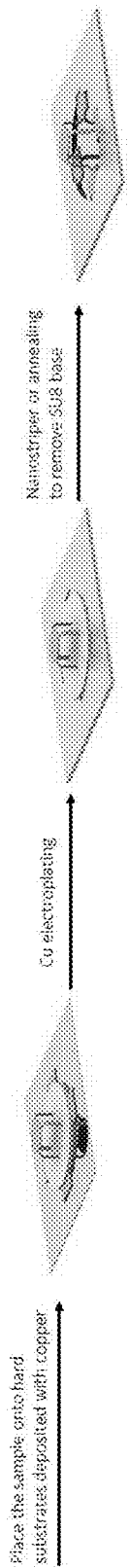
FIG. 84: Schematic illustration of welding a three-dimensional thin film structure onto a hard surface.

Exemplary relief features include, but are not limited to, truncated cones, diamonds, ellipses, triangles, trenches, squares, perforations and cut-outs. FIG. 81 illustrates various engineered substrates having relief features and arrays of relief features.

In some embodiments, engineered substrates are composite materials disposed side-by-side or layered to provide a desired thickness and/or modulus. The two or more materials making up the composite substrate may be joined or laminated, for example, by an adhesive, by van der Waals forces or via direct covalent bonding. In some embodiments, engineered substrates are made of a single material having a thickness or modulus that varies along a lateral dimension of the substrate. Composite or single material substrates may have features such as bulges, steps, tapering, convex curvature, concave curvature, relief features or arrays of relief features.

Example 5: 3D Shapes Using Shape Memory Polymers

This example provides steps in the formation of 3D shapes or structures using shape memory polymers.

Use pure shape memory polymer (SMP) to form the 2D precursor, or use SMP to form one layer of multilayer structures (e.g., SMP/Si, or SMP/Au) as the 2D precursor.

Heat the entire structure above transition temperature of SMP, and release the prestrain to pop up the SMP single layer (or multilayer structures) into desired 3D configuration.

Reduce the temperature to room temperature such that the 3D SMP structure becomes the permanent configuration, even without the support of substrate. In the case of SMP/Si (or SMP/Au) multilayer structures, if the SMP thickness is >5 times than Si (or Au), then SMP governs the bending stiffness, and the 3D configuration should be also fixed, although some residual stress will remain in Si or Au.

Remove the 3D structure from the polymer substrate, and then put onto non-polymer substrate.

Statements Regarding Incorporation by Reference and Variations

All references throughout this application, for example patent documents including issued or granted patents or equivalents; patent application publications; and non-patent literature documents or other source material are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods and steps set forth in the present description. As will be obvious to one of skill in the art, methods and devices useful for the present embodiments can include a large number of optional composition and processing elements and steps.

When a group of substituents is disclosed herein, it is understood that all individual members of that group and all subgroups, including any isomers, enantiomers, and diastereomers of the group members, are disclosed separately. When a Markush group or other grouping is used herein, all individual members of the group and all combinations and subcombinations possible of the group are intended to be individually included in the disclosure. When a compound is described herein such that a particular isomer, enantiomer or diastereomer of the compound is not specified, for example, in a formula or in a chemical name, that description is intended to include each isomer and enantiomer of the compound described individually or in any combination. Additionally, unless otherwise specified, all isotopic variants of compounds disclosed herein are intended to be encompassed by the disclosure. For example, it will be understood that any one or more hydrogens in a molecule disclosed can be replaced with deuterium or tritium. Isotopic variants of a molecule are generally useful as standards in assays for the molecule and in chemical and biological research related to the molecule or its use. Methods for making such isotopic variants are known in the art. Specific names of compounds are intended to be exemplary, as it is known that one of ordinary skill in the art can name the same compounds differently.

Every formulation or combination of components described or exemplified herein can be used to practice the invention, unless otherwise stated.

Whenever a range is given in the specification, for example, a number range, a temperature range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when compositions of matter are claimed, it should be understood that compounds known and available in the art prior to Applicant's invention, including compounds for which an enabling disclosure is provided in the references cited herein, are not intended to be included in the composition of matter claims herein.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements and/or limitation or limitations, which are not specifically disclosed herein.

One of ordinary skill in the art will appreciate that starting materials, biological materials, reagents, synthetic methods, purification methods, analytical methods, assay methods, and biological methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

It must be noted that as used herein and in the appended claims, the singular forms "a", "an", and "the" include plural reference unless the context clearly dictates otherwise. Thus, for example, reference to "a cell" includes a plurality of such cells and equivalents thereof known to those skilled in the art, and so forth. As well, the terms "a" (or "an"), "one or more" and "at least one" can be used interchangeably herein. It is also to be noted that the terms "comprising", "including", and "having" can be used interchangeably. The expression "of any of claims XX-YY" (wherein XX and YY refer to claim numbers) is intended to provide a multiple dependent claim in the alternative form, and in some embodiments is interchangeable with the expression "as in any one of claims XX-YY."

Unless defined otherwise, all technical and scientific terms used herein have the same meanings as commonly understood by one of ordinary skill in the art to which this invention belongs. Although any methods and materials similar or equivalent to those described herein can be used in the practice or testing of the present invention, the preferred methods and materials are described.

We claim:

1. A structure comprising:
   a thin film structure having a complex shape held under strain by at least partial contact with a supporting material; wherein:
   the thin film structure is characterized by at least one region with a mode ratio greater than or equal to 0.1, wherein the mode ratio of the at least one region corresponds to a ratio of average twisting curvature of the at least one region to the average bending curvature of the at least one region;
   the thin film structure is characterized by a thickness less than or equal to 300 µm;
   the thin film structure is bound to the supporting material at a plurality of bonding regions and not bound to the supporting material at a plurality of non-bonding regions; and
   the complex shape of the thin film structure is non-linear and helical.

2. A structure comprising:
   a thin film structure characterized by a plurality of cutouts configured to allow said thin film structure to form a predetermined three-dimensional shape upon application of a compressive force provided by relaxation of a deformable substrate; wherein said predetermined three-dimensional shape is a rigid structure characterized by at least one region with a mode ratio greater than or equal to 0.1; wherein the mode ratio of the at least one region corresponds to a ratio of average twisting curvature of the at least one region to the average bending curvature of the at least one region;
   the thin film structure is characterized by a thickness less than or equal to 300 µm; and
   the three-dimensional shape is a complex shape characterized as non-linear and helical.

3. A structure comprising:
   a deformable substrate having a surface; and
   a thin film structure supported by said surface; wherein said thin film structure is bound to said surface at a plurality of bonding regions and not bound to said surface at a plurality of non-bonding regions; wherein relaxation of said deformable substrate provides a compressive force that generates a predetermined three-dimensional form of said thin film structure; wherein said predetermined three-dimensional form is characterized by at least one region with a mode ratio greater than or equal to 0.1; wherein the mode ratio of the at least one region corresponds to a ratio of average twisting curvature of the at least one region to the average bending curvature of the at least one region;
the thin film structure is characterized by a thickness less than or equal to 300 µm; and
the thin film structure has a complex shape characterized as non-linear and helical.

4. The structure of claim 3 further comprising:
an encapsulation layer at least partially encapsulating said predetermined three-dimensional form.

5. The structure of claim 4, wherein said encapsulation layer is rigid.

6. The structure of claim 4, wherein said deformable substrate is rigid.

7. The structure of claim 6, wherein said thin film structure is an insulator.

8. A structure comprising:
a deformable substrate having a surface; and
a thin film structure supported by said surface; wherein said thin film structure is bound to said surface at a plurality of bonding regions and not bound to said surface at a plurality of non-bonding regions; wherein an overall shape of said thin film structure is non-linear and no bonding region exists at corners of a square or termini of a four-way intersection formed by said thin film structure;
wherein each of said non-bonding regions physically contacts said deformable substrate when said deformable substrate is in an expanded state and none of said non-bonding regions physically contacts said deformable substrate when said deformable substrate is in a contracted state; wherein:
wherein said overall shape is characterized by at least one region with a mode ratio greater than or equal to 0.1, wherein the mode ratio of the at least one region corresponds to a ratio of average twisting curvature of the at least one region to the average bending curvature of the at least one region;
the thin film structure is characterized by a thickness less than or equal to 300 µm; and
the overall shape is a complex shape characterized as non-linear and helical.

9. The structure of claim 6, wherein said predetermined three-dimensional form is a space-filling shape.

10. A template for a three-dimensional structure comprising:
a deformable substrate having a surface; and
a two-dimensional thin film structure substantially parallel with and supported by said surface; wherein said two-dimensional thin film structure comprises a pattern of cut-outs configured to allow said two-dimensional thin film structure to convert into a predetermined three-dimensional complex shape upon application of a compressive force provided by relaxation of said substrate; wherein:
the three-dimensional complex shape is characterized by at least one region with a mode ratio greater than or equal to 0.1, wherein the mode ratio of the at least one region corresponds to a ratio of average twisting curvature of the at least one region to the average bending curvature of the at least one region;
the thin film structure is characterized by a thickness less than or equal to 300 µm;
the thin film structure is bound to the substrate at a plurality of bonding regions and not bound to the substrate at a plurality of non-bonding regions; and
the three-dimensional complex shape is characterized as non-linear and helical.

11. A structure comprising:
a thin film structure characterized by a plurality of cut-outs configured to allow said thin film structure to form a predetermined three-dimensional shape upon application of a compressive force provided by relaxation of a deformable substrate; wherein:
the three-dimensional shape is characterized by at least one region with a mode ratio greater than or equal to 0.1, wherein the mode ratio of the at least one region corresponds to a ratio of average twisting curvature of the at least one region to the average bending curvature of the at least one region;
the thin film structure is characterized by a thickness less than or equal to 300 µm;
the thin film structure is bound to the substrate at a plurality of bonding regions and not bound to the substrate at a plurality of non-bonding regions; and
the three-dimensional shape is a complex shape characterized as non-linear and helical.

12. The structure of claim 6 wherein said predetermined three-dimensional form is a multilayered three-dimensional structure.

13. The structure of claim 6 wherein said predetermined three-dimensional form comprises an additional three-dimensional structure disposed inside said predetermined three-dimensional form.

14. The structure of claim 6 wherein said predetermined three-dimensional form displays chirality.

15. The structure of claim 6 further comprising:
a functional device or functional device component integrated into or disposed upon a non-bonding region of said thin film structure.

16. A spatially varying structure comprising:
a deformable substrate having a surface; and
a thin film structure supported by said surface; wherein said thin film structure is bound to said surface at a plurality of bonding regions and not bound to said surface at a plurality of non-bonding regions; wherein relaxation of said deformable substrate provides a compressive force that generates a predetermined three-dimensional form of said thin film structure having a plurality of buckled regions characterized by an anisotropic distribution of periodicities, amplitudes or both; wherein:
the three-dimensional form is characterized by at least one region with a mode ratio greater than or equal to 0.1, wherein the mode ratio of the at least one region corresponds to a ratio of average twisting curvature of the at least one region to the average bending curvature of the at least one region;
the thin film structure is characterized by a thickness less than or equal to 300 µm; and
the three-dimensional form is a complex shape characterized as non-linear and helical.

17. A spatially varying structure comprising:
a deformable substrate having a surface; and
a thin film structure supported by said surface; wherein said thin film structure is bound to said surface at a plurality of bonding regions and not bound to said surface at a plurality of non-bonding regions; wherein said thin film structure has a spatially varying density along a longitudinal axis;
wherein each of said non-bonding regions physically contacts said deformable substrate when said deformable substrate is in an expanded state and none of said non-bonding regions physically contacts said deformable substrate when said deformable substrate is in a contracted state; wherein:

the thin film structure is characterized by at least one region with a mode ratio greater than or equal to 0.1 when the deformable substrate is in a contracted state, wherein the mode ratio of the at least one region corresponds to a ratio of average twisting curvature of the at least one region to the average bending curvature of the at least one region;

the thin film structure is characterized by a thickness less than or equal to 300 μm; and the thin film structure has a complex shape characterized as non-linear and helical when the deformable substrate is in a contracted state.

18. The structure of claim 17, wherein said thin film structure varies in thickness and/or lateral dimensions along said longitudinal axis, thereby providing said thin film structure having said spatially varying density.

19. The structure of claim 6, wherein strain is reversibly transferable from said deformable substrate to said thin film structure.

20. The structure of claim 6, wherein said structure has an overall strain greater than or equal to 10%.

21. The structure of claim 6, wherein said non-bonding regions of said thin film structure are suspended above said deformable substrate by a compressive force of at least 0.01 MPa.

22. The structure of claim 6, wherein said non-bonding regions of said thin film structure are buckled away from said surface of said deformable substrate.

23. The structure of claim 6, wherein said non-bonding regions of said thin film structure are buckled toward said surface of said deformable substrate.

24. The structure of claim 6, wherein said deformable substrate is a stretchable substrate.

25. The structure of claim 6, wherein said deformable substrate is an elastic substrate.

26. The structure of claim 6, wherein said deformable substrate is a uniaxially expanded substrate, a biaxially expanded substrate or a multiaxially expanded substrate.

27. The structure of claim 6, wherein said deformable substrate has a uniform thickness.

28. The structure of claim 6, wherein said deformable substrate is an engineered substrate.

29. The structure of claim 6, wherein said deformable substrate has a spatially varying thickness.

30. The structure of claim 6, wherein said deformable substrate has an average thickness less than or equal to 10 cm.

31. The structure of claim 6, wherein said deformable substrate has a spatially varying modulus.

32. The structure of claim 6, wherein said deformable substrate has an average modulus less than or equal to 50 MPa.

33. The structure of claim 6, wherein said deformable substrate comprises a material selected from the group consisting of elastomers based on silicones, polyurethanes, perfluoropolyethers and other combinations thereof.

34. The structure of claim 6, wherein said thin film structure has an average thickness less than or equal to 10 cm.

35. The structure of claim 6, wherein said thin film structure has lateral dimensions less than or equal to 100 cm.

36. The structure of claim 6, wherein said thin film structure has spatially varying lateral dimensions.

37. The structure of claim 6, wherein said thin film structure comprises filaments, square plates, rectangular plates, triangular plates, diamond plates, hexagonal plates, pentagonal plates, oval plates, circular plates, fractional pieces of these and combinations thereof.

38. The structure of claim 6, wherein said thin film structure has a ratio of length to width greater than or equal to 5:1.

39. The structure of claim 6, wherein said thin film structure comprises a material selected from the group consisting of semiconductor, polymer, metal, dielectric and combinations thereof.

40. The structure of claim 6, wherein said thin film structure is a single crystalline semiconductor material.

41. The structure of claim 6, wherein said thin film structure possesses chirality.

42. The structure of claim 6, wherein said thin film structure comprises a plate portion and three or more compressible interconnects each having first ends attached to said plate portion and second ends attached to said deformable substrate at said bonding regions.

43. The structure of claim 6, wherein said thin film structure is a device component selected from the group consisting of an electrical interconnect, a structural component, a photonic element, a strain gauge, an acoustic element, an antenna, a tissue engineering scaffold, an optical shutter, an optoelectronic device, a solar cell, a photodetector, and a microelectromechanical system.

44. The structure of claim 6, wherein said thin film structure is an electrical circuit for an electronic device.

45. The structure of claim 6, wherein said thin film structure an electrical interconnect configured as a three-dimensional coil.

46. The structure of claim 6, further comprising one or more materials for at least partially encapsulating and supporting at least a portion of said thin film structure.

47. The structure of claim 46, wherein said material is selected from the group consisting of foams, shape memory polymers, hydrogels, directional polymers, elastomers, polymer and combinations thereof.

48. A method of making a three-dimensional structure, said method comprising:

providing a prestrained elastic substrate in an expanded state; said substrate having a receiving surface;

providing a two-dimensional thin film structure to said receiving surface, wherein said two-dimensional thin film structure comprises a pattern of cut-outs configured to allow said two-dimensional thin film structure to convert into a predetermined three-dimensional complex shape upon application of a compressive force; and allowing said prestrained elastic substrate to relax so as to provide said compressive force, thereby generating said three-dimensional structure; wherein:

the three-dimensional complex shape is characterized by at least one region with a mode ratio greater than or equal to 0.1, wherein the mode ratio of the at least one region corresponds to a ratio of average twisting curvature of the at least one region to the average bending curvature of the at least one region;

the thin film structure is characterized by a thickness less than or equal to 300 μm;

the three-dimensional structure is bound to the substrate at a plurality of bonding regions and not bound to the substrate at a plurality of non-bonding regions; and the three-dimensional complex shape is non-linear and helical.

49. A method of making a three-dimensional structure, said method comprising:
- providing a prestrained elastic substrate characterized by an anisotropic spatial distribution of strain; said substrate having a receiving surface;
- providing a thin film structure to said receiving surface, said thin film structure having a geometry allowing conversion into a predetermined three-dimensional complex shape upon application of an anisotropic compressive force; and
- allowing said prestrained elastic substrate to relax, thereby generating said anisotropic compressive force for making said three-dimensional structure; wherein:
- the three-dimensional complex shape is characterized by at least one region with a mode ratio greater than or equal to 0.1, wherein the mode ratio of the at least one region corresponds to a ratio of average twisting curvature of the at least one region to the average bending curvature of the at least one region;
- the thin film structure is characterized by a thickness less than or equal to 300 µm;
- the three-dimensional structure is bound to the substrate at a plurality of bonding regions and not bound to the substrate at a plurality of non-bonding regions; and
- the three-dimensional complex shape is non-linear and helical.

50. A method of making a structure having a predetermined three-dimensional geometry, said method comprising:
- providing an assembly substrate having a first state characterized by a first shape;
- wherein said assembly substrate has a receiving surface;
- bonding selected regions of a thin film structure having a planar geometry to said receiving surface of said assembly substrate; and
- transitioning said assembly substrate from said first state into a second state characterized by a second shape different from said first shape; wherein transition of said assembly substrate from said first state into a second state generates a nonuniform spatial distribution of compressive forces upon said thin film structure resulting in transformation of said planar geometry into said predetermined three-dimensional geometry of said thin film structure; wherein:
- the three-dimensional geometry is characterized by at least one region with a mode ratio greater than or equal to 0.1, wherein the mode ratio of the at least one region corresponds to a ratio of average twisting curvature of the at least one region to the average bending curvature of the at least one region;
- the thin film structure is characterized by a thickness less than or equal to 300 µm;
- the thin film structure having the three-dimensional geometry is bound to the substrate at a plurality of bonding regions and not bound to the substrate at a plurality of non-bonding regions; and
- the three-dimensional geometry is a complex shape characterized as non-linear and helical.

51. A method of making a structure having a predetermined three-dimensional geometry, said method comprising:
- providing an assembly substrate having a first state characterized by a first shape;
- wherein said assembly substrate has a receiving surface;
- bonding selected regions of a thin film structure having a planar geometry to said receiving surface of said assembly substrate;
- transitioning said assembly substrate from said first state into a second state characterized by a second shape different from said first shape; wherein transition of said assembly substrate from said first state into a second state generates a spatial distribution of compressive forces upon said thin film structure resulting in transformation of said planar geometry into said predetermined three-dimensional geometry of said thin film structure; and
- at least partially embedding said predetermined three-dimensional geometry in an encapsulating material to rigidify said predetermined three-dimensional geometry; wherein:
- the three-dimensional geometry is characterized by at least one region with a mode ratio greater than or equal to 0.1, wherein the mode ratio of the at least one region corresponds to a ratio of average twisting curvature of the at least one region to the average bending curvature of the at least one region;
- the thin film structure is characterized by a thickness less than or equal to 300 µm;
- the thin film structure having the three-dimensional geometry is bound to the substrate at a plurality of bonding regions and not bound to the substrate at a plurality of non-bonding regions; and
- the three-dimensional geometry is a complex shape characterized as non-linear and helical.

52. A method of making a structure having a predetermined three-dimensional geometry, said method comprising:
- providing an assembly substrate having a first state characterized by a first shape;
- wherein said assembly substrate has a receiving surface;
- bonding selected regions of a thin film structure having a planar geometry to said receiving surface of said assembly substrate;
- transitioning said assembly substrate from said first state into a second state characterized by a second shape different from said first shape; wherein transition of said assembly substrate from said first state into a second state generates a spatial distribution of compressive forces upon said thin film structure resulting in transformation of said planar geometry into said predetermined three-dimensional geometry of said thin film structure; and
- rigidifying said assembly substrate; wherein:
- the three-dimensional geometry is characterized by at least one region with a mode ratio greater than or equal to 0.1, wherein the mode ratio of the at least one region corresponds to a ratio of average twisting curvature of the at least one region to the average bending curvature of the at least one region;
- the thin film structure is characterized by a thickness less than or equal to 300 µm;
- the thin film structure having the three-dimensional geometry is bound to the substrate at a plurality of bonding regions and not bound to the substrate at a plurality of non-bonding regions; and
- the three-dimensional geometry is a complex shape characterized as non-linear and helical.

53. A method of making a structure having a predetermined three-dimensional geometry, said method comprising:
- providing an assembly substrate having a first state characterized by a first shape;
- wherein said assembly substrate has a receiving surface;

bonding selected regions of a thin film structure having a planar geometry to said receiving surface of said assembly substrate;

transitioning said assembly substrate from said first state into a second state characterized by a second shape different from said first shape; wherein transition of said assembly substrate from said first state into a second state generates a spatial distribution of compressive forces upon said thin film structure resulting in transformation of said planar geometry into said predetermined three-dimensional geometry of said thin film structure; and transferring said predetermined three-dimensional geometry to a rigid secondary substrate; wherein:

the three-dimensional geometry is characterized by at least one region with a mode ratio greater than or equal to 0.1, wherein the mode ratio of the at least one region corresponds to a ratio of average twisting curvature of the at least one region to the average bending curvature of the at least one region;

the thin film structure is characterized by a thickness less than or equal to 300 μm;

the thin film structure having the three-dimensional geometry is bound to the substrate at a plurality of bonding regions and not bound to the substrate at a plurality of non-bonding regions; and the three-dimensional geometry is a complex shape characterized as non-linear and helical.

54. The structure of claim 50, wherein said nonuniform spatial distribution of compressive forces provides a strain gradient selected from a range of 0.05/meter to 5000/meter.

55. A method of making a structure having a predetermined three-dimensional geometry, said method comprising:

providing an assembly substrate provided in a first state characterized by a first nonuniform spatial distribution of tensile strain; wherein said assembly substrate has a receiving surface;

bonding selected regions of a thin film structure having a planar geometry to said receiving surface of said assembly substrate;

transitioning said assembly substrate from said first state into a second state characterized by a second nonuniform spatial distribution of tensile strain different from said first nonuniform spatial distribution of tensile strain; wherein transition of said assembly substrate from said first state into a second state generates a nonuniform spatial distribution of compressive forces upon said thin film structure resulting in transformation of said planar geometry into said predetermined three-dimensional geometry of said thin film structure; wherein:

the three-dimensional geometry is characterized by at least one region with a mode ratio greater than or equal to 0.1, wherein the mode ratio of the at least one region corresponds to a ratio of average twisting curvature of the at least one region to the average bending curvature of the at least one region;

the thin film structure is characterized by a thickness less than or equal to 300 μm;

the thin film structure having the three-dimensional geometry is bound to the substrate at a plurality of bonding regions and not bound to the substrate at a plurality of non-bonding regions; and the three-dimensional geometry is a complex shape characterized as non-linear and helical.

56. A method of making a structure having a predetermined three-dimensional geometry, said method comprising:

providing an assembly substrate having a first state characterized by a first shape;

wherein said assembly substrate has a receiving surface;

bonding selected regions of a thin film structure having a planar geometry to said receiving surface of said assembly substrate;

transitioning said assembly substrate from said first state into a second state characterized by a second shape different from said first shape; wherein transition of said assembly substrate from said first state into a second state generates a spatial distribution of compressive forces upon said thin film structure resulting in transformation of said planar geometry into said predetermined three-dimensional geometry of said thin film structure; and rigidifying said predetermined three-dimensional geometry; wherein:

the three-dimensional geometry is characterized by at least one region with a mode ratio greater than or equal to 0.1, wherein the mode ratio of the at least one region corresponds to a ratio of average twisting curvature of the at least one region to the average bending curvature of the at least one region;

the thin film structure is characterized by a thickness less than or equal to 300 μm;

the thin film structure having the three-dimensional geometry is bound to the substrate at a plurality of bonding regions and not bound to the substrate at a plurality of non-bonding regions; and the three-dimensional geometry is a complex shape characterized as non-linear and helical.

57. The structure of claim 6, wherein said thin film structure has an average thickness selected from the range of 10 μm to 1000 μm.

58. The structure of claim 6, wherein said thin film structure comprises a single crystalline or polycrystalline semiconductor.

59. The structure of claim 6, wherein said thin film structure comprises single crystalline silicon.

60. The structure of claim 6, wherein said thin film structure comprises a device component selected from the group consisting of an electrical interconnect, a structural component, a photonic element, a strain gauge, an acoustic element, an antenna, a tissue engineering scaffold, an optical shutter, an optoelectronic device, a solar cell, a photodetector, and a microelectromechanical system.

61. The method of claim 50, wherein said thin film structure has an average thickness selected from the range of 10 μm to 1000 μm.

62. The method of claim 50, wherein said thin film structure comprises a single crystalline or polycrystalline semiconductor.

63. The method of claim 50, wherein said thin film structure comprises single crystalline silicon.

64. The method of claim 50, wherein said thin film structure comprises a device component selected from the group consisting of an electrical interconnect, a structural component, a photonic element, a strain gauge, an acoustic element, an antenna, a tissue engineering scaffold, an optical shutter, an optoelectronic device, a solar cell, a photodetector, and a microelectromechanical system.

* * * * *